US010804934B2

(12) United States Patent
Shinohara et al.

(10) Patent No.: US 10,804,934 B2
(45) Date of Patent: *Oct. 13, 2020

(54) DATA PROCESSING APPARATUS AND DATA PROCESSING METHOD

(71) Applicant: Saturn Licensing LLC, New York, NY (US)

(72) Inventors: Yuji Shinohara, Kanagawa (JP); Makiko Yamamoto, Tokyo (JP)

(73) Assignee: Saturn Licensing LLC, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/962,992

(22) Filed: Apr. 25, 2018

(65) Prior Publication Data

US 2019/0007061 A1   Jan. 3, 2019

Related U.S. Application Data

(63) Continuation of application No. 14/386,830, filed as application No. PCT/JP2014/051624 on Jan. 27, 2014, now abandoned.

(30) Foreign Application Priority Data

Feb. 8, 2013   (JP) .................................. 2013-023883

(51) Int. Cl.
*H03M 13/11* (2006.01)
*H03M 13/27* (2006.01)
(Continued)

(52) U.S. Cl.
CPC ..... *H03M 13/1177* (2013.01); *H03M 13/036* (2013.01); *H03M 13/1165* (2013.01);
(Continued)

(58) Field of Classification Search
CPC ............. H03M 13/255; H03M 13/271; H03M 13/118; H03M 13/1157; H03M 13/1177;
(Continued)

(56) References Cited

U.S. PATENT DOCUMENTS 8,707,128 B2   4/2014   Myung et al.
8,949,691 B2   2/2015   Shinohara et al.
(Continued)

FOREIGN PATENT DOCUMENTS

CN          1976238 A      6/2007
CN        101036301 A      9/2007
(Continued)

OTHER PUBLICATIONS

International Search Report dated Apr. 15, 2014 in PCT/JP2014/051624.
(Continued)

*Primary Examiner* — April Y Blair
*Assistant Examiner* — Sazzad Hossain
(74) *Attorney, Agent, or Firm* — Oblon, McClelland, Maier & Neustadt, L.L.P.

(57) ABSTRACT

A data processing apparatus and a data processing method which enable provision of an LDPC code that achieves good error-rate performance. An LDPC encoding unit performs encoding using an LDPC code having a code length of 64800 bits and a code rate of 24/30, 25/30, 26/30, 27/30, 28/30, or 29/30. The LDPC code includes information bits and parity bits, and a parity check matrix H is composed of an information matrix portion corresponding to the information bits of the LDPC code, and a parity matrix portion corresponding to the parity bits. The information matrix portion of the parity check matrix H is represented by a parity check matrix initial value table that shows positions of elements of 1 in the information matrix portion in units of
(Continued)

360 columns. The apparatus and method may be applied to LDPC encoding and LDPC decoding.

15 Claims, 123 Drawing Sheets

(51) Int. Cl.
*H04L 1/00* (2006.01)
*H03M 13/03* (2006.01)
*H03M 13/25* (2006.01)
*H03M 13/29* (2006.01)
*H03M 13/35* (2006.01)
*H03M 13/15* (2006.01)

(52) U.S. Cl.
CPC ....... *H03M 13/255* (2013.01); *H03M 13/271* (2013.01); *H03M 13/2707* (2013.01); *H03M 13/2906* (2013.01); *H03M 13/356* (2013.01); *H04L 1/0057* (2013.01); *H04L 1/0071* (2013.01); *H03M 13/152* (2013.01)

(58) Field of Classification Search
CPC ........... H03M 13/036; H03M 13/1165; H03M 13/152; H03M 13/2906; H03M 13/356; H04L 1/0057; H04L 1/0071
See application file for complete search history.

(56) References Cited

U.S. PATENT DOCUMENTS

| | | | | |
|---|---|---|---|---|
| 10,164,661 B2* | 12/2018 | Ikegaya | ............... | H03M 13/036 |
| 10,193,571 B2* | 1/2019 | Ikegaya | ............... | H03M 13/116 |
| 2005/0091565 A1 | 4/2005 | Eroz et al. | | |
| 2006/0109821 A1 | 5/2006 | Xia | | |
| 2006/0187815 A1 | 8/2006 | Wallace et al. | | |
| 2007/0226578 A1 | 9/2007 | Eroz et al. | | |
| 2008/0184084 A1* | 7/2008 | Matsumoto | ......... | H03M 13/033 714/728 |
| 2009/0125780 A1 | 5/2009 | Taylor et al. | | |
| 2010/0257426 A1* | 10/2010 | Yokokawa | ......... | H03M 13/1137 714/752 |
| 2010/0269019 A1 | 10/2010 | Yokokawa et al. | | |
| 2010/0275100 A1 | 10/2010 | Yokokawa et al. | | |
| 2010/0275101 A1 | 10/2010 | Yokokawa et al. | | |
| 2010/0281329 A1 | 11/2010 | Yokokawa et al. | | |
| 2010/0287453 A1 | 11/2010 | Balachandran et al. | | |
| 2010/0325512 A1 | 12/2010 | Yokokawa et al. | | |
| 2011/0243651 A1 | 10/2011 | Yoon | | |
| 2012/0179947 A1 | 7/2012 | Kato | | |
| 2013/0166992 A1 | 6/2013 | Shinohara et al. | | |
| 2013/0227378 A1 | 8/2013 | Yamamoto et al. | | |
| 2013/0254617 A1 | 9/2013 | Shinohara et al. | | |
| 2013/0290816 A1 | 10/2013 | Shinohara et al. | | |
| 2013/0297992 A1 | 11/2013 | Yamamoto et al. | | |
| 2013/0305113 A1 | 11/2013 | Shinohara et al. | | |
| 2014/0040707 A1 | 2/2014 | Shinohara et al. | | |
| 2014/0047295 A1 | 2/2014 | Shinohara et al. | | |
| 2016/0043737 A1 | 2/2016 | Shinohara et al. | | |
| 2019/0149172 A1* | 5/2019 | Ikegaya | ............... | H03M 13/116 |

FOREIGN PATENT DOCUMENTS

| | | | |
|---|---|---|---|
| CN | 101874350 A | | 10/2010 |
| EP | 2 214 319 A1 | | 8/2010 |
| EP | 2 955 852 A1 | | 12/2015 |
| JP | 2005-136990 A | | 5/2005 |
| JP | 2012-517138 A | | 7/2012 |
| JP | 2012-147197 A | | 8/2012 |
| KR | 10-1031873 | | 5/2011 |
| WO | WO 2009/069628 A1 | | 6/2009 |
| WO | WO 2009/104898 A2 | | 8/2009 |
| WO | WO 2011/105287 A1 | | 9/2011 |

OTHER PUBLICATIONS

"Digital Video Broadcasting (DVB); Frame structure channel coding and modulation for a second generation digital terrestrial television broadcasting system (DVB-T2)", ETSI EN 302 755, V1.3.1., (Apr. 2012), pp. 1, 40-45,130-138.

Digital Video Broadcasting (DVB), "TM-S2 Call for technologies (CfT) for Evolutionary subsystems of the S2 system", TM-S2-0122, (Aug. 2009), 10 pages.

Digital Video Broadcasting (DVB); Second generation framing structure, channel coding and modulation systems for Broadcasting, Interactive Services, News Gathering and other broadband satellite applications (DVB-S2), ETSI EN 302 307, V1.2.1, (Aug. 2009), 78 pages.

Extended European Search Report dated Jul. 20, 2016 in Patent Application No. 14749367.0, 15 pages.

Combined Office Action and Search Report dated Mar. 13, 2018 in Chinese Patent Application No. 201480000958.9 (with English language translation), 32 pages.

Mignone, V., "TM-S20337: Draft Specification", Digital Video Broadcasting, XP017845125, Dec. 17, 2013, pp. 1-101.

Sony, "TM-S20145: CfT Sony_LDPC_64_Annex", Digital Video Broadcasting, XP01784037, Feb. 12, 2013, pp. 1-127.

Korean Office Action dated Dec. 18. 2019, in Patent Application No. 10-2014-7027155, 3 pages.

* cited by examiner

FIG. 3

$$H = \begin{bmatrix} 1 & 1 & 1 & 0 & 0 & 0 & 1 & 0 & 1 & 1 & 0 & 0 \\ 1 & 1 & 0 & 1 & 1 & 0 & 0 & 0 & 0 & 0 & 1 & 1 \\ 0 & 0 & 1 & 1 & 1 & 1 & 1 & 0 & 0 & 1 & 0 & 0 \\ 0 & 0 & 0 & 1 & 1 & 1 & 0 & 1 & 1 & 0 & 0 & 1 \\ 1 & 1 & 0 & 0 & 0 & 1 & 0 & 1 & 0 & 1 & 1 & 0 \\ 0 & 0 & 1 & 0 & 0 & 0 & 1 & 1 & 1 & 0 & 1 & 1 \end{bmatrix}$$

PARITY MATRIX $H_T$

FIG. 13

| Nominal CODE RATE | N=64800 | | | | N=16200 | | | |
|---|---|---|---|---|---|---|---|---|
| | X | KX | K3 | M | X | KX | K3 | M |
| 1/4 | 12 | 5400 | 10800 | 48600 | 12 | 1440 | 1800 | 12960 |
| 1/3 | 12 | 7200 | 14400 | 43200 | 12 | 1800 | 3600 | 10800 |
| 2/5 | 12 | 8640 | 17280 | 38880 | 12 | 2160 | 4320 | 9720 |
| 1/2 | 8 | 12960 | 19440 | 32400 | 8 | 1800 | 5400 | 9000 |
| 3/5 | 12 | 12960 | 25920 | 25920 | 12 | 3240 | 6480 | 6480 |
| 2/3 | 13 | 4320 | 38880 | 21600 | 13 | 1080 | 9720 | 5400 |
| 3/4 | 12 | 5400 | 43200 | 16200 | 12 | 360 | 11520 | 4320 |
| 4/5 | 11 | 6480 | 45360 | 12960 | — | 0 | 12600 | 3600 |
| 5/6 | 13 | 5400 | 48600 | 10800 | 13 | 360 | 12960 | 2880 |
| 8/9 | 4 | 7200 | 50400 | 7200 | 4 | 1800 | 12600 | 1800 |
| 9/10 | 4 | 6480 | 51840 | 6480 | — | — | — | — |

NUMBER OF COLUMNS FOR EACH COLUMN WEIGHT

FIG. 29

| NUMBER OF NECESSARY COLUMNS OF MEMORY mb | b=1 (FIRST TO THIRD PERMUTATION METHODS) | b=2 (FOURTH PERMUTATION METHOD) | RESPECTIVE WRITE START POSITIONS IN mb COLUMNS | | | | | | | | | | | | | | | | | | | | | | |
|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 2 | | | | | | | | | | | | | | | | | | | | | | |
| 4 | 16QAM | QPSK | 0 | 2 | 4 | 7 | | | | | | | | | | | | | | | | | | | | |
| 6 | 64QAM | | 0 | 2 | 5 | 9 | 10 | 13 | | | | | | | | | | | | | | | | | | |
| 8 | 256QAM | 16QAM | 0 | 0 | 2 | 4 | 4 | 5 | 7 | 7 | | | | | | | | | | | | | | | | |
| 10 | 1024QAM | | 0 | 3 | 6 | 8 | 11 | 13 | 15 | 17 | 18 | 20 | | | | | | | | | | | | | | |
| 12 | 4096QAM | 64QAM | 0 | 0 | 2 | 2 | 3 | 4 | 4 | 5 | 5 | 7 | 8 | 9 | | | | | | | | | | | | |
| 16 | | 256QAM | 0 | 2 | 2 | 2 | 2 | 3 | 4 | 5 | 16 | 20 | 22 | 22 | 27 | 28 | 32 | | | | | | | | | |
| 20 | | 1024QAM | 0 | 1 | 3 | 4 | 5 | 6 | 7 | 9 | 13 | 14 | 16 | 21 | 23 | 25 | 26 | 28 | 30 | | | | | | | |
| 24 | | 4096QAM | 0 | 5 | 8 | 8 | 8 | 10 | 10 | 12 | 13 | 16 | 17 | 19 | 21 | 22 | 23 | 26 | 26 | 37 | 39 | 40 | 41 | 41 | 41 | 41 |

FIG. 30

| NUMBER OF NECESSARY COLUMNS OF MEMORY mb | b=1 (FIRST TO THIRD PERMUTATION METHODS) | b=2 (FOURTH PERMUTATION METHOD) | RESPECTIVE WRITE START POSITIONS IN mb COLUMNS ||||||||||||||||||||||||
|---|---|---|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
| 2 | QPSK | | 0 | 0 | | | | | | | | | | | | | | | | | | | | | | | |
| 4 | 16QAM | QPSK | 0 | 2 | 3 | 3 | | | | | | | | | | | | | | | | | | | | |
| 6 | 64QAM | | 0 | 0 | 2 | 3 | 7 | 7 | | | | | | | | | | | | | | | | | | |
| 8 | 256QAM | 16QAM | 0 | 0 | 0 | 1 | 7 | 20 | 20 | 21 | | | | | | | | | | | | | | | | |
| 10 | 1024QAM | | 0 | 1 | 2 | 2 | 3 | 3 | 4 | 4 | 5 | 7 | | | | | | | | | | | | | | |
| 12 | 4096QAM | 64QAM | 0 | 0 | 0 | 2 | 2 | 2 | 3 | 3 | 3 | 6 | 5 | 7 | | | | | | | | | | | | |
| 20 | | 1024QAM | 0 | 0 | 0 | 2 | 2 | 2 | 2 | 2 | 5 | 5 | 5 | 7 | 7 | 7 | 7 | 7 | 7 | 8 | 8 | 10 | | | | |
| 24 | | 4096QAM | 0 | 0 | 0 | 0 | 0 | 0 | 0 | 1 | 1 | 1 | 2 | 2 | 3 | 3 | 7 | 9 | 9 | 10 | 10 | 10 | 10 | 10 | 10 | 11 |

```
N=64800, rate=2/30
   30  251  2458  3467  9897 12052 12191 15073 15949 16328 16972 17704 20672 22200 22276 25349
26106 28258 29737 30518 30951 32440 43031 46622 47113 52077 52609 52750 54295 55384 56954
57155 57853 59942
  6985  7975  8681 10628 10866 13223 14882 18449 19570 24418 24538 24556 25926 26162 26947
28181 30049 33678 35497 37980 41276 43443 44124 48684 50382 51223 53635 57661 58040 59128
59300 59614 60200 60329
  1896  5169  7347 10895 14434 14583 15125 15279 17169 18374 20805 25203 29509 30267 30925
33774 34653 34827 35707 36868 38136 38926 42690 43464 44624 46562 50291 50321 51544 56470
56532 58199 58398 60423
   144   152  1236  8826 11983 12930 13349 19562 20564 30203 31766 35635 40367 40905 41792 41872
42428 43828 44359 47973 48041 49046 50158 50786 55527 55541 57260 57353 57821 58770 59098
59407 60358 60475
 2085 28320 37838 50085
 6903 21724 38880 59861
17156 20293 21231 44440
16799 38095 41049 44269
11939 30310 39689 47323
10563 17282 45331 60186
19860 23595 59085 60417
10403 19812 27225 48006
```

FIG. 41

```
N=64800, rate=3/30
  153  2939  6037 11618 12401 17787 18472 22673 25220 26245 29839 35106 36915 37622 37655
45425 55595 56308 56726 58286
  146   160  9060 12867 16536 20818 31754 35546 36480 36698 56314 56509 56837 57342 57373
57895 57947 58163 58202 58262
   58  1555 10183 10446 12204 16197 16830 17382 19144 19565 21476 29121 41158 49953 51531
55642 57423 57587 57627 57974
  120  9906 12466 21668 26856 27304 28451 29413 30168 31274 33309 33499 37486 38265 43457
50299 55218 56971 57059 58115
   80  6649  9541 12490 14153 14346 19926 20677 23672 42397 45629 46288 55935 56115 56555
56865 56993 57921 58049 58190
   46   152  3536  7134  9040 10474 10504 11549 17066 19102 27486 29364 39577 39995 48289 56236
57279 57560 57608 57930
19824 21165 34427 58143
22747 50215 50864 58176
 2943 31340 39711 57281
 1186 20802 27612 33409
 1347 20868 29222 48776
   19  8548 46255 56946
10762 20467 48519
   39  7401 34355
  142 10827 17009
 1822 29424 39439
 5944 11349 28870
 4981 14731 15377
```

FIG. 42

```
┌ N=64800, rate=4/30
  7248 8578 11266 16015 17433 18038 20159 20848 22164 23848 24516 25093 25888 28382 31701
33259 33540 34615 36428 38595 38683 38814 41592 44323 44522 44859 45857 48657 49686 53354
54260 54853 55069 55426 56127
  715 1505 3314 5537 6377 6750 11039 11271 15840 16615 24045 24314 24435 26992 28524 28745
28935 32956 33359 34964 36217 37546 38189 42599 44326 49694 54236 54779 55501 55543 55721
55865 55961 55966 55988
  70 116 613 2482 6204 6608 7392 13585 14175 14228 17842 20004 20142 21324 22575 24443
24497 25394 26585 30222 37825 38548 41709 44999 50925 52186 53793 54177 54705 55096 55489
55584 56019 56055 56151
  9 2054 3493 3584 3989 5916 11915 14323 15091 16998 17631 18645 18882 20510 27499 28990
30054 32231 36556 37437 39651 41543 41963 42798 42937 44864 48056 48971 53104 54511 54610
55151 55216 55470 55736
  30 81 110 294 1636 2152 4312 6098 9415 12105 14021 15226 15618 18614 21368 23154 28913
29260 36969 37792 39386 42362 42949 43758 43765 44572 45877 46424 46948 47683 47903 48245
51804 52166 53264
  3 50 987 1771 4255 9714 9907 13728 17807 20438 24206 24326 24458 26039 26898 35691 36875
37877 38103 38398 38671 39288 40642 41533 41753 42069 45374 46377 48016 48165 48805 49392
50660 51907 51968
  138 441 4163 6450 7419 10743 11330 14962 14984 15032 24819 28987 29221 33223 35464 37535
38213 39085 39223 39925 41220 41341 41643 44944 46330 46870 47142 48577 49387 50732 52578
53839 54085 55426 56132
  3773 41938 55428 55720
  8833 47844 49437 50265
  7054 31403 48642 53739
  2286 22401 42270 53546
  14435 24811 29047 36135
  21010 23783 55073 55612
  20516 27533 51132 52391
  884 22844 25100 56123
  1150 12133 44416 53752
  9761 38585 52021 55545
  1476 5057 49721 50744
  16334 39503 40494 43840
  24 31960 33866 53369
  22065 22989 32356 52287
  111 155 3706 13753
  17878 18240 27828 55776
  13582 47019 54558 55557
```

FIG. 43

```
┌─ N=64800, rate=5/30 ─────────────────────────────────────────────────────────┐
│   2035 5424 6737 8778 10775 15496 17467 21825 23901 27869 28939 29614 34298 34951 35578 │
│  37326 39797 44488 45293 45900 49239 53415 53900                             │
│   2090 4170 12643 12925 13383 17659 23995 24520 25766 26042 26585 29531 31126 34856 43610 │
│  49028 49872 50309 50455 51586 52161 52207 53263                             │
│   819 1629 5521 8339 8501 18663 22208 24768 25082 35272 35560 40387 40618 42891 44288 │
│  46834 47264 47458 47561 48563 49141 49583 51837                             │
│   100 564 4861 9130 15954 22395 23542 26105 27127 31905 33977 35256 37679 40472 40912 │
│  42224 43230 44945 45473 52217 52707 52953 53468                             │
│   73 86 6004 9799 13581 14067 14910 14944 15502 22412 26032 27498 27746 27993 28590 35442 │
│  38766 44649 47956 48653 48724 50247 52165                                   │
│   108 1173 5321 6132 7304 15477 18466 19091 20238 23398 26431 34944 36899 40209 42997 48433 │
│  48762 49752 49826 50984 51319 53634 53657                                   │
│   4541 7635 11720 12065 16896 28028 28457 30950 35156 38740 39045 43153 43802 44180 45186 │
│  45716 45794 46645 48679 49071 49181 53212 53489                             │
│   6118 8633 11204 11448 15114 19954 24570 26810 28236 39277 43584 46042 47499 48573 48715 │
│  49697 50511 51228 51563 51635 53410 53760 53851                             │
│   1223 4008 8948 9130 16129 17767 22039 23572 24550 28200 29157 32730 33821 38449 39758 │
│  48433 49362 52582 53129 53282 53407 53414 53972                             │
│   176 10948 11719 12340 13870 15842 18928 20987 24540 24852 28366 30017 36547 37426 38667 │
│  40361 44725 48275 48825 51211 52901 53737 53868                             │
│   21792 35759 44481 53371                                                    │
│   147 33771 34263 35853                                                      │
│   15696 41236 46244 46674                                                    │
│   48208 52868 53324 53794                                                    │
│   34077 36441 49909 53506                                                    │
│   34932 51666 53755 53974                                                    │
│   18455 38927 49349 51201                                                    │
│   3836 31114 37755 53469                                                     │
│   31831 42633 46626 52743                                                    │
│   21053 28415 46538 53154                                                    │
│   5752 19363 42484                                                           │
│   719 48444 52185                                                            │
│   25502 53443 53739                                                          │
│   11596 53495 53635                                                          │
│   43934 52112 53323                                                          │
│   42015 52196 52288                                                          │
│   72 129 52340                                                               │
│   9 17870 43153                                                              │
│   24743 41406 53180                                                          │
│   23388 48087 52441                                                          │
└──────────────────────────────────────────────────────────────────────────────┘
```

FIG. 44

```
N=64800, rate=6/30
  13033 14477 15028 17763 19244 20156 22458 24073 32202 32591 33531 33552 35823 41495
46351 49442 51612
  44 66 8422 8760 14694 18768 20943 27806 29012 33594 36262 36820 40434 47704 49355 51729
51758
  4233 16270 18958 20915 21313 27009 28249 33438 33855 34475 34541 37093 38835 42139 42169
44757 50122
  82 10760 14292 17911 18008 23008 33152 34162 35749 36166 37411 37523 40838 42786 43581
46177 48829
  4661 5201 5824 6014 8283 12840 22044 22103 29657 29722 32246 32893 34131 36007 40779
44900 51089
  5869 12204 14095 26632 27101 27300 32344 33761 35081 38057 40709 46805 47733 48220 49806
51318 51691
  87 5764 16204 20947 23257 31579 38832 40942 43112 43239 44602 49032 49482 49727 49929
50186 50593
  880 1883 8876 9204 12370 21536 32858 35875 36247 36319 37151 38601 48914 49533 51239
51399 51824
  20 129 2841 5695 8176 15720 26066 26197 34149 35814 36477 37478 45338 48988 50675 51071
51774
  7252 14498 19246 20257 20693 22336 26037 29523 29844 34015 35828 38232 40999 41437 43343
44109 49883
  4859 8000 9342 16137 21600 24083 36364 37038 38988 44465 45445 46569 48994 50591 51065
51166 51268
  7728 9766 11199 11244 13877 14245 23083 27064 28433 28810 34979 39031 42939 44517 45730
48365 51374
  67 135 1601 6123 9100 22043 24498 25417 30186 34430 34535 37216 40359 42794 47908 50685
51501
  1006 10492 18259 51816
  27272 49144 51574 51631
  23 5636 38161 39514
  9490 41564 46463 51162
  33623 41959 50610
  11626 22027 50936
  28345 39504 45097
  46639 50046 50319
  74 18582 27985
  102 17060 43142
  38765 49453 51242
  6102 41272 51729
  24686 33446 49011
  19634 49837 50000
  569 22448 25746
  33986 50729 51301
  9883 14876 29601
  9142 29505 50604
  22623 40979 51260
  23109 33398 51819
  163 50643 50984
  47021 47381 50970
  16215 20964 21588
```

FIG. 45

```
N=64800, rate=7/30
 548 9528 12205 12770 22023 22082 25884 27421 33215 36046 43580 43953 47539
 919 2623 5098 5514 5645 6348 9666 13795 14555 43224 44048 44948 47964
 995 7270 17753 21272 29228 29916 31634 34055 35205 37499 37777 47490 49301
 645 3803 8836 9470 11054 20253 29417 31243 31990 36468 38715 39932 43045
 14572 18646 21100 26617 32033 32410 37195 38586 43833 44577 45584 46453 49515
 6004 16982 17829 24616 28056 29646 32944 39051 42517 47086 48585 48772 49247
 1306 1447 4898 7781 18587 25724 26672 35062 35202 37080 39781 46111 47595
 92 3231 13043 22258 24198 28923 33303 37846 43610 44857 47322 48914 49291
 298 12557 13469 14451 21917 23539 26310 29839 37050 38507 41377 46971 48155
 12582 13044 21039 30600 34202 34947 37120 39108 39203 43449 46941 48542 49354
 871 12218 12680 14152 17171 25797 29021 37783 43728 47519 48794 48898 48980
 35 4623 13422 15881 16692 17463 23675 28063 31248 41997 44246 47992 48339
 7150 13015 17950 18214 20659 23579 25714 28328 32658 39717 39995 43322 45884
 82 11054 11845 19085 24174 26694 41530 45954 46508 46892 48832 49097 49420
 5789 13839 18512 25596 26478 26736 29431 32349 33384 41765 46661 49206 49543
 13805 17786 17798 29653 30310 34870 40176 40391 43227 45292 46423 46855 49454
 12433 27119 34645
 32065 34998 44021
 5158 16546 34359
 44 33285 39929
 39032 39296 40317
 9885 45251 47640
 14383 43446 44478
 31280 39945 48472
 27961 38221 48391
 2927 37404 38716
 19461 42462 46162
 24909 25915 40636
 11029 35538 45381
 26880 34179 48775
 192 6032 26853
 4563 14952 24256
 10003 30853 43811
 749 36334 41363
 100 17006 24982
 9507 20228 31214
 41691 44310 47083
 24070 30411 46982
 2727 28251 49289
 16689 21167 32590
 40813 41198 46175
 8336 32714 43075
```

FIG. 46

```
─ N=64800, rate=8/30 ─────────────────────────────────────────
  100 3433 4111 9089 13360 24012 26305 30252 31430 31769 34689 34917 36091 40873 41983
42689 43835 44318 47109
  3 48 124 2240 7029 21694 24565 29302 39777 42706 43631 43784 46033 47064 47079 47141
47239 47439 47479
  2 5675 7056 12715 24128 26596 30571 38210 38586 41138 42272 43336 43444 43917 45812 46840
47245 47286 47510
  2103 4285 10068 10702 12693 17619 18711 21309 22191 22999 37432 45646 46275 46338 46777
46860 46963 47432 47472
  6827 8209 8606 10412 15670 19469 22205 22215 25425 29565 34843 34985 37686 39277 44625
45016 45623 47069 47250
  58 114 1751 7913 24642 26995 40734 41486 43133 44804 45490 45725 46122 46412 47019 47080
47103 47495 47506
  96 5952 9078 9786 17738 17888 17986 31657 34430 34763 35450 37276 42395 43223 43283
44261 45648 47014 47276
  106 5405 9614 20500 21633 23242 28875 37238 38854 41778 42292 43883 45909 46558 46826
47292 47353 47436 47504
  32 11217 12153 26818 27616 38783 39976 40842 43581 43703 44287 44435 44576 44774 46080
46098 46801 46813 47168
  65 102 111 3879 11224 11772 23623 27306 28726 34663 34873 36288 39196 42003 45279 45629
46836 47021 47419
  77 131 11275 18964 20418 22364 22635 27727 28689 29720 29781 32110 41597 42046 43952
44786 46416 46808 47200
  87 8637 10829 23737 24117 26486 29603 34389 35509 35872 38948 40643 42698 45949 46159
46660 47041 47165 47220
  2 58 3110 7539 8886 10422 11597 13385 27870 35895 38120 43546 44948 46272 46369 46596
47199 47317 47351
  78 16119 27780 32231 38973 39088 40118 40231 43170 44131 44203 44878 45905 46250 47011
47113 47195 47303 47427
  2960 6685 8830 11107 11843 12811 30030 36574 36850 36920 37706 38025 41007 43554 44109
44643 45874 46469 46565
  125 366 10175 29860
  45 17503 44634 45789
  6272 19614 34408 37248
  14785 41017 44274 46858
  19935 22960 44726 44919
  15247 17925 33947 37392
  34631 39148 43287 45443
  8544 26457 30996 38672
  11725 31442 42167 45461
  22357 41743 46702 47285
  13786 26288 41358 43082
  7306 21352 43298 47359
  77 5188 20988 45572
  10334 23790 40878
  9304 29379 47450
  22048 44762 47300
  8529 8825 47443
  40831 41328 46415
  26715 43038 46498
  26925 30797 43181
  32434 45624 47460
```

FIG. 48

```
N=64800, rate=9/30
  339 4777 5366 7623 13034 13260 15107 17772 20338 21178 25914 27663 29948 37489 41021
  3871 5812 9795 23437 24079 27699 33471 39878 40302 41038 41217 42316 42765 43675 45118
  3699 4072 16553 21492 26210 29839 30322 34139 38227 39696 40762 41156 41269 45168 45350
  995 12194 12494 16542 20423 21950 23519 26215 26708 30587 38352 38840 39729 41645 43210
  3963 4315 6832 11354 21042 21084 21108 25595 33109 34029 34448 35129 38018 39012 44791
  164 887 2902 9021 9193 16705 17850 19241 25893 33427 37416 41024 41355 44381 45303
  1367 1495 5495 14440 18026 18130 18178 21946 24057 25663 29216 31965 38107 43907 44278
  10763 13722 13975 18294 20813 23028 23353 24211 37366 38805 40985 41792 42495 43259
43528
  1580 12448 21464 31246 33058 34794 35760 36021 36426 37138 37478 38199 42138 42335 45207
  83 112 12225 15224 18205 21345 28488 34362 37195 39660 42371 42814 44509 45201 45244
  6836 7635 11644 16591 17121 19307 21456 23544 30596 37887 38141 38581 43607 44246 45097
  9174 14934 17131 29762 30243 31656 33251 35498 37106 37655 41462 44002 44649 45032 45230
  33 5376 13536 17068 18581 23478 32021 32074 33716 38434 39452 42166 44305 44979 45306
  6013 7553 10023 19354 23126 25427 27665 30239 32699 34123 36171 38898 38972 41974 45213
  41 98 3088 8522 26252 29602 30009 30138 30948 32190 32428 32498 34273 34955 45311
  2000 15664 20677 20792 22980 25111 31491 37611 37981 39872 41668 42336 43602 43828 45329
  23 67 97 5339 8121 8583 20647 25425 32305 37158 40968 41578 43492 44929 45273
  1643 3496 5121 6546 15643 16423 20602 39950 43178 43252 43683 43992 44001 44611 45125
  11093 19172 20548 24518 28289 29246 30148 34884 40403 40745 42723 43064 44448 44723
44812
  12748 12799 28567 41605
  1965 4087 31879
  27178 33638 38344
  9580 13096 45337
  2672 22800 43869
  28287 31407 31975
  2823 5108 9945
  5891 30848 42082
  23 41944 44909
  909 2311 45162
  24998 37829 44704
  35339 40087 45019
  16928 26505 35256
  26462 27297 37766
  19656 35067 38586
  6958 17172 41412
  72 26012 37231
  15259 16044 30243
  2879 12148 34601
  36173 39731 42668
  20670 35816 43266
  22570 27213 30404
  40284 44171 45313
  17765 22514 39347
  24711 39892 45132
  13741 34633 44535
  15209 31692 45280
  11189 43771 45303
  28294 31110 32287
  29085 39876 45246
```

FIG. 50

```
─ N=64800, rate=10/30 ──────────────────────────────
  867 2733 2978 8947 10214 11810 13566 15922 18838 20543 25845 29179 30055 31284 33447
34330 35081 35605 36268 39563 42331 43174
  2765 6017 6394 6769 12351 13567 15195 19900 23094 27077 28626 28914 32219 33106 33662
33905 34878 37861 39749 39862 40976 42690
  2343 4231 7603 7789 8396 8783 15636 16221 20591 21538 24008 25117 25663 26817 29692 30937
31472 32070 33793 39506 41763 43172
  8536 10705 10960 11206 12513 15399 17108 17224 17512 20180 25288 27824 28958 30600 36792
36828 38891 39575 39581 42342 42914 42961
  9 107 681 1195 9957 14055 21420 23279 26129 32044 35750 37065 37092 37165 37179 40127
40835 41476 41564 41571 42576 42910
  86 1760 6842 8119 8904 12644 17603 18189 20018 22259 22654 25620 27606 27833 28002 31053
31814 31848 35573 36133 40698 41370
  28 115 4354 9276 11229 11252 13848 21112 22851 29912 32453 34693 37344 37420 40926 40992
41063 41762 41856 42012 42642 43045
  1589 7190 7221 7668 11805 14071 14367 14629 17087 19579 19861 25505 35471 35514 37495
38375 40286 40330 40402 41662 42638 43126
  76 99 3237 5137 7982 9598 13470 14045 26680 27058 32025 32235 34601 35658 36841 38408
40517 40987 41400 41861 42691 42772
  54 2470 2728 3177 3484 8267 9351 17523 18513 21119 22947 23771 26569 27308 31217 35887
36449 38529 40424 41873 42146 42706
  39 80 385 1386 3397 5234 14733 16955 17656 23262 23463 25340 31638 31676 32683 37130
37641 39064 41839 42193 42495 43063
  62 573 11847 14616 16033 16064 16302 18776 19434 23845 23873 25937 27741 32244 32612
33554 38445 38480 38610 40933 42386 42520
  33 183 968 5477 6173 7363 10358 12597 14468 18025 23369 23387 24723 25254 28299 28989
31675 32776 35077 40241 41572 42035
  36 2529 2543 3891 7108 9002 9481 16496 19796 26687 27343 33300 35495 37070 39247 40126
41758 41892 42124 42622 42738 43100
  91 6897 8794 9581 12922 15711 18539 19227 21592 22906 26449 29804 30895 31538 31930 33392
38006 38294 38705 38952 39005 42120
  64 76 709 1155 3162 7099 8740 9670 12678 21126 29239 29844 31248 32001 35243 36814 38008
42050 42149 42631 42705 43119
  17670 40897 42359
  17471 20895 32101
  5458 5508 30504
  17291 19627 27186
  14600 41106 43103
  18059 28398 40623
  23776 30190 32880
  4676 13593 21791
  19 2832 27959
  6193 21762 42854
  64 16088 42982
  29425 35004 42209
  14338 31982 41789
  21572 42838 42923
  5 87 6639
  5529 42541 43173
  15512 31740 35801
  44 86 43183
  26027 26995 36455
```

FIG. 52

```
N=64800, rate=11/30
   3208  6587  9493  9539 12368 12501 14811 15784 17625 18654 18721 19471 19503 20079 20411
  20876 21493 22083 22430 27275 29322 32758 33227 33347 33715 34472 34711 38450 39151 39709
  39862 40093 40497 40912
     42  1118  3086  5466  6379  8483  9051  9330 13250 13898 14055 15033 18094 21429 22652 25251
  28709 29909 30233 30472 30635 31367 32603 33614 33708 36404 36530 37039 37782 38115 38307
  40225 40597 40822
   5939 11990 15027 15162 16503 17171 17806 17902 18031 18077 21216 22134 22660 24170 28558
  29364 30003 31128 32674 33103 33361 34196 34435 34626 34991 35974 36022 37459 38170 38709
  39774 39960 40571 40858
     63  3871  9148 10328 12830 12912 18361 18839 20122 23126 23795 28612 30350 32251 32750
  33762 33866 36188 36979 37562 37836 38536 38705 38829 39609 40219 40324 40336 40367 40638
  40699 40809 40987 41019
     36    70   104  3737  5028 19023 19575 19746 23840 24611 24661 26741 27749 30359 31027 31509
  32621 32859 33830 34619 35281 35479 36796 37344 37555 38993 39088 39445 40276 40299 40762
  40771 40835 40967
    113  2313  4411  5858  9909 10426 18955 21663 21884 24105 24472 26944 27826 28574 28689 29579
  30903 32352 33334 36408 36795 36805 37112 37121 38731 39080 39739 40007 40326 40356 40472
  40476 40622 40778
     54    84  3529  5202  9825  9900 10846 12104 13332 14493 14584 23772 24084 25786 25963 26145
  28306 29514 30050 30060 33171 33416 33657 33951 34908 37715 37854 38088 38966 39148 40166
  40633 40746 40939
    105  8722 10244 12148 13029 16368 18186 19660 19830 21616 22256 22534 23100 23219 25473
  26585 29858 32350 33305 34290 34356 34675 35297 37052 37144 37934 38201 39867 40270 40539
  40781 40804 40944 40966
     53    61    82    96  2665  6552  9517 15693 17214 17588 18347 19039 20679 21962 24255 25861 27117
  27919 30691 36195 36379 37031 37309 37535 37793 38198 38212 38595 38808 38911 39474 39677
  40135 40935
     15    67   723  2962  4991  5285 11583 13398 16301 16338 20996 21510 25697 28214 29143 30539
  30573 31108 32500 32506 32727 32755 36134 37226 37655 37799 39219 39626 39980 40093 40105
  40628 40634 40816
  18854 37884 40104 40772
  35209 40379 40447 40508
   3049 36078 39403 40402
  19118 27981 35730 36649
  20465 28570 39076 40910
  24047 31275 39790 40126
  31041 33526 34162 39092
   1152  8976 24071 35698
      3 27991 31485 40934
   5245 20676 30579 38823
     47 11196 38674 38894
  14920 15270 16047 40928
  23974 30146 39805 40911
   8791 16641 25060 31681
   1147  4233 34386 37802
     58  5354 22265 41018
    869  3078 39882 40730
   1071  6322  9163 10642
   7235 32596 35540 37487
  26910 35537 40830 41035
     81 11905 16179 19558
```

```
─N=64800, rate=12/30─
   2455  2650  6184  7016  7280  7409  7507  8261  8591  8829 11277 13729 14302 15883 17754 18506
  19816 19940 22442 23981 26881 26981 28760 29688 31138 31497 32673 35889 37690 38665
     50   327  3574  4465  5954  9702 10606 11684 11715 12627 14132 14951 20099 24111 24283 27026
  27473 28162 30076 31032 31476 35031 36675 36914 37008 37425 37530 37689 38830 38856
     59   102  5278  5548  5850 11840 13813 16641 19597 20543 24088 24298 25171 25224 26925 28312
  28867 31551 31898 32849 33616 34486 34562 35252 35931 36107 37950 38494 38537 38547
     79  2084  2361  2922  3048  3525  5712  9376 10012 10463 11842 15200 18443 19223 20476 21361
  22584 24343 24594 28001 28304 28475 28969 31149 31528 32574 33007 35120 38245 38253
    821  2803  8187  8501 10063 10497 14472 14570 15613 18469 19620 23034 24029 24578 26538
  31025 32621 34134 34508 34988 35201 35907 36693 36793 37608 37998 38090 38506 38611 38682
      9    50    88  1222  2430  2824  7233  9972 10225 15762 18283 18961 20711 28455 29946 32016 35611
  35763 37263 37325 38287 38360 38416 38471 38518 38551 38643 38759 38763 38818
     33    38   151  2523  3787  5069  6710  7667  8501 11083 17631 19589 24263 24684 24940 28493 30646
  31916 33741 35060 35810 36284 36394 36400 38209 38312 38340 38782 38825 38858
      8    49    84   381  4009  6978  9983 14028 14051 16325 17393 24325 25130 25838 30998 35159 36135
  37516 37636 37837 37927 38433 38620 38647 38650 38699 38733 38784 38804 38862
     44    76  4362  4480  8679  8833 13730 16493 16507 22419 24544 25614 25671 33032 33120 35219
  35986 36415 36505 38169 38173 38327 38371 38468 38508 38546 38551 38747 38761 38853
     16   683  1013  8364  8665 12213 12279 12643 13134 15450 16703 17846 20656 21664 22896 23487
  25022 32049 32482 33647 35029 35197 36636 37162 38376 38408 38430 38520 38721 38734
      3   760  1052  6377  8526  9014 11769 12589 16661 18156 20521 21303 23361 27434 32315 34602
  34892 35078 35262 35639 36655 37893 38063 38578 38602 38719 38737 38748 38837 38861
     15    30    79    99 16844 19586 24117 24702 25088 26129 27790 28383 30976 33472 34613 35266 35337
  36278 36841 36980 37214 37651 37817 38085 38218 38338 38396 38432 38760 38812
  12483 24049 35782 38706
  12146 19270 23193 38389
  26418 34831 37883 38501
  25045 36512 37567 38487
  15238 33547 38210 38696
     14  6773 17384 38679
  14367 16694 16867 38453
  15371 37498 37910 38610
   2509 18705 27907 28422
  21246 37360 38125 38868
  11357 23312 24884 36318
  14467 19559 22338 37893
  26899 35264 36300 37973
  17311 28273 32934 38607
      0 14452 16264 38585
   6736 19801 31034 38279
  35256 36593 38204 38655
  10037 29019 32956 38670
     98 17138 28233 37750
    576  4888 14014 23030
   2003  2470 18968 38841
   1042  4623  8098  9963
     61  3037  9719 27052
  15129 26628 31307 37604
   9791 11904 12369 34528
   7996 15467 21456 38165
   7644 12741 34083 38851
```

FIG. 56

```
┌─ N=64800, rate=13/30 ─
   1153 2676 2759 5782 7192 10887 11573 11888 12383 18472 20695 21466 21753 23630 24580
 25006 25182 25636 25887 29615 29677 31968 32188 32277 33135
    935 5609 7730 9427 9519 10465 11182 12164 15765 17266 18156 20309 20542 21193 21697 22913
 22989 23780 27048 30762 31731 35754 36161 36379 36710
    644 2718 6995 7088 7898 11242 13921 14068 14328 15840 19581 19919 21938 22749 23311 23767
 25945 26731 27405 27830 31023 32589 33239 33957 34456
     17 131 2331 6624 10568 12965 16184 17665 19575 20690 22609 23378 24385 28281 30808 33083
 34435 34509 36016 36355 36525 36580 36586 36636 36644
      5 42 59 80 100 3327 4882 5238 6588 15417 17416 17476 18307 19336 20336 22770 33204 33302
 34207 35133 35594 35650 36090 36619 36659
     46 141 308 995 2267 2645 5224 5839 7945 8336 10865 14607 21285 22062 23225 23772 24190
 25324 26738 29253 29674 33264 35593 36564 36608
     55 2316 8545 13623 14353 14516 15773 18442 20172 21970 22319 26595 27849 29185 30141
 31195 33614 34586 35699 35994 36309 36445 36516 36662 36665
     17 59 82 955 5050 7239 17495 19753 23481 25131 30124 32434 33042 34583 35231 35786 36232
 36336 36518 36530 36541 36584 36592 36629 36648
      1 16 78 717 5622 7351 7729 9200 10674 12647 22946 24316 25268 28139 31794 32278 33243
 34217 34485 34505 34929 35450 35865 36340 36565
     15 36 73 2381 4118 6829 9453 11705 12402 14884 17442 19226 21328 25523 26538 29300 34635
 35066 35547 35617 36285 36343 36599 36607 36708
     27 58 3657 8026 9245 11874 14579 15588 16280 16426 22692 25061 27788 29797 31776 34992
 35324 35529 36295 36298 36469 36608 36626 36661 36679
     13 36 78 3785 5888 10015 13647 14824 18283 20262 26268 26890 27517 33128 33659 34191
 35729 35965 36196 36381 36385 36501 36593 36659 36667
      0 6 63 1713 8050 11113 18981 20118 22082 23210 24401 27239 31104 32963 33846 34334 35232
 35626 36159 36424 36441 36457 36523 36609 36640
     39 60 64 92 438 4764 6022 9256 14471 20458 23327 26872 30944 34061 34882 35249 35586 35642
 35680 36092 36126 36548 36626 36633 36649
     40 67 6336 8195 9735 19400 20396 21095 22015 28597 31367 33511 33932 34732 34847 35247
 35543 36020 36258 36619 36651 36688 36693 36709 36717
   13990 15734 24992 35907
    448 14650 29725 36141
  27195 27825 34118 35317
   2514 7964 31027 31885
  12966 22180 24997 33406
  13568 17438 18377 36038
     76 15846 25385 35720
      1 758 23751 36083
   2238 8449 29406 31840
     80 14882 15923 33878
     86 18320 24636 36111
   5392 24119 31102 34507
   6485 8182 14790 21264
  13702 29065 35939 36554
   9160 11429 36663 36691
   9153 12051 20063 25493
     37 3918 13758 18923
  18643 24675 31646 33893
   3941 9238 30160 36584
  26037 31006 35886
    115 8925 13728
```

FIG. 58

```
N=64800, rate=14/30
  2422 2919 3173 3795 4428 12681 13428 14654 17367 17687 19587 20017 23588 24353 25280
27167 29853 32040 32473 33170 33375
  34 79 817 12478 12769 14798 15383 16688 16739 17538 21654 22792 25145 25588 26995 27388
31655 32133 32601 33452 34471
  88 986 1907 2868 3657 6826 8595 11922 14704 17681 19503 20604 24251 28125 28612 29976
30687 31208 31464 33686 33909
  526 3853 4486 6507 10616 11300 11453 13385 20007 21420 21441 22554 23794 24581 24959
27083 28710 30235 32852 34179 34327
  43 1775 4405 5644 6553 8885 10337 11178 14114 15108 16189 16192 18490 18801 21475 22748
28269 28970 30758 31968 33554
  27 624 1191 1470 4277 5054 5695 9632 10911 11365 13339 21097 23810 26677 27822 28433
29878 31026 32525 33335 33873
  14 45 760 1098 1567 2003 6710 10195 12052 13024 13337 19088 22647 25050 25899 27035 28844
29927 33916 34033 34490
  30 94 4493 11928 14051 17759 18541 20842 21277 24587 24948 25790 27442 31120 31205 31526
32107 32263 33696 34393 34529
  3 4245 5284 7791 10196 10922 13992 14397 14947 16908 21032 24585 27219 30300 30981 32732
33362 33558 33725 34424 34537
  78 6958 8297 15781 23302 23386 23863 25570 25734 31844 31919 32100 32815 33345 33531
33561 33889 34348 34504 34512 34530
  52 90 775 3760 4099 6945 8954 11931 16578 20804 23252 26583 29420 32461 33695 33874 33964
34018 34177 34483 34506
  81 1162 3084 3986 4494 8523 10309 10934 12819 16784 23113 23803 25952 29134 29930 30530
32021 33343 33400 33664 33685
  0 35 57 1564 9062 19694 24489 24737 26422 27021 30630 31513 33317 33425 33545 33624 33743
33869 33875 34046 34519
  58 639 2340 3613 19319 21917 24284 29214 29430 29736 32496 32785 32830 32835 33176 33323
33711 33967 34197 34438 34468
  71 77 88 953 4233 7365 8395 15176 16662 18280 21989 24348 26847 27645 31050 31890 34119
34223 34235 34548 34551
  163 4304 4697 7470 11857 12787 12837 18000 18472 18489 19730 27014 29653 29740 30070
30252 32769 33637 34382 34394 34555
  7 29 79 7321 9770 11315 15354 16240 18888 19559 27783 28220 28924 30659 31474 33084 33310
33644 34282 34452 34557
  8 24 41 4491 11252 14225 18230 25845 30258 30801 31349 32655 32932 32951 33058 33794
33889 34150 34338 34463 34494
  13 13092 15747 23904 29675 29732 30199 31273 31928 32211 32704 32959 33056 33374 33646
33931 34043 34203 34426 34429 34509
  6 11188 19937
  11738 14763 34508
  11 4674 25431
  6346 9658 31716
  13231 32283 33193
  19187 31166 33846
  297 27886 32712
  74 8683 24435
  2200 20501 21571
  25 10097 29631
  4515 32145 33245
  13010 26434 29967
  0 30598 33940
```

```
N=64800, rate=15/30
  760  874 3785 6601 10266 14790 16713 18014 18215 20992 21237 21250 24161 24295 25360
 25380 26306 28764 30139 30708 31719 31730 32179
  191 7294 12316 12887 15172 15688 16749 18425 21102 25133 25875 25892 26013 26763 27058
 29510 29746 30265 30326 30386 31467 31665 32391
   76 2184 4641 6139 8656 9053 10603 15456 15797 15853 19689 21857 23984 24703 24732 26828
 26912 27714 27978 28627 30815 31332 31701
   13 5917 11178 13332 13401 16567 18144 18332 21502 22585 26654 27287 27474 27580 28266
 28949 30045 30669 30950 31368 31786 31820 32319
  723 9266 11501 12279 14691 14757 16829 18863 19022 19311 21466 22322 23441 23479 26959
 29450 29621 30075 30305 32044 32050 32110 32387
   42 3584 3807 6900 8188 12414 14341 20161 20466 23466 23722 26503 28207 29006 30745 30942
 31023 31647 31668 31908 32130 32332 32338
 2108 6363 8375 8971 10744 12734 15004 16460 16558 21479 22043 23858 24423 27887 28871
 30000 30089 30596 30926 31378 31525 32333 32355
   28  948 5841 6154 6643 10141 11528 12498 12525 13792 15031 18762 20383 20443 23824 25767
 27445 27558 27979 31402 32064 32133 32394
   14   19 2616 3474 4620 5333 6095 8507 8656 9411 13922 17800 18897 23695 25311 29891 30342
 31067 31124 31139 31467 32019 32240
    0 1082 2189 4147 8496 8986 10062 11294 16960 20197 23516 23989 24429 25718 29296 30293
 31195 31351 31665 31820 32073 32355 32376
 1661 4207 5859 14432 17329 18592 20431 20758 23186 23573 29558 29974 30107 30295 30396
 30635 30935 31185 31534 31650 31685 31960 32007
   89 4834 5934 6765 7256 7928 9025 12135 14585 23859 25231 25332 26519 26921 30891 31001
 31496 31625 31700 31730 31852 32022 32224
 5460 6506 6639 10691 16488 20520 21627 22863 25303 26209 26647 27502 27898 28112 28982
 29023 29188 31060 31193 31673 31911 32200 32343
 4652 9366 12753 13047 16124 19840 19846 19928 22041 26095 27473 28784 29506 29827 29958
 30347 31018 31027 31904 32274 32300 32383 32387
 2265 3996 4208 6150 7258 9151 9983 12269 12788 12986 15469 17063 26727 26859 28941 30162
 30172 30616 30714 31315 31357 31818 32284
 6518 11111 24325 32103
   72 12699 23236 30992
 8360 19792 19940 32358
 14197 21794 25358 27036
 4398 6859 18988 32137
  841 22129 27876 31949
 6974 7937 17758 27732
 7040 9749 9755 32242
 2949 17069 29881 30587
 1373 9669 30875 32281
 11884 12078 27981 32205
 7736 24771 25380 32163
   74 3602 19540 25410
 16273 30193 32344 32355
 1315 13197 20672 25600
   13 9947 14814 27294
 21919 29940 31822 32276
   11 3234 17261 27366
 18543 21226 24436 32375
 18492 19557 22383 30490
   24 17620 23927 32049
 14847 22301 22903 29032
```

```
─N=64800, rate=16/30──────────────────────────────────
   3111  4871  6505  6799  7635 11197 14052 14348 14826 15557 15659 18613 21220 22340 22401
 27614 28374 29255 29841
   3361  4302  5676  9039 12309 14206 14677 15432 18320 20678 22348 23548 24612 27694 28211
 28562 29155 29406 29548
      5    53  3037  4529  5584  5648 17104 18025 18489 20393 24434 24500 24814 25552 25565 26415
 27851 29090 29780
   5161  5493  5523 10121 12283 13234 14979 17374 18240 20035 24222 25047 26289 26734 28216
 28403 28465 28810 29385
     43   186  1836  4590 11586 12799 13507 13724 14711 15317 21647 23476 24193 24699 25994 28699
 29940 30122 30203
   2003  3800  5130  6577  9365 10145 11356 15819 15932 16104 18223 19103 20631 22002 23366
 26895 28896 28976 30165
     23  9657 11412 13196 15347 15358 16644 17463 18784 19185 26582 28301 28342 28525 28922
 29224 29957 30116 30120
   2206  3177  4177  6441  7458 11162 15727 16894 19718 20753 20946 22516 22660 26757 26827
 26850 28909 29822 30046
    739  3969  4582 14549 15188 15831 21294 22417 22460 23015 25237 25515 26568 26656 27187
 27924 28526 29071 29734
   4208  4241  4427  6512 14103 18082 22518 23522 24048 24879 27014 28704 28753 29196 29438
 29571 29695 29829 30174
     13    32  3455  8111 10978 13661 13856 18718 19398 20224 22663 23517 26241 27440 28748 28817
 28979 29377 30187
   1463  3641  4046  6345  6676 10287 12165 13506 15052 15192 20449 23322 23426 24120 25788
 26284 27049 28460 30124
   1569  3052  3370  5187  6418 12733 15343 15725 16555 19231 25563 26273 27866 28411 28938
 29006 29339 29387 29566
     77  4306  7810 12815 18400 19686 19803 20446 20940 21189 22144 23248 24200 25226 28695
 28801 29268 30118 30206
     45   649  1691  4421  8406  9642 10567 11550 12441 15117 17109 18327 19727 24980 26328 27075
 27235 28892 30221
  12483 13895 20152 20245 20655 21468 22162 22961 24057 24365 24605 25411 26180 26761
 27446 29507 30100 30181 30216
     44  1264  3026  7950  8626 14270 17615 17922 18819 23010 23725 25137 25284 25409 27704 28128
 28675 29774 30092
     55  2812  7572  7825  8647 19309 20122 20243 20787 22530 22612 24719 24955 25546 26352 26396
 26477 29301 29918
   6419 11660 28980 30169
     62  7613 22157 25645
   3958  5559 27517 28608
   2395  6628 21235 27555
    750 14167 14443 29001
  14265 15570 28940 29039
     77   600  7982 16623
  19331 26506 29810 30208
   1269  1541 23861 27282
     19 12841 24031 27927
   1666 14901 16818 28517
   3189 11786 18478 23399
   6495 10934 16584 25011
      8 28009 28559 30049
     58  1288 17394 18565
```

FIG. 65

```
N=64800, rate=17/30
  3638 3722 7015 10458 11119 12197 14103 14536 17412 18774 22287 22612 22713 25635 27548
27686 27778 27826
  5324 7803 10924 11606 12282 12502 12860 16739 22141 23364 23709 23875 25369 26285 26862
26922 26948 27844
  118 2886 6188 8567 8753 10752 11895 11939 12361 12739 14031 15749 16127 16638 18517 22030
23682 27925
  158 489 824 1854 2935 4257 6997 11791 15452 15664 16719 19672 24085 25188 25240 25283
25636 27011
  2918 5981 6349 7833 12983 14033 14242 14344 17083 17405 19655 21959 22550 23777 27153
27827 27848 27921
  3265 5089 6050 6323 10714 18435 20910 21582 24038 24361 24712 25131 25484 26901 27073
27174 27309 27693
  17 26 32 3083 10749 11918 11982 12657 13842 14454 18559 20569 23993 27282 27712 27732
27772 27820
  3991 4273 5550 8223 9048 10163 12392 15961 19676 20564 20586 21360 24139 26555 27189
27334 27708 27844
  1611 3553 6046 9278 10150 13220 13670 14436 17764 19828 20986 21353 21723 25542 25691
26339 27591 27823
  6173 6835 7028 7803 8388 8626 11307 15884 17784 18339 19512 24249 26438 27137 27255 27594
27770 28072
  67 486 3205 5487 10201 11054 14546 20328 23045 23272 23673 25248 25527 25802 26578 27235
27872 27971
  23 3605 3873 13976 16258 18335 18529 20465 22508 24880 24946 25672 26326 26479 26514
27758 28026 28047
  2183 7317 10716 11014 11637 20111 21269 22729 23581 25870 25891 27176 27185 27709 27747
27912 28003 28024
  12 31 53 68 1492 9988 15395 19124 20807 23692 25299 25979 26394 27022 27026 27092 27576
28041
  18 52 4442 12761 15481 17938 20266 24312 24821 25137 25916 26131 26642 26851 27065 27311
27697 27987
  49 4516 5076 12930 15048 20703 21360 22615 25025 25577 25997 26353 26659 26701 27206
27655 28030 28037
  36 1654 2703 8738 13150 15338 18464 20505 21404 25826 25911 27400 27433 27513 27891 28011
28015 28043
  40 54 6027 11231 14164 15995 17839 19890 22537 25509 26043 26700 27141 27166 27182 27660
27893 27990
  2840 11826 14170 15701 15758 17947 19094 23029 26232 26528 26556 26849 27015 27456 27761
27881 27987 28036
  30 680 1541 5734 8251 19767 20127 21120 22480 25861 25867 26517 26755 26821 27220 27547
27793 27875
  1630 5956 7702 9606 10458 10541 17763 19609 21908 23593 24189 24356 24896 25180 26091
27038 27081 27422
  2459 2748 22536 23254
  597 7455 22226 26562
  12250 13286 13325 25013
  8523 13590 27754
  39 19867 24723
  19403 21896 22752
  8491 20514 23236
  4300 25422 27311
  11586 19002 28004
```

```
N=64800, rate=18/30
   113  1557  3316  5680  6241 10407 13404 13947 14040 14353 15522 15698 16079 17363 19374 19543
 20530 22833 24339
   271  1361  6236  7006  7307  7333 12768 15441 15568 17923 18341 20321 21502 22023 23938 25351
 25590 25876 25910
    73   605   872  4008  6279  7653 10346 10799 12482 12935 13604 15909 16526 19782 20506 22804
 23629 24859 25600
  1445  1690  4304  4851  8919  9176  9252 13783 16076 16675 17274 18806 18882 20819 21958 22451
 23869 23999 24177
  1290  2337  5661  6371  8996 10102 10941 11360 12242 14918 16808 20571 23374 24046 25045
 25060 25662 25783 25913
    28    42  1926  3421  3503  8558  9453 10168 15820 17473 19571 19685 22790 23336 23367 23890
 24061 25657 25680
     0  1709  4041  4932  5968  7123  8430  9564 10596 11026 14761 19484 20762 20858 23803 24016
 24795 25853 25863
    29  1625  6500  6609 16831 18517 18568 18738 19387 20159 20544 21603 21941 24137 24269
 24416 24803 25154 25395
    55    66   871  3700 11426 13221 15001 16367 17601 18380 22796 23488 23938 25476 25635 25678
 25807 25857 25872
     1    19  5958  8548  8860 11489 16845 18450 18469 19496 20190 23173 25262 25566 25668 25679
 25858 25888 25915
  7520  7690  8855  9183 14654 16695 17121 17854 18083 18428 19633 20470 20736 21720 22335
 23273 25083 25293 25403
    48    58   410  1299  3786 10668 18523 18963 20864 22106 22308 23033 23107 23128 23990 24286
 24409 24595 25802
    12    51  3894  6539  8276 10885 11644 12777 13427 14039 15954 17078 19053 20537 22863 24521
 25087 25463 25838
  3509  8748  9581 11509 15884 16230 17583 19264 20900 21001 21310 22547 22756 22959 24768
 24814 25594 25626 25880
    21    29    69  1448  2386  4601  6626  6667 10242 13141 13852 14137 18640 19951 22449 23454 24431
 25512 25814
    18    53  7890  9934 10063 16728 19040 19809 20825 21522 21800 23582 24556 25031 25547 25562
 25733 25789 25906
  4096  4582  5766  5894  6517 10027 12182 13247 15207 17041 18958 20133 20503 22228 24332
 24613 25689 25855 25883
     0    25   819  5539  7076  7536  7695  9532 13668 15051 17683 19665 20253 21996 24136 24890 25758
 25784 25807
    34    40    44  4215  6076  7427  7965  8777 11017 15593 19542 22202 22973 23397 23423 24418 24873
 25107 25644
  1595  6216 22850 25439
  1562 15172 19517 22362
  7508 12879 24324 24496
  6298 15819 16757 18721
 11173 15175 19966 21195
    59 13505 16941 23793
  2267  4830 12023 20587
  8827  9278 13072 16664
 14419 17463 23398 25348
  6112 16534 20423 22698
   493  8914 21103 24799
  6896 12761 13206 25873
     2  1380 12322 21701
 11600 21306 25753 25790
```

```
N=64800, rate=19/30
  354  794 1214 1640 8278 9195 11069 11580 11911 13276 13438 14495 14734 15741 19195 19537 21951
 4657 5351 5887 6634 7718 8327 10300 10815 11822 13506 16746 19429 19920 21548 22087 23650 23712
 4603 5160 6345 7259 8428 8937 9665 11623 11864 13590 13613 17117 18678 19118 21126 21884 23054
   27 2157 3039 3219 4191 5651 7098 12555 12634 13791 14885 15505 16163 16664 19792 20437 23588
   30   49 2768 3314 4345 6972 8994 15294 16653 18282 18808 19324 20597 21510 21643 23741 23748
    1  553 2228 4277 4499 5818 10580 10823 12135 14102 14923 15980 15995 16319 18577 22838 23058
    4 2307 2764 3075 4755 8064 9673 12150 21139 21224 21572 21682 23415 23598 23703 23710 23739
    4    9   13 5867 6028 7730 10859 14755 14879 15746 21166 21643 22777 23409 23502 23511 23734
   13   28  481 7146 8144 13768 15081 19349 20187 20858 21913 22025 23134 23472 23506 23711 23744
   12   24   36 1004 3080 3496 7356 7834 16011 16492 19536 20918 22833 22937 23717 23745 23749
   31  378  812 1578 1957 5163 14759 16701 16829 18111 22931 23253 23314 23351 23584 23660 23699
   25   38 1183 6573 9556 12523 14303 14412 18209 18530 21334 21770 21809 22630 22734 23154 23186
   57 3497 6667 9653 10168 12771 15082 19365 19415 19514 19611 19785 21242 22974 23107 23690 23715
 2456 2562 6223 7150 12652 14580 14807 20072 20513 21091 21201 21922 23010 23046 23215 23514 23663
    5  635 3760 4981 6824 8425 13532 14618 19654 20026 21439 21684 22023 23027 23499 23691 23707
    8 3018 4509 9002 11537 17156 17490 17779 20182 22018 22416 23348 23497 23575 23685 23708 23753
    3   19   60 9502 12512 12907 17118 20225 20508 21429 21695 22010 22187 22347 23574 23608 23617
    2    5   22   61 6583 15302 17930 18081 18562 19427 21204 21744 22713 23422 23503 23597 23730
   15 4333 9774 11921 15075 20998 21581 21622 22468 22638 23104 23530 23593 23613 23645 23648 23719
   16   48   65 2563 3079 12594 17391 17524 20302 21062 21809 22772 23189 23501 23625 23628 23756
   59 4288 6124 13237 13580 13607 19899 20348 21481 22380 22510 22883 23114 23233 23709 23715 23735
   46 2949 3278 6100 9887 10255 19509 19883 20022 21147 21422 21915 22489 22777 23422 23750 23754
  761 8196 8895 23472
10842 15470 23658 23748
   13 16585 19888 21445
13341 17522 18603 20826
 2932 8194 19093 21220
 6202 9623 23715
 2288 21290 22116
 5143 10529 19731
15559 16069 23704
  137 11927 20849
```

```
┌ N=64800, rate=20/30
  692 1779 1973 2726 5151 6088 7921 9618 11804 13043 15975 16214 16889 16980 18585 18648
  13 4090 4319 5288 8102 10110 10481 10527 10953 11185 12069 13177 14217 15963 17661 20959
  2330 2516 2902 4087 6338 8015 8638 9436 10294 10843 11802 12304 12371 14095 18486 18996
  125 586 5137 5701 6432 6500 8131 8327 10488 11032 11334 11449 12504 16000 20753 21317
  30 480 2681 3635 3898 4058 12803 14734 20252 20306 20680 21329 21333 21466 21562 21568
  20 44 738 4965 5516 7659 8464 8759 12216 14630 18241 18711 19093 20217 21316 21490
  31 43 3554 5289 5667 8687 14885 16579 17883 18384 18486 19142 20785 20932 21131 21308
  7054 9276 10435 12324 12354 13849 14285 16482 19212 19217 19221 20499 20831 20925 21195
21247
  9 13 4099 10353 10747 14884 15492 17650 19291 19394 20356 20658 21068 21117 21183 21586
  28 2250 2980 8988 10282 12503 13301 18351 20546 20622 21006 21293 21344 21472 21530
21542
  17 32 2521 4374 5098 7525 13035 14437 15283 18635 19136 20240 21147 21179 21300 21349
  57 4735 5657 7649 8807 12375 16092 16178 16379 17545 19461 19489 20321 20530 21453 21457
  35 55 5333 14423 14670 15438 19468 19667 20823 21084 21241 21344 21447 21520 21554 21586
  13 20 2025 11854 12516 14938 15929 18081 19730 19929 20408 21338 21391 21425 21468 21546
  54 7451 8176 10136 15240 16442 16482 19431 19483 19762 20647 20839 20966 21512 21579
21592
  26 465 3604 4233 9831 11741 13692 18953 18974 21021 21039 21133 21282 21488 21532 21558
  1 7 16 59 6979 7675 7717 9791 12370 13050 18534 18729 19846 19864 20127 20165
  15 31 11089 12360 13640 14237 17937 18043 18410 19443 21107 21444 21449 21528 21576 21584
  32 51 9768 17848 18095 19326 19594 19618 19765 20440 20482 20582 21236 21338 21563 21587
  44 55 4864 10253 11306 12117 13076 13901 15610 17057 18205 19794 20939 21132 21267 21573
  3436 11304 15361 16511 16860 18238 18639 19341 20106 20123 20407 21200 21280 21452 21526
21569
  679 8822 11045 14403 16588 17838 19117 19453 20265 20558 21374 21396 21428 21442 21529
21590
  391 13002 13140 14314 17169 17175 17846 18122 19447 20075 20212 20436 20583 21330 21359
21403
  7601 10257 20060 21285
  4419 9150 18097 20315
  4675 13376 21435
  610 1238 16704
  5732 7096 21104
  5690 13531 14545
  4334 14839 17357
  8 2814 17674
  2392 8128 18369
  502 7403 15133
  343 13624 20673
  13188 15687 21593
  321 16866 21347
  1242 4261 17449
  4691 8086 8691
  8500 11538 20278
  6269 12905 18192
  5984 15452 17111
  11541 18717 21534
  16 10780 16107
  12310 12959 20390
  1365 18306 19634
```

```
N=64800, rate=21/30
 549 611 1357 3717 5079 5412 5964 10310 13716 16028 16067 16726 16856 18095 18515
 25 163 1310 4468 5938 8348 9208 11118 13355 13539 14004 14869 16512 17878 19194
 9 3271 4816 5091 5642 6704 8049 8431 8513 9264 10118 10905 17317 19047 19204
 1775 2009 2741 3978 5427 6376 8143 9682 12173 13086 13232 14386 15220 17433 19332
 18 519 4261 4265 6356 6409 11253 12973 14592 16637 17039 18474 19112 19202 19214
 874 2918 3977 8791 9100 10391 10623 11738 16545 16968 17928 19049 19251 19295 19384
 15 2832 4906 5010 7208 7315 8266 12524 14718 14789 16532 16637 17333 19314 19361
 1 44 169 967 3980 7358 8489 9672 11731 12519 19027 19030 19156 19348 19434
 32 112 2611 5885 6907 9231 9890 10047 10456 17955 17959 19236 19361 19395 19419
 5 13 38 51 1307 6348 7275 10351 11869 13074 17179 17889 18802 18957 18963
 45 1114 1822 13768 13968 16002 17945 18577 18944 19097 19142 19191 19211 19280 19410
 16 25 31 6527 7318 10336 11522 11826 12038 17843 19218 19270 19346 19365 19428
 44 3166 11719 13946 14592 16659 17881 18127 18335 18401 18672 19025 19093 19218 19233
 3890 4804 10421 11575 15260 15641 15738 15835 16462 17085 17902 18650 19131 19328 19336
 40 4635 6324 12215 13030 14029 15387 16287 18128 18893 18939 19138 19409 19416 19422
 26 10421 10487 11386 12158 13231 16951 17521 18100 18309 18468 18689 18745 18862 19350
 33 1635 8499 10728 12209 15641 16482 17298 18157 18247 18498 18885 19018 19304 19340
 155 7584 9130 9253 10095 14414 15396 16572 16660 18942 19031 19287 19319 19334 19418
 0 452 4180 6281 7401 13527 13855 14524 16190 18133 18346 18428 18983 19370 19377
 43 5974 9711 10621 11296 13782 16955 17413 17514 17949 18441 18465 18800 19368 19380
 20 2462 6141 6157 7855 13754 17444 17900 18517 19099 19217 19392 19416 19419 19436
 44 3197 6827 8627 12967 13503 14327 15070 16306 17079 18212 18283 19000 19021 19318
 0 9 24 784 875 2519 3900 5797 13090 13395 18070 18095 18767 19024 19212
 27 1943 4688 5617 7512 7773 10220 13453 15976 15984 17284 17785 18950 19187 19422
 2095 17203 18559
 29 10616 15594
 14366 14924 15179
 5487 7882 14228
 1228 19301 19420
 2144 9744 10245
 47 12037 16969
 4990 8811 19259
 13271 13624 18766
 11793 15199 18405
 13618 15135 16272
 9174 15906 19070
 10882 15172 19435
 2925 5216 18611
 8983 16271 19303
 5729 11533 19203
 3507 5159 11003
 11001 13292 17253
 101 1300 14833
 8847 16410 19344
 38 3941 11470
 10236 12322 19338
 1260 12919 18542
 14 1600 18816
 7291 10840 19376
 13341 17748 18862
 2024 16189 16472
```

```
─ N=64800, rate=22/30 ─
 696 989 1238 3091 3116 3738 4269 6406 7033 8048 9157 10254 12033 16456 16912
 444 1488 6541 8626 10735 12447 13111 13706 14135 15195 15947 16453 16916 17137 17268
 401 460 992 1145 1576 1678 2238 2320 4280 6770 10027 12486 15363 16714 17157
 1161 3108 3727 4508 5092 5348 5582 7727 11793 12515 12917 13362 14247 16717 17205
 542 1190 6883 7911 8349 8835 10489 11631 14195 15009 15454 15482 16632 17040 17063
 17 487 776 880 5077 6172 9771 11446 12798 16016 16109 16171 17087 17132 17226
 1337 3275 3462 4229 9246 10180 10845 10866 12250 13633 14482 16024 16812 17186 17241
 15 980 2305 3674 5971 8224 11499 11752 11770 12897 14082 14836 15311 16391 17209
 0 3926 5869 8696 9351 9391 11371 14052 14172 14636 14974 16619 16961 17033 17237
 3033 5317 6501 8579 10698 12168 12966 14019 15392 15806 15991 16493 16690 17062 17090
 981 1205 4400 6410 11003 13319 13405 14695 15846 16297 16492 16563 16616 16862 16953
 1725 4276 8869 9588 14062 14486 15474 15548 16300 16432 17042 17050 17060 17175 17273
 1807 5921 9960 10011 14305 14490 14872 15852 16054 16061 16306 16799 16833 17136 17262
 2826 4752 6017 6540 7016 8201 14245 14419 14716 15983 16569 16652 17171 17179 17247
 1662 2516 3345 5229 8086 9686 11456 12210 14595 15808 16011 16421 16825 17112 17195
 2890 4821 5987 7226 8823 9869 12468 14694 15352 15805 16075 16462 17102 17251 17263
 3751 3890 4382 5720 10281 10411 11350 12721 13121 14127 14980 15202 15335 16735 17123
 26 30 2805 5457 6630 7188 7477 7556 11065 16608 16859 16909 16943 17030 17103
 40 4524 5043 5566 9645 10204 10282 11696 13080 14837 15607 16274 17034 17225 17266
 904 3157 6284 7151 7984 11712 12887 13767 15547 16099 16753 16829 17044 17250 17259
 7 311 4876 8334 9249 11267 14072 14559 15003 15235 15686 16331 17177 17238 17253
 4410 8066 8596 9631 10369 11249 12610 15769 16791 16960 17018 17037 17062 17165 17204
 24 8261 9691 10138 11607 12782 12786 13424 13933 15262 15795 16476 17084 17193 17220
 88 11622 14705 15890
 304 2026 2638 6018
 1163 4268 11620 17232
 9701 11785 14463 17260
 4118 10952 12224 17006
 3647 10823 11521 12060
 1717 3753 9199 11642
 2187 14280 17220
 14787 16903 17061
 381 3534 4294
 3149 6947 8323
 12562 16724 16881
 7289 9997 15306
 5615 13152 17260
 5666 16926 17027
 4190 7798 16831
 4778 10629 17180
 10001 13884 15453
 6 2237 8203
 7831 15144 15160
 9186 17204 17243
 9435 17168 17237
 42 5701 17159
 7812 14259 15715
 39 4513 6658
 38 9368 11273
 1119 4785 17182
 5620 16521 16729
```

```
N=64800, rate=23/30
  310 1729 3466 4343 5079 5360 6486 7268 8660 8684 9687 10496 12682 13283 14142
   10   35 3137 4489 4906 5614 6655 9072 10341 10512 11699 12547 12992 15098 15103
   20   28 1671 4321 8051 8676 9003 10395 11047 11259 12221 13005 14041 14459 15078
   82  329 2415 3798 8856 11071 11483 12210 12283 13592 14111 14118 14890 15043 15080
   38 3425 4256 5892 6586 9088 10029 10168 10845 13170 13742 14143 14505 14648 14949
   24 1462 5755 9371 9921 10303 11838 13574 13755 13982 14821 14848 14916 15082 15088
   27 4818 7432 7508 8148 9725 10575 13009 13205 13469 14264 14707 14967 15029 15092
 4118 6906 8252 10421 11578 12851 13114 13662 13815 14535 14795 14971 15007 15019 15094
   34 5330 7799 9336 10563 11473 11624 13103 13490 13664 14286 14782 15013 15075 15089
   30 1833 4359 7535 10347 10691 12403 13357 14063 14358 14554 14563 14611 14886 14894
    2   11 2662 3363 5469 5674 8489 9870 11571 12625 14094 14602 14962 14972 15016
 2666 3305 4681 8359 9701 9970 10838 11432 12869 13053 13873 14664 14703 14928 14998
 3164 5920 5949 9228 10188 11757 12119 12878 13410 13951 14398 14652 14910 14967 15103
 7840 9295 9875 11112 12316 12463 12771 13094 13197 13712 14085 14444 14707 14947 14987
 1110 1223 3530 6281 10867 13008 14412 14528 14628 14753 14901 14938 15063 15087 15112
   21  791 3863 5611 8101 10837 12988 13585 13731 14228 14435 14843 14910 15052 15082
   40 1358 6434 9368 9892 10005 11561 11996 12506 13093 13167 14607 14674 14844 15030
  803 1072 4593 6553 8291 8954 10035 11469 13719 14077 14173 14771 14812 14888 14992
    6 5334 7322 7499 9560 10116 11560 11795 11874 11994 13936 14284 14376 14671 14863
   41 5509 7768 9585 9698 10441 11621 12907 13092 13535 13832 14759 14887 14903 14972
 4836 6794 8298 8883 10019 11625 12322 12563 13084 14192 14431 14526 14611 14883 15044
   39 2210 7759 8572 8654 13258 13651 14070 14115 14279 14418 14566 14718 14811 15004
   19 3975 4451 5642 6685 7975 8633 9640 9811 10753 10890 11243 11269 12598 14952
 6363 6545 9439 9791 9818 13695 14229 14556 14711 14730 14744 14758 14844 14962 15032
 6068 6472 6852 7431
 3260 8709 11880 14644
 8072 10635 12785 14902
  936 12069 14934 14957
   31 3503 7561 14443
 4377 13028 14483 14513
  397 6963 12232
 8743 10726 14721
 2800 3819 12560
11057 13202 15084
 2256 4829 13796
 2759 3104 14683
  139 10014 12174
 3531 9304 14860
 3890 5170 13556
10401 13606 14910
 4070 4564 7583
13749 14399 15019
 2025 13882 15031
10616 11730 14148
 2890 6342 12520
 2071 6431 14496
 8209 9125 13522
 6008 7161 12442
14655 14792 15037
 9054 14297 15119
 5028 6219 12074
```

```
N=64800, rate=24/30
  1504 2103 2621 2840 3869 4594 5246 6314 7327 7364 10425 11934 12898 12954
  27 1903 3923 4513 7812 8098 8428 9789 10519 11345 12032 12157 12573 12930
  17 191 660 2451 2475 2976 3398 3616 5769 6724 8641 10046 11552 12842
  13 1366 4993 6468 7689 8563 9131 10012 10914 11574 11837 12203 12715 12946
  432 872 2603 3286 3306 3385 4137 5563 7540 9339 9948 12315 12656 12929
  1113 1394 4104 4186 7240 8827 11522 11833 12359 12363 12629 12821 12904 12946
  14 441 1432 1677 2432 8981 11478 11507 12599 12783 12793 12912 12922 12943
  1579 1806 7971 8586 9845 10357 11600 12007 12020 12339 12576 12817 12830 12904
  20 546 3672 5538 6944 8052 8781 9743 12269 12393 12418 12549 12555 12718
  1 3540 4397 5011 6626 8617 9587 10360 10602 11402 11983 12068 12495 12838
  30 1572 4908 7421 8041 8910 8963 11005 11930 12240 12340 12467 12892 12933
  33 2060 3907 4215 5545 8306 8655 8743 8806 9315 9364 10685 11954 12959
  1338 2596 4876 5207 9555 10421 10929 11648 11739 12375 12416 12643 12742 12754
  9469 10544 10932 11250 11426 11582 11846 12139 12202 12210 12356 12378 12873 12929
  2681 3337 3616 6113 7078 8167 8624 9697 10908 11781 11855 12095 12475 12659
  28 4086 5432 6555 6848 7368 8794 11483 11572 12414 12816 12894 12936 12957
  5 5044 5572 9023 9192 9589 9979 10009 10855 10991 11715 12314 12610 12945
  17 272 602 5681 6530 9572 9886 11061 11495 12238 12265 12483 12885 12955
  22 2245 4282 4469 5007 6650 6733 10151 10401 11571 12004 12261 12805 12844
  23 3270 4468 8621 9662 11240 11934 12091 12444 12691 12717 12858 12888 12917
  740 1519 4923 6191 7878 8350 9293 10779 11020 11287 11630 12792 12862 12920
  12 28 3584 6072 7079 8075 10477 11130 11383 11780 12341 12667 12818 12927
  14 118 5283 5382 8301 9097 9413 9664 10437 10701 11124 12685 12730 12734
  32 1426 3078 4325 5353 7780 9042 9928 10077 10377 10679 11191 11750 12611
  1 669 3831 3980 5381 5412 6552 8453 9435 10243 11546 11821 11987 12807
  232 483 919 1232 2156 2396 2990 3774 8539 8704 8819 10810 11868 12634
  2381 7309 9334
  348 6494 12623
  4872 6257 11090
  7 11970 11985
  6615 12788 12855
  1173 5269 12647
  1944 7738 8116
  17 4828 9175
  2329 6034 12642
  1254 2366 5013
  2984 5078 5664
  7423 10265 11528
  1656 8526 8716
  22 287 2837
  18 100 3079
  299 3171 12169
  33 5920 11144
  1286 3650 9309
  2283 8809 12588
  3199 8242 9081
  2507 6846 8113
  5211 8722 12689
  1064 2592 8659
  6136 6925 12958
  1256 12789 12932
```

```
─N=64800, rate=25/30
  1860 2354 3967 4292 4488 5243 5373 5766 8378 9111 10468 10505 10774
  24 2266 2380 3282 4255 4779 8729 9140 9566 10102 10661 10711 10797
  605 650 1108 1669 2251 3133 5847 6197 6902 7545 10521 10600 10773
  1016 1428 1612 2335 3102 3810 4926 5953 9964 10246 10569 10734 10784
  3195 6308 8029 9030 9397 9461 9833 10239 10499 10675 10736 10757 10773
  2 27 3641 4566 7332 9318 9323 9916 10365 10438 10561 10581 10750
  2405 2458 4820 6232 6254 6347 7139 7474 8623 8779 8798 10747 10794
  3164 4736 6474 7162 7420 7517 7835 8238 8412 8489 9006 10113 10440
  20 2372 5561 5649 6907 8393 8505 9181 9567 9595 10388 10483 10714
  1071 2899 5135 5780 6616 7111 7773 8582 9015 9912 10139 10387 10768
  292 2833 5490 6011 6136 6713 7517 9096 10128 10328 10407 10525 10736
  1044 3711 4421 5140 5207 8118 8749 8884 9205 10359 10372 10746 10784
  3241 5696 6440 7240 7419 8613 8878 9593 9959 9997 10401 10404 10754
  3133 4647 5912 6065 6694 7208 7346 8227 9465 9739 10452 10516 10770
  2254 6444 7449 8095 8120 8710 9030 9162 9643 9968 10101 10571 10678
  918 1445 2217 4262 4623 5401 5749 7446 7907 9539 10125 10514 10726
  6 1341 1788 3105 4359 5263 5470 7552 8249 8644 10609 10674 10733
  1994 3000 3151 3173 7742 8335 8438 8741 9232 9296 9817 10023 10257
  467 1674 3016 3950 4055 5399 6688 7113 7273 8658 8702 9642 10545
  2007 2541 3125 7380 7550 8122 8501 8665 9882 10403 10519 10594 10696
  334 587 709 1540 2023 2876 6216 8768 9328 9481 10424 10507 10779
  2165 4185 4306 5019 6961 7386 8447 9082 9837 10091 10461 10559 10570
  7 903 2948 6312 6654 7738 7980 8312 9104 9743 10070 10278 10406
  3047 3154 4160 4378 5461 8711 8809 9040 9173 9252 9537 9995 10735
  2018 2355 3828 3854 6201 6696 8313 8459 8550 8833 9586 10202 10224
  1402 1908 4286 4660 6029 6115 6737 7538 9495 9517 10055 10509 10644
  3442 3589 3868 5051 5322 5580 8725 9046 9170 10041 10613 10681 10689
  2733 7826 10622
  3597 4753 7086
  1394 7297 10264
  2848 7502 10304
  1649 2405 10783
  647 2911 9069
  2572 4006 7508
  1361 8887 10103
  3681 4023 9090
  1496 4962 6325
  2016 5120 9747
  3954 5260 8568
  3364 8719 10035
  4208 4806 9973
  29 3361 3490
  1835 2317 10436
  7312 8177 9041
  7728 8097 10761
  2109 7902 9685
  5424 8943 9436
  4369 7643 9152
  2240 10140 10528
  3435 6124 10604
  8962 9357 10040
```

```
N=64800, rate=26/30
  142 2307 2598 2650 4028 4434 5781 5881 6016 6323 6681 6698 8125
 2932 4928 5248 5256 5983 6773 6828 7789 8426 8494 8534 8539 8583
  899 3295 3833 5399 6820 7400 7753 7890 8109 8451 8529 8564 8602
   21 3060 4720 5429 5636 5927 6966 8110 8170 8247 8355 8365 8616
   20 1745 2838 3799 4380 4418 4646 5059 7343 8161 8302 8456 8631
    9 6274 6725 6792 7195 7333 8027 8186 8209 8273 8442 8548 8632
  494 1365 2405 3799 5188 5291 7644 7926 8139 8458 8504 8594 8625
  192  574 1179 4387 4695 5089 5831 7673 7789 8298 8301 8612 8632
   11   20 1406 6111 6176 6256 6708 6834 7828 8232 8457 8495 8602
    6 2654 3554 4483 4966 5866 6795 8069 8249 8301 8497 8509 8623
   21 1144 2355 3124 6773 6805 6887 7742 7994 8358 8374 8580 8611
  335 4473 4883 5528 6096 7543 7586 7921 8197 8319 8394 8489 8636
 2919 4331 4419 4735 6366 6393 6844 7193 8165 8205 8544 8586 8617
   12   19  742  930 3009 4330 6213 6224 7292 7430 7792 7922 8137
  710 1439 1588 2434 3516 5239 6248 6827 8230 8448 8515 8581 8619
  200 1075 1868 5581 7349 7642 7698 8037 8201 8210 8320 8391 8526
    3 2501 4252 5256 5292 5567 6136 6321 6430 6486 7571 8521 8636
 3062 4599 5885 6529 6616 7314 7319 7567 8024 8153 8302 8372 8598
  105  381 1574 4351 5452 5603 5943 7467 7788 7933 8362 8513 8587
  787 1857 3386 3659 6550 7131 7965 8015 8040 8312 8484 8525 8537
   15 1118 4226 5197 5575 5761 6762 7038 8260 8338 8444 8512 8568
   36 5216 5368 5616 6029 6591 8038 8067 8299 8351 8565 8578 8585
    1   23 4300 4530 5426 5532 5817 6967 7124 7979 8022 8270 8437
  629 2133 4828 5475 5875 5890 7194 8042 8345 8385 8518 8598 8612
   11 1065 3782 4237 4993 7104 7863 7904 8104 8228 8321 8383 8565
 2131 2274 3168 3215 3220 5597 6347 7812 8238 8354 8527 8557 8614
 5600 6591 7491 7696
 1766 8281 8626
 1725 2280 5120
 1650 3445 7652
 4312 6911 8626
   15 1013 5892
 2263 2546 2979
 1545 5873 7406
   67  726 3697
 2860 6443 8542
   17  911 2820
 1561 4580 6052
   79 5269 7134
   22 2410 2424
 3501 5642 8627
  808 6950 8571
 4099 6389 7482
 4023 5000 7833
 5476 5765 7917
 1008 3194 7207
   20  495 5411
 1703 8388 8635
    6 4395 4921
  200 2053 8206
 1089 5126 5562
```

```
┌N=64800, rate=27/30─────
  658  706  898 1149 2577 2622 2772 3266 3329 5243 6079 6271
  289  784 1682 3584 3995 4821 4856 5063 5974 6168 6437 6453
  658 1426 2043 2065 2986 4118 4284 5394 5444 5477 5727 6018
  641  928 1225 2841 4052 4840 4992 5268 5533 6249 6461 6475
 2312 2917 3713 3849 4059 4241 4610 5440 5727 6101 6397 6444
 1165 1592 1891 2154 3981 4817 5181 5748 5788 6012 6266 6350
   13 2758 3069 4233 4697 5100 5279 5677 5919 5969 6280 6422
  818 1500 2125 2340 3774 4707 4901 5170 5744 6008 6316 6353
  857 3054 3409 3496 3704 4868 5326 6211 6292 6356 6367 6381
    0    7   12 1709 2166 3418 3723 4887 5770 6043 6069 6431
 2481 3379 4650 4900 4919 5060 5410 5425 6056 6173 6283 6386
   15  814  854 1871 2934 3387 3915 5180 5303 5442 5581 5665
  146 1882 3076 4458 4848 5252 5602 5778 5821 6213 6251 6401
    2  947 1419 1566 3437 3646 4615 4634 4735 5819 5943 6280
 1231 2309 2920 4158 4185 4298 4711 5082 5757 5762 6204 6209
  257  297  337 2783 3230 4134 4480 4749 5295 5689 5921 6202
 1436 2151 2629 3217 3930 4078 5386 5799 5906 6146 6226 6366
  133  530 2448 4745 5000 5020 5224 5273 6211 6266 6431 6453
   13 2644 3895 3898 4485 4722 5142 5462 5951 6031 6084 6351
    6 3000 3873 3995 4680 5158 5504 5692 5755 6255 6338 6359
  166  465 1658 2549 2941 4244 5071 5149 5452 5874 5939 6038
 2309 2937 4282 4628 5113 5454 5731 5825 6021 6171 6402 6472
    3 1077 2116 2426 2830 4853 5066 5571 5850 5916 6389 6421
  817 1608 2229 2925 3281 4393 5042 5058 5377 5464 5588 6448
 1848 3871 4381 4776 5366 5578 5648 6143 6389 6434 6465 6473
 1263 1616 3150 3497 3759 4078 5530 5665 5694 5913 6397 6420
   11  813 2185 2795 3349 4652 4678 5078 5504 6011 6286 6387
 3060 3161 4584 4996 5143 5542 5697 5937 6141 6155 6342 6445
 1638 2333 2632 3450 3505 3911 4399 4454 5499 5860 6044 6360
  650 1744 4517
 5772 6071 6471
 3582 3622 5776
 6153 6380 6446
 3977 5932 6447
 2071 4597 4891
   11 1428 3776
 1111 3874 5048
 1410 2144 4445
 4681 5481 6462
 4044 5037 5497
 2716 2891 6411
 3299 4384 6224
 1843 6087 6400
 4664 5009 5856
 1548 4383 5055
 3172 4190 6373
 5899 6443 6470
 2572 3647 6240
 1295 2158 6466
 5604 6269 6368
    3 5551 6454
```

```
─ N=64800, rate=28/30 ─
   85  314 1602 1728 1929 2295 2729 2924 3779 4054 4276
  918 1378 1838 1903 2399 2524 2937 3615 3740 4140 4213
 1361 1430 2639 2648 2910 3418 3511 3543 4177 4209 4248
  472 1143 1318 1545 1830 2228 2249 2256 3626 3839 3991
  226 1401 2154 2318 2851 3317 3468 3944 3983 4047 4093
  490 1145 1247 1851 2671 2776 3152 3229 3345 3758 3786
  522 1393 1473 2196 2707 3052 3398 3814 3827 4148 4301
  417 1982 2176 2336 2459 2806 3005 3771 3870 4080 4243
  112 1040 1596 1621 1685 2118 2571 3359 3945 4034 4171
  646 1705 2181 2439 2808 2851 2987 3044 3494 4049 4312
    6   11  115  245  663 1773 2624 3444 3601 3952 4246
   11  541 1020 1326 2259 2347 2750 2861 3328 3428 4126
  515  941 1233 1804 2295 2528 3265 3826 4002 4022 4224
   46  484  679 1949 2342 2929 3555 3860 3918 4068 4113
 1832 2023 2279 2376 2965 3278 3318 3549 3640 3843 3910
  241  943 1222 1583 1637 2745 3338 4080 4086 4203 4300
   11 1419 1841 2398 2920 3409 3703 3768 3878 4052 4254
  878 2049 2123 2431 2657 2704 3135 3342 3728 4141 4162
   16  837 1267 1410 2100 3026 3099 3107 4042 4129 4157
  133  646 1367 1394 2118 2311 2676 2956 3195 3536 3657
  698 1444 2129 2432 2494 2793 2947 3852 3985 4254 4319
   11 1076 1618 1995 2332 2743 2934 3009 3565 4169 4188
   14   20  808 2629 2681 3090 3491 3835 4017 4068 4083
  433 1386 2416 2570 2950 3611 3869 3969 4248 4251 4316
  384 1292 1534 2610 2617 3559 3638 3964 4131 4293 4313
  271  564 1719 2288 2597 2674 3429 3455 3793 4074 4286
  133  190  815  955 1485 2000 2860 3000 3734 4013 4287
  559  771 1762 2537 2764 2816 3186 3806 3933 4224 4271
   11  733 1198 1735 1856 2668 2754 3216 4070 4113 4311
    4  806 1832 2047 2058 2724 3387 3793 3833 4005 4319
  506 1456 2339 3069 3343 3442 3889 3939 4013 4212 4278
 2038 3980 4313
   64 2373 4080
  800 1535 4166
 1030 3759 4002
 1687 3269 4225
 1219 2632 3878
  719 2916 4277
 1261 1930 3459
  777 1568 1914
    4  397 3290
   10 3451 4115
 3629 3885 4155
 2652 3668 4026
  135 3172 4319
 1426 1970 3657
  199 1268 2064
  570  845 2761
   41 1067 3498
 1588 2482 2750
 1615 2013 2715
```

```
N=64800, rate=29/30
212 499 911 940 1392
316 563 1527 2006 2077
2 1906 2043 2112 2123
537 901 1582 1812 1955
5 978 1280 1933 2145
5 2035 2044 2108 2121
5 939 1874 1974
4 1069 1758
694 2096 2106
1129 1511 1659
1564 2089 2159
2 1605 2004
474 1341 2003
103 2128 2150
1656 1993 2153
1881 2122 2138
1088 1968 2141
1 298 2073
1042 1724 2137
1253 1758 2145
1209 1566 2123
1466 2116 2155
43 2006 2049
592 1806 1865
3 143 2149
1158 1448 2002
1422 2152 2157
485 2119 2150
371 1831 2086
204 2042 2151
174 544 974
1469 1795 1995
13 708 1683
5 1144 2030
486 1309 1576
165 2030 2147
504 2073 2126
263 565 1798
239 861 1861
862 1610 1716
1346 1971 2128
5 804 1399
2139 2144 2155
4 2136 2159
1485 2059 2158
50 1091 1332
373 1730 2092
59 1086 1401
1166 1781 2065
```

| Rate | PERFORMANCE THRESHOLD (Es/NO) | MINIMUM CYCLE LENGTH |
|---|---|---|
| 2/30 | -9.523519 | 14 |
| 3/30 | -7.758979 | 14 |
| 4/30 | -6.428797 | 6 |
| 5/30 | -5.490092 | 10 |
| 6/30 | -4.589849 | 10 |
| 7/30 | -3.760281 | 12 |
| 8/30 | -3.191565 | 8 |
| 9/30 | -2.550214 | 10 |
| 10/30 | -1.878597 | 8 |
| 11/30 | -1.378961 | 8 |
| 12/30 | -0.947792 | 6 |
| 13/30 | -0.494134 | 6 |
| 14/30 | -0.045119 | 8 |
| 15/30 | 0.428446 | 8 |
| 16/30 | 0.829080 | 8 |
| 17/30 | 1.248503 | 8 |
| 18/30 | 1.658523 | 8 |
| 19/30 | 2.078240 | 8 |
| 20/30 | 2.489205 | 6 |
| 21/30 | 2.918982 | 6 |
| 22/30 | 3.351930 | 6 |
| 23/30 | 3.788323 | 6 |
| 24/30 | 4.252169 | 6 |
| 25/30 | 4.761537 | 6 |
| 26/30 | 5.301749 | 6 |
| 27/30 | 5.921125 | 6 |
| 28/30 | 6.675945 | 6 |
| 29/30 | 7.881048 | 6 |

FIG. 111

| Rate | X | KX | Y1 | KY1 | Y2 | KY2 | M |
|---|---|---|---|---|---|---|---|
| 2/30 | 34 | 1440 | 4 | 2880 | 3 | 0 | 60480 |
| 3/30 | 20 | 2160 | 4 | 2160 | 3 | 2160 | 58320 |
| 4/30 | 35 | 2520 | 4 | 6120 | 3 | 0 | 56160 |
| 5/30 | 23 | 3600 | 4 | 3600 | 3 | 3600 | 54000 |
| 6/30 | 17 | 4680 | 4 | 1440 | 3 | 6840 | 51840 |
| 7/30 | 13 | 5760 | 4 | 0 | 3 | 9360 | 49680 |
| 8/30 | 19 | 5400 | 4 | 4680 | 3 | 7200 | 47520 |
| 9/30 | 15 | 6840 | 4 | 360 | 3 | 12240 | 45360 |
| 10/30 | 22 | 5760 | 4 | 0 | 3 | 15840 | 43200 |
| 11/30 | 34 | 3600 | 4 | 20160 | 3 | 0 | 41040 |
| 12/30 | 30 | 4320 | 4 | 12600 | 3 | 9000 | 38880 |
| 13/30 | 25 | 5400 | 4 | 6840 | 3 | 15840 | 36720 |
| 14/30 | 21 | 6840 | 4 | 0 | 3 | 23400 | 34560 |
| 15/30 | 23 | 5400 | 4 | 12240 | 3 | 14760 | 32400 |
| 16/30 | 19 | 6480 | 4 | 5400 | 3 | 22680 | 30240 |
| 17/30 | 18 | 7560 | 4 | 1080 | 3 | 28080 | 28080 |
| 18/30 | 19 | 6840 | 4 | 6840 | 3 | 25200 | 25920 |
| 19/30 | 17 | 7920 | 4 | 1800 | 3 | 31320 | 23760 |
| 20/30 | 16 | 8280 | 4 | 720 | 3 | 34200 | 21600 |
| 21/30 | 15 | 8640 | 4 | 0 | 3 | 36720 | 19440 |
| 22/30 | 15 | 8280 | 4 | 2520 | 3 | 36720 | 17280 |
| 23/30 | 15 | 8640 | 4 | 2160 | 3 | 38880 | 15120 |
| 24/30 | 14 | 9360 | 4 | 0 | 3 | 42480 | 12960 |
| 25/30 | 13 | 9720 | 4 | 0 | 3 | 44280 | 10800 |
| 26/30 | 13 | 9360 | 4 | 360 | 3 | 46440 | 8640 |
| 27/30 | 12 | 10440 | 4 | 0 | 3 | 47880 | 6480 |
| 28/30 | 11 | 11160 | 4 | 0 | 3 | 49320 | 4320 |
| 29/30 | 5 | 2160 | 4 | 360 | 3 | 60120 | 2160 |

| LDPD code | BCH Uncoded Block K$_{bch}$ | BCH coded block K$_{bch}$ LDPC Uncoded Block K$_{ldpc}$ | BCH t-error correction | LDPC Coded Block n$_{ldpc}$ |
|---|---|---|---|---|
| 1/4 | 16 008 | 16 200 | 12 | 64 800 |
| 1/3 | 21 408 | 21 600 | 12 | 64 800 |
| 2/5 | 25 728 | 25 920 | 12 | 64 800 |
| 1/2 | 32 208 | 32 400 | 12 | 64 800 |
| 3/5 | 38 688 | 38 880 | 12 | 64 800 |
| 2/3 | 43 040 | 43 200 | 10 | 64 800 |
| 3/4 | 48 408 | 48 600 | 12 | 64 800 |
| 4/5 | 51 648 | 51 840 | 12 | 64 800 |
| 5/6 | 53 840 | 54 000 | 10 | 64 800 |
| 8/9 | 57 472 | 57 600 | 8 | 64 800 |
| 9/10 | 58 192 | 58 320 | 8 | 64 800 |

B

| LDPC code rate | NUMBER OF BCH CODE INFORMATION BITS | NUMBER OF BCH CODE BITS (NUMBER OF LDPC CODE INFORMATION BITS) | NUMBER OF BCH CORRECTION BITS | NUMBER OF LDPC CODE BITS |
|---|---|---|---|---|
| 2/30 | 4128 | 4320 | 12 | 64800 |
| 3/30 | 6288 | 6480 | 12 | 64800 |
| 4/30 | 8448 | 8640 | 12 | 64800 |
| 5/30 | 10608 | 10800 | 12 | 64800 |
| 6/30 | 12768 | 12960 | 12 | 64800 |
| 7/30 | 14928 | 15120 | 12 | 64800 |
| 8/30 | 17088 | 17280 | 12 | 64800 |
| 9/30 | 19248 | 19440 | 12 | 64800 |
| 10/30 | 21408 | 21600 | 12 | 64800 |
| 11/30 | 23568 | 23760 | 12 | 64800 |
| 12/30 | 25728 | 25920 | 12 | 64800 |
| 13/30 | 27888 | 28080 | 12 | 64800 |
| 14/30 | 30048 | 30240 | 12 | 64800 |
| 15/30 | 32208 | 32400 | 12 | 64800 |
| 16/30 | 34368 | 34560 | 12 | 64800 |
| 17/30 | 36528 | 36720 | 12 | 64800 |
| 18/30 | 38688 | 38880 | 12 | 64800 |
| 19/30 | 40848 | 41040 | 12 | 64800 |
| 20/30 | 43040 | 43200 | 10 | 64800 |
| 21/30 | 45168 | 45360 | 12 | 64800 |
| 22/30 | 47328 | 47520 | 12 | 64800 |
| 23/30 | 49488 | 49680 | 12 | 64800 |
| 24/30 | 51648 | 51840 | 12 | 64800 |
| 25/30 | 53840 | 54000 | 10 | 64800 |
| 26/30 | 56032 | 56160 | 8 | 64800 |
| 27/30 | 58192 | 58320 | 8 | 64800 |
| 28/30 | 60352 | 60480 | 8 | 64800 |
| 29/30 | 62512 | 62640 | 8 | 64800 |

DATA PROCESSING APPARATUS AND DATA PROCESSING METHOD

CROSS-REFERENCE TO RELATED APPLICATIONS

This application is a continuation of U.S. application Ser. No. 14/386,830, filed on Sep. 22, 2014, now pending, which is a National Stage of PCT/JP2014/051624, filed on Jan. 27, 2014, which claims the benefit of priority from Japanese Patent No. 2013-023883, filed on Feb. 8, 2013, the entire contents of each of which are incorporated herein by reference.

TECHNICAL FIELD

The present technology relates to data processing apparatuses and data processing methods, and more specifically to data processing apparatuses and data processing methods which enable provision of, for example, LDPC codes that achieve good error-rate performance.

BACKGROUND ART

In recent years, LDPC (Low Density Parity Check) codes, which have a high error-correcting capability, have been widely employed in transmission schemes including satellite digital broadcasting technologies, such as DVB (Digital Video Broadcasting)—S.2, which is used in Europe (see, for example, NPL 1). LDPC codes are also employed in next-generation terrestrial digital broadcasting technologies, such as DVB-T.2.

Recent studies have found that, like turbo codes, LDPC codes have a performance closer to the Shannon limit for larger code lengths. In addition, because of their characteristic of having minimum distances proportional to code lengths, LDPC codes have the feature of high block error probability performance, and have a further advantage in showing substantially no error floor phenomena, which is observed in the decoding characteristics of turbo codes and the like.

LDPC codes will now be described in more detail. LDPC codes are linear codes, and may or may not be binary. The following description will be given in the context of binary LDPC codes.

An LDPC code has the most striking feature that it is defined by a sparse parity check matrix. Here, the term "sparse matrix" refers to a matrix having a very small number of elements of 1 (or a matrix whose elements are almost zeros).

FIG. 1 illustrates an example of a parity check matrix H of an LDPC code.

In the parity check matrix H illustrated in FIG. 1, the weight of each column (column weight) (i.e., the number of 1s) is 3 and the weight of each row (row weight) is 6.

In an encoding operation using an LDPC code (LDPC encoding), for example, a generator matrix G is generated on the basis of a parity check matrix H. By multiplying the generator matrix G by binary information bits, a code word (i.e., an LDPC code) is generated.

Specifically, an encoding device that performs LDPC encoding first calculates a generator matrix G, where the equation $GH^T=0$ is established between the transpose $H^T$ of the parity check matrix H and the generator matrix G. Here, if the generator matrix G is a K×N matrix, the encoding device multiplies the generator matrix G by a bit sequence (i.e., a vector u) of K information bits to generate a code word c (=uG) having N bits. The code word (or LDPC code) generated by the encoding device is received on the receiver side via a certain communication path.

An LDPC code can be decoded using the message passing algorithm, which is an algorithm called probabilistic decoding proposed by Gallager and which is based on belief propagation on a so-called Tanner graph with variable nodes (also referred to as "message nodes") and check nodes. Here, the variable nodes and the check nodes will also be hereinafter referred to simply as "nodes" as appropriate.

FIG. 2 illustrates an LDPC code decoding procedure.

Note that, in the following description, a real-number value representing the likelihood of the value "0" of the i-th bit of an LDPC code (i.e., a code word) received on the receiver side, which is expressed in log likelihood ratio (i.e., a reception LLR), is also referred to as a "reception value $u_{0i}$" as appropriate. Further, a message output from a check node is represented by $u_j$, and a message output from a variable node is represented by $v_i$.

In an LDPC code decoding process, first, as illustrated in FIG. 2, in step S11, an LDPC code is received, and a message (check node message) $u_j$ is initialized to "0". In addition, a variable k of a counter for repetitive processing, which takes an integer value, is initialized to "0". Then, the process proceeds to step S12. In step S12, a message (variable node message) $v_i$ is determined by performing computation given by Expression (1) (variable node computation) on the basis of a reception value $u_{0i}$ obtained through the reception of the LDPC code. A message $u_j$ is further determined by performing computation given by Expression (2) (check node computation) on the basis of the message $v_i$.

[Math. 1]
$$v_i = u_{0i} + \sum_{j=1}^{d_v-1} u_j \qquad (1)$$

[Math. 2]
$$\tanh\left(\frac{u_j}{2}\right) = \prod_{i=1}^{d_c-1} \tanh\left(\frac{v_i}{2}\right) \qquad (2)$$

Here, $d_v$ and $d_c$ in Expressions (1) and (2) are arbitrarily selectable parameters indicating the number of is in the vertical direction (columns) and the horizontal direction (rows) of the parity check matrix H, respectively. For example, for an LDPC code in a parity check matrix H with a column weight of 3 and a row weight of 6 (i.e., a (3,6) LDPC code) illustrated in FIG. 1, $d_v=3$ and $d_c=6$.

Note that, in each of the variable node computation of Expression (1) and the check node computation of Expression (2), a message input from an edge (or a line connecting between a variable node and a check node) from which a message is output is not the target of the computation. Thus, the range of computation is 1 to $d_v-1$ or 1 to $d_c-1$. Furthermore, the check node computation of Expression (2) is actually performed by creating in advance a table of a function $R(v_1, v_2)$ given by Expression (3), which is defined by one output for two inputs $v_1$ and $v_2$, and sequentially (or recursively) using the table in the manner given by Expression (4).

[Math. 3]

$$x = 2\tan h^{-1}\{\tan h(v_1/2)\tan h(v_2/2)\} = R(v_1, v_2) \quad (3)$$

[Math. 4]

$$u_j = R(v_2, R(v_3, \ldots R(v_{d_c-2}, v_{d_c-2}))) \quad (4)$$

In step S12, furthermore, the variable k is incremented by "1". Then, the process proceeds to step S13. In step S13, it is determined whether the variable k is larger than a certain number of times of repetitive decoding C. If it is determined in step S13 that the variable k is not larger than C, the process returns to step S12, and subsequently, similar processing is repeatedly performed.

If it is determined in step S13 that the variable k is larger than C, the process proceeds to step S14. In step S14, a message $v_i$ as a final output result of decoding is determined by performing computation given by Expression (5), and is output. Then, the LDPC code decoding process ends.

[Math. 5]

$$v_i = u_{0i} + \sum_{j=1}^{d_v} u_j \quad (5)$$

Here, the computation of Expression (5) is performed using, unlike the variable node computation of Expression (1), the messages $u_j$ from all the edges connected to a variable node.

FIG. 3 illustrates an example of a parity check matrix H of a (3,6) LDPC code (with a code rate of ½ and a code length of 12).

In the parity check matrix H illustrated in FIG. 3, similarly to FIG. 1, the column weight is 3 and the row weight is 6.

FIG. 4 illustrates a Tanner graph of the parity check matrix H illustrated in FIG. 3.

Here, in FIG. 4, a check node is represented by a plus "+" sign, and a variable node is represented by an equal "=" sign. A check node and a variable node correspond to each row and column of the parity check matrix H, respectively. A connection between a check node and a variable node is an edge, and corresponds to an element of "1" in the parity check matrix.

More specifically, in a case where the element in the j-th row and the i-th column of the parity check matrix is 1, in FIG. 4, the i-th variable node ("=" node) from the top and the j-th check node ("+" node) from the top are connected by an edge. An edge indicates that a code bit corresponding to a variable node has a constraint corresponding to a check node.

In the sum product algorithm, which is an LDPC code decoding method, variable node computation and check node computation are repeatedly performed.

FIG. 5 illustrates variable node computation to be performed at a variable node.

At a variable node, a message $v_i$ corresponding to an edge for which calculation is to be performed is determined through the variable node computation of Expression (1) using messages $u_1$ and $u_2$ from the remaining edges connected to the variable node and also using a reception value $u_{0i}$. The messages corresponding to the other edges are also determined in a similar way.

FIG. 6 illustrates check node computation to be performed at a check node.

Here, the check node computation of Expression (2) can be rewritten as Expression (6) by using the relationship of the equation $a \times b = \exp\{\ln(|a|) + \ln(|b|)\} \times \text{sign}(a) \times \text{sign}(b)$, where $\text{sign}(x)$ is 1 for $x \geq 0$ and $-1$ for $x < 0$.

[Math. 6]

$$u_j = 2\tan h^{-1}\left(\prod_{i=1}^{d_c-1} \tan h\left(\frac{v_i}{2}\right)\right) \quad (6)$$

$$= 2\tan h^{-1}\left[\exp\left\{\sum_{i=1}^{d_c-1} \ln\left(\left|\tan h\left(\frac{v_i}{2}\right)\right|\right)\right\} \times \prod_{i=1}^{d_c-1} \text{sign}\left(\tan h\left(\frac{v_i}{2}\right)\right)\right]$$

$$= 2\tan h^{-1}\left[\exp\left\{-\left(\sum_{i=1}^{d_c-1} -\ln\left(\tan h\left(\frac{|v_i|}{2}\right)\right)\right)\right\}\right] \times \prod_{i=1}^{d_c-1} \text{sign}(v_i)$$

If the function $\phi(x)$ is defined as the equation $\phi(x) = \ln(\tan h(x/2))$ for $x \geq 0$, the equation $\phi^{-1}(x) = 2\tan h^{-1}(e^{-x})$ is established. Thus, Expression (6) can be transformed into Expression (7).

[Math. 7]

$$u_j = \phi^{-1}\left(\sum_{i=1}^{d_c-1} \phi(|v_i|)\right) \times \prod_{i=1}^{d_c-1} \text{sign}(v_i) \quad (7)$$

At a check node, the check node computation of Expression (2) is performed in accordance with Expression (7).

More specifically, at a check node, as illustrated in FIG. 6, a message $u_j$ corresponding to an edge for which calculation is to be performed is determined through the check node computation of Expression (7) using messages $v_1$, $v_2$, $v_3$, $v_4$, and $v_5$ from the remaining edges connected to the check node. The messages corresponding to the other edges are also determined in a similar way.

Note that the function $\phi(x)$ in Expression (7) can be represented by the equation $\phi(x) = \ln((e^x+1)/(e^x-1))$, where $\phi(x) = \phi^{-1}(x)$ for $x > 0$. The functions $\phi(x)$ and $\phi^{-1}(x)$ may be implemented in hardware by using an LUT (Look Up Table), where the same LUT is used for both functions.

CITATION LIST

Non Patent Literature

NPL 1: DVB-S.2: ETSI EN 302 307 V1.2.1 (2009 August)

SUMMARY OF INVENTION

Technical Problem

In the standards that employ LDPC codes, such as DVB-S.2, DVB-T.2, and DVB-C.2, an LDPC code is mapped to symbols (or is symbolized) of orthogonal modulation (digital modulation) such as QPSK (Quadrature Phase Shift Keying). The symbols are mapped to constellation points and are transmitted.

Meanwhile, there has recently been a demand for efficient transmission of a large amount of data such as a three-dimensional (3D) image or a 4 k image. A 4 k image has a resolution of 3840 pixels horizontally and 2160 pixels vertically, providing approximately four times the pixel resolution of full high definition.

However, prioritizing the efficiency of data transmission would increase an error rate.

On the contrary, there may also be a demand that the efficiency of data transmission can be somewhat sacrificed for data transmission with good error-rate performance.

In the future, demands for data transmission with various efficiency levels are expected to increase. For example, a plurality of LDPC codes having different code rates allow data transmission with various efficiency levels.

In data transmission, therefore, it is desirable that LDPC codes having code rates which are easily set to a somewhat large number of code rates, the number of which is greater than or equal to, for example, the number of code rates demanded for data transmission, be employed.

It is also desirable that LDPC codes have high resistance to errors (i.e., high robustness), that is, good error-rate performance, no matter which code rate of LDPC code is to be employed.

The present technology has been made in view of the foregoing situation, and is intended to provide LDPC codes having good error-rate performance.

Solution to Problem

A first data processing apparatus or data processing method of the present technology includes an encoding unit configured to encode or an encoding step of encoding information bits into an LDPC (Low Density Parity Check) code having a code length of 64800 bits and a code rate of 24/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 1504 2103 2621 2840 3869 4594 5246 6314 7327 7364 10425 11934 12898 12954
27 1903 3923 4513 7812 8098 8428 9789 10519 11345 12032 12157 12573 12930
17 191 660 2451 2475 2976 3398 3616 5769 6724 8641 10046 11552 12842
13 1366 4993 6468 7689 8563 9131 10012 10914 11574 11837 12203 12715 12946
432 872 2603 3286 3306 3385 4137 5563 7540 9339 9948 12315 12656 12929
1113 1394 4104 4186 7240 8827 11522 11833 12359 12363 12629 12821 12904 12946
14 441 1432 1677 2432 8981 11478 11507 12599 12783 12793 12912 12922 12943
1579 1806 7971 8586 9845 10357 11600 12007 12020 12339 12576 12817 12830 12904
20 546 3672 5538 6944 8052 8781 9743 12269 12393 12418 12549 12555 12718
1 3540 4397 5011 6626 8617 9587 10360 10602 11402 11983 12068 12495 12838
30 1572 4908 7421 8041 8910 8963 11005 11930 12240 12340 12467 12892 12933
33 2060 3907 4215 5545 8306 8655 8743 8806 9315 9364 10685 11954 12959
1338 2596 4876 5207 9555 10421 10929 11698 11739 12375 12416 12643 12792 12754
9469 10549 10932 11250 11426 11582 11846 12139 12202 12210 12356 12378 12873 12929
2681 3337 3616 6113 7078 8167 8624 9697 10908 11781 11855 12095 12475 12659
28 4086 5432 6555 6848 7368 8799 11483 11572 12414 12816 12894 12936 12957
5 5044 5572 9023 9192 9589 9979 10009 10855 10991 11715 12314 12610 12945
17 272 602 5681 6530 9572 9886 11061 11495 12238 12265 12483 12885 12955
22 2245 4282 4469 5007 6650 6733 10151 10401 11571 12004 12261 12805 12844
23 3270 4468 8621 9662 11240 11934 12091 12444 12691 12717 12858 12888 12917
740 1519 4923 6191 7878 8350 9293 10779 11020 11287 11630 12792 12862 12920
12 28 3584 6072 7079 8075 10477 11130 11383 11780 12341 12667 12818 12927
14 118 5283 5382 8301 9097 9413 9664 10437 10701 11124 12685 12730 12734
32 1426 3078 4325 5353 7780 9042 9928 10077 10377 10679 11191 11750 12611
1 669 3831 3980 5381 5412 6552 8453 9435 10243 11546 11821 11987 12807
232 483 919 1232 2156 2396 2990 3774 8539 8704 8819 10810 11868 12634
2381 7309 9334
348 6494 12623
4872 6257 11090
7 11970 11985
6615 12788 12855
1173 5269 12647
1944 7738 8116
17 4828 9175
2329 6034 12642
1254 2366 5013
2984 5078 5664
7423 10265 11528
1656 8526 8716
22 287 2837
18 100 3079
299 3171 12169
33 5920 11144
1286 3650 9309
2283 8809 12588
3199 8242 9081
2507 6846 8113
5211 8722 12689
1064 2592 8659
6136 6925 12958
1256 12789 12932
4274 8045 8788
1824 3209 6926
11 8899 12669
6249 6338 8730
641 9679 12831
3459 9876 11185
3226 6148 8173
9078 12126 12771
10907 11278 12731
3392 4020 12838
2814 11588 12909
6063 9214 11519

6064 6827 12683
1610 2452 6582
903 6289 8074
4592 8138 12952
2587 6271 9945
2733 11844 11893
581 4601 10020
14 5597 6049
343 3582 5931
5263 6521 12846
1394 2457 5251
11 4627 12747
2650 10366 12390
6285 11893 12062
10143 12892 12956
8448 11917 12330
4209 11693 12356
1529 2360 9086
5389 8148 10224
64 4876 12862
9483 12659 12887
3587 6767 12478
3122 5245 9044
3267 10118 11466
1347 3857 6705
9384 9576 11971
1366 8708 10758
412 4249 12863
1676 10488 11850
17 1605 2455
14 111 6045
11368 12919 12953
10588 11530 12937
4549 5143 12218
3088 4185 11674
23 2554 7823
6615 9291 9863
2229 3629 10855
3818 5509 12764
2740 11525 12914
8297 8611 12948
3606 11104 12920
5097 10412 12759
6502 7266 12072
5425 5490 10728
22 73 8462
32 12439 12657
8483 9540 10430
7275 7377 7420
5748 9726 12356
5672 6150 9156
28 3527 5857
520 7099 11335
405 6173 12865
5847 12843 12934
4289 7679 10386
2950 8021 12938
8844 11214 12955
2130 10760 12665
734 4790 12940
8 6991 12772
19 8205 11289
12 1440 9077
8670 8837 12951
3531 9166 12937
15 8901 8929
838 10114 11740
2648 9959 10934
323 7499 12877
5505 5659 11395
6627 12709 12933
364 1976 12888
8213 9124 12793
9588 10088 11108
299 890 11634
7368 7598 11602
28 4669 12585
15 27 12474
1426 3614 4205
30 2087 11147
6226 6259 12941.

A second data processing apparatus or data processing method of the present technology includes a decoding unit configured to decode or a decoding step of decoding an LDPC (Low Density Parity Check) code having a code length of 64800 bits and a code rate of 24/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 1504 2103 2621 2840 3869 4594 5246 6314 7327 7364 10425 11934 12898 12954
27 1903 3923 4513 7812 8098 8428 9789 10519 11345 12032 12157 12573 12930
17 191 660 2451 2475 2976 3398 3616 5769 6724 8641 10046 11552 12842
13 1366 4993 6468 7689 8563 9131 10012 10914 11574 11837 12203 12715 12946
432 872 2603 3286 3306 3385 4137 5563 7540 9339 9948 12315 12656 12929
1113 1394 4104 4186 7240 8827 11522 11833 12359 12363 12629 12821 12904 12946
14 441 1432 1677 2432 8981 11478 11507 12599 12783 12793 12912 12922 12943
1579 1806 7971 8586 9845 10357 11600 12007 12020 12339 12576 12817 12830 12904
20 546 3672 5538 6944 8052 8781 9743 12269 12393 12418 12549 12555 12718
1 3540 4397 5011 6626 8617 9587 10360 10602 11402 11983 12068 12495 12838
30 1572 4908 7421 8041 8910 8963 11005 11930 12240 12340 12467 12892 12933
33 2060 3907 4215 5545 8306 8655 8743 8806 9315 9364 10685 11954 12959
1338 2596 4876 5207 9555 10421 10929 11648 11739 12375 12416 12643 12742 12754
9469 10544 10932 11250 11426 11582 11846 12139 12202 12210 12356 12378 12873 12929
2681 3337 3616 6113 7078 8167 8624 9697 10908 11781 11855 12095 12475 12659
28 4086 5432 6555 6848 7368 8794 11483 11572 12414 12816 12894 12936 12957
5 5044 5572 9023 9192 9589 9979 10009 10855 10991 11715 12314 12610 12945
17 272 602 5681 6530 9572 9886 11061 11495 12238 12265 12483 12885 12955
22 2245 4282 4469 5007 6650 6733 10151 10401 11571 12004 12261 12805 12844

23 3270 4468 8621 9662 11240 11934 12091 12444 12691 12717 12858 12888 12917
740 1519 4923 6191 7878 8350 9293 10779 11020 11287 11630 12792 12862 12920
12 28 3584 6072 7079 8075 10477 11130 11383 11780 12341 12667 12818 12927
14 118 5283 5382 8301 9097 9413 9664 10437 10701 11124 12685 12730 12734
32 1426 3078 4325 5353 7780 9042 9928 10077 10377 10679 11191 11750 12611
1 669 3831 3980 5381 5412 6552 8453 9435 10243 11546 11821 11987 12807
232 483 919 1232 2156 2396 2990 3774 8539 8704 8819 10810 11868 12634
2381 7309 9334
348 6494 12623
4872 6257 11090
7 11970 11985
6615 12788 12855
1173 5269 12647
1944 7738 8116
17 4828 9175
2329 6034 12642
1254 2366 5013
2984 5078 5664
7423 10265 11528
1656 8526 8716
22 287 2837
18 100 3079
299 3171 12169
33 5920 11144
1286 3650 9309
2283 8809 12588
3199 8242 9081
2507 6846 8113
5211 8722 12689
1064 2592 8659
6136 6925 12958
1256 12789 12932
4274 8045 8788
1824 3209 6926
11 8899 12669
6249 6338 8730
641 9679 12831
3459 9876 11185
3226 6148 8173
9078 12126 12771
10907 11278 12731
3392 4020 12838
2814 11588 12909
6063 9214 11519
6064 6827 12683
1610 2452 6582
903 6289 8074
4592 8138 12952
2587 6271 9945
2733 11844 11893
581 4601 10020
14 5597 6049
343 3582 5931
5263 6521 12846
1394 2457 5251
11 4627 12747
2650 10366 12390
6285 11893 12062
10143 12892 12956
8448 11917 12330
4209 11693 12356
1529 2360 9086
5389 8148 10224
64 4876 12862
9483 12659 12887
3587 6767 12478
3122 5245 9044
3267 10118 11466
1347 3857 6705
9384 9576 11971
1366 8708 10758
412 4249 12863
1676 10488 11850
17 1605 2455
14 111 6045
11368 12919 12953
10588 11530 12937
4549 5143 12218
3088 4185 11674
23 2554 7823
6615 9291 9863
2229 3629 10855
3818 5509 12764
2740 11525 12914
8297 8611 12948
3606 11104 12920
5097 10412 12759
6502 7266 12072
5425 5490 10728
22 73 8462
32 12439 12657
8483 9540 10430
7275 7377 7420
5748 9726 12356
5672 6150 9156
28 3527 5857
520 7099 11335
405 6173 12865
5847 12843 12934
4289 7679 10386
2950 8021 12938
8844 11214 12955
2130 10760 12665
734 4790 12940
8 6991 12772
19 8205 11289
12 1440 9077
8670 8837 12951
3531 9166 12937
15 8901 8929
838 10114 11740
2648 9959 10934
323 7499 12877
5505 5659 11395
6627 12709 12933
364 1976 12888
8213 9124 12793
9588 10088 11108
299 890 11634
7368 7598 11602
28 4669 12585
15 27 12474
1426 3614 4205
30 2087 11147
6226 6259 12941.

A third data processing apparatus or data processing method of the present technology includes an encoding unit configured to encode or an encoding step of encoding information bits into an LDPC (Low Density Parity Check) code having a code length of 64800 bits and a code rate of 25/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 1860 2354 3967 4292 4488 5243 5373 5766 8378 9111 10468 10505 10774
24 2266 2380 3282 4255 4779 8729 9140 9566 10102 10661 10711 10797
605 650 1108 1669 2251 3133 5847 6197 6902 7545 10521 10600 10773
1016 1428 1612 2335 3102 3810 4926 5953 9964 10246 10569 10734 10784
3195 6308 8029 9030 9397 9461 9833 10239 10499 10675 10736 10757 10773
2 27 3641 4566 7332 9318 9323 9916 10365 10438 10561 10581 10750
2405 2458 4820 6232 6254 6347 7139 7474 8623 8779 8798 10747 10794
3164 4736 6474 7162 7420 7517 7835 8238 8412 8489 9006 10113 10440
20 2372 5561 5649 6907 8393 8505 9181 9567 9595 10388 10483 10714
1071 2899 5135 5780 6616 7111 7773 8582 9015 9912 10139 10387 10768
292 2833 5490 6011 6136 6713 7517 9096 10128 10328 10407 10525 10736
1044 3711 4421 5140 5207 8118 8749 8884 9205 10359 10372 10746 10784
3241 5696 6440 7240 7419 8613 8878 9593 9959 9997 10401 10404 10754
3133 4647 5912 6065 6694 7208 7346 8227 9465 9739 10452 10516 10770
2254 6444 7449 8095 8120 8710 9030 9162 9643 9968 10101 10571 10678
918 1445 2217 4262 4623 5401 5749 7446 7907 9539 10125 10514 10726
6 1341 1788 3105 4359 5263 5470 7552 8249 8644 10609 10674 10733
1994 3000 3151 3173 7742 8335 8438 8741 9232 9296 9817 10023 10257
467 1674 3016 3950 4055 5399 6688 7113 7273 8658 8702 9642 10545
2007 2541 3125 7380 7550 8122 8501 8665 9882 10403 10519 10594 10696
334 587 709 1540 2023 2876 6216 8768 9328 9481 10424 10507 10779
2165 4185 4306 5019 6961 7386 8447 9082 9837 10091 10461 10559 10570
7 903 2948 6312 6654 7738 7980 8312 9104 9743 10070 10278 10406
3047 3154 4160 4378 5461 8711 8809 9040 9173 9252 9537 9995 10735
2018 2355 3828 3854 6201 6696 8313 8459 8550 8833 9586 10202 10224
1402 1908 4286 4660 6029 6115 6737 7538 9495 9517 10055 10509 10644
3442 3589 3868 5051 5322 5580 8725 9046 9170 10041 10613 10681 10689
2733 7826 10622
3597 4753 7086
1394 7297 10264
2848 7502 10304
1649 2405 10783
647 2911 9069
2572 4006 7508
1361 8887 10103
3681 4023 9090
1496 4962 6325
2016 5120 9747
3954 5260 8568
3364 8719 10035
4208 4806 9973
29 3361 3490
1835 2317 10436
7312 8177 9041
7728 8097 10761
2109 7902 9685
5424 8943 9436
4369 7643 9152
2240 10140 10528
3435 6124 10604
8962 9357 10040
26 1931 8629
8275 10455 10643
8 24 4952
3995 6456 10633
28 10300 10337
4894 9286 9429
5587 6721 9120
1859 9198 9762
6374 6453 7011
1319 4530 5442
1507 10711 10798
2115 3445 3641
6668 9139 10163
4038 8117 10295
1479 3403 8247
25202 2934 3562
1526 5073 9650
2136 9820 10636
4214 8464 9891
8018 10330 10610
8984 10209 10647
3414 7272 8599
4883 9077 9525
22 8173 8425
2941 6536 10126
29 6540 7361
5 3787 10468
4264 4818 6906
3903 7041 10412
6078 7661 10619
6922 9723 9890
5112 5416 6253
5925 9961 10447
9 10311 10598
8790 8814 10793
4768 5466 10664
10 10675 10766
6814 8705 10737
17 769 6692
1503 10696 10742
1285 4632 8976
4279 4973 7907
4650 4775 10785

28 729 10331
1914 5240 10723
3569 4921 9561
4 9442 10796
494 2328 9507
1717 8768 10750
9540 10599 10774
11 10075 10644
10246 10607 10753
5510 7088 9053
1347 3584 5523
7872 10596 10736
628 10592 10695
5632 5688 10627
2375 10009 10561
4169 4630 8871
2896 10038 10521
89 9695 9799
20 7563 9069
4534 10321 10697
8212 9868 10716
7485 9312 10327
234 536 6293
5515 7350 9251
283 3182 7167
2444 5378 6130
6183 8315 10726
43 4871 8347
2427 10219 10728
10 21 9448
1067 8312 8420
4793 9522 10105
4688 10536 10724
3825 7496 10709
682 8544 10449
2794 7110 10741
9279 10741 10767
2897 5442 8771
33 7957 10460
5 10393 10792
6225 10224 10798
23 9014 10786
7836 8339 8642
3476 5455 9788
1939 10251 10384
4008 7890 10450
926 2090 3804
1038 2497 10701
22 6220 8405
5153 5944 10367
7260 7726 9529
3039 8397 10665
7262 9644 10083
5531 6248 10795
7926 8248 8413
4649 8971 10182.

A fourth data processing apparatus or data processing method of the present technology includes a decoding unit configured to decode or a decoding step of decoding an LDPC (Low Density Parity Check) code having a code length of 64800 bits and a code rate of 25/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 1860 2354 3967 4292 4488 5243 5373 5766 8378 9111 10468 10505 10774
24 2266 2380 3282 4255 4779 8729 9140 9566 10102 10661 10711 10797
605 650 1108 1669 2251 3133 5847 6197 6902 7545 10521 10600 10773
1016 1428 1612 2335 3102 3810 4926 5953 9964 10246 10569 10734 10784
3195 6308 8029 9030 9397 9461 9833 10239 10499 10675 10736 10757 10773
2 27 3641 4566 7332 9318 9323 9916 10365 10438 10561 10581 10750
2405 2458 4820 6232 6254 6347 7139 7474 8623 8779 8798 10747 10794
3164 4736 6474 7162 7420 7517 7835 8238 8412 8489 9006 10113 10440
20 2372 5561 5649 6907 8393 8505 9181 9567 9595 10388 10483 10714
1071 2899 5135 5780 6616 7111 7773 8582 9015 9912 10139 10387 10768
292 2833 5490 6011 6136 6713 7517 9096 10128 10328 10407 10525 10736
1044 3711 4421 5140 5207 8118 8749 8884 9205 10359 10372 10746 10784
3241 5696 6440 7240 7419 8613 8878 9593 9959 9997 10401 10404 10754
3133 4647 5912 6065 6694 7208 7346 8227 9465 9739 10452 10516 10770
2254 6944 7449 8095 8120 8710 9030 9162 9643 9968 10101 10571 10678
918 1495 2217 4262 4623 5401 5749 7446 7907 9539 10125 10514 10726
6 1341 1788 3105 4359 5263 5470 7552 8249 8644 10609 10674 10733
1994 3000 3151 3173 7742 8335 8438 8741 9232 9296 9817 10023 10257
467 1674 3016 3950 4055 5399 6688 7113 7273 8658 8702 9642 10545
2007 2541 3125 7380 7550 8122 8501 8665 9882 10403 10519 10594 10696
334 587 709 1540 2023 2876 6216 8768 9328 9981 10424 10507 10779
2165 4185 4306 5019 6961 7386 8447 9082 9837 10091 10461 10559 10570
7 903 2948 6312 6654 7738 7980 8312 9104 9743 10070 10278 10406
3047 3154 4160 4378 5461 8711 8809 9040 9173 9252 9537 9995 10735
2018 2355 3828 3854 6201 6696 8313 8459 8550 8833 9586 10202 10224
1402 1908 4286 4660 6029 6115 6737 7538 9495 9517 10055 10509 10644
3442 3589 3868 5051 5322 5580 8725 9046 9170 10041 10613 10681 10689
2733 7826 10622
3597 4753 7086
1394 7297 10264
2848 7502 10304
1649 2405 10783
647 2911 9069
2572 4006 7508
1361 8887 10103
3681 4023 9090
1496 4962 6325

2016 5120 9747
3954 5260 8568
3364 8719 10035
4208 4806 9973
29 3361 3490
1835 2317 10436
7312 8177 9041
7728 8097 10761
2109 7902 9685
5424 8943 9436
4369 7643 9152
2240 10140 10528
3435 6124 10604
8962 9357 10040
26 1931 8629
8275 10455 10643
8 24 4952
3995 6456 10633
28 10300 10337
4894 9286 9429
5587 6721 9120
1859 9198 9762
6374 6453 7011
1319 4530 5442
1507 10711 10798
2115 3445 3641
6668 9139 10163
4038 8117 10295
1479 3403 8247
2522 2934 3562
1526 5073 9650
2136 9820 10636
4214 8464 9891
8018 10330 10610
8984 10209 10647
3414 7272 8599
4883 9077 9525
22 8173 8425
2941 6536 10126
29 6540 7361
5 3787 10468
4264 4818 6906
3903 7041 10412
6078 7661 10619
6922 9723 9890
5112 5416 6253
5925 9961 10447
9 10311 10598
8790 8814 10793
4768 5466 10664
10 10675 10766
6814 8705 10737
17 769 6692
1503 10696 10742
1285 4632 8976
4279 4973 7907
4650 4775 10785
28 729 10331
1914 5240 10723
3569 4921 9561
4 9442 10796
494 2328 9507
1717 8768 10750
9540 10599 10774
11 10075 10644
10246 10607 10753
5510 7088 9053

1347 3584 5523
7872 10596 10736
628 10592 10695
5632 5688 10627
2375 10009 10561
4169 4630 8871
2896 10038 10521
89 9695 9799
20 7563 9069
4534 10321 10697
8212 9868 10716
7485 9312 10327
234 536 6293
5515 7350 9251
283 3182 7167
2444 5378 6130
6183 8315 10726
43 4871 8347
2427 10219 10728
10 21 9448
1067 8312 8420
4793 9522 10105
4688 10536 10724
3825 7496 10709
682 8544 10449
2794 7110 10741
9279 10741 10767
2897 5442 8771
33 7957 10460
5 10393 10792
6225 10224 10798
23 9014 10786
7836 8339 8642
3476 5455 9788
1939 10251 10384
4008 7890 10450
926 2090 3804
1038 2497 10701
22 6220 8405
5153 5944 10367
7260 7726 9529
3039 8397 10665
7262 9644 10083
5531 6248 10795
7926 8248 8413
4649 8971 10182.

A fifth data processing apparatus or data processing method of the present technology includes an encoding unit configured to encode or an encoding step of encoding information bits into an LDPC (Low Density Parity Check) code having a code length of 64800 bits and a code rate of 26/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 142 2307 2598 2650 4028 4434 5781 5881 6016 6323 6681 6698 8125

2932 4928 5248 5256 5983 6773 6828 7789 8426 8494 8534 8539 8583

899 3295 3833 5399 6820 7400 7753 7890 8109 8451 8529 8564 8602

21 3060 4720 5429 5636 5927 6966 8110 8170 8247 8355 8365 8616
20 1745 2838 3799 4380 4418 4646 5059 7343 8161 8302 8456 8631
9 6274 6725 6792 7195 7333 8027 8186 8209 8273 8442 8548 8632
494 1365 2405 3799 5188 5291 7644 7926 8139 8458 8504 8594 8625
192 574 1179 4387 4695 5089 5831 7673 7789 8298 8301 8612 8632
11 20 1406 6111 6176 6256 6708 6834 7828 8232 8457 8495 8602
6 2654 3554 4483 4966 5866 6795 8069 8249 8301 8497 8509 8623
21 1144 2355 3124 6773 6805 6887 7742 7994 8358 8374 8580 8611
335 4473 4883 5528 6096 7543 7586 7921 8197 8319 8394 8489 8636
2919 4331 4419 4735 6366 6393 6844 7193 8165 8205 8544 8586 8617
12 19 742 930 3009 4330 6213 6224 7292 7430 7792 7922 8137
710 1439 1588 2434 3516 5239 6248 6827 8230 8448 8515 8581 8619
200 1075 1868 5581 7349 7642 7698 8037 8201 8210 8320 8391 8526
3 2501 4252 5256 5292 5567 6136 6321 6430 6486 7571 8521 8636
3062 4599 5885 6529 6616 7314 7319 7567 8024 8153 8302 8372 8598
105 381 1574 4351 5452 5603 5943 7467 7788 7933 8362 8513 8587
787 1857 3386 3659 6550 7131 7965 8015 8040 8312 8484 8525 8537
15 1118 4226 5197 5575 5761 6762 7038 8260 8338 8444 8512 8568
36 5216 5368 5616 6029 6591 8038 8067 8299 8351 8565 8578 8585
1 23 4300 4530 5426 5532 5817 6967 7124 7979 8022 8270 8437
629 2133 4828 5475 5875 5890 7194 8042 8345 8385 8518 8598 8612
11 1065 3782 4237 4993 7104 7863 7904 8104 8228 8321 8383 8565
2131 2274 3168 3215 3220 5597 6347 7812 8238 8354 8527 8557 8614
5600 6591 7491 7696
1766 8281 8626
1725 2280 5120
1650 3445 7652
4312 6911 8626
15 1013 5892
2263 2546 2979
1545 5873 7406
67 726 3697
2860 6443 8542
17 911 2820
1561 4580 6052
79 5269 7134
22 2410 2424
3501 5642 8627
808 6950 8571
4099 6389 7482
4023 5000 7833
5476 5765 7917
1008 3194 7207
20 495 5411
1703 8388 8635
6 4395 4921
200 2053 8206
1089 5126 5562
10 4193 7720
1967 2151 4608
22 738 3513
3385 5066 8152
440 1118 8537
3429 6058 7716
5213 7519 8382
5564 8365 8620
43 3219 8603
4 5409 5815
5 6376 7654
4091 5724 5953
5348 6754 8613
1634 6398 6632
72 2058 8605
3497 5811 7579
3846 6743 8559
15 5933 8629
2133 5859 7068
4151 4617 8566
2960 8270 8410
2059 3617 8210
549 1441 6895
4093 7482 8592
294 2180 8524
3058 8227 8373
364 5756 8617
5383 8555 8619
1704 2480 4181
7338 7929 7990
2615 3905 7981
4298 4548 8296
8262 8319 8630
892 1893 8028
5694 7237 8595
1487 5012 5810
4335 8593 8624
3509 4531 5273
10 22 830
4161 5208 6280
275 7063 8634
4 2725 3113
2279 7403 8174
1637 3328 3930
2810 4939 5624
3 1234 7687
2799 7740 8616
22 7701 8636
4302 7857 7993
7477 7794 8592
9 6111 8591
5 8606 8628
347 3497 4033
1747 2613 8636
1827 5600 7042
580 1822 6842
232 7134 7783
4629 5000 7231
951 2806 4947
571 3474 8577
2437 2496 7945
23 5873 8162
12 1168 7686

8315 8540 8596
1766 2506 4733
929 1516 3338
21 1216 6555
782 1952 8617
8 6083 6087
667 3240 4583
4030 4661 5790
559 7122 8553
3202 9388 4909
2533 3673 8594
1991 3954 6206
6835 7900 7980
189 5722 8573
2680 4928 4998
243 2579 7735
4281 8132 8566
7656 7671 8609
1116 2291 4166
21 388 8021
6 1123 8369
311 4918 8511
0 3248 6290
13 6762 7172
4209 5632 7563
49 127 8074
581 1735 4075
0 2235 5470
2178 5820 6179
16 3575 6054
1095 4564 6458
9 1581 5953
2537 6469 8552
14 3874 4844
0 3269 3551
2119 7372 7926
1875 2388 4057
3232 4042 6663
9 401 583
13 4100 6584
2299 4190 4410
21 3670 4979.

A sixth data processing apparatus or data processing method of the present technology includes a decoding unit configured to decode or a decoding step of decoding an LDPC (Low Density Parity Check) code having a code length of 64800 bits and a code rate of 26/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 142 2307 2598 2650 4028 4434 5781 5881 6016 6323 6681 6698 8125
2932 4928 5248 5256 5983 6773 6828 7789 8426 8494 8534 8539 8583
899 3295 3833 5399 6820 7400 7753 7890 8109 8451 8529 8564 8602
21 3060 4720 5429 5636 5927 6966 8110 8170 8247 8355 8365 8616
20 1745 2838 3799 4380 4418 4646 5059 7393 8161 8302 8456 8631
9 6274 6725 6792 7195 7333 8027 8186 8209 8273 8442 8548 8632
494 1365 2405 3799 5188 5291 7644 7926 8139 8458 8504 8594 8625
192 574 1179 4387 4695 5089 5831 7673 7789 8298 8301 8612 8632
11 20 1406 6111 6176 6256 6708 6834 7828 8232 8457 8495 8602
6 2654 3554 4483 4966 5866 6795 8069 8249 8301 8497 8509 8623
21 1144 2355 3124 6773 6805 6887 7742 7994 8358 8374 8580 8611
335 4473 4883 5528 6096 7543 7586 7921 8197 8319 8394 8489 8636
2919 4331 4419 4735 6366 6393 6844 7193 8165 8205 8544 8586 8617
12 19 742 930 3009 4330 6213 6224 7292 7430 7792 7922 8137
710 1439 1588 2434 3516 5239 6248 6827 8230 8448 8515 8581 8619
200 1075 1868 5581 7349 7642 7698 8037 8201 8210 8320 8391 8526
3 2501 4252 5256 5292 5567 6136 6321 6430 6486 7571 8521 8636
3062 4599 5885 6529 6616 7314 7319 7567 8024 8153 8302 8372 8598
105 381 1574 4351 5452 5603 5943 7467 7788 7933 8362 8513 8587
787 1857 3386 3659 6550 7131 7965 8015 8040 8312 8484 8525 8537
15 1118 4226 5197 5575 5761 6762 7038 8260 8338 8444 8512 8568
36 5216 5368 5616 6029 6591 8038 8067 8299 8351 8565 8578 8585
1 23 4300 4530 5426 5532 5817 6967 7124 7979 8022 8270 8437
629 2133 4828 5475 5875 5890 7194 8042 8345 8385 8518 8598 8612
11 1065 3782 4237 4993 7104 7863 7904 8104 8228 8321 8383 8565
2131 2274 3168 3215 3220 5597 6347 7812 8238 8354 8527 8557 8614
5600 6591 7491 7696
1766 8281 8626
1725 2280 5120
1650 3445 7652
4312 6911 8626
15 1013 5892
2263 2546 2979
1545 5873 7406
67 726 3697
2860 6443 8542
17 911 2820
1561 4580 6052
79 5269 7134
22 2410 2424
3501 5642 8627
808 6950 8571
4099 6389 7482
4023 5000 7833
5476 5765 7917
1008 3194 7207
20 495 5411
1703 8388 8635
6 4395 4921
200 2053 8206
1089 5126 5562

10 4193 7720
1967 2151 4608
22 738 3513
3385 5066 8152
440 1118 8537
3429 6058 7716
5213 7519 8382
5564 8365 8620
43 3219 8603
4 5409 5815
5 6376 7654
4091 5724 5953
5398 6759 8613
1634 6398 6632
72 2058 8605
3497 5811 7579
3846 6743 8559
15 5933 8629
2133 5859 7068
4151 4617 8566
2960 8270 8410
2059 3617 8210
544 1441 6895
4043 7482 8592
294 2180 8524
3058 8227 8373
364 5756 8617
5383 8555 8619
1704 2480 4181
7338 7929 7990
2615 3905 7981
4298 4548 8296
8262 8319 8630
892 1893 8028
5694 7237 8595
1487 5012 5810
4335 8593 8624
3509 4531 5273
10 22 830
4161 5208 6280
275 7063 8634
4 2725 3113
2279 7403 8174
1637 3328 3930
2810 4939 5624
3 1234 7687
2799 7740 8616
22 7701 8636
4302 7857 7993
7477 7794 8592
9 6111 8591
5 8606 8628
347 3497 4033
1747 2613 8636
1827 5600 7042
580 1822 6842
232 7134 7783
4629 5000 7231
951 2806 4947
571 3474 8577
2437 2496 7945
23 5873 8162
12 1168 7686
8315 8540 8596
1766 2506 4733
929 1516 3338
21 1216 6555
782 1452 8617
8 6083 6087
667 3240 4583
4030 4661 5790
559 7122 8553
3202 4388 4909
2533 3673 8594
1991 3954 6206
6835 7900 7980
189 5722 8573
2680 4928 4998
243 2579 7735
4281 8132 8566
7656 7671 8609
1116 2291 4166
21 388 8021
6 1123 8369
311 4918 8511
0 3248 6290
13 6762 7172
4209 5632 7563
49 127 8074
581 1735 4075
0 2235 5470
2178 5820 6179
16 3575 6054
1095 4564 6458
9 1581 5953
2537 6469 8552
14 3874 4844
0 3269 3551
2114 7372 7926
1875 2388 4057
3232 4042 6663
9 401 583
13 4100 6584
2299 4190 4410
21 3670 4979.

A seventh data processing apparatus or data processing method of the present technology includes an encoding unit configured to encode or an encoding step of encoding information bits into an LDPC (Low Density Parity Check) code having a code length of 64800 bits and a code rate of 27/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 658 706 898 1149 2577 2622 2772 3266 3329 5243 6079 6271
289 784 1682 3584 3995 4821 4856 5063 5974 6168 6437 6453
658 1426 2043 2065 2986 4118 4284 5394 5444 5477 5727 6018
641 928 1225 2841 4052 4840 4992 5268 5533 6249 6461 6475
2312 2917 3713 3849 4059 4241 4610 5440 5727 6101 6397 6444
1165 1592 1891 2154 3981 4817 5181 5748 5788 6012 6266 6350
13 2758 3069 4233 4697 5100 5279 5677 5919 5969 6280 6422

818 1500 2125 2340 3774 4707 4901 5170 5744 6008 6316 6353
857 3054 3409 3496 3704 4868 5326 6211 6292 6356 6367 6381
0 7 12 1709 2166 3418 3723 4887 5770 6043 6069 6431
2481 3379 4650 4900 4919 5060 5410 5425 6056 6173 6283 6386
15 814 854 1871 2934 3387 3915 5180 5303 5442 5581 5665
146 1882 3076 4458 4848 5252 5602 5778 5821 6213 6251 6401
2 947 1419 1566 3437 3646 4615 4634 4735 5819 5943 6280
1231 2309 2920 4158 4185 4298 4711 5082 5757 5762 6204 6209
257 297 337 2783 3230 4134 4480 4749 5295 5689 5921 6202
1436 2151 2629 3217 3930 4078 5386 5799 5906 6146 6226 6366
133 530 2448 4745 5000 5020 5224 5273 6211 6266 6431 6453
13 2644 3895 3898 4485 4722 5142 5462 5951 6031 6084 6351
6 3000 3873 3995 4680 5158 5504 5692 5755 6255 6338 6359
166 465 1658 2549 2941 4244 5071 5149 5452 5874 5939 6038
2309 2937 4282 4628 5113 5454 5731 5825 6021 6171 6402 6972
3 1077 2116 2426 2830 4853 5066 5571 5850 5916 6389 6421
817 1608 2229 2925 3281 4393 5042 5058 5377 5464 5588 6448
1848 3871 4381 4776 5366 5578 5648 6143 6389 6434 6465 6473
1263 1616 3150 3497 3759 4078 5530 5665 5694 5913 6397 6420
11 813 2185 2795 3349 4652 4678 5078 5504 6011 6286 6387
3060 3161 4584 4996 5143 5542 5697 5937 6141 6155 6342 6445
1638 2333 2632 3450 3505 3911 4399 4454 5499 5860 6044 6360
650 1744 4517
5772 6071 6471
3582 3622 5776
6153 6380 6446
3977 5932 6447
2071 4597 4891
11 1428 3776
1111 3874 5048
1410 2144 4445
4681 5481 6462
4044 5037 5497
2716 2891 6411
3299 4384 6224
1843 6087 6400
4664 5009 5856
1548 4383 5055
3172 4190 6373
5899 6443 6470
2572 3647 6240
1295 2158 6466
5604 6269 6368
3 5551 6454
3325 5797 6261
666 1397 5538
3069 4274 6410
4042 5992 6437
743 3075 3447
1344 2725 6386
283 2808 6303
2 4627 4632
26 1565 4000
4012 4946 6472
1629 6158 6467
6300 6351 6376
2969 4344 4440
2317 3115 4832
2099 5263 6285
2409 5868 5997
3752 4200 6350
3125 5841 6142
1 2249 6328
16 2525 6379
3198 5269 5960
4 1705 2069
990 4948 5520
1669 3836 4521
1765 4110 6454
9 1373 6387
1969 2405 6368
623 1428 3946
3111 6380 6436
1861 5611 5934
9 2444 3081
5 5508 6317
3184 4988 5995
1060 4803 6400
5021 5826 6289
1608 4754 5648
4702 6391 6421
3899 4811 6128
927 2286 5313
4123 6181 6453
2893 4150 5261
605 4332 5094
17 3518 6358
2858 6126 6478
15 1316 6465
2 2032 2983
5249 6340 6427
5 6003 6200
4478 6315 6420
5158 6390 6447
2598 3229 5399
3747 6424 6446
1412 2453 6332
5256 5715 6455
2137 3421 4368
15 3880 5245
17 3156 5638
3227 3798 6230
2094 3129 6458
1412 5573 5932
175 1182 6304
3555 6407 6463
583 1654 6339
14 6261 6449
3553 5383 5679
2092 2744 4153
0 4466 6472
11 3840 4354
17 5457 6222

1467 6083 6220
3449 3858 6337
3782 5318 6426
417 5038 5790
3571 5638 5873
6117 6241 6476
1898 5680 6219
3235 3817 6429
2095 4194 6224
2 4092 6448
5 6330 6383
285 5075 6334
10 505 2867
1183 5956 6466
839 4716 6471
984 3254 6432
1501 4790 6465
8 1457 1707
1660 1969 6438
4349 6182 6305
1423 3848 5490
1651 2969 6345
344 4164 6298
2397 6027 6274
2233 2778 6161
13 1778 2977
9 1916 3377
0 3 6190
395 4893 6394
3512 4098 6400
3490 6281 6473
12 1359 6465
4202 5179 6412
3007 3542 4271
2400 3350 6351
7 5490 5716
4695 5231 6266
777 6292 6402
919 4851 6367
6 644 3893
5386 6190 6434
17 169 4896.

An eighth data processing apparatus or data processing method of the present technology includes a decoding unit configured to decode or a decoding step of decoding an LDPC (Low Density Parity Check) code having a code length of 64800 bits and a code rate of 27/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 658 706 898 1149 2577 2622 2772 3266 3329 5243 6079 6271
289 784 1682 3584 3995 4821 4856 5063 5974 6168 6437 6453
658 1426 2043 2065 2986 4118 4284 5394 5944 5477 5727 6018
641 928 1225 2841 4052 4840 4992 5268 5533 6249 6461 6475
2312 2917 3713 3849 4059 4241 4610 5440 5727 6101 6397 6444
1165 1592 1891 2154 3981 4817 5181 5798 5788 6012 6266 6350
13 2758 3069 4233 4697 5100 5279 5677 5919 5969 6280 6422
818 1500 2125 2340 3774 4707 4901 5170 5744 6008 6316 6353
857 3054 3409 3496 3704 4868 5326 6211 6292 6356 6367 6381
0 7 12 1709 2166 3418 3723 4887 5770 6043 6069 6431
2481 3379 4650 4900 4919 5060 5410 5425 6056 6173 6283 6386
15 814 854 1871 2934 3387 3915 5180 5303 5442 5581 5665
146 1882 3076 4458 4848 5252 5602 5778 5821 6213 6251 6401
2 947 1419 1566 3437 3646 4615 4634 4735 5819 5943 6280
1231 2309 2920 4158 4185 4298 4711 5082 5757 5762 6204 6209
257 297 337 2783 3230 4134 4480 4749 5295 5689 5921 6202
1436 2151 2629 3217 3930 4078 5386 5799 5906 6146 6226 6366
133 530 2448 4745 5000 5020 5224 5273 6211 6266 6431 6453
13 2644 3895 3898 4485 4722 5142 5462 5951 6031 6084 6351
6 3000 3873 3995 4680 5158 5504 5692 5755 6255 6338 6359
166 465 1658 2549 2941 4244 5071 5149 5452 5874 5939 6038
2309 2937 4282 4628 5113 5454 5731 5825 6021 6171 6402 6472
3 1077 2116 2426 2830 4853 5066 5571 5850 5916 6389 6421
817 1608 2229 2925 3281 4393 5042 5058 5377 5464 5588 6448
1848 3871 4381 4776 5366 5578 5648 6143 6389 6434 6465 6473
1263 1616 3150 3497 3759 4078 5530 5665 5694 5913 6397 6420
11 813 2185 2795 3349 4652 4678 5078 5504 6011 6286 6381
3060 3161 4584 4996 5143 5542 5697 5937 6141 6155 6342 6445
1638 2333 2632 3450 3505 3911 4399 4454 5499 5860 6044 6360
650 1744 4517
5772 6071 6471
3582 3622 5776
6153 6380 6446
3977 5932 6447
2071 4597 4891
11 1428 3776
1111 3874 5048
1410 2144 4445
4681 5481 6462
4044 5037 5497
2716 2891 6411
3299 4384 6224
1843 6087 6400
4664 5009 5856
1548 4383 5055
3172 4190 6373
5899 6443 6970
2572 3647 6240
1295 2158 6466

5604 6269 6368
3 5551 6454
3325 5797 6261
666 1397 5538
3069 4274 6410
4042 5992 6437
743 3075 3447
1344 2725 6386
283 2808 6303
2 4627 4632
26 1565 4000
4012 4946 6472
1629 6158 6467
6300 6351 6376
2969 4344 4490
2317 3115 4832
2099 5263 6285
2409 5868 5997
3752 4200 6350
3125 5841 6192
1 2249 6328
16 2525 6379
3198 5269 5960
4 1705 2069
990 4948 5520
1664 3836 4521
1765 4110 6454
9 1373 6387
1969 2405 6368
623 1428 3946
3111 6380 6436
1861 5611 5934
9 2444 3081
5 5508 6317
3184 4988 5995
1060 4803 6400
5021 5826 6289
1608 4754 5648
4702 6391 6421
3899 4811 6128
927 2286 5313
4123 6181 6453
2893 4150 5261
605 4332 5094
17 3518 6358
2858 6126 6478
15 1316 6465
2 2032 2983
5249 6340 6427
5 6003 6200
4478 6315 6420
5158 6390 6447
2598 3229 5399
3747 6424 6446
1412 2453 6332
5256 5715 6455
2137 3421 4368
15 3880 5245
17 3156 5638
3227 3798 6230
2094 3129 6458
1412 5573 5932
175 1182 6304
3555 6407 6463
583 1654 6339
14 6261 6449
3553 5383 5679
2092 2744 4153
0 4466 6472
11 3840 4354
17 5457 6222
1467 6083 6220
3449 3858 6337
3782 5318 6426
417 5038 5790
3571 5638 5873
6117 6241 6476
1898 5680 6219
3235 3817 6429
2095 4194 6224
2 4092 6448
5 6330 6383
285 5075 6334
10 505 2867
1183 5956 6466
839 4716 6471
984 3254 6432
1501 4790 6465
8 1457 1707
1660 1969 6438
4349 6182 6305
1423 3848 5490
1651 2969 6345
344 4164 6298
2397 6027 6274
2233 2778 6161
13 1778 2977
9 1916 3377
0 3 6190
395 4893 6394
3512 4098 6400
3490 6281 6473
12 1359 6465
4202 5179 6412
3007 3542 4271
2400 3350 6351
7 5490 5716
4695 5231 6266
777 6292 6402
919 4851 6367
6 644 3893
5386 6190 6434
17 169 4896.

A ninth data processing apparatus or data processing method of the present technology includes an encoding unit configured to encode or an encoding step of encoding information bits into an LDPC (Low Density Parity Check) code having a code length of 64800 bits and a code rate of 28/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 85 314 1602 1728 1929 2295 2729 2924 3779 4054 4276
918 1378 1838 1903 2399 2524 2937 3615 3740 4140 4213
1361 1430 2639 2648 2910 3418 3511 3543 4177 4209 4248

472 1143 1318 1545 1830 2228 2249 2256 3626 3839 3991
226 1401 2154 2318 2851 3317 3468 3944 3983 4047 4093
490 1145 1247 1851 2671 2776 3152 3229 3345 3758 3786
522 1393 1473 2196 2707 3052 3398 3814 3827 4148 4301
417 1982 2176 2336 2459 2806 3005 3771 3870 4080 4243
112 1040 1596 1621 1685 2118 2571 3359 3945 4034 4171
646 1705 2181 2439 2808 2851 2987 3044 3494 4049 4312
6 11 115 245 663 1773 2624 3444 3601 3952 4246
11 541 1020 1326 2259 2347 2750 2861 3328 3428 4126
515 941 1233 1804 2295 2528 3265 3826 4002 4022 4224
46 484 679 1949 2342 2929 3555 3860 3918 4068 4113
1832 2023 2279 2376 2965 3278 3318 3549 3640 3843 3910
241 943 1222 1583 1637 2745 3338 4080 4086 4203 4300
11 1419 1841 2398 2920 3409 3703 3768 3878 4052 4254
878 2049 2123 2431 2657 2704 3135 3342 3728 4141 4162
16 837 1267 1410 2100 3026 3099 3107 4042 4129 4157
133 646 1367 1394 2118 2311 2676 2956 3195 3536 3657
698 1444 2129 2432 2494 2793 2947 3852 3985 4254 4319
11 1076 1618 1995 2332 2743 2934 3009 3565 4169 4188
14 20 808 2629 2681 3090 3491 3835 4017 4068 4083
433 1386 2416 2570 2950 3611 3869 3969 4248 4251 4316
384 1292 1534 2610 2617 3559 3638 3964 4131 4293 4313
271 564 1719 2288 2597 2674 3429 3455 3793 4074 4286
133 190 815 955 1485 2000 2860 3000 3734 4013 4287
559 771 1762 2537 2764 2816 3186 3806 3933 4224 4271
11 733 1198 1735 1856 2668 2754 3216 4070 4113 4311
4 806 1832 2047 2058 2729 3387 3793 3833 4005 4319
506 1956 2339 3069 3343 3442 3889 3939 4013 4212 4278
2038 3980 4313
64 2373 4080
800 1535 4166
1030 3759 4002
1687 3269 4225
1219 2632 3878
719 2916 4277
1261 1930 3459
777 1568 1914
4 397 3290
10 3451 4115
3629 3885 4155
2652 3668 4026
135 3172 4319
1426 1970 3657
199 1268 2064
570 845 2761
41 1067 3498
1588 2482 2750
1615 2013 2715
121 1812 2588
10 992 1082
1929 4225 4279
6 1967 3760
593 1812 4107
891 2146 4158
924 2282 3585
592 2971 9235
260 3493 9313
2423 3180 3449
2042 3118 3625
2877 3064 3882
7 2139 4316
4 7 2954
1398 3947 4272
3675 4253 4318
1561 1977 2432
2531 4192 4209
1032 1102 4268
75 1718 3438
925 1073 4171
2124 2762 4148
4 3455 4069
3 1279 3382
1277 1746 3969
2727 3127 4230
584 1108 3454
9 2057 3061
1608 4103 4310
2673 3164 3713
1379 4072 4318
950 3447 4146
2509 4255 4296
819 1352 3371
3562 3865 4041
940 1217 3607
114 2544 4310
4 2178 4213
2035 4246 4251
272 1236 2733
953 2762 4115
1853 3496 4309
1119 3740 4318
2051 4058 4317
0 3162 4207
2389 4034 4111
4 3395 4301
3716 4089 4198
6 4272 4311
1 4 1854
4238 4299 4305
7 10 3737
11 3764 4296
297 1912 4117
1087 1796 4056
2153 3882 4030
962 4043 4203
243 3841 4308
2183 3886 4216
943 1974 2897
278 3224 3933
3 4196 4295
3409 4301 4315
2 2176 3214
462 3203 4008
478 2178 4202
3593 3825 4216
115 2796 4225
3827 4196 4251
1375 4301 4306
296 407 2055
688 3913 4281
3446 3840 4314

1073 3444 4146
1556 2761 3391
2 3543 4264
1378 3347 4305
847 1952 2745
1 1743 4042
2087 3048 4254
1010 4073 4132
2610 4129 4152
4106 4120 4313
7 4282 4304
3885 4227 4319
1235 4105 4195
1700 2332 4224
9 3750 4282
1539 4013 4310
3734 3834 4011
1397 2758 3645
7 1000 2984
11 3433 4068
1139 1800 3352
8 546 2561
1 4209 4239
2366 4063 4282
279 2524 2533
657 1913 4006
2322 2623 2960
758 803 2304
9 13 4241
3887 4299 4318
2612 3830 4230
1300 1596 2155
3622 3671 4230
2491 3722 3977
735 3812 4201
3204 3796 4317
2727 4292 4305
1062 2676 4255
2777 3131 4286
2518 3352 3937
4225 4255 4317
3644 3822 4311
1853 3754 4094
599 2608 3276.

A tenth data processing apparatus or data processing method of the present technology includes a decoding unit configured to decode or a decoding step of decoding an LDPC (Low Density Parity Check) code having a code length of 64800 bits and a code rate of 28/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 85 314 1602 1728 1929 2295 2729 2924 3779 4054 4276
918 1378 1838 1903 2399 2524 2937 3615 3740 4140 4213
1361 1430 2639 2648 2910 3418 3511 3543 4177 4209 4248
472 1143 1318 1545 1830 2228 2249 2256 3626 3839 3991
226 1401 2154 2318 2851 3317 3468 3944 3983 4047 4093
490 1145 1247 1851 2671 2776 3152 3229 3345 3758 3786
522 1393 1473 2196 2707 3052 3398 3814 3827 4148 4301
417 1982 2176 2336 2459 2806 3005 3771 3870 4080 4243
112 1040 1596 1621 1685 2118 2571 3359 3945 4034 4171
646 1705 2181 2439 2808 2851 2987 3044 3494 4049 4312
6 11 115 245 663 1773 2624 3444 3601 3952 4246
11 541 1020 1326 2259 2347 2750 2861 3328 3428 4126
515 941 1233 1804 2295 2528 3265 3826 4002 4022 4224
46 484 679 1949 2342 2929 3555 3860 3918 4068 4113
1832 2023 2279 2376 2965 3278 3318 3549 3640 3843 3910
241 943 1222 1583 1637 2745 3338 4080 4086 4203 4300
11 1419 1841 2398 2920 3409 3703 3768 3878 4052 4254
878 2049 2123 2431 2657 2704 3135 3342 3728 4141 4162
16 837 1267 1410 2100 3026 3099 3107 4042 4129 4157
133 646 1367 1394 2118 2311 2676 2956 3195 3536 3657
698 1444 2129 2432 2494 2793 2947 3852 3985 4254 4319
11 1076 1618 1995 2332 2743 2934 3009 3565 4169 4188
14 20 808 2629 2681 3090 3491 3835 4017 4068 4083
433 1386 2416 2570 2950 3611 3869 3969 4248 4251 4316
384 1292 1534 2610 2617 3559 3638 3964 4131 4293 4313
271 564 1719 2288 2597 2674 3429 3455 3793 4074 4286
133 190 815 955 1485 2000 2860 3000 3734 4013 4287
559 771 1762 2537 2764 2816 3186 3806 3933 4224 4271
11 733 1198 1735 1856 2668 2754 3216 4070 4113 4311
4 806 1832 2047 2058 2724 3387 3793 3833 4005 4319
506 1456 2339 3069 3343 3442 3889 3939 4013 4212 4278
2038 3980 4313
64 2373 4080
800 1535 4166
1030 3759 4002
1687 3269 4225
1219 2632 3878
719 2916 4277
1261 1930 3459
777 1568 1914
4 397 3290
10 3451 4115
3629 3885 4155
2652 3668 4026
135 3172 4319
1426 1970 3657
199 1268 2064
570 845 2761
41 1067 3498
1588 2482 2750
1615 2013 2715
121 1812 2588
10 992 1082
1929 4225 4279
6 1967 3760
593 1812 4107
891 2146 4158
924 2282 3585
592 2971 4235
260 3493 4313
2423 3180 3449

2092 3118 3625
28/7 3064 3882
7 2139 4316
4 7 2954
1398 3947 4272
3675 4253 4318
1561 1977 2432
2531 4192 4209
1032 1102 4268
75 1718 3438
925 1073 4171
2124 2762 4148
4 3455 4069
3 1279 3382
1277 1746 3969
2727 3127 4230
584 1108 3454
9 2057 3061
1608 4103 4310
2673 3164 3713
1379 4072 4318
950 3447 4146
2509 4255 4296
819 1352 3371
3562 3865 4041
940 1217 3607
114 2544 4310
4 2178 4213
2035 4246 4251
272 1236 2733
953 2762 4115
1853 3496 4309
1119 3740 4318
2051 4058 4317
0 3162 4207
2389 4034 4111
4 3395 4301
3716 4089 4198
6 4272 4311
1 4 1854
4238 4299 4305
7 10 3737
11 3764 4296
297 1912 4117
1087 1796 4056
2153 3882 4030
962 4043 4203
243 3841 4308
2183 3886 4216
943 1974 2897
278 3224 3933
3 4196 4245
3409 4301 4315
2 2176 3214
462 3203 4008
478 2178 9202
3593 3825 4216
115 2796 4225
3827 4196 4251
1375 4301 4306
296 407 2055
688 3913 4281
3446 3840 4314
1073 3444 4146
1556 2761 3391
2 3543 4264
1378 3347 4305
847 1952 2745
1 1743 4042
2087 3048 4254
1010 4073 4132
2610 4129 4152
4106 4120 4313
7 4282 4304
3885 4227 4319
1235 4105 4195
1700 2332 4224
9 3750 4282
1539 4013 4310
3734 3834 4011
1397 2758 3645
7 1000 2984
11 3433 4068
1139 1800 3352
8 546 2561
1 4209 4239
2366 4063 4282
279 2524 2533
657 1913 4006
2322 2623 2960
758 803 2304
9 13 4241
3887 4299 4318
2612 3830 4230
1300 1596 2155
3622 3671 4230
2491 3722 3977
735 3812 4201
3204 3796 4317
2727 4292 4305
1062 2676 4255
2777 3131 4286
2518 3352 3937
4225 4255 4317
3644 3822 4311
1853 3754 4094
599 2608 3276.

An eleventh data processing apparatus or data processing method of the present technology includes an encoding unit configured to encode or an encoding step of encoding information bits into an LDPC (Low Density Parity Check) code having a code length of 64800 bits and a code rate of 29/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 212 499 911 940 1392
316 563 1527 2006 2077
2 1906 2043 2112 2123
537 901 1582 1812 1955
5 978 1280 1933 2145
5 2035 2044 2108 2121
5 939 1874 1974
4 1069 1758
694 2096 2106
1129 1511 1659
1564 2089 2159
2 1605 2004

474 1341 2003
103 2128 2150
1656 1993 2153
1881 2122 2138
1088 1968 2141
1 298 2073
1042 1724 2137
1253 1758 2145
1209 1566 2123
1466 2116 2155
43 2006 2049
592 1806 1865
3 143 2149
1158 1448 2002
1422 2152 2157
485 2119 2150
371 1831 2086
204 2042 2151
174 544 974
1469 1795 1995
13 708 1683
5 1144 2030
486 1309 1576
165 2030 2147
504 2073 2126
263 565 1798
239 861 1861
862 1610 1716
1346 1971 2128
5 804 1399
2139 2144 2155
4 2136 2159
1485 2059 2158
50 1091 1332
373 1730 2092
59 1086 1401
1166 1781 2065
213 2080 2154
492 1905 2110
1 1517 2126
722 1927 2196
885 991 1842
3 278 1806
967 1354 1907
1697 2047 2156
684 1924 2151
2077 2122 2157
978 2054 2135
435 2034 2150
136 1997 2125
1504 1850 2153
1404 1989 2119
109 1001 2152
780 1473 2150
198 1723 2062
927 2087 2138
1 666 2018
1293 1960 2141
1648 2033 2144
681 1578 1999
1342 2022 2157
949 1907 1994
138 1261 2135
3 608 982
1211 1501 2150
201 228 1186
1295 2089 2132
267 556 2142
801 2052 2122
1382 2135 2155
572 1503 1704
346 1183 2129
1926 2090 2149
1337 2133 2140
5 1806 2125
1383 1628 2068
1193 1626 2138
1999 2115 2146
217 274 2021
3 816 2024
1380 2138 2157
607 1385 2110
184 1195 2063
0 1767 2108
0 2081 2097
1135 2036 2128
1748 2001 2125
797 1552 1926
1046 1890 2128
291 1859 2131
1075 1214 1762
60 549 1943
581 1197 1232
1009 2026 2136
884 2002 2117
1 576 1449
519 1968 2114
5 1489 1630
1926 2037 2158
2 1249 2159
0 811 2114
2055 2152 2159
802 1911 2120
204 1033 2033
1840 2012 2037
1746 2111 2155
1098 1835 2157
2 1492 1831
353 1537 1830
375 1264 2036
2 1638 2035
1096 1971 2021
950 1809 1884
253 467 1600
5 379 1833
4 1698 1970
37 1637 2136
1174 1460 2157
612 1827 2134
1783 1802 1949
2029 2118 2151
1984 2030 2141
2 347 462
862 1693 2121
2 895 1401
4 1901 2100
1183 1674 2069
1575 1940 2158
5 1904 2097
1044 2029 2092
1441 1943 2150
0 3 1300
2 516 1735
503 1342 2019

1421 1914 2131
28 986 1467
1270 1851 1988
481 1265 2016
530 546 909
653 1909 2158
1805 2002 2149
2 1359 1518
1640 2104 2129
1656 2109 2155
1307 1762 2114
565 1647 2118
1690 2081 2156
1 300 1995
5 1681 2151
1602 2050 2156
1 1960 2153
2061 2070 2138
1581 1673 2142
1048 1142 2101
1867 1991 2055
856 1640 1878
251 561 966
343 1816 2114
3 966 2045
1885 1922 2158
57 556 2059
732 1724 2147.

A twelfth data processing apparatus or data processing method of the present technology includes a decoding unit configured to decode or a decoding step of decoding an LDPC (Low Density Parity Check) code having a code length of 64800 bits and a code rate of 29/30 on the basis of a parity check matrix of the LDPC code, wherein the LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 212 499 911 940 1392
316 563 1527 2006 2077
2 1906 2043 2112 2123
537 901 1582 1812 1955
5 978 1280 1933 2145
5 2035 2044 2108 2121
5 939 1874 1974
4 1069 1758
694 2096 2106
1129 1511 1659
1564 2089 2159
2 1605 2004
474 1341 2003
103 2128 2150
1656 1993 2153
1881 2122 2138
1088 1968 2141
1 298 2073
1042 1724 2137
1253 1758 2145
1209 1566 2123
1466 2116 2155
43 2006 2049
592 1806 1865
3 143 2149
1158 1448 2002
1422 2152 2157
485 2119 2150
371 1831 2086
204 2042 2151
174 544 974
1469 1795 1995
13 708 1683
5 1144 2030
486 1309 1576
165 2030 2147
504 2073 2126
263 565 1798
239 861 1861
862 1610 1716
1346 1971 2128
5 804 1399
2139 2144 2155
4 2136 2159
1485 2059 2158
50 1091 1332
373 1730 2092
59 1086 1401
1166 1781 2065
213 2080 2154
492 1905 2110
1 1517 2126
722 1427 2146
885 991 1842
3 278 1806
967 1354 1907
1697 2047 2156
684 1924 2151
2077 2122 2157
978 2054 2135
435 2034 2150
136 1997 2125
1504 1850 2153
1404 1989 2119
109 1001 2152
780 1473 2150
198 1723 2062
927 2087 2138
1 666 2018
1293 1960 2141
1648 2033 2144
681 1578 1999
1342 2022 2157
949 1907 1994
138 1261 2135
3 608 982
1211 1501 2150
201 228 1186
1295 2089 2132
267 556 2142
801 2052 2122
1382 2135 2155
572 1503 1704
346 1183 2129
1926 2090 2149
1337 2133 2140
5 1806 2125
1383 1628 2068
1193 1626 2138
1999 2115 2146
217 274 2021
3 816 2024

1380 2138 2157
607 1385 2110
184 1195 2063
0 1767 2108
0 2081 2097
1135 2036 2128
1748 2001 2125
797 1552 1926
1046 1890 2128
291 1859 2131
1075 1214 1762
60 549 1943
581 1197 1232
1009 2026 2136
884 2002 2117
1 576 1499
519 1968 2114
5 1489 1630
1926 2037 2158
2 1249 2159
0 811 2114
2055 2152 2159
802 1911 2120
204 1033 2033
1840 2012 2037
1746 2111 2155
1098 1835 2157
2 1492 1831
353 1537 1830
375 1264 2036
2 1638 2035
1096 1971 2021
950 1809 1884
253 467 1600
5 379 1833
4 1698 1970
37 1637 2136
1174 1460 2157
612 1827 2134
1783 1802 1949
2029 2118 2151
1984 2030 2141
2 347 462
862 1693 2121
2 895 1401
4 1901 2100
1183 1674 2069
1575 1940 2158
5 1904 2097
1044 2029 2092
1441 1943 2150
0 3 1300
2 516 1735
503 1342 2019
1421 1914 2131
28 986 1467
1270 1851 1988
481 1265 2016
530 546 909
653 1909 2158
1805 2002 2149
2 1359 1518
1640 2104 2129
1656 2109 2155
1307 1762 2114
565 1647 2118
1690 2081 2156

1 300 1995
5 1681 2151
1602 2050 2156
1 1960 2153
2061 2070 2138
1581 1673 2142
1048 1142 2101
1867 1991 2055
856 1640 1878
251 561 966
343 1816 2114
3 966 2045
1885 1922 2158
57 556 2059
732 1724 2147.

In the present technology, information bits are encoded into an LDPC (Low Density Parity Check) code having a code length of 64800 bits and a code rate of 24/30, 25/30, 26/30, 27/30, 28/30, or 29/30 on the basis of a parity check matrix of the LDPC code.

In the present technology, furthermore, an LDPC (Low Density Parity Check) code having a code length of 64800 bits and a code rate of 24/30, 25/30, 26/30, 27/30, 28/30, or 29/30 is decoded on the basis of the parity check matrix of an LDPC code.

The LDPC code includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns.

A parity check matrix initial value table with a code rate of 24/30 includes 1504 2103 2621 2840 3869 4594 5246 6314 7327 7364 10425 11934 12898 12954

27 1903 3923 4513 7812 8098 8428 9789 10519 11345 12032 12157 12573 12930

17 191 660 2451 2475 2976 3398 3616 5769 6724 8641 10046 11552 12842

13 1366 4993 6468 7689 8563 9131 10012 10914 11574 11837 12203 12715 12946

432 872 2603 3286 3306 3385 4137 5563 7540 9339 9948 12315 12656 12929

1113 1394 4104 4186 7240 8827 11522 11833 12359 12363 12629 12821 12904 12946

14 441 1432 1677 2432 8981 11478 11507 12599 12783 12793 12912 12922 12943

1579 1806 7971 8586 9845 10357 11600 12007 12020 12339 12576 12817 12830 12904

20 546 3672 5538 6944 8052 8781 9743 12269 12393 12418 12549 12555 12718

1 3540 4397 5011 6626 8617 9587 10360 10602 11402 11983 12068 12495 12838

30 1572 4908 7421 8041 8910 8963 11005 11930 12240 12340 12467 12892 12933

33 2060 3907 4215 5545 8306 8655 8743 8806 9315 9364 10685 11954 12959

1338 2596 4876 5207 9555 10421 10929 11648 11739 12375 12416 12643 12742 12754

9469 10544 10932 11250 11426 11582 11846 12139 12202 12210 12356 12378 12873 12929

2681 3337 3616 6113 7078 8167 8624 9697 10908 11781 11855 12095 12475 12659

28 4086 5432 6555 6848 7368 8794 11483 11572 12414 12816 12894 12936 12957

5 5044 5572 9023 9192 9589 9979 10009 10855 10991 11715 12314 12610 12945
17 272 602 5681 6530 9572 9886 11061 11495 12238 12265 12483 12885 12955
22 2245 4282 4469 5007 6650 6733 10151 10401 11571 12004 12261 12805 12844
23 3270 4468 8621 9662 11240 11934 12091 12444 12691 12717 12858 12888 12917
740 1519 4923 6191 7878 8350 9293 10779 11020 11287 11630 12792 12862 12920
12 28 3584 6072 7079 8075 10477 11130 11383 11780 12341 12667 12818 12927
14 118 5283 5382 8301 9097 9413 9664 10437 10701 11124 12685 12730 12734
32 1426 3078 4325 5353 7780 9042 9928 10077 10377 10679 11191 11750 12611
1 669 3831 3980 5381 5412 6552 8453 9435 10243 11546 11821 11987 12807
232 483 919 1232 2156 2396 2990 3774 8539 8704 8819 10810 11868 12634
2381 7309 9334
348 6494 12623
4872 6257 11090
7 11970 11985
6615 12788 12855
1173 5269 12647
1994 7738 8116
17 4828 9175
2329 6034 12642
1254 2366 5013
2984 5078 5664
7423 10265 11528
1656 8526 8716
22 287 2837
18 100 3079
299 3171 12169
33 5920 11144
1286 3650 9309
2283 8809 12588
3199 8242 9081
2507 6846 8113
5211 8722 12689
1064 2592 8659
6136 6925 12958
1256 12789 12932
4274 8045 8788
1824 3209 6926
11 8899 12669
6249 6338 8730
641 9679 12831
3459 9876 11185
3226 6148 8173
9078 12126 12771
10907 11278 12731
3392 4020 12838
2814 11588 12909
6063 9214 11519
6064 6827 12683
1610 2452 6582
903 6289 8074
4592 8138 12952
2587 6271 9945
2733 11844 11893
581 4601 10020
14 5597 6049
343 3582 5931
5263 6521 12846
1394 2457 5251
11 4627 12747
2650 10366 12390
6285 11893 12062
10143 12892 12956
8448 11917 12330
4209 11693 12356
1529 2360 9086
5389 8148 10224
64 4876 12862
9483 12659 12887
3587 6767 12478
3122 5245 9044
3267 10118 11466
1347 3857 6705
9384 9576 11971
1366 8708 10758
412 4249 12863
1676 10488 11850
17 1605 2455
14 111 6045
11368 12919 12953
10588 11530 12937
4549 5143 12218
3088 4185 11674
23 2554 7823
6615 9291 9863
2229 3629 10855
3818 5509 12764
2740 11525 12914
8297 8611 12948
3606 11104 12920
5097 10412 12759
6502 7266 12072
5425 5490 10728
22 73 8462
32 12439 12657
8483 9540 10430
7275 7377 7420
5748 9726 12356
5672 6150 9156
28 3527 5857
520 7099 11335
405 6173 12865
5847 12843 12934
4289 7679 10386
2950 8021 12938
8844 11214 12955
2130 10760 12665
734 4790 12940
8 6991 12772
19 8205 11289
12 1440 9077
8670 8837 12951
3531 9166 12937
15 8901 8929
838 10114 11740
2648 9959 10934
323 7499 12877
5505 5659 11395
6627 12709 12933
364 1976 12888
8213 9124 12793
9588 10088 11108
299 890 11634
7368 7598 11602
28 4669 12585

15 27 12474
1426 3614 4205
30 2087 11147
6226 6259 12941.

A parity check matrix initial value table with a code rate of 25/30 includes 1860 2354 3967 4292 4488 5243 5373 5766 8378 9111 10468 10505 10774
24 2266 2380 3282 4255 4779 8729 9140 9566 10102 10661 10711 10797
605 650 1108 1669 2251 3133 5847 6197 6902 7545 10521 10600 10773
1016 1428 1612 2335 3102 3810 4926 5953 9964 10246 10569 10734 10784
3195 6308 8029 9030 9397 9461 9833 10239 10499 10675 10736 10757 10773
2 27 3641 4566 7332 9318 9323 9916 10365 10438 10561 10581 10750
2405 2458 4820 6232 6254 6347 7139 7474 8623 8779 8798 10747 10794
3164 4736 6474 7162 7420 7517 7835 8238 8412 8489 9006 10113 10440
20 2372 5561 5649 6907 8393 8505 9181 9567 9595 10388 10483 10714
1071 2899 5135 5780 6616 7111 7773 8582 9015 9912 10139 10387 10768
292 2833 5490 6011 6136 6713 7517 9096 10128 10328 10407 10525 10736
1044 3711 4421 5140 5207 8118 8749 8884 9205 10359 10372 10746 10784
3241 5696 6440 7240 7419 8613 8878 9593 9959 9997 10401 10404 10754
3133 4647 5912 6065 6694 7208 7346 8227 9465 9739 10452 10516 10770
2254 6444 7449 8095 8120 8710 9030 9162 9643 9968 10101 10571 10678
918 1445 2217 4262 4623 5401 5749 7446 7907 9539 10125 10514 10726
6 1341 1788 3105 4359 5263 5470 7552 8249 8644 10609 10674 10733
1994 3000 3151 3173 7742 8335 8438 8741 9232 9296 9817 10023 10257
467 1674 3016 3950 4055 5399 6688 7113 7273 8658 8702 9642 10545
2007 2541 3125 7380 7550 8122 8501 8665 9882 10403 10519 10594 10696
334 587 709 1540 2023 2876 6216 8768 9328 9481 10424 10507 10779
2165 4185 4306 5019 6961 7386 8447 9082 9837 10091 10461 10559 10570
7 903 2948 6312 6654 7738 7980 8312 9104 9743 10070 10278 10406
3047 3154 4160 4378 5461 8711 8809 9040 9173 9252 9537 9995 10735
2018 2355 3828 3854 6201 6696 8313 8459 8550 8833 9586 10202 10224
1402 1908 4286 4660 6029 6115 6737 7538 9495 9517 10055 10509 10644
3442 3589 3868 5051 5322 5580 8725 9046 9170 10041 10613 10681 10689
2733 7826 10622
3597 4753 7086
1394 7297 10264
2848 7502 10304
1649 2405 10783
647 2911 9069
2572 4006 7508
1361 8887 10103
3681 4023 9090
1496 4962 6325
2016 5120 9747
3954 5260 8568
3364 8719 10035
4208 4806 9973
29 3361 3490
1835 2317 10436
7312 8177 9041
7728 8097 10761
2109 7902 9685
5424 8943 9436
4369 7643 9152
2240 10140 10528
3435 6124 10604
8962 9357 10040
26 1931 8629
8275 10455 10643
8 24 4952
3995 6456 10633
28 10300 10337
4894 9286 9429
5587 6721 9120
1859 9198 9762
6374 6453 7011
1319 4530 5442
1507 10711 10798
2115 3445 3641
6668 9139 10163
4038 8117 10295
1479 3403 8247
2522 2934 3562
1526 5073 9650
2136 9820 10636
4214 8464 9891
8018 10330 10610
8984 10209 10647
3414 7272 8599
4883 9077 9525
22 8173 8425
2941 6536 10126
29 6540 7361
5 3787 10468
4264 4818 6906
3903 7041 10412
6078 7661 10619
6922 9723 9890
5112 5416 6253
5925 9961 10447
9 10311 10598
8790 8814 10793
4768 5466 10664
10 10675 10766
6814 8705 10737
17 769 6692
1503 10696 10742
1285 4632 8976
4279 4973 7907
4650 4775 10785
28 729 10331
1914 5240 10723
3569 4921 9561
4 9442 10796
494 2328 9507
1717 8768 10750
9540 10599 10779

11 10075 10644
10246 10607 10753
5510 7088 9053
1347 3584 5523
7872 10596 10736
628 10592 10695
5632 5688 10627
2375 10009 10561
4169 4630 8871
2896 10038 10521
89 9695 9799
20 7563 9069
4534 10321 10697
8212 9868 10716
7485 9312 10327
234 536 6293
5515 7350 9251
283 3182 7167
2444 5378 6130
6183 8315 10726
43 4871 8347
2427 10219 10728
10 21 9448
1067 8312 8420
4793 9522 10105
4688 10536 10724
3825 7496 10709
682 8544 10449
2794 7110 10741
9279 10741 10767
2897 5442 8771
33 7957 10460
5 10393 10792
6225 10224 10798
23 9014 10786
7836 8339 8642
3476 5455 9788
1939 10251 10384
4008 7890 10450
926 2090 3804
1038 2497 10701
22 6220 8405
5153 5944 10367
7260 7726 9529
3039 8397 10665
7262 9644 10083
5531 6248 10795
7926 8248 8413
4649 8971 10182.

A parity check matrix initial value table with a code rate of 26/30 includes 142 2307 2598 2650 4028 4434 5781 5881 6016 6323 6681 6698 8125
2932 4928 5248 5256 5983 6773 6828 7789 8426 8494 8534 8539 8583
899 3295 3833 5399 6820 7400 7753 7890 8109 8451 8529 8564 8602
21 3060 4720 5429 5636 5927 6966 8110 8170 8247 8355 8365 8616
20 1745 2838 3799 4380 4418 4646 5059 7343 8161 8302 8456 8631
9 6274 6725 6792 7195 7333 8027 8186 8209 8273 8442 8548 8632
494 1365 2405 3799 5188 5291 7644 7926 8139 8458 8504 8594 8625
192 574 1179 4387 4695 5089 5831 7673 7789 8298 8301 8612 8632
11 20 1406 6111 6176 6256 6708 6834 7828 8232 8457 8495 8602
6 2654 3554 4483 4966 5866 6795 8069 8249 8301 8497 8509 8623
21 1144 2355 3124 6773 6805 6887 7742 7994 8358 8374 8580 8611
335 4473 4883 5528 6096 7543 7586 7921 8197 8319 8394 8489 8636
2919 4331 4419 4735 6366 6393 6844 7193 8165 8205 8544 8586 8617
12 19 742 930 3009 4330 6213 6224 7292 7430 7792 7922 8137
710 1439 1588 2434 3516 5239 6248 6827 8230 8448 8515 8581 8619
200 1075 1868 5581 7349 7642 7698 8037 8201 8210 8320 8391 8526
3 2501 4252 5256 5292 5567 6136 6321 6430 6486 7571 8521 8636
3062 4599 5885 6529 6616 7314 7319 7567 8024 8153 8302 8372 8598
105 381 1574 4351 5452 5603 5943 7467 7788 7933 8362 8513 8587
787 1857 3386 3659 6550 7131 7965 8015 8040 8312 8484 8525 8537
15 1118 4226 5197 5575 5761 6762 7038 8260 8338 8444 8512 8568
36 5216 5368 5616 6029 6591 8038 8067 8299 8351 8565 8578 8585
1 23 9300 4530 5426 5532 5817 6967 7124 7979 8022 8270 8437
629 2133 4828 5475 5875 5890 7194 8042 8345 8385 8518 8598 8612
11 1065 3782 4237 4993 7104 7863 7904 8104 8228 8321 8383 8565
2131 2274 3168 3215 3220 5597 6347 7812 8238 8354 8527 8557 8614
5600 6591 7491 7696
1766 8281 8626
1725 2280 5120
1650 3445 7652
4312 6911 8626
15 1013 5892
2263 2546 2979
1545 5873 7406
67 726 3697
2860 6443 8542
17 911 2820
1561 4580 6052
79 5269 7134
22 2410 2424
3501 5642 8627
808 6950 8571
4099 6389 7482
4023 5000 7833
5476 5765 7917
1008 3194 7207
20 495 5411
1703 8388 8635
6 4395 4921
200 2053 8206
1089 5126 5562
10 4193 7720
1967 2151 4608
22 738 3513
3385 5066 8152
440 1118 8537
3429 6058 7716

5213 7519 8382
5564 8365 8620
43 3219 8603
4 5409 5815
5 6376 7654
4091 5724 5953
5348 6754 8613
1634 6398 6632
72 2058 8605
3497 5811 7579
3846 6743 8559
15 5933 8629
2133 5859 7068
4151 4617 8566
2960 8270 8410
2059 3617 8210
544 1441 6895
4043 7482 8592
294 2180 8524
3058 8227 8373
364 5756 8617
5383 8555 8619
1704 2480 4181
7338 7929 7990
2615 3905 7981
4298 4548 8296
8262 8319 8630
892 1893 8028
5694 7237 8595
1487 5012 5810
4335 8593 8624
3509 4531 5273
10 22 830
4161 5208 6280
275 7063 8634
4 2725 3113
2279 7403 8174
1637 3328 3930
2810 4939 5624
3 1234 7687
2799 7740 8616
22 7701 8636
4302 7857 7993
7477 7794 8592
9 6111 8591
5 8606 8628
347 3497 4033
1747 2613 8636
1827 5600 7042
580 1822 6842
232 7134 7783
4629 5000 7231
951 2806 4947
571 3474 8577
2437 2496 7945
23 5873 8162
12 1168 7686
8315 8540 8596
1766 2506 4733
929 1516 3338
21 1216 6555
782 1452 8617
8 6083 6087
667 3240 4583
4030 4661 5790
559 7122 8553
3202 4388 4909

2533 3673 8594
1991 3954 6206
6835 7900 7980
189 5722 8573
2680 4928 4998
243 2579 7735
4281 8132 8566
7656 7671 8609
1116 2291 4166
21 388 8021
6 1123 8369
311 4918 8511
0 3248 6290
13 6762 7172
4209 5632 7563
49 127 8074
581 1735 4075
0 2235 5470
2178 5820 6179
16 3575 6054
1095 4564 6458
9 1581 5953
2537 6469 8552
14 3874 4844
0 3269 3551
2114 7372 7926
1875 2388 4057
3232 4042 6663
9 401 583
13 4100 6584
2299 4190 4410
21 3670 4979.

A parity check matrix initial value table with a code rate of 27/30 includes 658 706 898 1149 2577 2622 2772 3266 3329 5243 6079 6271

289 784 1682 3584 3995 4821 4856 5063 5974 6168 6437 6453

658 1426 2043 2065 2986 4118 4284 5394 5444 5477 5727 6018

641 928 1225 2841 4052 4890 4992 5268 5533 6249 6461 6475

2312 2917 3713 3849 4059 4241 4610 5440 5727 6101 6397 6444

1165 1592 1891 2154 3981 4817 5181 5748 5788 6012 6266 6350

13 2758 3069 4233 4697 5100 5279 5677 5919 5969 6280 6422

818 1500 2125 2340 3774 4707 4901 5170 5744 6008 6316 6353

857 3054 3409 3496 3704 4868 5326 6211 6292 6356 6367 6381

0 7 12 1709 2166 3418 3723 4887 5770 6043 6069 6431

2481 3379 4650 9900 4919 5060 5410 5425 6056 6173 6283 6386

15 814 854 1871 2934 3387 3915 5180 5303 5442 5581 5665

146 1882 3076 4458 4848 5252 5602 5778 5821 6213 6251 6401

2 947 1419 1566 3437 3646 9615 4639 4735 5819 5943 6280

1231 2309 2920 4158 4185 4298 4711 5082 5757 5762 6204 6209

257 297 337 2783 3230 4134 4480 4749 5295 5689 5921 6202

1436 2151 2629 3217 3930 4078 5386 5799 5906 6146 6226 6366

133 530 2448 4745 5000 5020 5224 5273 6211 6266 6431 6453
13 2644 3895 3898 4485 4722 5142 5462 5951 6031 6084 6351
6 3000 3873 3995 4680 5158 5504 5692 5755 6255 6338 6359
166 465 1658 2549 2941 4244 5071 5149 5452 5874 5939 6038
2309 2937 4282 4628 5113 5454 5731 5825 6021 6171 6402 6472
3 1077 2116 2426 2830 4853 5066 5571 5850 5916 6389 6421
817 1608 2229 2925 3281 4393 5042 5058 5377 5464 5588 6448
1848 3871 4381 4776 5366 5578 5648 6143 6389 6434 6465 6473
1263 1616 3150 3497 3759 4078 5530 5665 5694 5913 6397 6420
11 813 2185 2795 3349 4652 4678 5078 5504 6011 6286 6387
3060 3161 4584 4996 5143 5542 5697 5937 6141 6155 6342 6445
1638 2333 2632 3450 3505 3911 4399 4454 5499 5860 6044 6360
650 1744 4517
5772 6071 6471
3582 3622 5776
6153 6380 6446
3977 5932 6447
2071 4597 4891
11 1428 3776
1111 3874 5048
1410 2144 4445
4681 5481 6462
4044 5037 5497
2716 2891 6411
3299 4384 6224
1843 6087 6400
4664 5009 5856
1548 4383 5055
3172 4190 6373
5899 6443 6470
2572 3647 6290
1295 2158 6466
5604 6269 6368
3 5551 6454
3325 5797 6261
666 1397 5538
3069 4274 6410
4042 5992 6437
743 3075 3447
1344 2725 6386
283 2808 6303
2 4627 4632
26 1565 4000
4012 4946 6472
1629 6158 6467
6300 6351 6376
2969 4344 4440
2317 3115 4832
2099 5263 6285
2409 5868 5997
3752 4200 6350
3125 5841 6142
1 2249 6328
16 2525 6379
3198 5269 5960
4 1705 2069
990 4948 5520
1664 3836 4521
1765 4110 6454
9 1373 6387
1969 2405 6368
623 1428 3946
3111 6380 6436
1861 5611 5934
9 2444 3081
5 5508 6317
3184 4988 5995
1060 4803 6400
5021 5826 6289
1608 4754 5648
4702 6391 6421
3899 4811 6128
927 2286 5313
4123 6181 6453
2893 4150 5261
605 4332 5094
17 3518 6358
2858 6126 6478
15 1316 6465
2 2032 2983
5249 6340 6427
5 6003 6200
4478 6315 6420
5158 6390 6447
2598 3229 5399
3747 6424 6446
1412 2453 6332
5256 5715 6455
2137 3421 4368
15 3880 5245
17 3156 5638
3227 3798 6230
2094 3129 6458
1412 5573 5932
175 1182 6304
3555 6407 6463
583 1654 6339
14 6261 6449
3553 5383 5679
2092 2744 4153
0 4466 6472
11 3840 4354
17 5457 6222
1467 6083 6220
3449 3858 6337
3782 5318 6426
417 5038 5790
3571 5638 5873
6117 6241 6476
1898 5680 6219
3235 3817 6429
2095 4194 6224
2 4092 6448
5 6330 6383
285 5075 6334
10 505 2867
1183 5956 6466
839 4716 6471
984 3254 6432
1501 4790 6465
8 1457 1707
1660 1969 6438

4349 6182 6305
1423 3848 5490
1651 2969 6345
344 4164 6298
2397 6027 6274
2233 2778 6161
13 1778 2977
9 1916 3377
0 3 6190
395 4893 6394
3512 4098 6400
3490 6281 6473
12 1359 6465
4202 5179 6412
3007 3542 4271
2400 3350 6351
7 5490 5716
4695 5231 6266
777 6292 6402
919 4851 6367
6 644 3893
5386 6190 6434
17 169 4896.

A parity check matrix initial value table with a code rate of 28/30 includes 85 314 1602 1728 1929 2295 2729 2924 3779 4054 4276
918 1378 1838 1903 2399 2524 2937 3615 3740 4140 4213
1361 1430 2639 2648 2910 3418 3511 3543 4177 4209 4248
472 1143 1318 1545 1830 2228 2249 2256 3626 3839 3991
226 1401 2154 2318 2851 3317 3468 3944 3983 4047 4093
490 1145 1247 1851 2671 2776 3152 3229 3345 3758 3786
522 1393 1473 2196 2707 3052 3398 3814 3827 4148 4301
417 1982 2176 2336 2459 2806 3005 3771 3870 4080 4243
112 1040 1596 1621 1685 2118 2571 3359 3945 4034 4171
646 1705 2181 2439 2808 2851 2987 3044 3494 4049 4312
6 11 115 245 663 1773 2624 3444 3601 3952 4246
11 541 1020 1326 2259 2347 2750 2861 3328 3428 4126
515 941 1233 1804 2295 2528 3265 3826 4002 4022 4224
46 484 679 1949 2342 2929 3555 3860 3918 4068 4113
1832 2023 2279 2376 2965 3278 3318 3549 3640 3843 3910
241 943 1222 1583 1637 2795 3338 4080 4086 4203 4300
11 1419 1841 2398 2920 3409 3703 3768 3878 4052 4254
878 2049 2123 2431 2657 2704 3135 3342 3728 4141 4162
16 837 1267 1410 2100 3026 3099 3107 4042 4129 4157
133 646 1367 1394 2118 2311 2676 2956 3195 3536 3657
698 1444 2129 2432 2494 2793 2947 3852 3985 4254 4319
11 1076 1618 1995 2332 2743 2934 3009 3565 4169 4188
14 20 808 2629 2681 3090 3491 3835 4017 4068 4083
433 1386 2416 2570 2950 3611 3869 3969 4248 4251 4316
384 1292 1534 2610 2617 3559 3638 3964 4131 4293 4313
271 564 1719 2288 2597 2674 3429 3455 3793 4074 4286
133 190 815 955 1485 2000 2860 3000 3734 4013 4287
559 771 1762 2537 2764 2816 3186 3806 3933 4224 4271
11 733 1198 1735 1856 2668 2754 3216 4070 4113 4311
4 806 1832 2047 2058 2724 3387 3793 3833 4005 4319
506 1456 2339 3069 3343 3442 3889 3939 4013 4212 4278
2038 3980 4313
64 2373 4080
800 1535 4166
1030 3759 4002
1687 3269 4225
1219 2632 3878
719 2916 4277
1261 1930 3459
777 1568 1914
4 397 3290
10 3451 4115
3629 3885 4155
2652 3668 4026
135 3172 4319
1426 1970 3657
199 1268 2064
570 845 2761
41 1067 3498
1588 2482 2750
1615 2013 2715
121 1812 2588
10 992 1082
1929 4225 4279
6 1967 3760
593 1812 4107
891 2146 4158
924 2282 3585
592 2971 4235
260 3493 4313
2423 3180 3449
2042 3118 3625
2877 3064 3882
7 2139 4316
4 7 2954
1398 3947 4272
3675 4253 4318
1561 1977 2432
2531 4192 4209
1032 1102 4268
75 1718 3438
925 1073 4171
2124 2762 4198
4 3455 4069
3 1279 3382
1277 1746 3969
2727 3127 4230
584 1108 3459
9 2057 3061
1608 4103 4310
2673 3164 3713
1379 4072 4318
950 3447 4146
2509 4255 4296
819 1352 3371
3562 3865 4041
940 1217 3607
114 2544 4310
4 2178 4213
2035 4246 4251
272 1236 2733
953 2762 4115
1853 3496 4309
1119 3740 4318

2051 4058 4317
0 3162 4207
2389 4034 4111
4 3395 4301
3716 4089 4198
6 4272 4311
1 4 1854
4238 4299 4305
7 10 3737
11 3764 4296
297 1912 4117
1087 1796 4056
2153 3882 4030
962 4043 4203
243 3841 4308
2183 3886 4216
943 1974 2897
278 3224 3933
3 4196 4245
3409 4301 4315
2 2176 3214
462 3203 4008
478 2178 4202
3593 3825 4216
115 2796 4225
3827 4196 4251
1375 4301 4306
296 407 2055
688 3913 4281
3446 3840 4314
1073 3444 4146
1556 2761 3391
2 3543 4264
1378 3347 4305
847 1952 2745
1 1743 4042
2087 3048 4254
1010 4073 4132
2610 4129 4152
4106 4120 4313
7 4282 4304
3885 4227 4319
1235 4105 4195
1700 2332 4224
9 3750 4282
1539 4013 4310
3734 3834 4011
1397 2758 3645
7 1000 2984
11 3433 4068
1139 1800 3352
8 546 2561
1 4209 4239
2366 4063 4282
279 2524 2533
657 1913 4006
2322 2623 2960
758 803 2304
9 13 4241
3887 4299 4318
2612 3830 4230
1300 1596 2155
3622 3671 4230
2491 3722 3977
735 3812 4201
3204 3796 4317
2727 4292 4305

1062 2676 4255
2777 3131 4286
2518 3352 3937
4225 4255 4317
3644 3822 4311
1853 3754 4094
599 2608 3276.

A parity check matrix initial value table with a code rate of 29/30 includes 212 499 911 940 1392
316 563 1527 2006 2077
2 1906 2043 2112 2123
537 901 1582 1812 1955
5 978 1280 1933 2145
5 2035 2044 2108 2121
5 939 1874 1974
4 1069 1758
694 2096 2106
1129 1511 1659
1564 2089 2159
2 1605 2004
474 1341 2003
103 2128 2150
1656 1993 2153
1881 2122 2138
1088 1968 2141
1 298 2073
1042 1724 2137
1253 1758 2145
1209 1566 2123
1466 2116 2155
43 2006 2049
592 1806 1865
3 143 2149
1158 1448 2002
1422 2152 2157
485 2119 2150
371 1831 2086
204 2042 2151
174 544 974
1469 1795 1995
13 708 1683
5 1144 2030
486 1309 1576
165 2030 2147
504 2073 2126
263 565 1798
239 861 1861
862 1610 1716
1346 1971 2128
5 804 1399
2139 2144 2155
4 2136 2159
1485 2059 2158
50 1091 1332
373 1730 2092
59 1086 1401
1166 1781 2065
213 2080 2154
492 1905 2110
1 1517 2126
722 1427 2146
885 991 1842
3 278 1806
967 1354 1907
1697 2047 2156
684 1924 2151

2077 2122 2157
978 2054 2135
435 2034 2150
136 1997 2125
1504 1850 2153
1404 1989 2119
109 1001 2152
780 1473 2150
198 1723 2062
927 2087 2138
1 666 2018
1293 1960 2141
1648 2033 2144
681 1578 1999
1342 2022 2157
949 1907 1994
138 1261 2135
3 608 982
1211 1501 2150
201 228 1186
1295 2089 2132
267 556 2142
801 2052 2122
1382 2135 2155
572 1503 1704
346 1183 2129
1926 2090 2149
1337 2133 2140
5 1806 2125
1383 1628 2068
1193 1626 2138
1999 2115 2146
217 274 2021
3 816 2029
1380 2138 2157
607 1385 2110
184 1195 2063
0 1767 2108
0 2081 2097
1135 2036 2128
1748 2001 2125
797 1552 1926
1046 1890 2128
291 1859 2131
1075 1214 1762
60 549 1943
581 1197 1232
1009 2026 2136
884 2002 2117
1 576 1449
519 1968 2114
5 1489 1630
1926 2037 2158
2 1249 2159
0 811 2114
2055 2152 2159
802 1911 2120
204 1033 2033
1840 2012 2037
1746 2111 2155
1098 1835 2157
2 1492 1831
353 1537 1830
375 1264 2036
2 1638 2035
1096 1971 2021
950 1809 1884
253 467 1600
5 379 1833
4 1698 1970
37 1637 2136
1174 1460 2157
612 1827 2134
1783 1802 1949
2029 2118 2151
1984 2030 2141
2 347 462
862 1693 2121
2 895 1401
4 1901 2100
1183 1674 2069
1575 1940 2158
5 1904 2097
1044 2029 2092
1441 1943 2150
0 3 1300
2 516 1735
503 1342 2019
1421 1914 2131
28 986 1467
1270 1851 1988
481 1265 2016
530 546 909
653 1909 2158
1805 2002 2149
2 1359 1518
1640 2104 2129
1656 2109 2155
1307 1762 2114
565 1647 2118
1690 2081 2156
1 300 1995
5 1681 2151
1602 2050 2156
1 1960 2153
2061 2070 2138
1581 1673 2142
1048 1142 2101
1867 1991 2055
856 1640 1878
251 561 966
343 1816 2114
3 966 2045
1885 1922 2158
57 556 2059
732 1724 2147.

Note that each data processing apparatus may be an independent apparatus, or may be an internal block in a single apparatus.

Advantageous Effects of Invention

According to the present technology, it is possible to provide LDPC codes having good error-rate performance.

BRIEF DESCRIPTION OF DRAWINGS

FIG. 3 is a diagram illustrating an example of a parity check matrix of an LDPC code.

FIG. 13 is a diagram depicting a parity check matrix of an LDPC code defined in the DVB-S.2 standard.

FIG. 29 is a diagram illustrating the numbers of columns of a memory 31 which are necessary for column twist interleaving, and the addresses of write start positions.

FIG. 30 is a diagram illustrating the numbers of columns of the memory 31 which are necessary for column twist interleaving, and the addresses of write start positions.

FIG. 40 is a diagram illustrating an example of a parity check matrix initial value table with the code rate 2/30 and the code length 64800.

FIG. 41 is a diagram illustrating an example of a parity check matrix initial value table with the code rate 3/30 and the code length 64800.

FIG. 42 is a diagram illustrating an example of a parity check matrix initial value table with the code rate 4/30 and the code length 64800.

FIG. 43 is a diagram illustrating an example of a parity check matrix initial value table with the code rate 5/30 and the code length 64800.

FIG. 44 is a diagram illustrating an example of a parity check matrix initial value table with the code rate 6/30 and the code length 64800.

FIG. 45 is a diagram illustrating an example of a parity check matrix initial value table with the code rate 7/30 and the code length 64800.

FIG. 46 is a diagram illustrating an example of a parity check matrix initial value table with the code rate 8/30 and the code length 64800.

FIG. 48 is a diagram illustrating an example of a parity check matrix initial value table with the code rate 9/30 and the code length 64800.

FIG. 50 is a diagram illustrating an example of a parity check matrix initial value table with the code rate 10/30 and the code length 64800.

FIG. 52 is a diagram illustrating an example of a parity check matrix initial value table with the code rate 11/30 and the code length 64800.

FIG. 53 is a diagram illustrating the example of the parity check matrix initial value table with the code rate 11/30 and the code length 64800.

FIG. 54 is a diagram illustrating an example of a parity check matrix initial value table with the code rate 12/30 and the code length 64800.

FIG. 56 is a diagram illustrating an example of a parity check matrix initial value table with the code rate 13/30 and the code length 64800.

FIG. 58 is a diagram illustrating an example of a parity check matrix initial value table with the code rate 14/30 and the code length 64800.

FIG. 59 is a diagram illustrating the example of the parity check matrix initial value table with the code rate 14/30 and the code length 64800.

FIG. 60 is a diagram illustrating an example of a parity check matrix initial value table with the code rate 15/30 and the code length 64800.

FIG. 61 is a diagram illustrating the example of the parity check matrix initial value table with the code rate 15/30 and the code length 64800.

FIG. 62 is a diagram illustrating an example of a parity check matrix initial value table with the code rate 16/30 and the code length 64800.

FIG. 65 is a diagram illustrating an example of a parity check matrix initial value table with the code rate 17/30 and the code length 64800.

FIG. 66 is a diagram illustrating the example of the parity check matrix initial value table with the code rate 17/30 and the code length 64800.

FIG. 68 is a diagram illustrating an example of a parity check matrix initial value table with the code rate 18/30 and the code length 64800.

FIG. 69 is a diagram illustrating the example of the parity check matrix initial value table with the code rate 18/30 and the code length 64800.

FIG. 71 is a diagram illustrating an example of a parity check matrix initial value table with the code rate 19/30 and the code length 64800.

FIG. 72 is a diagram illustrating the example of the parity check matrix initial value table with the code rate 19/30 and the code length 64800.

FIG. 74 is a diagram illustrating an example of a parity check matrix initial value table with the code rate 20/30 and the code length 64800.

FIG. 75 is a diagram illustrating the example of the parity check matrix initial value table with the code rate 20/30 and the code length 64800.

FIG. 77 is a diagram illustrating an example of a parity check matrix initial value table with the code rate 21/30 and the code length 64800.

FIG. 78 is a diagram illustrating the example of the parity check matrix initial value table with the code rate 21/30 and the code length 64800.

FIG. 80 is a diagram illustrating an example of a parity check matrix initial value table with the code rate 22/30 and the code length 64800.

FIG. 81 is a diagram illustrating the example of the parity check matrix initial value table with the code rate 22/30 and the code length 64800.

FIG. 83 is a diagram illustrating an example of a parity check matrix initial value table with the code rate 23/30 and the code length 64800.

FIG. 84 is a diagram illustrating the example of the parity check matrix initial value table with the code rate 23/30 and the code length 64800.

FIG. 85 is a diagram illustrating the example of the parity check matrix initial value table with the code rate 23/30 and the code length 64800.

FIG. 86 is a diagram illustrating an example of a parity check matrix initial value table with the code rate 24/30 and the code length 64800.

FIG. 87 is a diagram illustrating the example of the parity check matrix initial value table with the code rate 24/30 and the code length 64800.

FIG. 88 is a diagram illustrating the example of the parity check matrix initial value table with the code rate 24/30 and the code length 64800.

FIG. 89 is a diagram illustrating an example of a parity check matrix initial value table with the code rate 25/30 and the code length 64800.

FIG. 90 is a diagram illustrating the example of the parity check matrix initial value table with the code rate 25/30 and the code length 64800.

FIG. 91 is a diagram illustrating the example of the parity check matrix initial value table with the code rate 25/30 and the code length 64800.

FIG. 92 is a diagram illustrating an example of a parity check matrix initial value table with the code rate 26/30 and the code length 64800.

FIG. 93 is a diagram illustrating the example of the parity check matrix initial value table with the code rate 26/30 and the code length 64800.

FIG. 94 is a diagram illustrating the example of the parity check matrix initial value table with the code rate 26/30 and the code length 64800.

FIG. 95 is a diagram illustrating an example of a parity check matrix initial value table with the code rate 27/30 and the code length 64800.

FIG. 96 is a diagram illustrating the example of the parity check matrix initial value table with the code rate 27/30 and the code length 64800.

FIG. 97 is a diagram illustrating the example of the parity check matrix initial value table with the code rate 27/30 and the code length 64800.

FIG. 99 is a diagram illustrating an example of a parity check matrix initial value table with the code rate 28/30 and the code length 64800.

FIG. 100 is a diagram illustrating the example of the parity check matrix initial value table with the code rate 28/30 and the code length 64800.

FIG. 101 is a diagram illustrating the example of the parity check matrix initial value table with the code rate 28/30 and the code length 64800.

FIG. 103 is a diagram illustrating an example of a parity check matrix initial value table with the code rate 29/30 and the code length 64800.

FIG. 105 is a diagram illustrating the example of the parity check matrix initial value table with the code rate 29/30 and the code length 64800.

FIG. 109 is a diagram illustrating minimum cycle lengths and performance thresholds for parity check matrices of LDPC codes with the code length 64800.

FIG. 111 is a diagram depicting parity check matrices of LDPC codes with the code length 64800.

FIG. 115 includes diagrams illustrating BCH codes used in simulations of BERs/FERs of LDPC codes with the code length 64800.

FIG. 119 is a diagram illustrating an example of a parity check matrix of an LDPC code.

FIG. 121 is a diagram illustrating a transformed parity check matrix that is divided into 5×5 units.

FIG. 122 is a block diagram illustrating an example configuration of a decoding device that collectively performs node computation for P nodes.

FIG. 123 is a block diagram illustrating an example configuration of the LDPC decoder 166.

Figure 124:
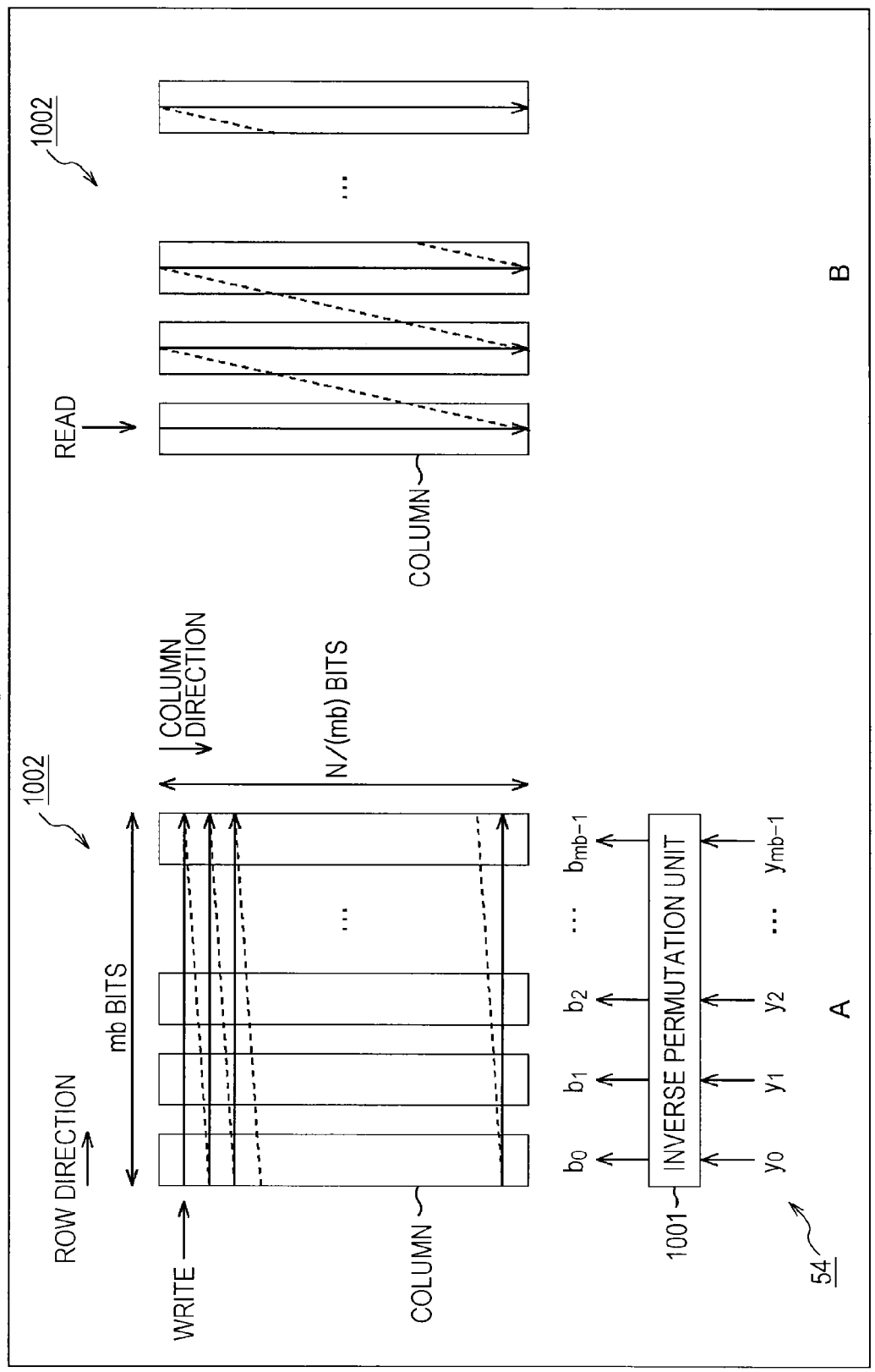

FIG. 124 includes diagrams depicting a process of a multiplexer 54 included in the bit deinterleaver 165.

Figure 125:
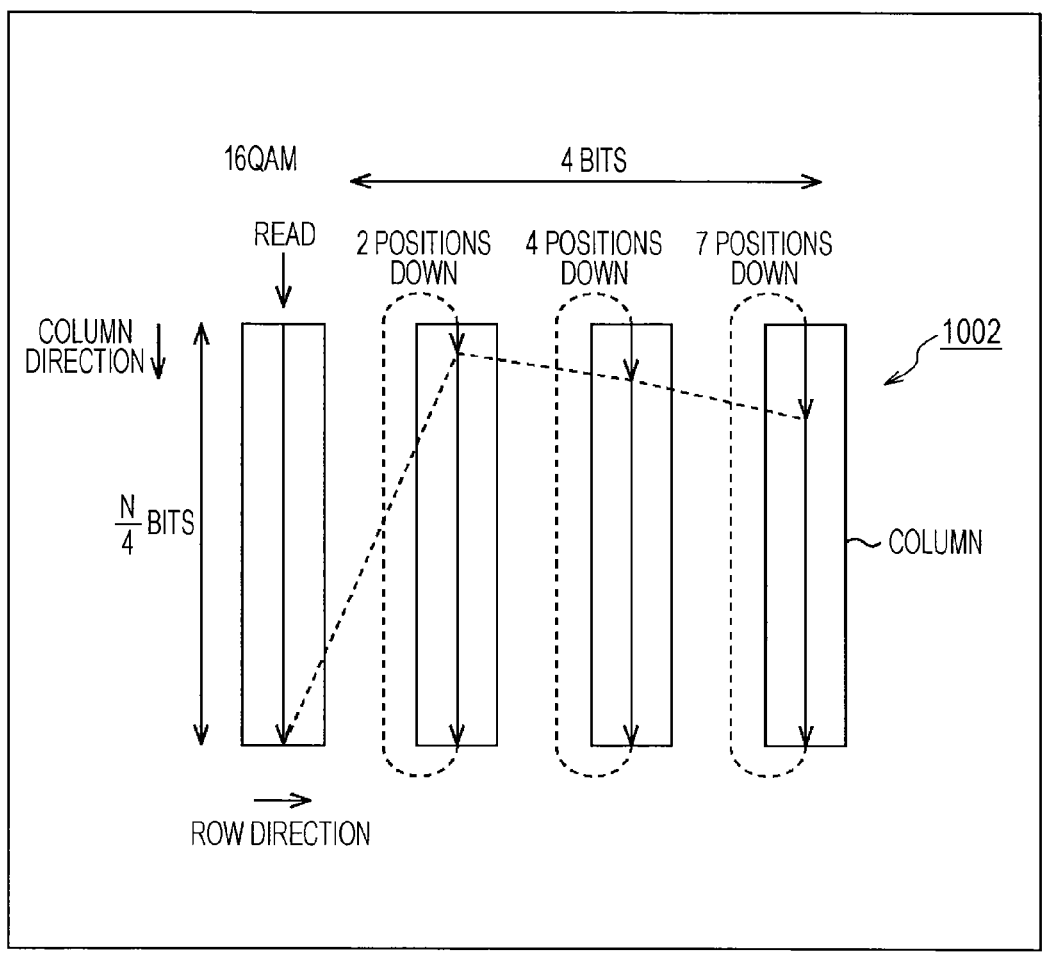

FIG. 125 is a diagram depicting the processing of a column twist deinterleaver 55.

Figure 126:
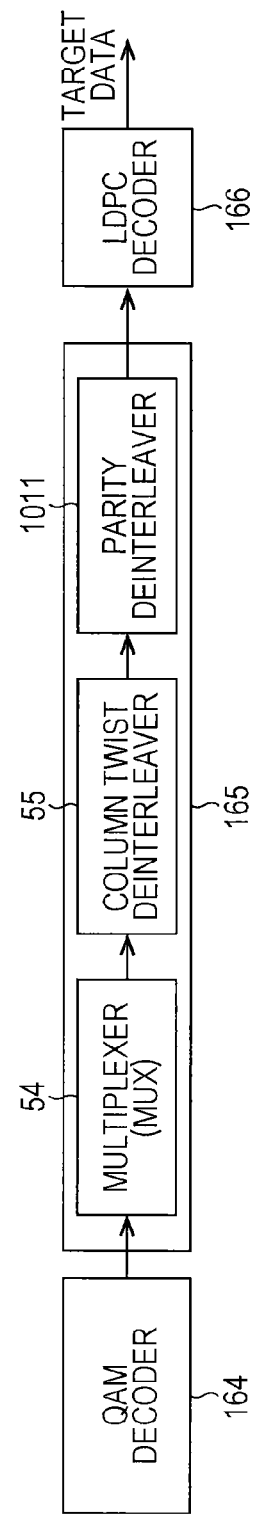

FIG. 126 is a block diagram illustrating another example configuration of the bit deinterleaver 165.

Figure 127:
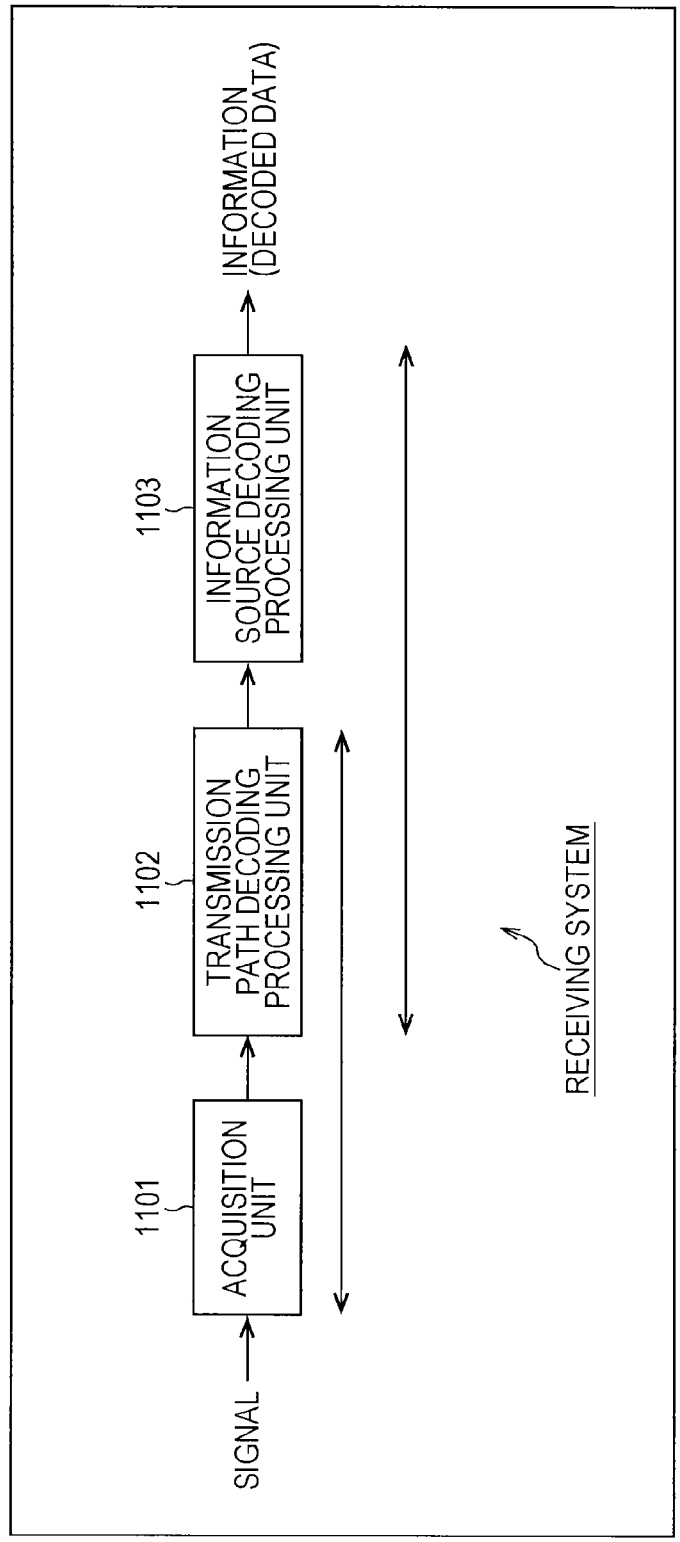

FIG. 127 is a block diagram illustrating a first example configuration of a receiving system in which the receiving device 12 can be used.

Figure 128:
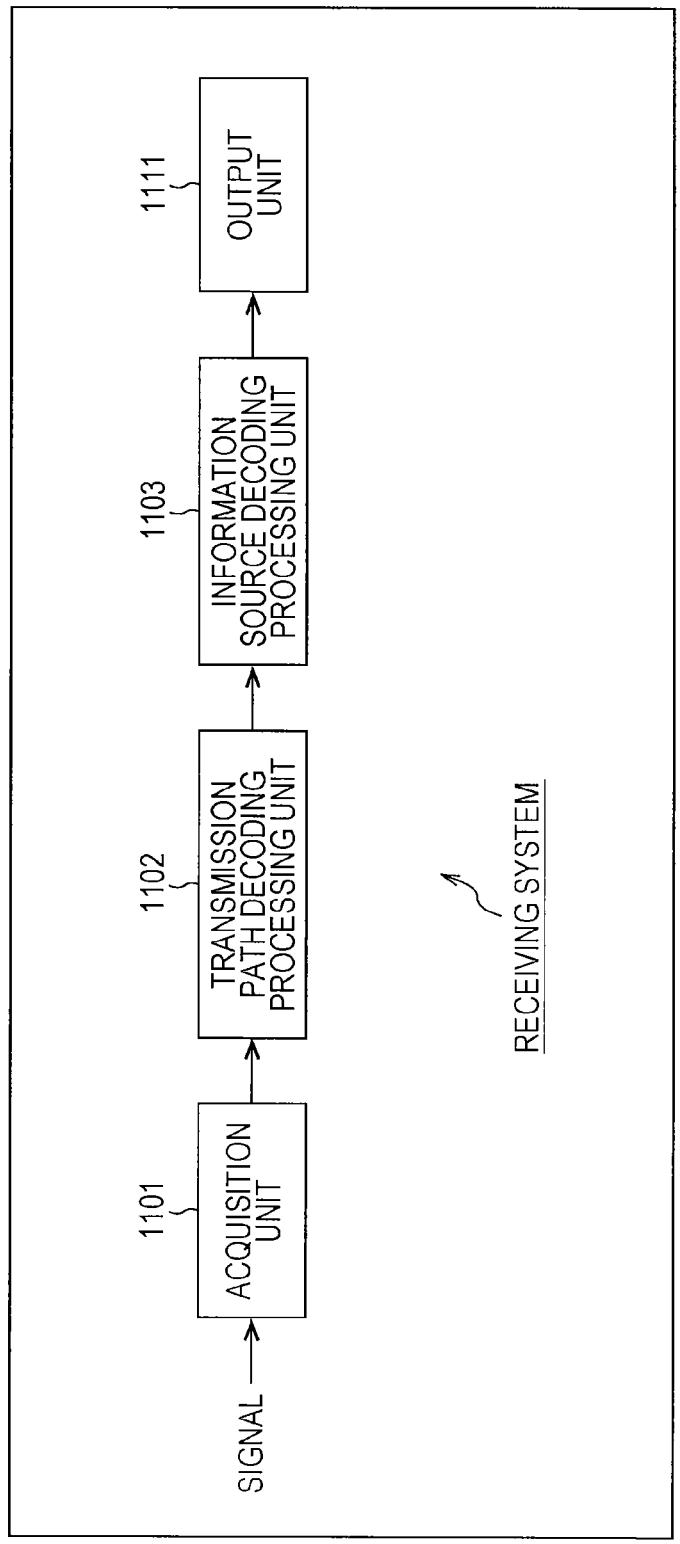

FIG. 128 is a block diagram illustrating a second example configuration of the receiving system in which the receiving device 12 can be used.

Figure 129:
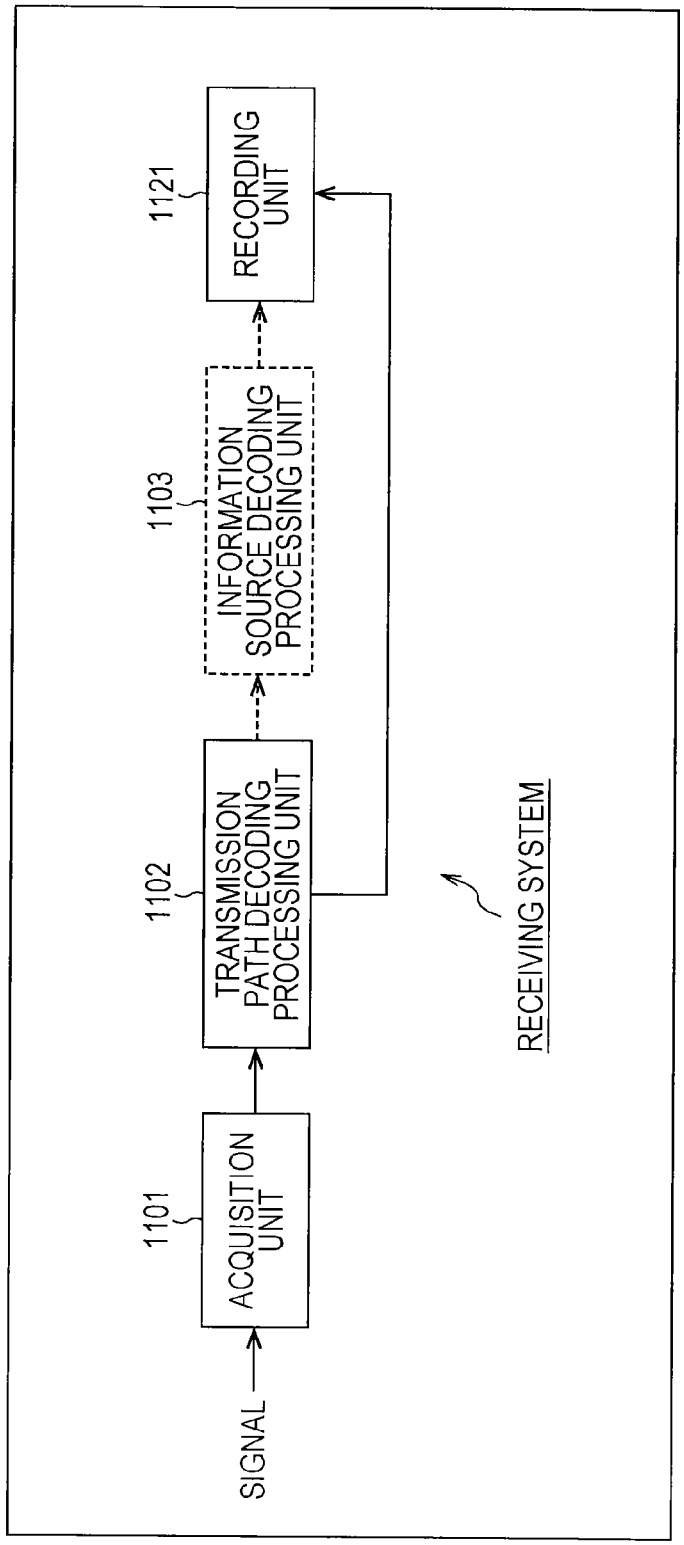

FIG. 129 is a block diagram illustrating a third example configuration of the receiving system in which the receiving device 12 can be used.

Figure 130:
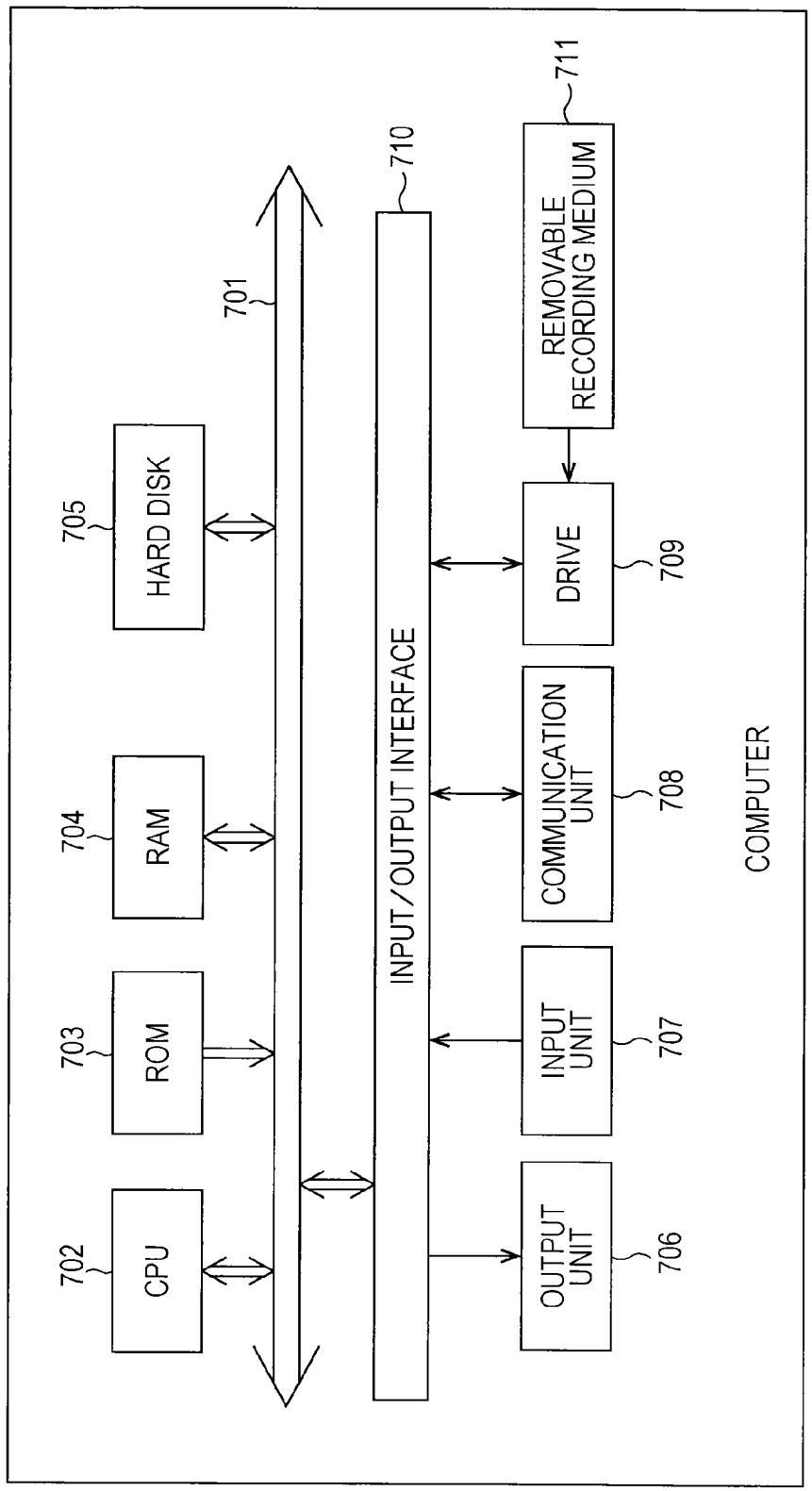

FIG. 130 is a block diagram illustrating an example configuration of an embodiment of a computer to which the present technology applies.

DESCRIPTION OF EMBODIMENTS

[Example Configuration of Transmission System to which Present Technology Applies]

Figure 7:
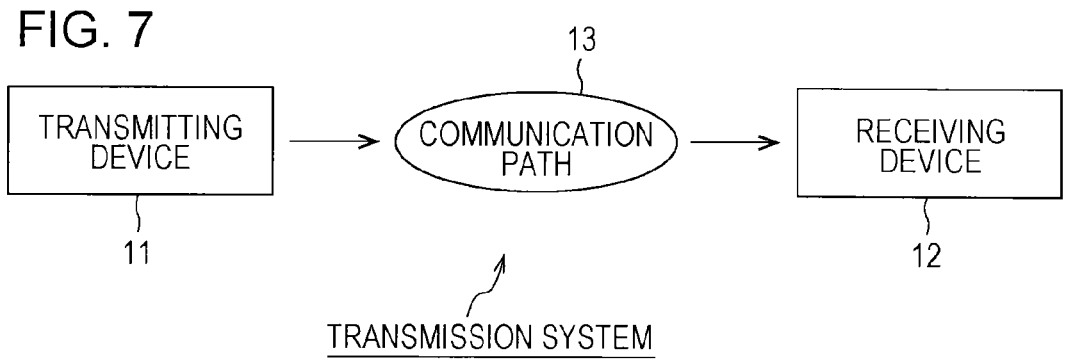
FIG. 7 is a diagram illustrating an example configuration of an embodiment of a transmission system to which the present technology applies.

FIG. 7 illustrates an example configuration of an embodiment of a transmission system (the term "system" refers to a logical set of devices or apparatuses, and the devices or apparatuses may or may not be accommodated in the same housing) to which the present technology applies.

Referring to FIG. 7, the transmission system includes a transmitting device 11 and a receiving device 12.

The transmitting device 11 is configured to transmit (or broadcast) data such as a television broadcast program. More specifically, the transmitting device 11 encodes the target data to be transmitted, such as image data and audio data of a program, into an LDPC code, and transmits the LDPC code via a communication path 13 such as a satellite link, a terrestrial link, or a cable (wired line).

The receiving device 12 receives an LDPC code transmitted from the transmitting device 11 via the communication path 13, decodes the LDPC code into target data, and outputs the target data.

Here, it is well established that an LDPC code used in the transmission system illustrated in FIG. 7 exhibits very high performance on an AWGN (Additive White Gaussian Noise) communication path.

However, burst errors or erasures may occur in the communication path 13. For example, notably in a case where the communication path 13 is a terrestrial link, in an OFDM (Orthogonal Frequency Division Multiplexing) system, a specific symbol may drop to zero in power (or be erased) in accordance with the delay of an echo (which is a path other than the main path) in a multi-path environment where a D/U (Desired to Undesired Ratio) is 0 dB (i.e., the power of the echo as the undesired power is equal to the power of the main path as the desired power).

Further, if the D/U is 0 dB, all OFDM symbols at a specific point in time may also drop to zero in power (or erased) due to a Doppler (doppler) frequency in a flutter (which is a communication path to which an echo with a Doppler frequency applied and having a delay of 0 is added).

In addition, burst errors may occur due to unstable power of the receiving device 12 or undesired wiring conditions from a receiver (not illustrated) that receives a signal from the transmitting device 11, such as an antenna, on the receiving device 12 side to the receiving device 12.

Figure 1:
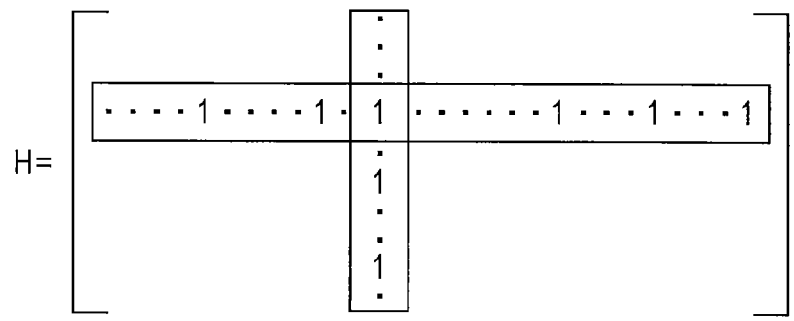
FIG. 1 is a diagram depicting a parity check matrix H of an LDPC code.
Figure 2:
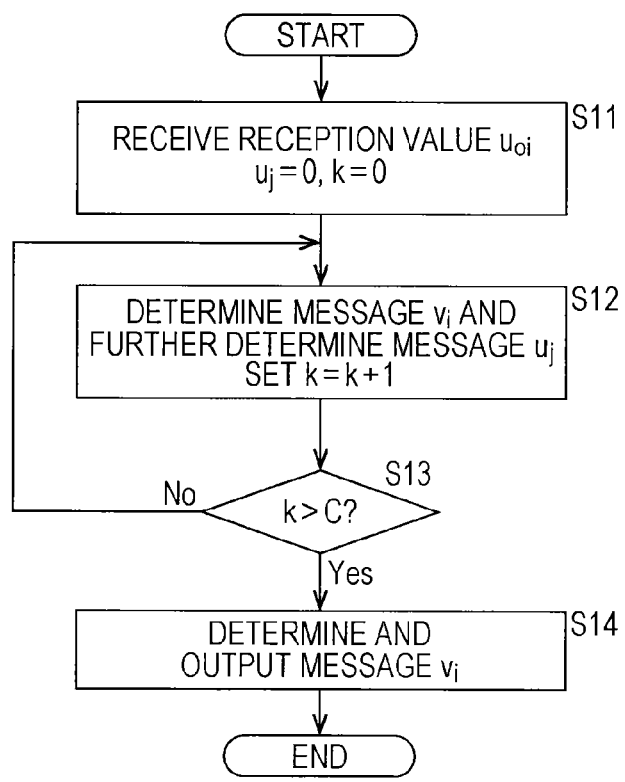
FIG. 2 is a flowchart depicting an LDPC code decoding procedure.
Figure 4:
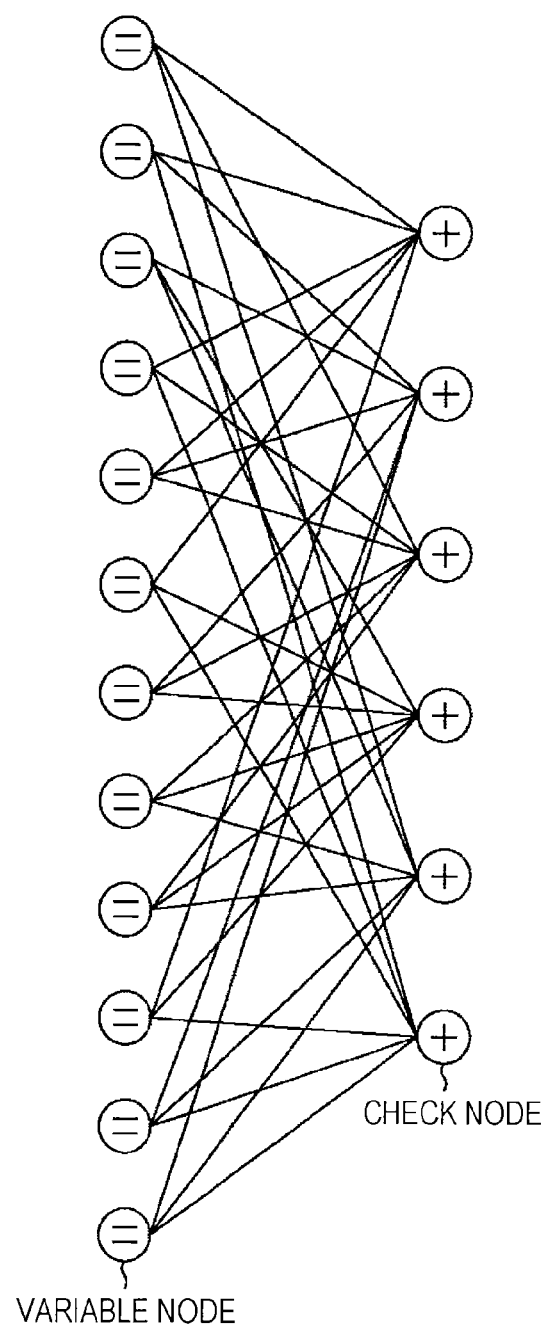
FIG. 4 is a diagram illustrating a Tanner graph of a parity check matrix.
Figure 5:
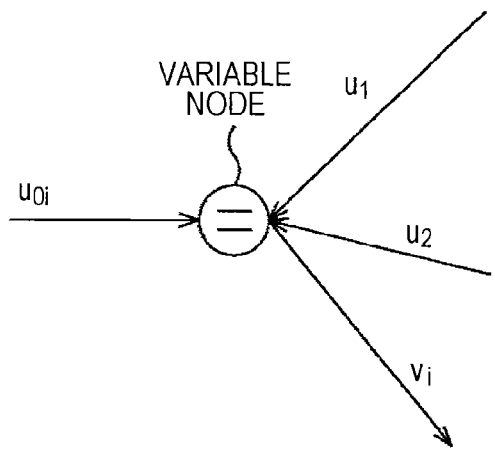
FIG. 5 is a diagram illustrating a variable node.
Figure 6:
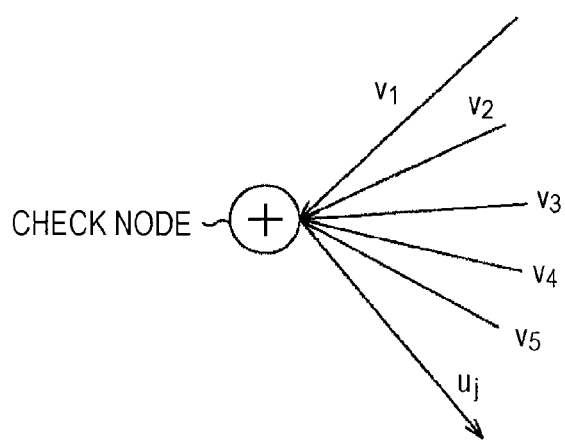
FIG. 6 is a diagram illustrating a check node.

In the LDPC code decoding process, on the other hand, as described above with reference to FIG. 5, the variable node computation of Expression (1), which involves addition of (the reception values $u_{0i}$ of) the code bits of the LDPC code, is performed at the respective columns of the parity check matrix H, that is, the variable nodes corresponding to the code bits of the LDPC code. Thus, an error occurring in a code bit used for variable node computation would reduce the accuracy of a determined message.

In the LDPC code decoding process, furthermore, the check node computation of Expression (7) is performed at a check node, by using messages determined at the variable nodes connected to the check node. Thus, an increase in the number of check nodes for which errors (including erasures)

simultaneously occur in (code bits of an LDPC code corresponding to) a plurality of connected variable nodes would reduce decoding performance.

More specifically, for example, if two or more of variable nodes connected to a check node simultaneously become erasures, the check node returns a message with the probability of the value 0 being equal to the probability of the value 1 to all the variable nodes. In this case, the check node that returns the message with equal probabilities does not contribute to single decoding processing (one set of variable node computation and check node computation), resulting in a larger number of repetitions of decoding processing. Thus, decoding performance may deteriorate, and, additionally, the power consumption of the receiving device 12 that decodes the LDPC code may increase.

To address the inconveniences described above, the transmission system illustrated in FIG. 7 is capable of increasing the resistance to burst errors or erasures while maintaining performance in an AWGN communication path.

[Example Configuration of Transmitting Device 11]

Figure 8:
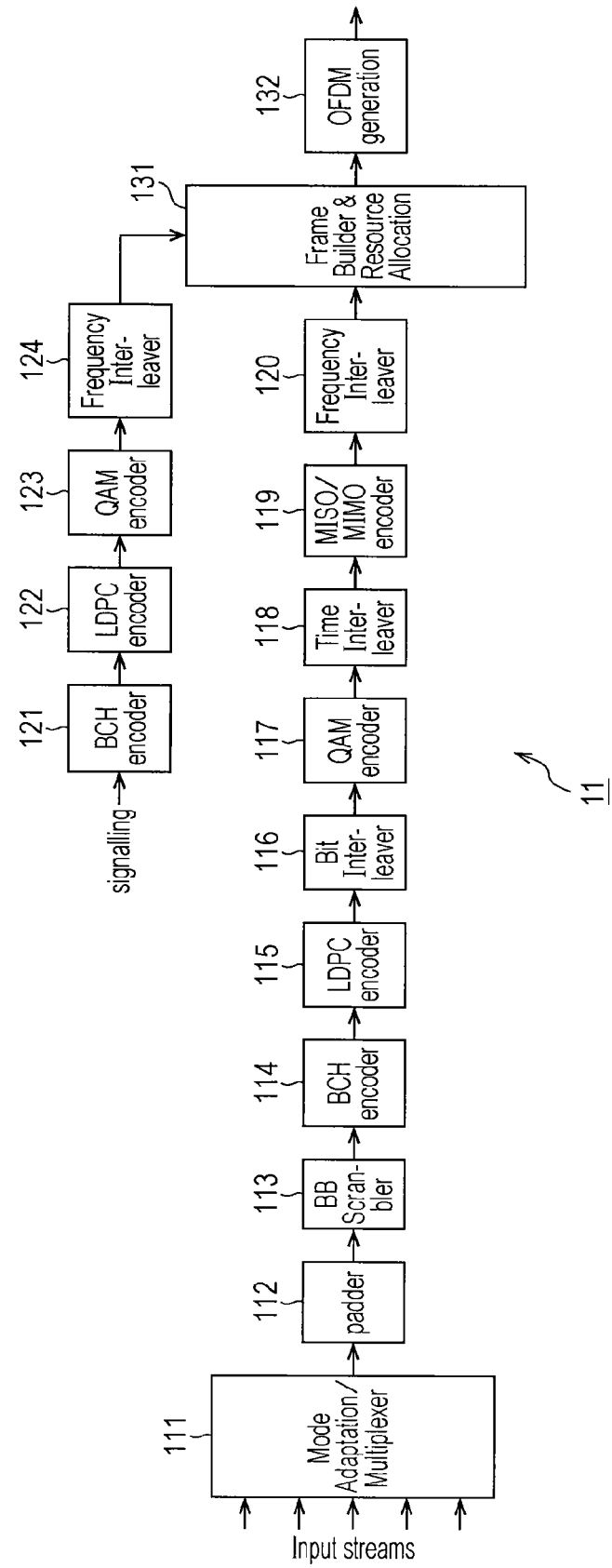
FIG. 8 is a block diagram illustrating an example configuration of a transmitting device 11.

FIG. 8 is a block diagram illustrating an example configuration of the transmitting device 11 illustrated in FIG. 7.

In the transmitting device 11, one or more input streams as target data are supplied to a mode adaptation/multiplexer 111.

The mode adaptation/multiplexer 111 performs processing such as mode selection and multiplexing the supplied one or more input streams, if necessary, and supplies the resulting data to a padder 112.

The padder 112 pads zeros (or adds null) to the data supplied from the mode adaptation/multiplexer 111, as necessary, and supplies the resulting data to a BB scrambler 113.

The BB scrambler 113 applies BB scrambling (Base-Band Scrambling) to the data supplied from the padder 112, and supplies the resulting data to a BCH encoder 114.

The BCH encoder 114 performs BCH encoding on the data supplied from the BB scrambler 113, and supplies the resulting data to an LDPC encoder 115 as LDPC target data to be subjected to LDPC encoding.

The LDPC encoder 115 performs LDPC encoding on the LDPC target data supplied from the BCH encoder 114 in accordance with a parity check matrix of an LDPC code, in which a parity matrix that is a portion of parity bits of the LDPC code has a stepwise structure, to obtain an LDPC code having information bits corresponding to the LDPC target data. The LDPC encoder 115 outputs the LDPC code.

More specifically, the LDPC encoder 115 performs LDPC encoding to encode the LDPC target data into, for example, an LDPC code defined in a certain standard such as DVB-S.2, DVB-T.2, or DVB-C.2 (corresponding to a parity check matrix) or a predetermined LDPC code (corresponding to a parity check matrix), and outputs the resulting LDPC code.

Here, an LDPC code defined in the DVB-S.2, DVB-T.2, or DVB-C.2 standard is an IRA (Irregular Repeat Accumulate) code, and a parity matrix in a parity check matrix of the LDPC code has a stepwise structure. The parity matrix and the stepwise structure will be described below. An example of the IRA code is described in, for example, "Irregular Repeat-Accumulate Codes," H. Jin, A. Khandekar, and R. J. McEliece, in Proceedings of 2nd International Symposium on Turbo Codes and Related Topics, pp. 1-8, September 2000.

The LDPC code output from the LDPC encoder 115 is supplied to a bit interleaver 116.

The bit interleaver 116 performs bit interleaving, described below, on the LDPC code supplied from the LDPC encoder 115, and supplies the LDPC code that has been subjected to bit interleaving to a QAM encoder 117.

The QAM encoder 117 maps the LDPC code supplied from the bit interleaver 116 to constellation points each representing one symbol of orthogonal modulation in units of one or more code bits of the LDPC code (or in units of symbols), and performs orthogonal modulation (multi-level modulation).

More specifically, the QAM encoder 117 maps the LDPC code supplied from the bit interleaver 116 to constellation points defined by the modulation scheme on which orthogonal modulation of the LDPC code is based, in an IQ plane (IQ constellation) defined by an I axis representing an I component that is in the same phase as that of the carrier and a Q axis representing a Q component orthogonal to the carrier, and performs orthogonal modulation.

Here, examples of the modulation scheme on which the orthogonal modulation performed by the QAM encoder 117 is based include modulation schemes defined in the DVB-S.2, DVB-T.2, and DVB-C.2, and similar standards, and other modulation schemes, examples of which include BPSK (Binary Phase Shift Keying), QPSK (Quadrature Phase Shift Keying), 16APSK (Amplitude Phase-Shift Keying), 32APSK, 16QAM (Quadrature Amplitude Modulation), 64QAM, 256QAM, 1024QAM, 4096QAM, and 4PAM (Pulse Amplitude Modulation). Which of the modulation schemes the QAM encoder 117 uses to perform orthogonal modulation is set in advance through, for example, operation or the like by an operator of the transmitting device 11.

The data obtained by the processing of the QAM encoder 117 (i.e., the symbols mapped to the constellation points) is supplied to a time interleaver 118.

The time interleaver 118 performs time interleaving (which is interleaving in the time domain) on the data (i.e., symbols) supplied from the QAM encoder 117 in units of symbols, and supplies the resulting data to a MISO/MIMO encoder 119.

The MISO/MIMO encoder 119 performs space-time encoding on the data (i.e., symbols) supplied from the time interleaver 118, and supplies the resulting data to a frequency interleaver 120.

The frequency interleaver 120 performs frequency interleaving (which is interleaving in the frequency domain) on the data (i.e., symbols) supplied from the MISO/MIMO encoder 119 in units of symbols, and supplies the resulting data to a frame builder & resource allocation unit 131.

On the other hand, control data (signalling) for transmission control, such as BB signalling (Base Band Signalling) (BB Header), is supplied to a BCH encoder 121.

The BCH encoder 121 performs BCH encoding on the control data supplied thereto in a manner similar to that for the BCH encoder 114, and supplies the resulting data to an LDPC encoder 122.

The LDPC encoder 122 performs LDPC encoding on the data supplied from the BCH encoder 121, as LDPC target data, in a manner similar to that for the LDPC encoder 115, and supplies the resulting LDPC code to a QAM encoder 123.

The QAM encoder 123 maps the LDPC code supplied from the LDPC encoder 122 to constellation points each representing one symbol of orthogonal modulation, in units of one or more code bits of the LDPC code (i.e., in units of symbols) in a manner similar to that for the QAM encoder 117, and performs orthogonal modulation. The QAM encoder 123 supplies the resulting data (i.e., symbols) to a frequency interleaver 124.

The frequency interleaver 124 performs frequency interleaving on the data (i.e., symbols) supplied from the QAM encoder 123 in units of symbols in a manner similar to that for the frequency interleaver 120, and supplies the resulting data to the frame builder & resource allocation unit 131.

The frame builder & resource allocation unit 131 adds pilot symbols at desired positions of the data (i.e., symbols) supplied from the frequency interleavers 120 and 124, and configures a frame including a certain number of symbols (for example, a PL (Physical Layer) frame, a T2 frame, a C2 frame, etc.) from the resulting data (i.e., symbols). The frame builder & resource allocation unit 131 supplies the frame to an OFDM generation unit 132.

The OFDM generation unit 132 generates an OFDM signal from the frame supplied from the frame builder & resource allocation unit 131, corresponding to the frame, and transmits the OFDM signal via the communication path 13 (FIG. 7).

Note that the transmitting device 11 may be configured without including some of the blocks illustrated in FIG. 8, such as the time interleaver 118, the MISO/MIMO encoder 119, the frequency interleaver 120, and the frequency interleaver 124.

Figure 9:
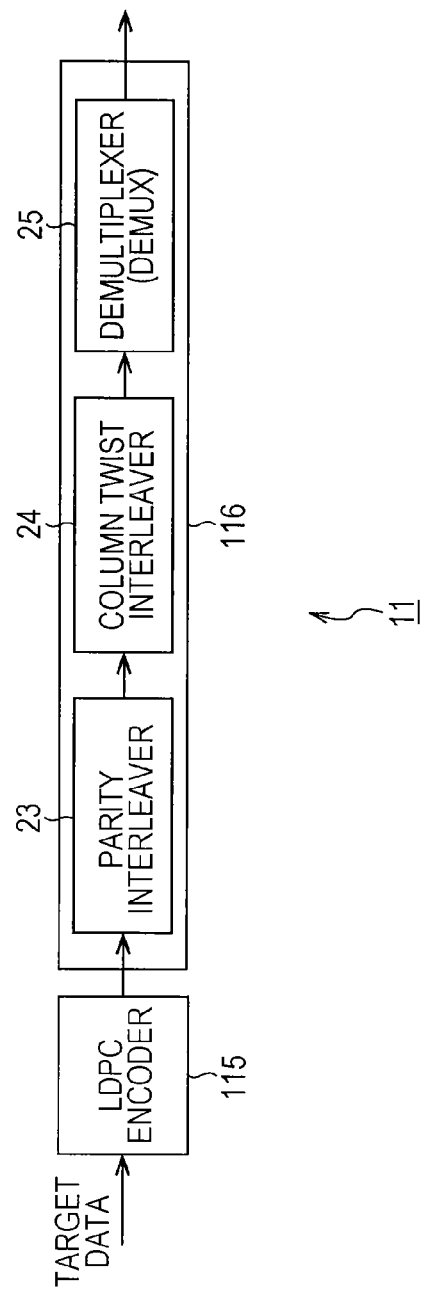
FIG. 9 is a block diagram illustrating an example configuration of a bit interleaver 116.

FIG. 9 illustrates an example configuration of the bit interleaver 116 illustrated in FIG. 8.

The bit interleaver 116 is a data processing device for interleaving data, and includes a parity interleaver 23, a column twist interleaver 24, and a demultiplexer (DEMUX) 25. Note that the bit interleaver 116 may be configured without including one or both of the parity interleaver 23 and the column twist interleaver 24.

The parity interleaver 23 performs parity interleaving on the LDPC code supplied from the LDPC encoder 115 to interleave parity bits of the LDPC code to different parity bit positions, and supplies the LDPC code that has been subjected to parity interleaving to the column twist interleaver 24.

The column twist interleaver 24 performs column twist interleaving on the LDPC code supplied from the parity interleaver 23, and supplies the LDPC code that has been subjected to column twist interleaving to the demultiplexer 25.

More specifically, the LDPC code is transmitted after one or more code bits of the LDPC code are mapped to a constellation point representing one symbol of orthogonal modulation using the QAM encoder 117 illustrated in FIG. 8.

The column twist interleaver 24 performs reordering processing, for example, column twist interleaving, described below, to reorder the code bits of the LDPC code supplied from the parity interleaver 23 so that a plurality of code bits of the LDPC code corresponding to is in an arbitrary row of the parity check matrix used in the LDPC encoder 115 are not included in one symbol.

The demultiplexer 25 performs permutation processing on the LDPC code supplied from the column twist interleaver 24 to permute the positions of two or more code bits of the LDPC code to be mapped to symbols, thereby obtaining an LDPC code with increased resistance to AWGN. The demultiplexer 25 then supplies the two or more code bits of the LDPC code, which are obtained through the permutation processing, to the QAM encoder 117 (FIG. 8) as a symbol.

Figure 10:
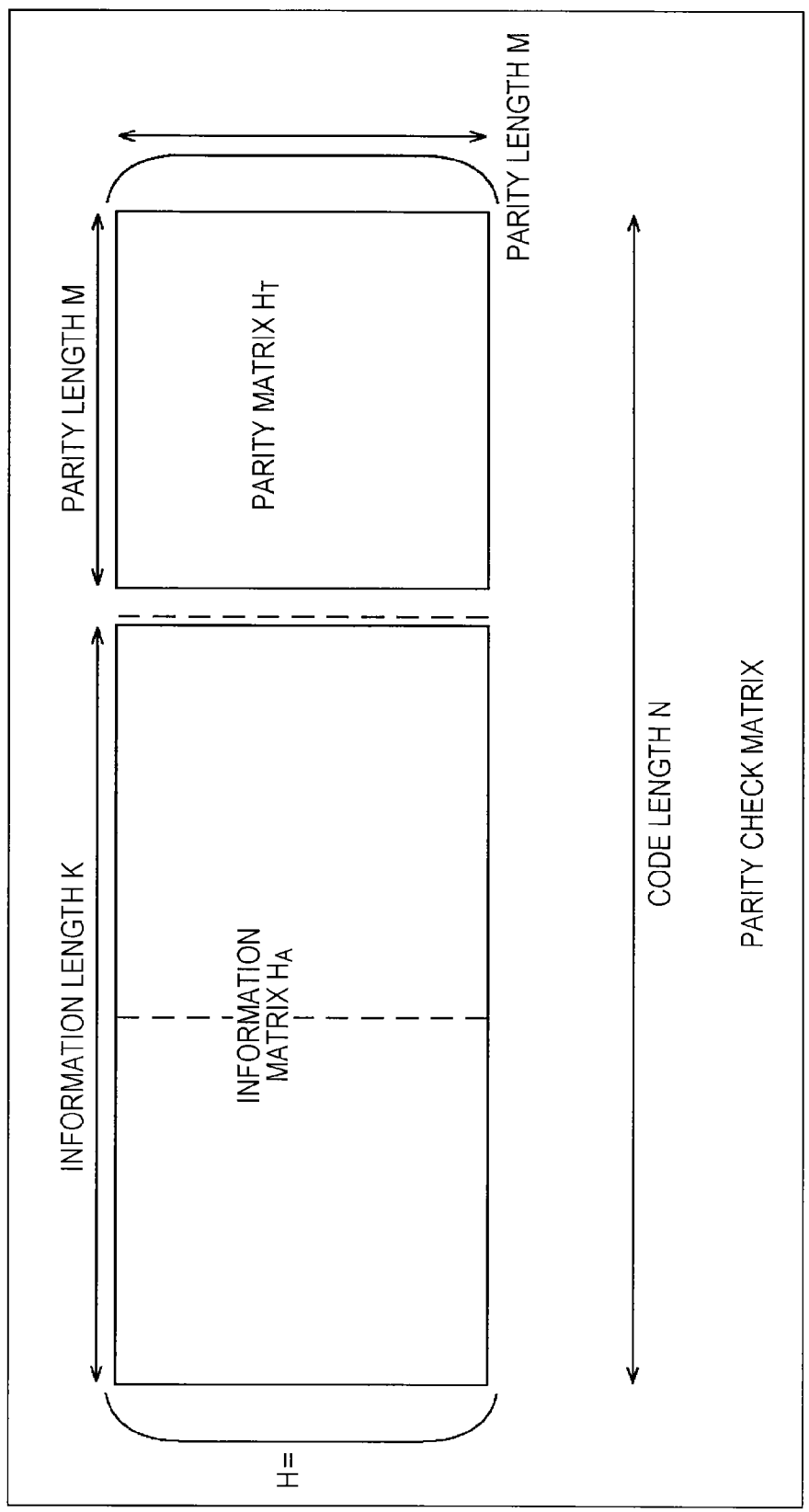
FIG. 10 is a diagram illustrating a parity check matrix.

Next, FIG. 10 illustrates the parity check matrix H that the LDPC encoder 115 illustrated in FIG. 8 uses for LDPC encoding.

The parity check matrix H has an LDGM (Low-Density Generation Matrix) structure, and can be expressed by the equation $H=[H_A|H_T]$ (which is a matrix whose left elements are the elements of an information matrix $H_A$ and right elements are the elements of a parity matrix $H_T$), where the information matrix $H_A$ is a portion corresponding to information bits and the parity matrix $H_T$ is a portion corresponding to parity bits among the code bits of the LDPC code.

Here, the number of information bits and the number of parity bits among the code bits of one LDPC code (i.e., one code word) are represented by an information length K and a parity length M, respectively. In addition, the number of code bits of one LDPC code is represented by a code length N (=K+M).

The information length K and the parity length M of an LDPC code having a certain code length N are determined in accordance with the code rate. In addition, the parity check matrix H is a matrix having M rows and N columns. Thus, the information matrix $H_A$ is an M×K matrix, and the parity matrix $H_T$ is an M×M matrix.

Figure 11:
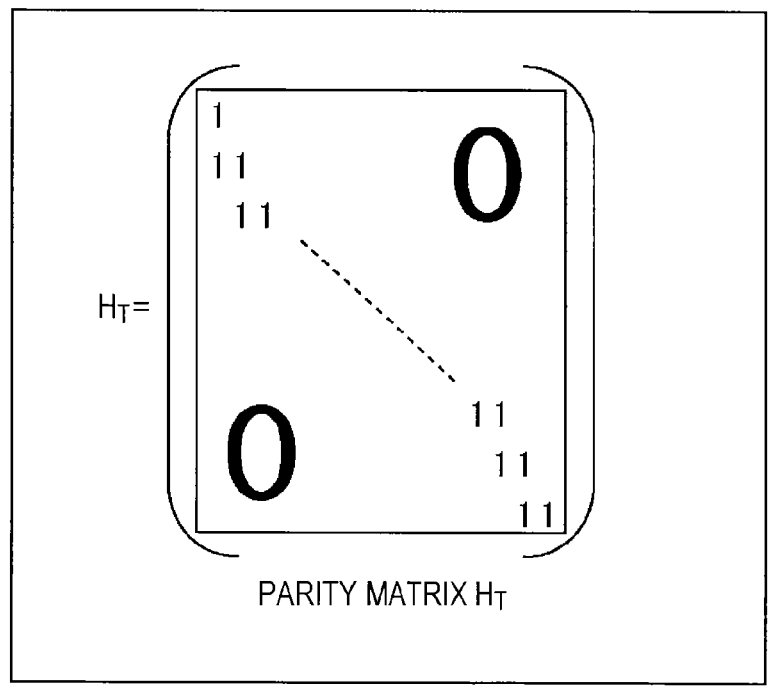
FIG. 11 is a diagram illustrating a parity matrix.

FIG. 11 illustrates a parity matrix $H_T$ of a parity check matrix H of an LDPC code defined in the DVB-S.2, DVB-T.2, and DVB-C.2 standards.

As illustrated in FIG. 11, the parity matrix $H_T$ of the parity check matrix H of the LDPC code defined in DVB-T.2 and similar standards is a matrix having a stepwise structure (i.e., a lower bidiagonal matrix) in which elements of 1 are arranged in a stepwise manner. The parity matrix $H_T$ has a row weight of 1 for the first row and a row weight of 2 for all the remaining rows. The parity matrix $H_T$ further has a column weight of 1 for the last column and a column weight of 2 for all the remaining columns.

In the manner described above, an LDPC code of a parity check matrix H including a parity matrix $H_T$ having a stepwise structure can be easily generated using the parity check matrix H.

More specifically, an LDPC code (i.e., a code word) is represented by a row vector c, and a column vector obtained by transposing the row vector is represented by $c^T$. In the row vector c, which is the LDPC code, furthermore, an information bit portion is represented by a row vector A, and a parity bit portion is represented by a row vector T.

In this case, the row vector c can be expressed by the equation c=[A|T] (which is a row vector whose left elements are the elements of a row vector A and right elements are the elements of a row vector T), where the row vector A corresponds to information bits and the row vector T corresponds to parity bits.

It is necessary for the parity check matrix H and the row vector c=[A|T], which serves as the LDPC code, to satisfy the equation $Hc^T=0$. Thus, the values of the elements of the row vector T corresponding to parity bits in the row vector c=[A|T] satisfying the equation $Hc^T=0$ can be sequentially (or successively) determined by setting the elements in the respective rows of the column vector $Hc^T$ in the equation $Hc^T=0$ to zero in order, starting from the element in the first row, in a case where the parity matrix $H_T$ in the parity check matrix $H=[H_A|H_T]$ has the stepwise structure illustrated in FIG. 11.

Figure 12:
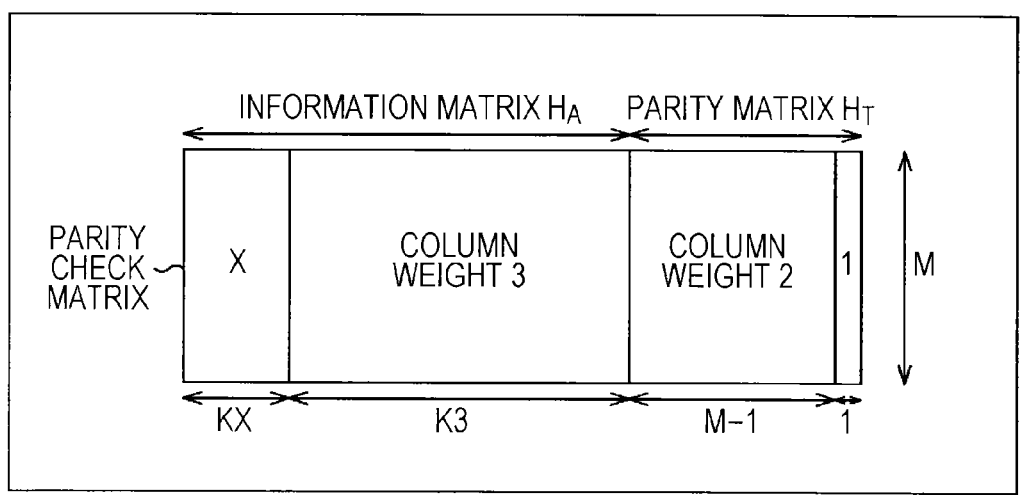
FIG. 12 is a diagram depicting a parity check matrix of an LDPC code defined in the DVB-S.2 standard.

FIG. 12 is a diagram depicting a parity check matrix H of an LDPC code defined in DVB-T.2 and similar standards.

The parity check matrix H of the LDPC code defined in DVB-T.2 and similar standards has a column weight X for KX columns, starting with the first column, a column weight of 3 for the subsequent K3 columns, a column weight of 2 for the subsequent (M−1) columns, and a column weight of 1 for the last column.

Here, the sum of columns given by KX−K3+M−1+1 equals the code length N.

FIG. 13 is a diagram illustrating the numbers of columns KX, K3, and M and the column weight X for the respective code rates r of LDPC codes defined in DVB-T.2 and similar standards.

In DVB-T.2 and similar standards, LDPC codes having code lengths N of 64800 bits and 16200 bits are defined.

In addition, 11 code rates (nominal rates), 1/4, 1/3, 2/5, 1/2, 3/5, 2/3, 3/4, 4/5, 5/6, 8/9, and 9/10, are defined for an LDPC code with a code length N of 64800 bits, and 10 code rates, 1/4, 1/3, 2/5, 1/2, 3/5, 2/3, 3/4, 4/5, 5/6, and 8/9, are defined for an LDPC code with a code length N of 16200 bits.

Hereinafter, the code length N of 64800 bits will also be referred to as "64 k bits", and the code length N of 16200 bits will also be referred to as "16 k bits".

It is well established that a code bit of an LDPC code corresponding to a column with a higher column weight in a parity check matrix H has a lower error rate.

In a parity check matrix H defined in DVB-T.2 and similar standards illustrated in FIGS. 12 and 13, the column weight tends to increase as the ordinal number of the columns of the parity check matrix H decreases (i.e., as the column comes closer to the left end of the parity check matrix H). Accordingly, robustness to errors (or resistance to errors) tends to increase as the ordinal number of the code bits of an LDPC code corresponding to the parity check matrix H decreases (i.e., the first code bit tends to be the most robust to errors), and tends to decrease as the ordinal number of the code bits increases (i.e., the last code bit tends to be the least robust to errors).

Figure 14:
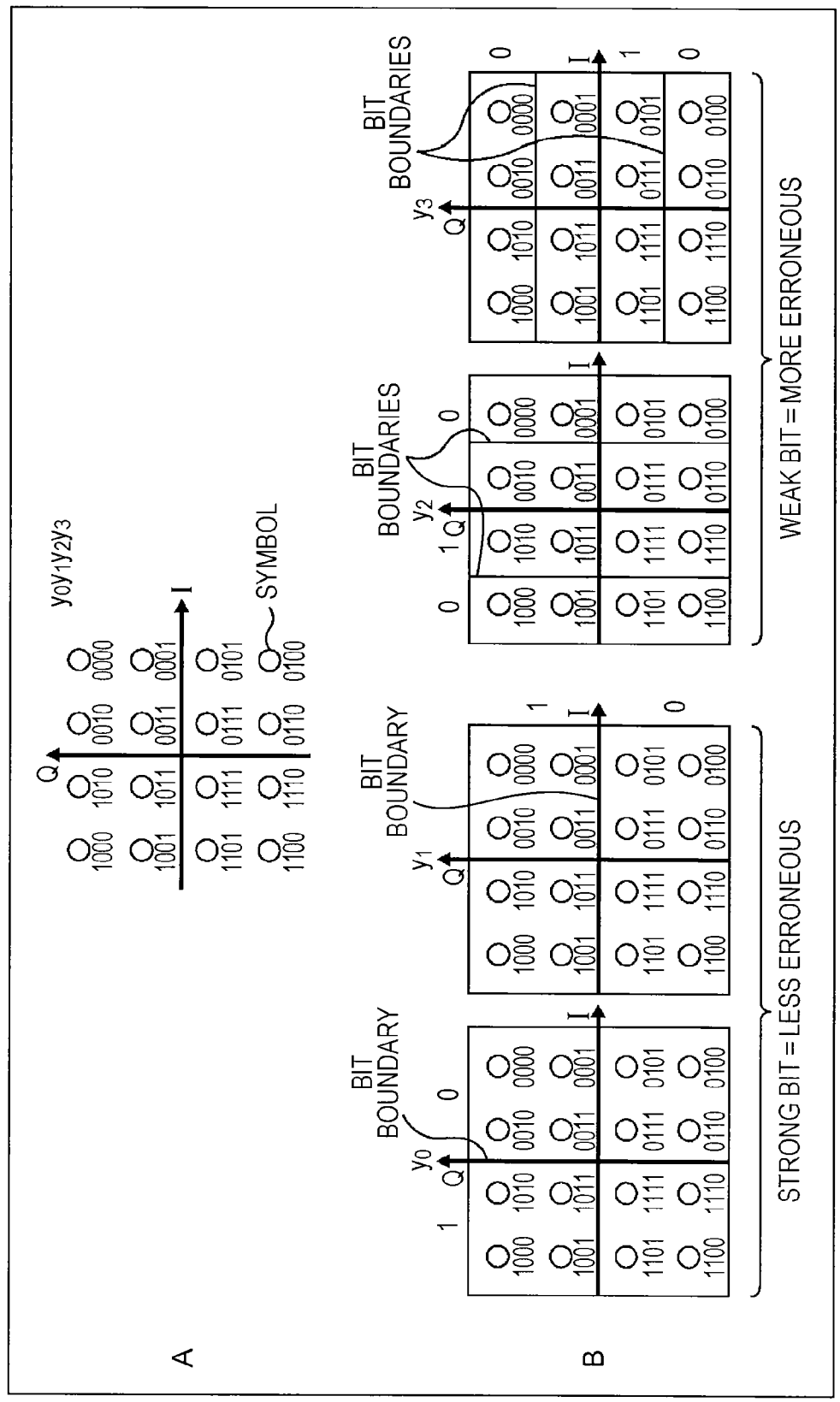
FIG. 14 includes diagrams illustrating an arrangement of constellation points of 16QAM.

Next, FIG. 14 illustrates example arrangements of (constellation points corresponding to) 16 symbols in an IQ plane in a case where the QAM encoder 117 illustrated in FIG. 8 performs 16QAM operation.

More specifically, part A of FIG. 14 illustrates symbols of DVB-T.2 16QAM.

In 16QAM, one symbol is represented as 4 bits, and 16 (=$2^4$) symbols are provided. Further, the 16 symbols are arranged in a square of 4 symbols in the I direction and 4 symbols in the Q direction, centered on the origin of the IQ plane.

Assuming now that the (i+1)-th bit from the most significant bit of a bit sequence represented by one symbol is represented by bit $y_i$, then 4 bits represented by one symbol of 16QAM can be represented by bits $y_0$, $y_1$, $y_2$, and $y_3$ in order, starting from the most significant bit. In a case where the modulation scheme is 16QAM, 4 code bits of an LDPC code are (symbolized) to a symbol (symbol values) of 4 bits $y_0$ to $y_3$.

Part B of FIG. 14 illustrates bit boundaries of 4 bits (hereinafter also referred to as "symbol bits") $y_0$ to $y_3$ represented by a 16QAM symbol.

Here, a bit boundary of symbol bits $y_i$ (in FIG. 14, i=0, 1, 2, 3) is a boundary between a symbol having a symbol bit $y_i$ of 0 and a symbol having a symbol bit $y_1$ of 1.

As illustrated in part B of FIG. 14, for the most significant symbol bit $y_0$ among the 4 symbol bits $y_0$ to $y_3$ represented by the 16QAM symbol, the only one bit boundary extends along the Q axis in the IQ plane. For the second symbol bit $y_1$ (the second most significant bit), the only one bit boundary extends along the I axis in the IQ plane.

In addition, two bit boundaries are provided for the third symbol bit $y_2$, one between the first and second columns of the 4×4 square of symbols, counting from the left, and the other between the third and fourth columns.

In addition, two bit boundaries are provided for the fourth symbol bit $y_3$, one between the first and second rows of the 4×4 square of symbols, counting from the top, and the other between the third and fourth rows.

Symbol bits $y_i$ represented by symbols are less erroneous (i.e., lower error probability) as the number of symbols spaced away from a bit boundary increases, and are more erroneous (i.e., higher error probability) as the number of symbols close to a bit boundary increases.

It is assumed now that a less erroneous bit (robust to errors) is referred to as a "strong bit" and a more erroneous bit (sensitive to errors) is referred to as a "weak bit". In the 4 symbol bits $y_0$ to $y_3$ of the 16QAM symbol, the most significant symbol bit $y_0$ and the second symbol bit $y_1$ are strong bits, and the third symbol bit $y_2$ and the fourth symbol bit $y_3$ are weak bits.

Figure 15:
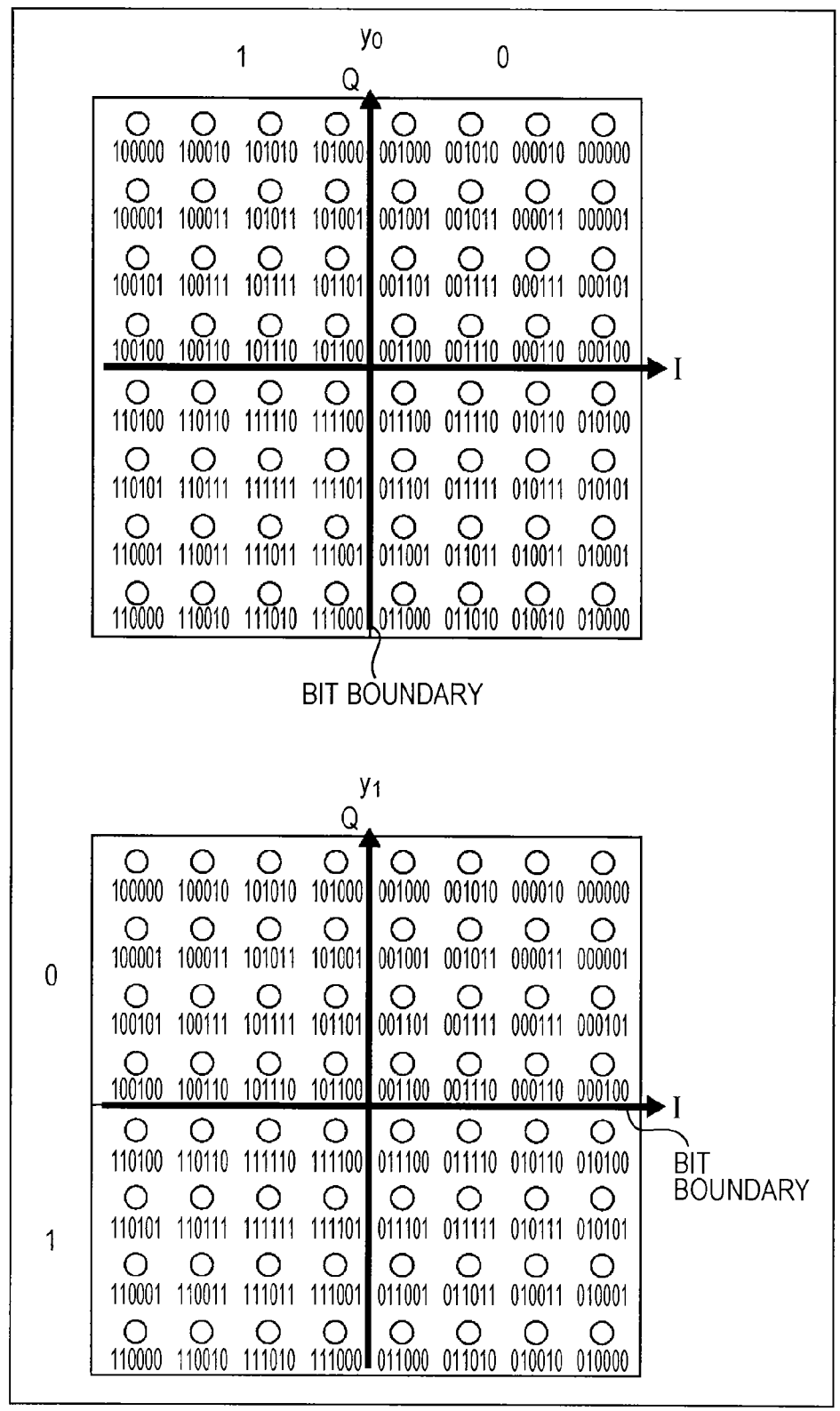
FIG. 15 is a diagram illustrating arrangements of constellation points of 64QAM.
Figure 16:
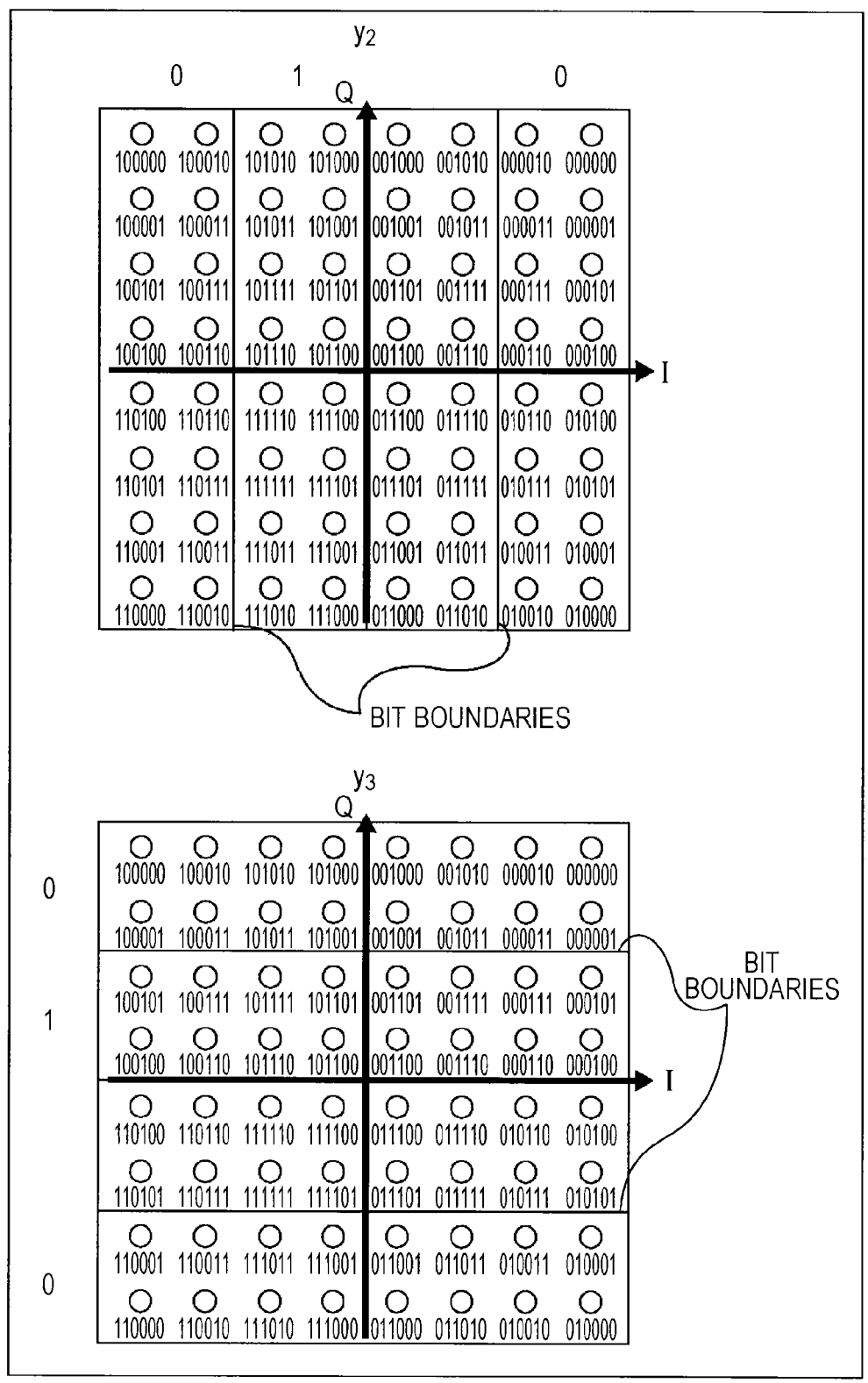
FIG. 16 is a diagram illustrating arrangements of constellation points of 64QAM.
Figure 17:
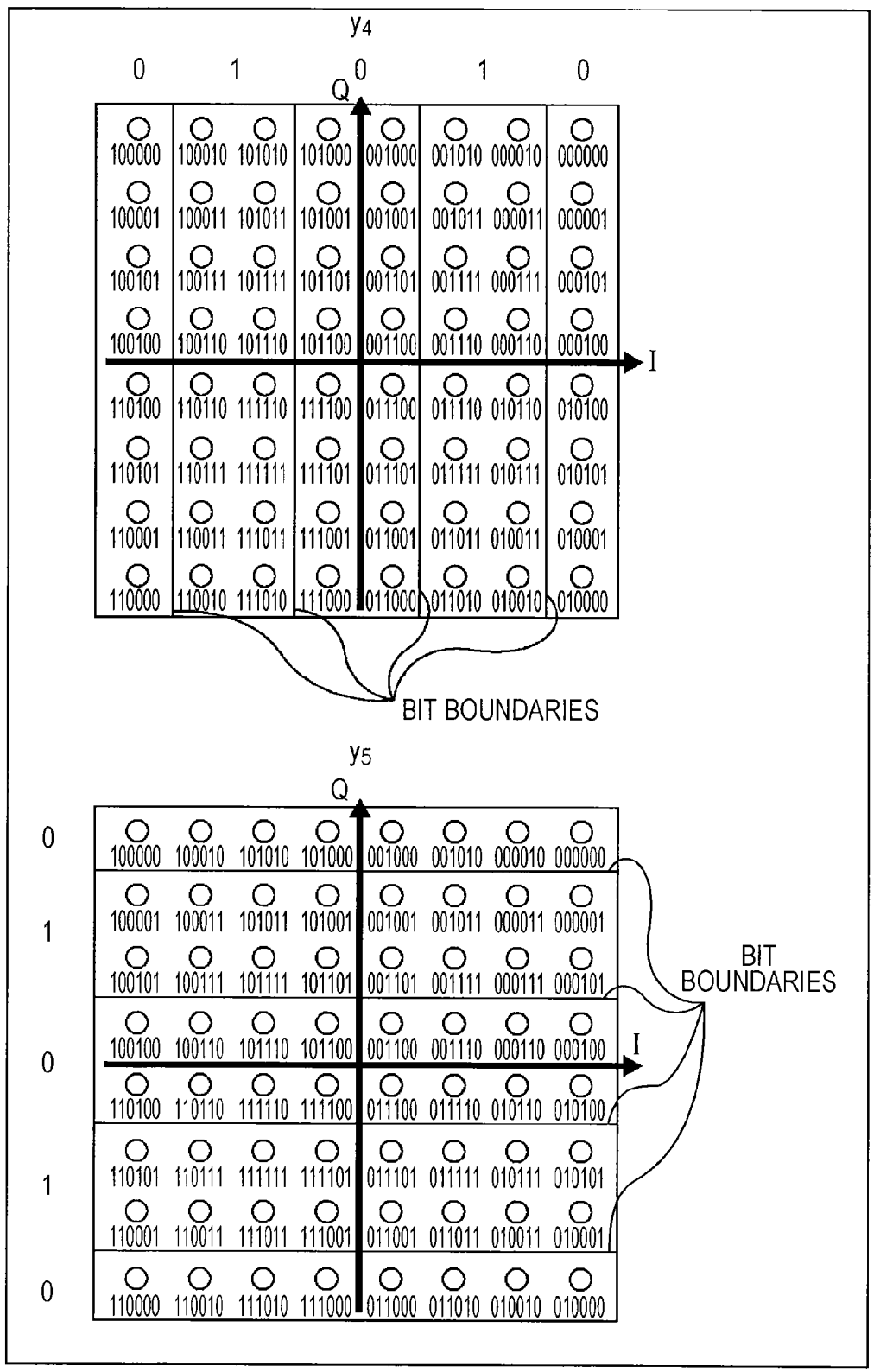
FIG. 17 is a diagram illustrating arrangements of constellation points of 64QAM.

FIGS. 15 to 17 illustrate example arrangements of (constellation points corresponding to) 64 symbols in an IQ plane in a case where the QAM encoder 117 illustrated in FIG. 8 performs 64QAM operation, that is, symbols of DVB-T.2 16QAM.

In 64QAM, one symbol represents 6 bits, and 64 (=$2^6$) symbols are provided. Further, the 64 symbols are arranged in a square of 8 symbols in the I direction and 8 symbols in the Q direction, centered on the origin of the IQ plane.

Symbol bits of one 64QAM symbol can be represented by bits $y_0$, $y_1$, $y_2$, $y_3$, $y_4$, and $y_5$ in order, starting from the most significant bit. In a case where the modulation scheme is 64QAM, 6 code bits of an LDPC code are mapped to a symbol of 6-bit symbol bits $y_0$ to $y_5$.

Here, FIG. 15 illustrates bit boundaries of the most significant symbol bit $y_0$ and the second symbol bit $y_1$ among the symbol bits $y_0$ to $y_5$ of the 64QAM symbol, FIG. 16 illustrates bit boundaries of the third symbol bit $y_2$ and the fourth symbol bit $y_3$, and FIG. 17 illustrates bit boundaries of the fifth symbol bit $y_4$ and the sixth symbol bit $y_5$.

As illustrated in FIG. 15, one bit boundary is provided for each of the most significant symbol bit $y_0$ and the second symbol bit $y_1$. Further, as illustrated in FIG. 16, two bit boundaries are provided for each of the third symbol bit $y_2$ and the fourth symbol bit $y_3$. As illustrated in FIG. 17, four bit boundaries are provided for each of the fifth symbol bit $y_4$ and the sixth symbol bit $y_5$.

Accordingly, among the symbol bits $y_0$ to $y_5$ of the 64QAM symbol, the most significant symbol bit $y_0$ and the second symbol bit $y_1$ are the strongest bits, and the third symbol bit $y_2$ and the fourth symbol bit $y_3$ are the second strongest bits. Then, the fifth symbol bit $y_4$ and the sixth symbol bit $y_5$ are weak bits.

It can be found from FIG. 14 and, furthermore, FIGS. 15 to 17 that symbol bits of an orthogonal modulation symbol have a tendency that more significant bits are stronger bits and less significant bits are weaker bits.

Figure 18:
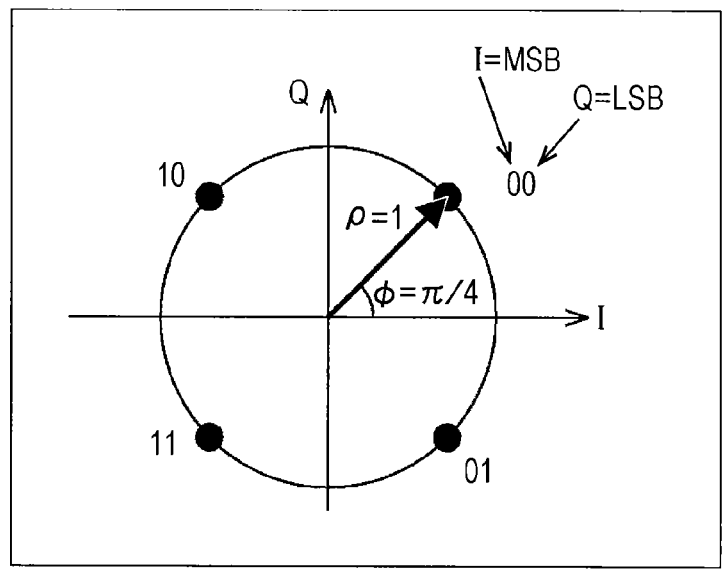
FIG. 18 is a diagram illustrating an arrangement of constellation points defined in the DVB-S.2 standard.

FIG. 18 is a diagram illustrating an example arrangement of (constellation points corresponding to) 4 symbols in an IQ plane in a case where a satellite link is used as the communication path 13 (FIG. 7) and the QAM encoder 117 illustrated in FIG. 8 performs QPSK operation, that is, a diagram of, for example, DVB-S.2 QPSK symbols.

In DVB-S.2 QPSK, each symbol is mapped to one of four constellation points on the circumference of a circle having a radius ρ of 1, centered on the origin of the IQ plane.

Figure 19:
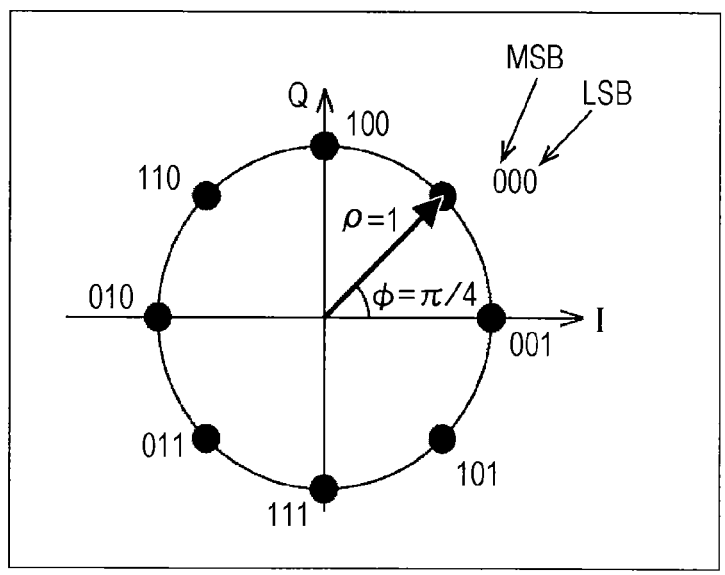
FIG. 19 is a diagram illustrating an arrangement of constellation points defined in the DVB-S.2 standard.

FIG. 19 is a diagram illustrating an example arrangement of 8 symbols in an IQ plane in a case where a satellite link is used as the communication path 13 (FIG. 7) and the QAM encoder 117 illustrated in FIG. 8 performs 8PSK operation, that is, a diagram of, for example, DVB-S.2 8PSK symbols.

In DVB-S.2 8PSK, each symbol is mapped to one of eight constellation points on the circumference of a circle having a radius ρ of 1, centered on the origin of the IQ plane.

Figure 20:
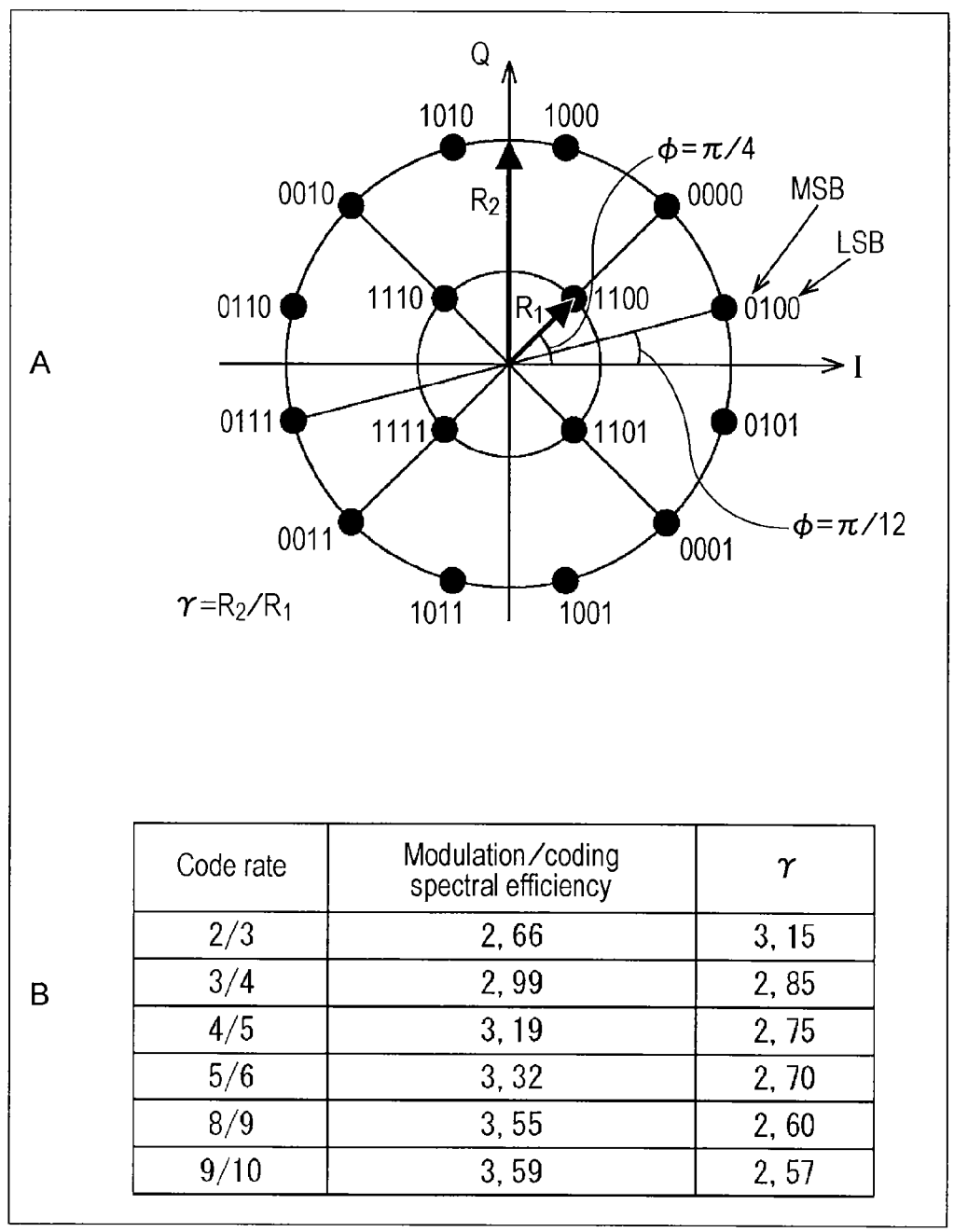
FIG. 20 includes diagrams illustrating an arrangement of constellation points defined in the DVB-S.2 standard.

FIG. 20 includes diagrams illustrating an example arrangement of 16 symbols in an IQ plane in a case where a satellite link is used as the communication path 13 (FIG. 7) and the QAM encoder 117 illustrated in FIG. 8 performs 16APSK operation, that is, diagrams of, for example, DVB-S.2 16APSK symbols.

Part A of FIG. 20 illustrates an arrangement of constellation points of DVB-S.2 16APSK.

In DVB-S.2 16APSK, each symbol is mapped to one of 16 constellation points in total, namely, 4 constellation points on the circumference of a circle having a radius $R_1$ and 12 constellation points on the circumference of a circle having a radius $R_2$ ($>R_1$), centered on the origin of the IQ plane.

Part B of FIG. 20 illustrates the ratio $\gamma=R_2/R_1$, which is the ratio of the radii $R_2$ and $R_1$ in the arrangement of constellation points of DVB-S.2 16APSK.

In the arrangement of constellation points of DVB-S.2 16APSK, the ratio γ of the radii $R_2$ and $R_1$ differs depending on the code rate.

Figure 21:
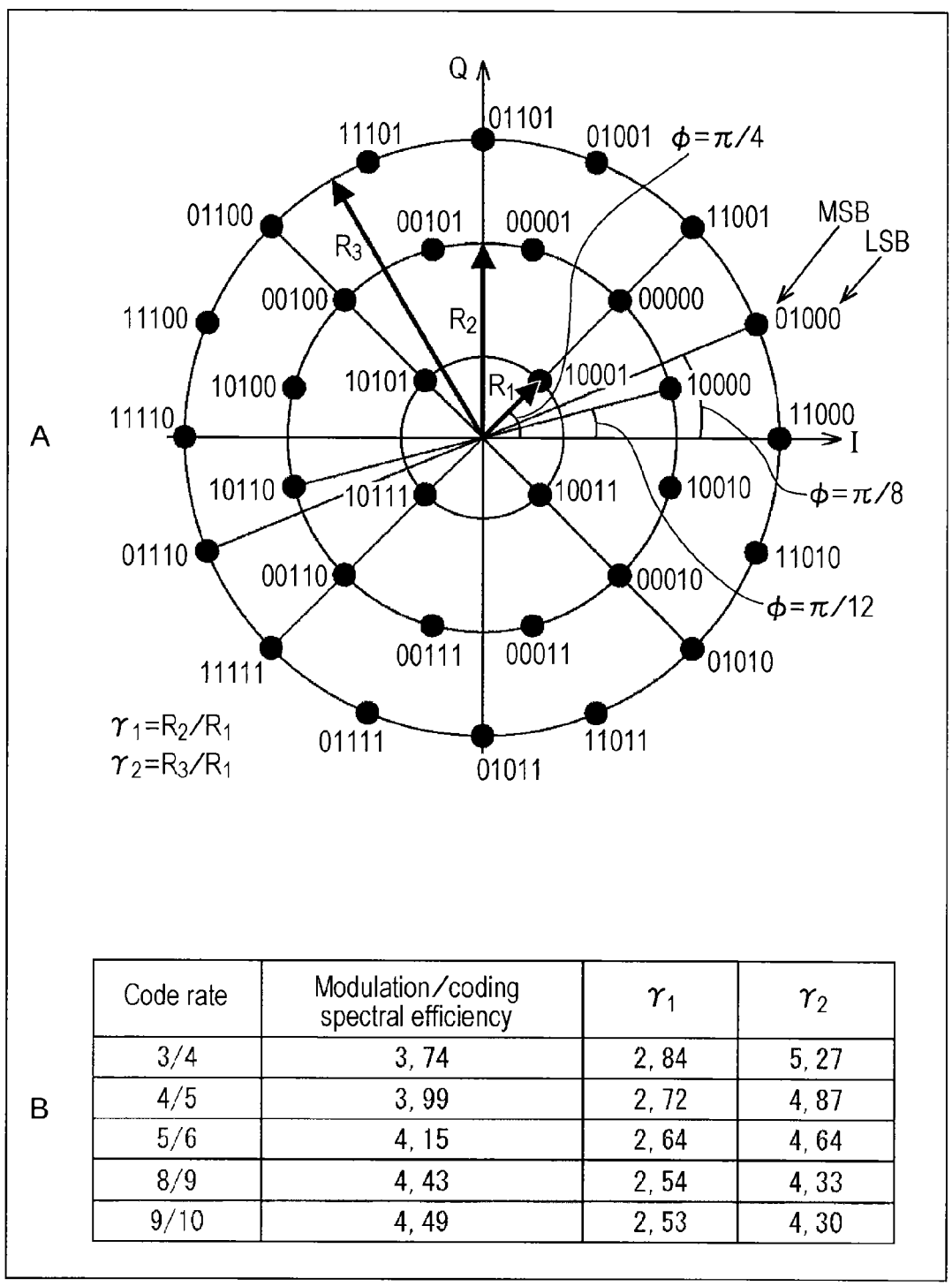
FIG. 21 includes diagrams illustrating an arrangement of constellation points defined in the DVB-S.2 standard.

FIG. 21 includes diagrams illustrating an example arrangement of 32 symbols in an IQ plane in a case where a satellite link is used as the communication path 13 (FIG. 7) and the QAM encoder 117 illustrated in FIG. 8 performs 32APSK operation, that is, diagrams of, for example, DVB-S.2 32APSK symbols.

Part A of FIG. 21 illustrates an arrangement of constellation points of DVB-S.2 32APSK.

In DVB-S.2 32APSK, each symbol is mapped to one of 32 constellation points in total, namely, 4 constellation points on the circumference of a circle having a radius $R_1$, 12 constellation points on the circumference of a circle having a radius $R_2$ ($>R_1$), and 16 constellation points on the circumference of a circle having a radius $R_3$ ($>R_2$), centered on the origin of the IQ plane.

Part B of FIG. 21 illustrates the ratio $\gamma_1=R_2/R_1$, which is the ratio of the radii $R_2$ and $R_1$, and the ratio $\gamma_2=R_3/R_1$, which is the ratio of the radii $R_3$ and $R_1$, in the arrangement of constellation points of DVB-S.2 32APSK.

In the arrangement of constellation points of DVB-S.2 32APSK, the ratio $\gamma_1$ of the radii $R_2$ and $R_1$ and the ratio $\gamma_2$ of the radii $R_3$ and $R_1$ each differ depending on the code rate.

The symbol bits of the symbols of the respective DVB-S.2 orthogonal modulation types (QPSK, 8PSK, 16APSK, and 32APSK) having the arrangements of constellation points illustrated in FIGS. 18 to 21 also include strong bits and weak bits similarly to those illustrated in FIGS. 14 to 17.

Here, as described above with reference to FIGS. 12 and 13, the LDPC code output from the LDPC encoder 115 (FIG. 8) includes code bits robust to errors and code bits sensitive to errors.

Furthermore, as described above with reference to FIGS. 14 to 21, the symbol bits of a symbol of orthogonal modulation performed by the QAM encoder 117 include strong bits and weak bits.

Thus, assigning code bits of an LDPC code which are sensitive to errors to symbol bits of an orthogonal modulation symbol which are sensitive to errors would reduce the resistance to errors as a whole.

Accordingly, an interleaver has been proposed that is configured to interleave code bits of an LDPC code such that a code bit of the LDPC code which is sensitive to errors is allocated to a strong bit (symbol bit) of an orthogonal modulation symbol.

The demultiplexer 25 illustrated in FIG. 9 is capable of performing the processing of the above-described interleaver.

Figure 22:
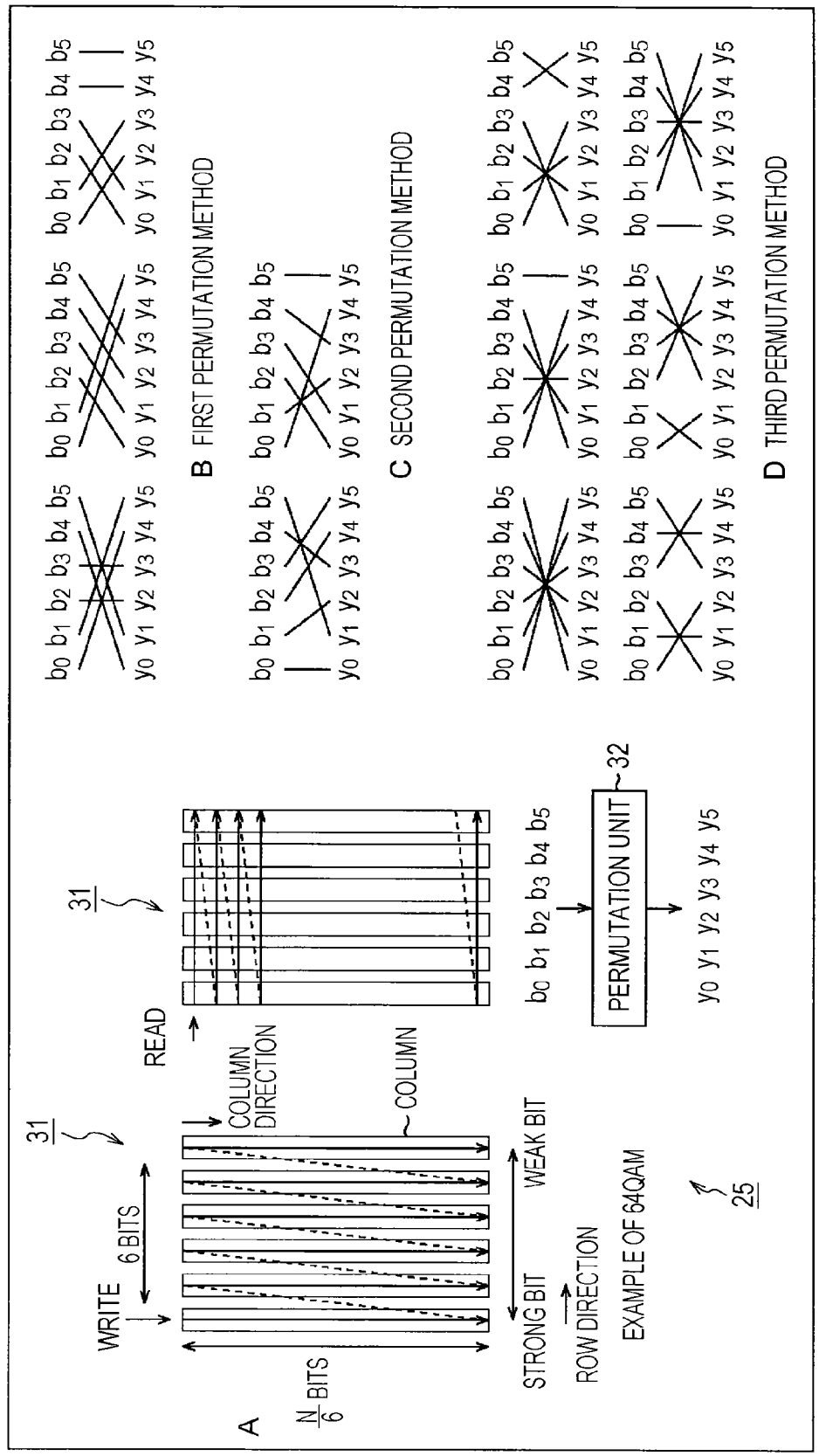
FIG. 22 includes diagrams depicting the processing of a demultiplexer 25.

FIG. 22 includes diagrams depicting the processing of the demultiplexer 25 illustrated in FIG. 9.

More specifically, part A of FIG. 22 illustrates an example functional configuration of the demultiplexer 25.

The demultiplexer 25 includes a memory 31 and a permutation unit 32.

An LDPC code is supplied to the memory 31 from the LDPC encoder 115.

The memory 31 has a storage capacity to store mb bits in its row (horizontal) direction and N/(mb) bits in its column (vertical) direction. Code bits of the LDPC code supplied to the memory 31 are written in the column direction, and are read in the row direction. The read code bits are supplied to the permutation unit 32.

Here, as described above, N (=information length K+parity length M) represents the code length of the LDPC code.

In addition, m represents the number of code bits of the LDPC code which are mapped to one symbol, and b is a certain positive integer and denotes a multiple used to obtain integer multiples of m. As described above, the demultiplexer 25 maps (or symbolizes) code bits of an LDPC code to a symbol, where the multiple b represents the number of symbols obtained by the demultiplexer 25 through single symbolization.

Part A of FIG. 22 illustrates an example configuration of the demultiplexer 25 in a case where the modulation scheme is 64QAM in which each symbol is mapped to one of 64 constellation points, or any other suitable modulation scheme. The number of code bits m of an LDPC code to be mapped to one symbol is therefore 6.

In part A of FIG. 22, furthermore, the multiple b is 1. Therefore, the memory 31 has a storage capacity of N/(6×1) bits in the column direction and (6×1) bits in the row direction.

Here, in the following, a storage area of the memory 31, which has one bit in the row direction and extends in the column direction, is referred to as a "column" as appropriate. In part A of FIG. 22, the memory 31 includes 6 (=6×1) columns.

The demultiplexer 25 writes code bits of the LDPC code to the memory 31 (in the column direction) from the top to the bottom of each column of the memory 31, where the writing operation moves toward the right, starting from the leftmost column.

Further, when the writing of code bits up to the bottom of the rightmost column is completed, code bits are read from the memory 31 in the row direction, starting from the first row of all the columns of the memory 31, in units of 6 bits (i.e., mb bits). The read code bits are supplied to the permutation unit 32.

The permutation unit 32 performs permutation processing to permute the positions of 6 code bits supplied from the memory 31, and outputs the resulting 6 bits as 6 symbol bits $y_0$, $y_1$, $y_2$, $y_3$, $y_4$, and $y_5$ representing one 64QAM symbol.

More specifically, mb (here, 6) code bits are read from the memory 31 in the row direction. If the i-th bit from the most significant bit of the mb code bits read from the memory 31 is represented by bit $b_i$ (where i=0, 1, . . . , mb−1), the 6 code bits read from the memory 31 in the row direction can be represented by bits $b_0$, $b_1$, $b_2$, $b_3$, $b_4$, and $b_5$ in order, starting from the most significant bit.

In terms of the column weights described with reference to FIGS. 12 and 13, the code bits in the bit $b_0$ direction are code bits robust to errors, and the code bits in the bit $b_5$ direction are code bits sensitive to errors.

The permutation unit 32 is configured to perform permutation processing to permute the positions of the 6 code bit $b_0$ to $b_5$ read from the memory 31 so that the code bits sensitive to errors among the 6 code bits $b_0$ to $b_5$ read from the memory 31 may be allocated to strong bits among the symbol bits $y_0$ to $y_5$ representing one 64QAM symbol.

Here, various methods for permuting the 6 code bits $b_0$ to $b_5$ read from the memory 31 and allocating them to the 6 symbol bits $y_0$ to $y_5$ representing one 64QAM symbol have been proposed by many companies.

Part B of FIG. 22 illustrates a first permutation method, part C of FIG. 22 illustrates a second permutation method, and part D of FIG. 22 illustrates a third permutation method.

In part B of FIG. 22 to part D of FIG. 22 (also in FIG. 23, described below), a line connecting bits $b_i$ and $y_j$ indicates that the code bit $b_i$ is allocated to the symbol bit $y_j$ of the symbol (i.e., the position of the code bit $b_i$ is replaced with that of the symbol bit $y_j$).

In the first permutation method illustrated in part B of FIG. 22, the use of one of three permutation types is proposed. In the second permutation method illustrated in part C of FIG. 22, the use of one of two permutation types is proposed.

In the third permutation method illustrated in part D of FIG. 22, the sequential selection and use of six permutation types are proposed.

Figure 23:
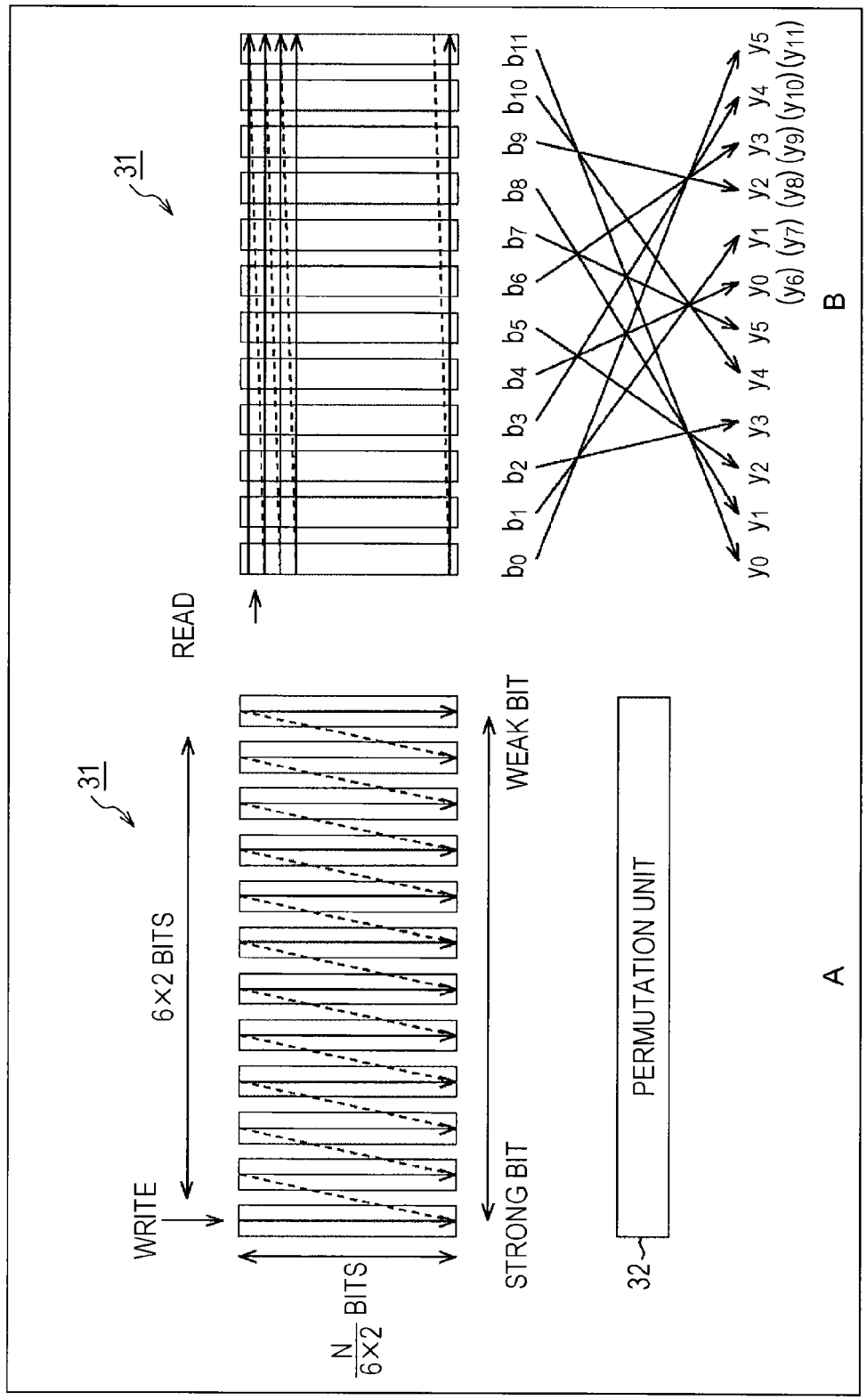
FIG. 23 includes diagrams depicting the processing of the demultiplexer 25.

FIG. 23 illustrates an example configuration of the demultiplexer 25 in a case where the modulation scheme is 64QAM in which each symbol is mapped to one of 64 constellation points, or any other suitable modulation scheme (and therefore, the number of code bits m of an LDPC code to be mapped to one symbol is 6, similarly to the case in FIG. 22) and in a case where the multiple b is 2, and also illustrates a fourth permutation method.

In a case where the multiple b is 2, the memory 31 has a storage capacity of N/(6×2) bits in the column direction and (6×2) bits in the row direction, and includes 12 (=6×2) columns.

Part A of FIG. 23 illustrates the order in which code bits of an LDPC code are written to the memory 31.

As described with reference to FIG. 22, the demultiplexer 25 writes code bits of the LDPC code to the memory 31 (in the column direction) from the top to the bottom of each column of the memory 31, where the writing operation moves toward the right, starting from the leftmost column.

Further, when the writing of code bits up to the bottom of the rightmost column is completed, code bits are read from the memory 31 in the row direction, starting from the first row of all the columns of the memory 31, in units of 12 bits (i.e., mb bits). The read code bits are supplied to the permutation unit 32.

The permutation unit 32 performs permutation processing to permute the positions of 12 code bits supplied from the memory 31, by using the fourth permutation method, and outputs the resulting 12 bits as 12 bits representing two symbols of 64QAM (i.e., b symbols), that is, 6 symbol bits $y_0$, $y_1$, $y_2$, $y_3$, $y_4$, and $y_5$ representing one 64QAM symbol and 6 symbol bits $y_0$, $y_1$, $y_2$, $y_3$, $y_4$, and $y_5$ representing the subsequent one symbol.

Here, part B of FIG. 23 illustrates a fourth permutation method that is a method for performing permutation processing by the permutation unit 32 illustrated in part A of FIG. 23.

Note that, in the permutation processing, in a case where the multiple b is 2 (also in a case where the multiple b is 3 or more), mb code bits are allocated to mb symbol bits of consecutive b symbols. In the following, including FIG. 23, the (i+1)-th bit from the most significant bit of mb symbol bits of consecutive b symbols is represented by bit (or symbol bit) $y_i$, for convenience of illustration.

The optimum permutation type of code bits, which increases the error-rate performance in an AWGN communication path, depends on the code rate or code length of an LDPC code, the modulation scheme, and so forth.

[Parity Interleaving]

Next, parity interleaving performed by the parity interleaver 23 illustrated in FIG. 9 will be described with reference to FIGS. 24 to 26.

Figure 24:
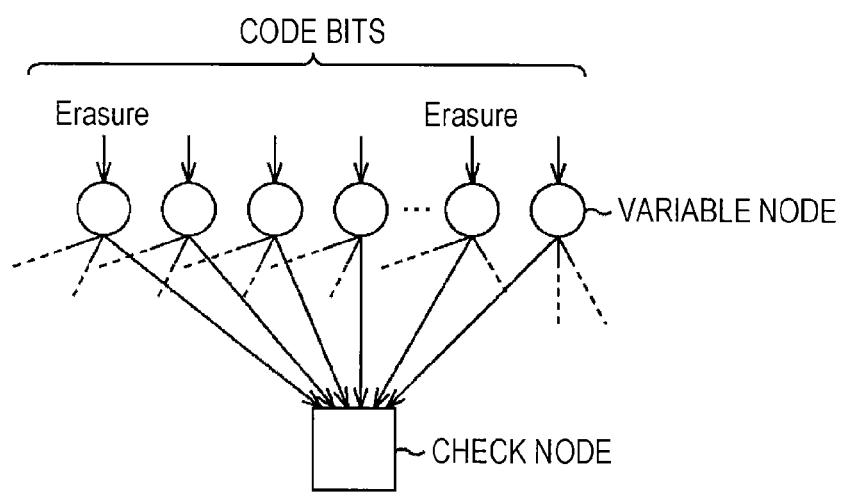
FIG. 24 is a diagram illustrating a Tanner graph for LDPC code decoding.

FIG. 24 illustrates (part of) a Tanner graph of a parity check matrix of an LDPC code.

As illustrated in FIG. 24, if errors such as erasures simultaneously occur in multiple, such as two, (code bits corresponding to) variable nodes connected to a check node, the check node returns a message with the probability of the value 0 being equal to the probability of the value 1 to all the variable nodes connected to the check node. Hence, the decoding performance deteriorates if a plurality of variable nodes connected to the same check node simultaneously become erasures or the like.

Meanwhile, the LDPC code output from the LDPC encoder 115 illustrated in FIG. 8, which is defined in the DVB-S.2 and similar standards, is an IRA code, and a parity matrix $H_T$ of the parity check matrix H has a stepwise structure, as illustrated in FIG. 11.

Figure 25:
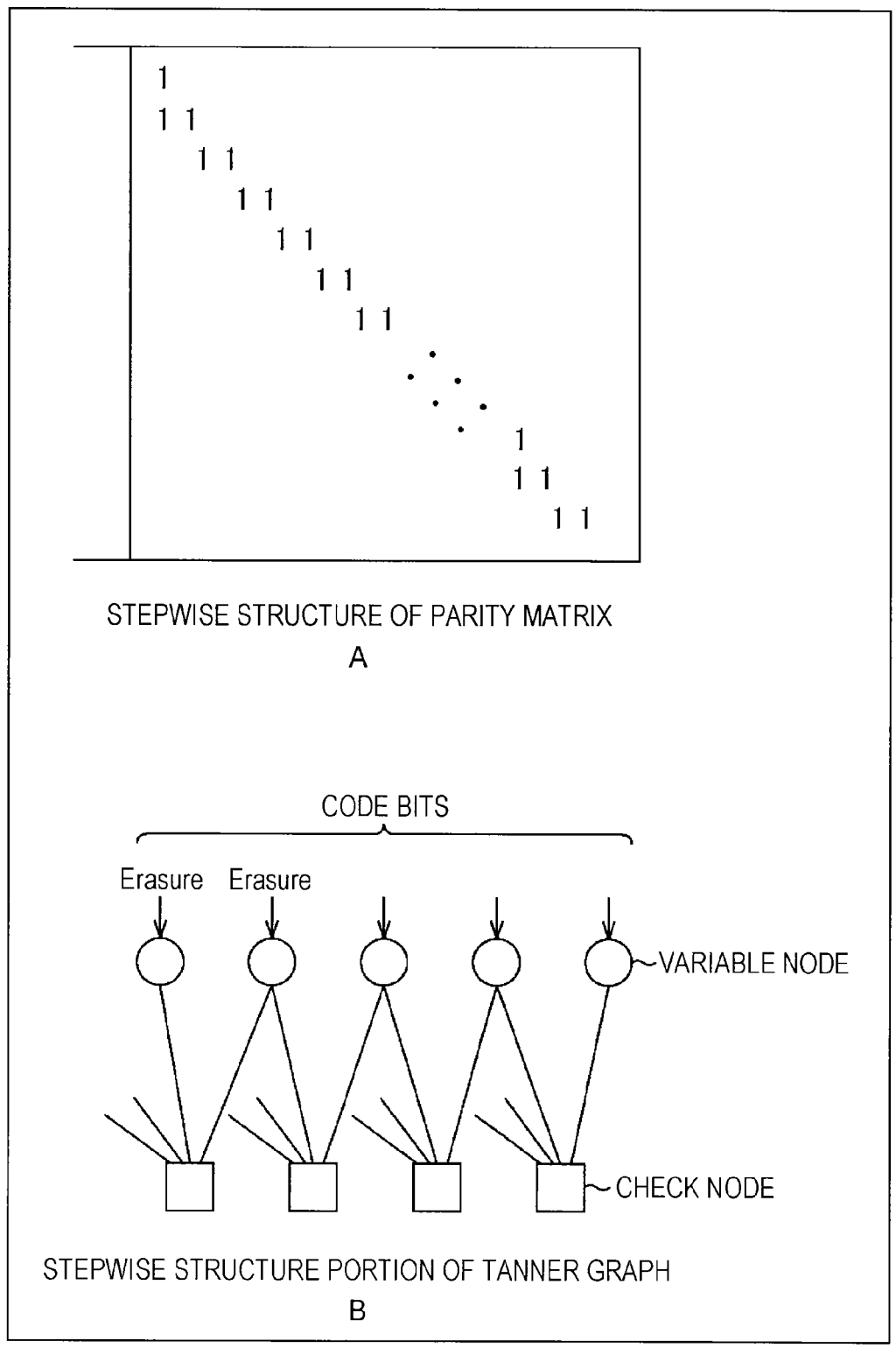
FIG. 25 includes diagrams illustrating a parity matrix $H_T$ having a stepwise structure, and a Tanner graph corresponding to the parity matrix $H_T$.

FIG. 25 illustrates a parity matrix $H_T$ having a stepwise structure, and a Tanner graph corresponding to the parity matrix $H_T$.

More specifically, part A of FIG. 25 illustrates a parity matrix $H_T$ having a stepwise structure, and part B of FIG. 25 illustrates a Tanner graph corresponding to the parity matrix $H_T$ illustrated in part A of FIG. 25.

In the parity matrix $H_T$ having a stepwise structure, elements of 1 are adjacent in each row (except the first row). Thus, in the Tanner graph of the parity matrix $H_T$, two adjacent variable nodes corresponding to two adjacent elements having the value 1 in the parity matrix $H_T$ are connected to the same check node.

Accordingly, if errors simultaneously occur in parity bits corresponding two adjacent variable nodes as described above due to burst errors, erasures, and the like, a check node connected to the two variable nodes (i.e., variable nodes whose messages are determined using the parity bits) corresponding to the two erroneous parity bits returns a message with the probability of the value 0 being equal to the probability of the value 1 to the variable nodes connected to the check node. The decoding performance thus deteriorates. Then, if the burst length (which is the number of consecutive erroneous parity bits) increases, the number of check nodes that return the message with equal probabilities increases, resulting in further deterioration of decoding performance.

Accordingly, the parity interleaver 23 (FIG. 9) performs parity interleaving on the LDPC code supplied from the LDPC encoder 115 to interleave parity bits to different parity bit positions in order to prevent the deterioration of decoding performance described above.

Figure 26:
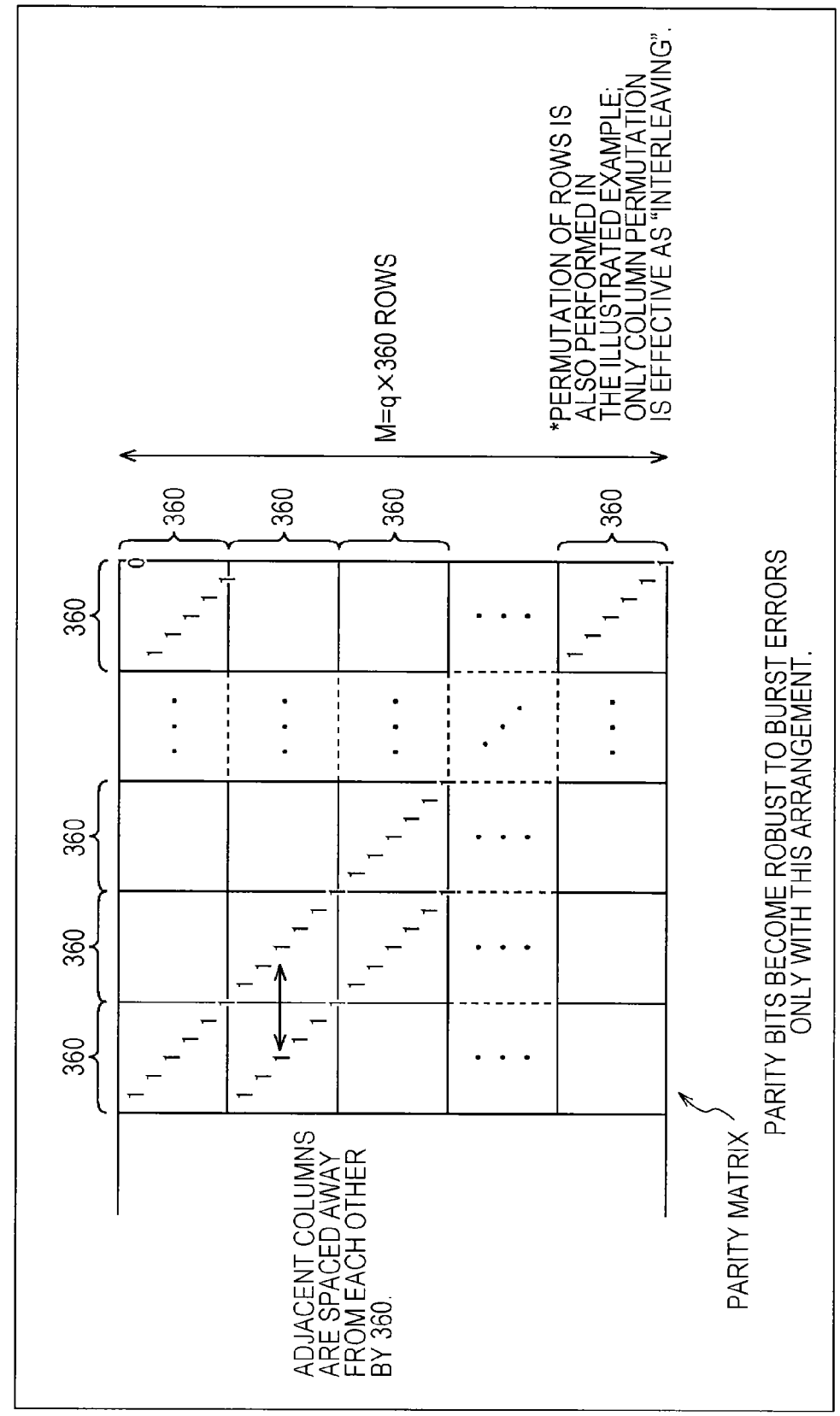
FIG. 26 is a diagram illustrating a parity matrix $H_T$ of a parity check matrix H corresponding to an LDPC code that has been subjected to parity interleaving.

FIG. 26 illustrates a parity matrix $H_T$ of a parity check matrix H corresponding to an LDPC code which has been subjected to parity interleaving by the parity interleaver 23 illustrated in FIG. 9.

Here, the information matrix $H_I$ of the parity check matrix H corresponding to the LDPC code defined in the DVB-S.2 and similar standards, which is output from the LDPC encoder 115, has a cyclic structure.

The term "cyclic structure" refers to a structure in which a certain column matches another column that is cyclically shifted. Examples of the cyclic structure include a structure in which the position of "1" in each row of every P columns corresponds to the position to which the position of the first column out of the P columns has been cyclically shifted in a column direction by a value proportional to the value q obtained by dividing the parity length M. In the following, the number of columns P in the cyclic structure will be referred to as the "number of unit columns of the cyclic structure" as appropriate.

As described with reference to FIGS. 12 and 13, examples of the LDPC codes defined in the DVB-S.2 and similar standards include two types of LDPC codes having code lengths N of 64800 bits and 16200 bits. For either of the two types of LDPC codes, the number of unit columns P of the cyclic structure is defined to be 360, which is one of the divisors, excluding 1 and M, of the parity length M.

In addition, the parity length M has a value other than the prime number represented by the equation $M = q \times P = q \times 360$, by using a value q which differs depending on the code rate. Therefore, similarly to the number of unit columns P of the cyclic structure, the value q is also one of the divisors, excluding 1 and M, of the parity length M, and is given by dividing the parity length M by the number of unit columns P of the cyclic structure (i.e., the parity length M is the product of the divisors P and q of the parity length M).

As described above, the parity interleaver 23 performs parity interleaving on an N-bit LDPC code to interleave the $(K+qx+y+1)$-th code bit among the code bits of the N-bit LDPC code to the $(K+Py+x+1)$-th code bit position, where K denotes the information length, x is an integer greater than or equal to 0 and less than P, and y is an integer greater than or equal to 0 and less than q.

The $(K+qx+y+1)$-th code bit and the $(K+Py+x+1)$-th code bit are code bits positioned after the $(K+1)$-th code bit, and are therefore parity bits. Accordingly, the position of a parity bit of an LDPC code is shifted by parity interleaving.

In this parity interleaving operation, (parity bits corresponding to) variable nodes connected to the check node are spaced away from each other by the number of unit columns P of the cyclic structure, i.e., in the illustrated example, 360 bits, thereby preventing simultaneous occurrence of errors in a plurality of variable nodes connected to the same check node for a burst length less than 360 bits. The resistance to burst errors can therefore be improved.

Note that the LDPC code, which has undergone parity interleaving such that the $(K+qx+y+1)$-th code bit is interleaved to the $(K+Py+x+1)$-th code bit position, is identical to an LDPC code of a parity check matrix (hereinafter also referred to as a "transformed parity check matrix") that is obtained through column permutation to replace the $(K+qx+y+1)$-th column of the original parity check matrix H with the $(K+Py+x+1)$-th column.

Furthermore, as illustrated in FIG. 26, the parity matrix of the transformed parity check matrix has a pseudo-cyclic structure whose number of unit columns is P (in FIG. 26, 360).

The term "pseudo-cyclic structure", as used herein, refers to a structure in which a portion of a matrix has a cyclic structure. A transformed parity check matrix produced by performing column permutation, corresponding to parity interleaving, on a parity check matrix of an LDPC code defined in the DVB-S.2 and similar standards has a portion of 360 rows and 360 columns in a right corner portion thereof (which corresponds to a shift matrix described below) in which only one element of "1" is missing (i.e., an element of "0" appears). In this regard, this cyclic structure is not a complete cyclic structure, called a pseudo-cyclic structure.

Note that the transformed parity check matrix illustrated in FIG. 26 is a matrix obtained by performing permutation of rows (row permutation), in addition to column permutation corresponding to parity interleaving, on the original parity check matrix H such that the transformed parity check matrix includes component matrices described below.

[Column Twist Interleaving]

Next, column twist interleaving as reordering processing performed by the column twist interleaver 24 illustrated in FIG. 9 will be described with reference to FIGS. 27 to 30.

The transmitting device 11 illustrated in FIG. 8 transmits one or more code bits of an LDPC code as one symbol. More specifically, for example, QPSK is used as a modulation scheme for the transmission of 2 code bits as one symbol, and 16APSK or 16QAM is used as a modulation scheme for the transmission of 4 code bits as one symbol.

In a case where 2 code bits are to be transmitted as one symbol, an error such as an erasure occurring in a certain symbol may cause all the code bits of the symbol to be erroneous (or erasures).

Accordingly, in order to reduce the probability of a plurality of (code bits corresponding to) variable nodes connected to the same check node becoming simultaneously erasures to improve decoding performance, it is necessary to prevent variable nodes corresponding to code bits of one symbol from being connected to the same check node.

In contrast, in the parity check matrix H of the LDPC code defined in the DVB-S.2 and similar standards, which is output from the LDPC encoder 115, as described above, the information matrix $H_A$ has a cyclic structure and the parity matrix $H_T$ has a stepwise structure. In addition, as described with reference to FIG. 26, in a transformed parity check matrix, which is a parity check matrix of an LDPC code that has been subjected to parity interleaving, the parity matrix also has a cyclic structure (more specifically, as described above, a pseudo-cyclic structure).

Figure 27:
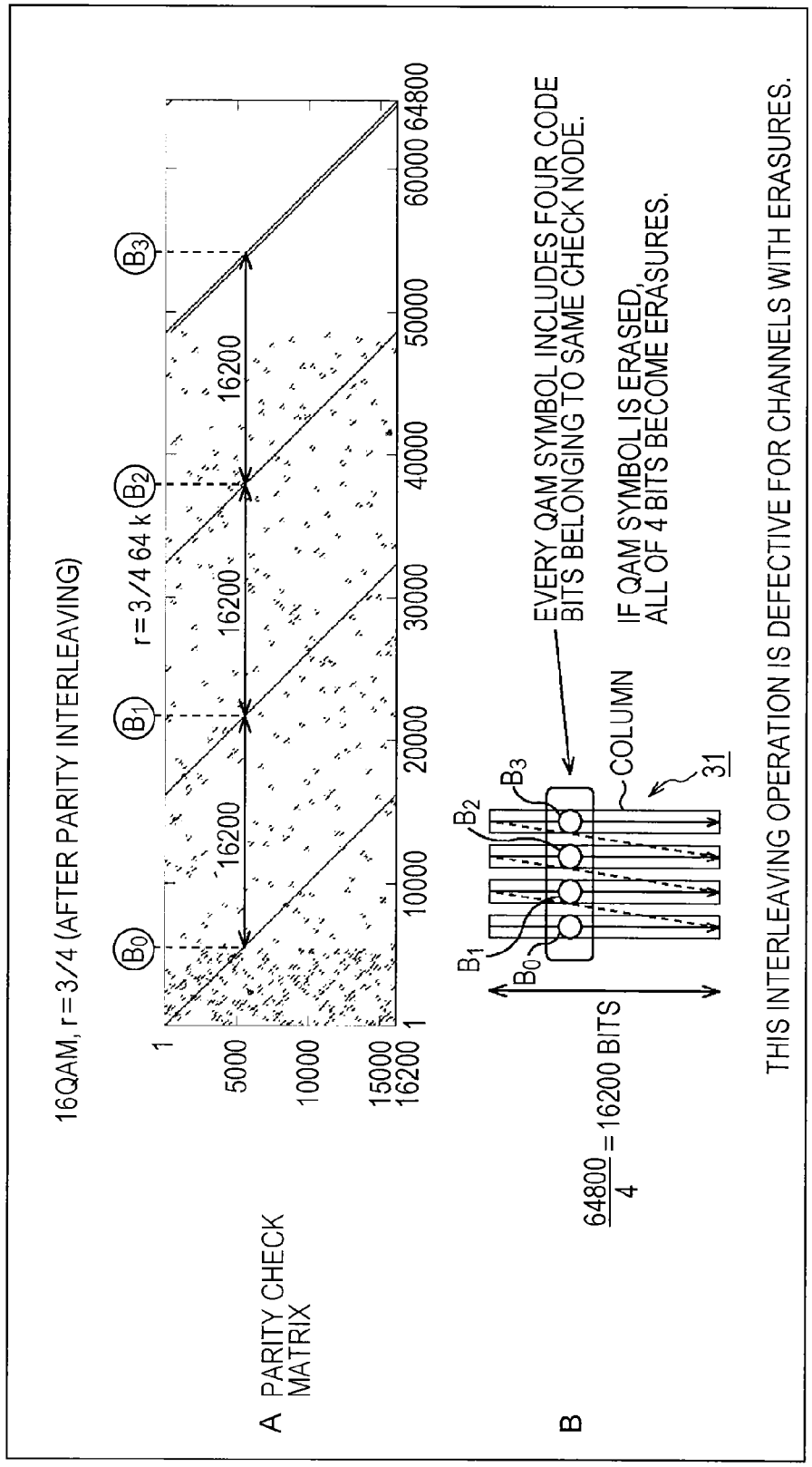
FIG. 27 includes diagrams illustrating a transformed parity check matrix.

FIG. 27 illustrates a transformed parity check matrix.

More specifically, part A of FIG. 27 illustrates a transformed parity check matrix of a parity check matrix H of an LDPC code having a code length N of 64800 bits and a code rate (r) of 3/4.

In the transformed parity check matrix illustrated in part A of FIG. 27, the positions of elements having the value 1 are indicated by dots ("•").

Part B of FIG. 27 illustrates processing that the demultiplexer 25 (FIG. 9) performs on an LDPC code of the transformed parity check matrix illustrated in part A of FIG. 27, that is, an LDPC code that has been subjected to parity interleaving.

In part B of FIG. 27, using a modulation scheme for mapping each symbol to one of 16 constellation points, such as 16APSK or 16QAM, code bits of the LDPC code that has been subjected to parity interleaving are written to four columns of the memory 31 in the demultiplexer 25 in a column direction.

The code bits written to the four columns of the memory 31 in the column direction are read in a row direction in units of 4 bits, and are mapped to one symbol.

In this case, 4 code bits $B_0$, $B_1$, $B_2$, and $B_3$, which are to be mapped to one symbol, may be code bits corresponding to 1s in an arbitrary row of the transformed parity check matrix illustrated in part A of FIG. 27. In this case, the variable nodes corresponding to the code bits $B_0$, $B_1$, $B_2$, and $B_3$ are connected to the same check node.

Accordingly, in a case where 4 code bits $B_0$, $B_1$, $B_2$, and $B_3$ of one symbol are code bits corresponding to is in an arbitrary row of the transformed parity check matrix, an erasure occurring in the symbol would make it difficult to determine an appropriate message for the same check node to which the variable nodes respectively corresponding to the code bits $B_0$, $B_1$, $B_2$, and $B_3$ are connected, resulting in deterioration of decoding performance.

Also for code rates other than a code rate of 3/4, a plurality of code bits corresponding to a plurality of variable nodes connected to the same check node may be mapped to one 16APSK or 16QAM symbol.

Accordingly, the column twist interleaver 24 performs column twist interleaving on the LDPC code that has been subjected to parity interleaving, which is supplied from the parity interleaver 23, to interleave code bits of the LDPC code so that a plurality of code bits corresponding to is in an arbitrary row of the transformed parity check matrix are not included in one symbol.

Figure 28:
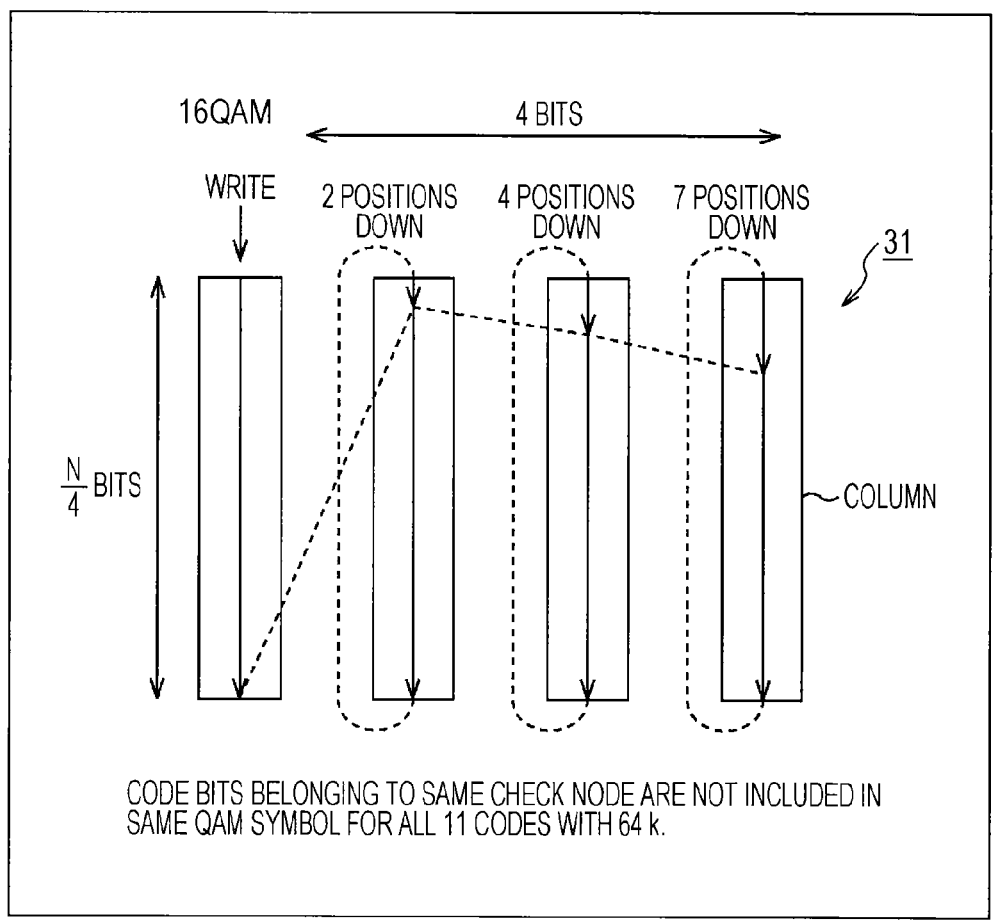
FIG. 28 is a diagram depicting the processing of a column twist interleaver 24.

FIG. 28 is a diagram depicting column twist interleaving. More specifically, FIG. 28 illustrates the memory 31 (FIGS. 22 and 23) of the demultiplexer 25.

As described with reference to FIG. 22, the memory 31 has a storage capacity to store N/(mb) bits in its column (vertical) direction and mb bits in its row (horizontal) direction, and includes mb columns. Then, the column twist interleaver 24 performs column twist interleaving by controlling a write start position from which the writing operation starts when a code bit of an LDPC code is written to the memory 31 in the column direction and is read from the memory 31 in the row direction.

More specifically, the column twist interleaver 24 appropriately changes a write start position with which the writing of a code bit starts in each of a plurality of columns so that a plurality of code bits read in the row direction, which are to be mapped to one symbol, does not match code bits corresponding to is in an arbitrary row of the transformed parity check matrix (That is, the column twist interleaver 24 reorders code bits of the LDPC code so that a plurality of code bits corresponding to 1s in an arbitrary row of the parity check matrix are not included in the same symbol).

Here, FIG. 28 illustrates an example configuration of the memory 31 in a case where the modulation scheme is 16APSK or 16QAM and the multiple b described with reference to FIG. 22 is 1. Accordingly, the number of bits m of the code bits of the LDPC code that are to be mapped to one symbol is 4, and the memory 31 includes 4 (=mb) columns.

The column twist interleaver 24 (instead of the demultiplexer 25 illustrated in FIG. 22) writes code bits of the LDPC code to the memory 31 (in the column direction) from the top to the bottom of each of the 4 columns of the memory 31, where the writing operation moves toward the right, starting from the leftmost column.

Further, when the writing of code bits up to the rightmost column is completed, the column twist interleaver 24 reads code bits from the memory 31 in the row direction, starting from the first row of all the columns of the memory 31, in units of 4 bits (i.e., mb bits), and outputs the read code bits as an LDPC code that has been subjected to column twist interleaving to the permutation unit 32 (FIGS. 22 and 23) of the demultiplexer 25.

In this regard, in the column twist interleaver 24, if the address of the first (or top) position of each column is represented by 0 and the addresses of the respective positions in the column direction are represented by integers arranged in ascending order, the write start position for the leftmost column is set to the position at the address 0, the write start position for the second column (from the left) is set to the position at the address 2, the write start position for the third column is set to the position at the address 4, and the write start position for the fourth column is set to the position of the address 7.

Note that, after writing code bits up to the bottom of the column for which the write start position is set to a position other than the position at the address 0, the column twist interleaver 24 returns to the first position (i.e., the position at the address 0), and writes code bits up to the position immediately before the write start position. The column twist interleaver 24 then performs writing to the subsequent (right) column.

The column twist interleaving operation described above may prevent a plurality of code bits corresponding to a plurality of variable nodes connected to the same check node for an LDPC code defined in DVB-T.2 and similar standards from being mapped to one symbol of 16APSK or 16QAM (i.e., from being included in the same symbol). Therefore, decoding performance can be improved in a communication path with an erasure.

FIG. 29 illustrates the number of columns of the memory 31 which is necessary for column twist interleaving, and the addresses of write start positions, in association with each modulation scheme, for an LDPC code having a code length N of 64800 and each of the 11 code rates, which is defined in the DVB-T.2 standard.

The multiple b is 1, and the number of bits m of one symbol is 2 when, for example, QPSK is employed as a modulation scheme. In this case, as illustrated in FIG. 29, the memory 31 has 2 columns for storing 2×1 (=mb) bits in its row direction, and stores 64800/(2×1) bits in its column direction.

Further, the write start position for the first column out of the 2 columns of the memory 31 is set to the position at the address 0, and the write start position for the second column is set to the position at the address 2.

The multiple b is 1 when, for example, one of the first to third permutation types illustrated in FIG. 22 is employed as the permutation type of the permutation processing of the demultiplexer 25 (FIG. 9).

The multiple b is 2, and the number of bits m of one symbol is 2 when, for example, QPSK is employed as a modulation scheme. In this case, as illustrated in FIG. 29, the memory 31 has 4 columns for storing 2×2 bits in its row direction, and stores 64800/(2×2) bits in its column direction.

Further, the write start position for the first column out of the 4 columns of the memory 31 is set to the position at the address 0, the write start position for the second column is set to the position at the address 2, the write start position for the third column is set to the position at the address 4, and the write start position for the fourth column is set to the position at the address 7.

Note that the multiple b is 2 when, for example, the fourth permutation type illustrated in FIG. 23 is employed as the permutation type of the permutation processing of the demultiplexer 25 (FIG. 9).

The multiple b is 1, and the number of bits m of one symbol is 4 when, for example, 16QAM is employed as a modulation scheme. In this case, as illustrated in FIG. 29, the memory 31 has 4 columns for storing 4×1 bits in its row direction, and stores 64800/(4×1) bits in its column direction.

Further, the write start position for the first column out of the 4 columns of the memory 31 is set to the position at the address 0, the write start position for the second column is set to the position at the address 2, the write start position for the third column is set to the position at the address 4, and the write start position for the fourth column is set to the position at the address 7.

The multiple b is 2, and the number of bits m of one symbol is 4 when, for example, 16QAM is employed as a modulation scheme. In this case, as illustrated in FIG. 29, the memory 31 has 8 columns for storing 4×2 bits in its row direction, and stores 64800/(4×2) bits in its column direction.

Further, the write start position for the first column out of the 8 columns of the memory 31 is set to the position at the address 0, the write start position for the second column is set to the position at the address 0, the write start position for the third column is set to the position at the address 2, the write start position for the fourth column is set to the position at the address 4, the write start position for the fifth column is set to the position at the address 4, the write start position for the sixth column is set to the position at the address 5, the write start position for the seventh column is set to the position at the address 7, and the write start position for the eighth column is set to the position at the address 7.

The multiple b is 1, and the number of bits m of one symbol is 6 when, for example, 64QAM is employed as a modulation scheme. In this case, as illustrated in FIG. 29, the memory 31 has 6 columns for storing 6×1 bits in its row direction, and stores 64800/(6×1) bits in its column direction.

Further, the write start position for the first column out of the 6 columns of the memory 31 is set to the position at the address 0, the write start position for the second column is set to the position at the address 2, the write start position for the third column is set to the position at the address 5, the write start position for the fourth column is set to the position at the address 9, the write start position for the fifth column is set to the position at the address 10, and the write start position for the sixth column is set to the position at the address 13.

The multiple b is 2, and the number of bits m of one symbol is 6 when, for example, 64QAM is employed as a modulation scheme. In this case, as illustrated in FIG. 29, the memory 31 has 12 columns for storing 6×2 bits in its row direction, and stores 64800/(6×2) bits in its column direction.

Further, the write start position for the first column out of the 12 columns of the memory 31 is set to the position at the address 0, the write start position for the second column is set to the position at the address 0, the write start position for the third column is set to the position at the address 2, the write start position for the fourth column is set to the position at the address 2, the write start position for the fifth column is set to the position at the address 3, the write start position for the sixth column is set to the position at the address 4, the write start position for the seventh column is set to the position at the address 4, the write start position for the eighth column is set to the position at the address 5, the write start position for the ninth column is set to the position at the address 5, the write start position for the tenth column is set to the position at the address 7, the write start position for the eleventh column is set to the position at the address 8, and the write start position for the twelfth column is set to the position at the address 9.

The multiple b is 1, and the number of bits m of one symbol is 8 when, for example, 256QAM is employed as a modulation scheme. In this case, as illustrated in FIG. 29, the memory 31 has 8 columns for storing 8×1 bits in its row direction, and stores 64800/(8×1) bits in its column direction.

Further, the write start position for the first column out of the 8 columns of the memory 31 is set to the position at the address 0, the write start position for the second column is set to the position at the address 0, the write start position for the third column is set to the position at the address 2, the write start position for the fourth column is set to the position at the address 4, the write start position for the fifth column is set to the position at the address 4, the write start position for the sixth column is set to the position at the address 5, the write start position for the seventh column is set to the position at the address 7, and the write start position for the eighth column is set to the position at the address 7.

The multiple b is 2, and the number of bits m of one symbol is 8 when, for example, 256QAM is employed as a modulation scheme. In this case, as illustrated in FIG. 29, the memory 31 has 16 columns for storing 8×2 bits in its row direction, and stores 64800/(8×2) bits in its column direction.

Further, the write start position for the first column out of the 16 columns of the memory 31 is set to the position at the address 0, the write start position for the second column is set to the position at the address 2, the write start position for the third column is set to the position at the address 2, the write start position for the fourth column is set to the position at the address 2, the write start position for the fifth column is set to the position at the address 2, the write start position for the sixth column is set to the position at the address 3, the write start position for the seventh column is set to the position at the address 7, the write start position for the eighth column is set to the position at the address 15, the write start position for the ninth column is set to the position at the address 16, the write start position for the tenth column is set to the position at the address 20, the write start position for the eleventh column is set to the position at the address 22, the write start position for the twelfth column is set to the position at the address 22, the write start position for the thirteenth column is set to the position at the address 27, the write start position for the fourteenth column is set to the position at the address 27, the write start position for the fifteenth column is set to the position at the address 28, and the write start position for the sixteenth column is set to the position at the address 32.

The multiple b is 1, and the number of bits m of one symbol is 10 when, for example, 1024QAM is employed as a modulation scheme. In this case, as illustrated in FIG. 29, the memory 31 has 10 columns for storing 10×1 bits in its row direction, and stores 64800/(10×1) bits in its column direction.

Further, the write start position for the first column out of the 10 columns of the memory 31 is set to the position at the address 0, the write start position for the second column is set to the position at the address 3, the write start position for the third column is set to the position at the address 6, the write start position for the fourth column is set to the position at the address 8, the write start position for the fifth column is set to the position at the address 11, the write start position for the sixth column is set to the position at the address 13, the write start position for the seventh column is set to the position at the address 15, the write start position for the eighth column is set to the position at the address 17, the write start position for the ninth column is set to the position at the address 18, and the write start position for the tenth column is set to the position at the address 20.

The multiple b is 2, and the number of bits m of one symbol is 10 when, for example, 1024QAM is employed as a modulation scheme. In this case, as illustrated in FIG. 29, the memory 31 has 20 columns for storing 10×2 bits in its row direction, and stores 64800/(10×2) bits in its column direction.

Further, the write start position for the first column out of the 20 columns of the memory 31 is set to the position at the address 0, the write start position for the second column is set to the position at the address 1, the write start position for the third column is set to the position at the address 3, the write start position for the fourth column is set to the position at the address 4, the write start position for the fifth column is set to the position at the address 5, the write start position for the sixth column is set to the position at the address 6, the write start position for the seventh column is set to the position at the address 6, the write start position for the eighth column is set to the position at the address 9, the write start position for the ninth column is set to the position at the address 13, the write start position for the tenth column is set to the position at the address 14, the write start position for the eleventh column is set to the position at the address 14, the write start position for the twelfth column is set to the position at the address 16, the write start position for the thirteenth column is set to the position at the address 21, the write start position for the fourteenth column is set to the position at the address 21, the write start position for the fifteenth column is set to the position at the address 23, the write start position for the sixteenth column is set to the position at the address 25, the write start position for the seventeenth column is set to the position at the address 25, the write start position for the eighteenth column is set to the position at the address 26, the write start position for the nineteenth column is set to the position at the address 28, and the write start position for the twentieth column is set to the position at the address 30.

The multiple b is 1, and the number of bits m of one symbol is 12 when, for example, 4096QAM is employed as a modulation scheme. In this case, as illustrated in FIG. 29, the memory 31 has 12 columns for storing 12×1 bits in its row direction, and stores 64800/(12×1) bits in its column direction.

Further, the write start position for the first column out of the 12 columns of the memory 31 is set to the position at the address 0, the write start position for the second column is set to the position at the address 0, the write start position for the third column is set to the position at the address 2, the write start position for the fourth column is set to the position at the address 2, the write start position for the fifth column is set to the position at the address 3, the write start position for the sixth column is set to the position at the address 4, the write start position for the seventh column is set to the position at the address 4, the write start position for the eighth column is set to the position at the address 5, the write start position for the ninth column is set to the position at the address 5, the write start position for the tenth column is set to the position at the address 7, the write start position for the eleventh column is set to the position at the address 8, and the write start position for the twelfth column is set to the position at the address 9.

The multiple b is 2, and the number of bits m of one symbol is 12 when, for example, 4096QAM is employed as a modulation scheme. In this case, as illustrated in FIG. 29, the memory 31 has 24 columns for storing 12×2 bits in its row direction, and stores 64800/(12×2) bits in its column direction.

Further, the write start position for the first column out of the 24 columns of the memory 31 is set to the position at the address 0, the write start position for the second column is set to the position at the address 5, the write start position for the third column is set to the position at the address 8, the write start position for the fourth column is set to the position at the address 8, the write start position for the fifth column is set to the position at the address 8, the write start position for the sixth column is set to the position at the address 8, the write start position for the seventh column is set to the position at the address 10, the write start position for the eighth column is set to the position at the address 10, the write start position for the ninth column is set to the position at the address 10, the write start position for the tenth column is set to the position at the address 12, the write start position for the eleventh column is set to the position at the address 13, the write start position for the twelfth column is set to the position at the address 16, the write start position for the thirteenth column is set to the position at the address 17, the write start position for the fourteenth column is set to the position at the address 19, the write start position for the fifteenth column is set to the position at the address 21, the write start position for the sixteenth column is set to the position at the address 22, the write start position for the seventeenth column is set to the position at the address 23, the write start position for the eighteenth column is set to the position at the address 26, the write start position for the nineteenth column is set to the position at the address 37, the write start position for the twentieth column is set to the position at the address 39, the write start position for the twenty-first column is set to the position at the address 40, the write start position for the twenty-second column is set to the position at the address 41, the write start position for the twenty-third column is set to the position at the address 41, and the write start position for the twenty-fourth column is set to the position at the address 41.

FIG. 30 illustrates the number of columns of the memory 31 which is necessary for column twist interleaving, and the addresses of write start positions, in association with each modulation scheme, for an LDPC code having a code length N of 16200 and each of the 10 code rates, which is defined in the DVB-T.2 standard.

The multiple b is 1, and the number of bits m of one symbol is 2 when, for example, QPSK is employed as a modulation scheme. In this case, as illustrated in FIG. 30, the memory 31 has 2 columns for storing 2×1 bits in its row direction, and stores 16200/(2×1) bits in its column direction.

Further, the write start position for the first column out of the 2 columns of the memory 31 is set to the position at the address 0, and the write start position for the second column is set to the position at the address 0.

The multiple b is 2, and the number of bits m of one symbol is 2 when, for example, QPSK is employed as a modulation scheme. In this case, as illustrated in FIG. 30, the memory 31 has 4 columns for storing 2×2 bits in its row direction, and stores 16200/(2×2) bits in its column direction.

Further, the write start position for the first column out of the 4 columns of the memory 31 is set to the position at the address 0, the write start position for the second column is set to the position at the address 2, the write start position for the third column is set to the position at the address 3, and the write start position for the fourth column is set to the position at the address 3.

The multiple b is 1, and the number of bits m of one symbol is 4 when, for example, 16QAM is employed as a modulation scheme. In this case, as illustrated in FIG. 30, the memory 31 has 4 columns for storing 4×1 bits in its row direction, and stores 16200/(4×1) bits in its column direction.

Further, the write start position for the first column out of the 4 columns of the memory 31 is set to the position at the address 0, the write start position for the second column is set to the position at the address 2, the write start position for the third column is set to the position at the address 3, and the write start position for the fourth column is set to the position at the address 3.

The multiple b is 2, and the number of bits m of one symbol is 4 when, for example, 16QAM is employed as a modulation scheme. In this case, as illustrated in FIG. 30, the memory 31 has 8 columns for storing 4×2 bits in its row direction, and stores 16200/(4×2) bits in its column direction.

Further, the write start position for the first column out of the 8 columns of the memory 31 is set to the position at the address 0, the write start position for the second column is set to the position at the address 0, the write start position for the third column is set to the position at the address 0, the write start position for the fourth column is set to the position at the address 1, the write start position for the fifth column is set to the position at the address 7, the write start position for the sixth column is set to the position at the address 20, the write start position for the seventh column is set to the position at the address 20, and the write start position for the eighth column is set to the position at the address 21.

The multiple b is 1, and the number of bits m of one symbol is 6 when, for example, 64QAM is employed as a modulation scheme. In this case, as illustrated in FIG. 30, the memory 31 has 6 columns for storing 6×1 bits in its row direction, and stores 16200/(6×1) bits in its column direction.

Further, the write start position for the first column out of the 6 columns of the memory 31 is set to the position at the address 0, the write start position for the second column is set to the position at the address 0, the write start position for the third column is set to the position at the address 2, the write start position for the fourth column is set to the position at the address 3, the write start position for the fifth column is set to the position at the address 7, and the write start position for the sixth column is set to the position at the address 7.

The multiple b is 2, and the number of bits m of one symbol is 6 when, for example, 64QAM is employed as a modulation scheme. In this case, as illustrated in FIG. 30, the memory 31 has 12 columns for storing 6×2 bits in its row direction, and stores 16200/(6×2) bits in its column direction.

Further, the write start position for the first column out of the 12 columns of the memory 31 is set to the position at the address 0, the write start position for the second column is set to the position at the address 0, the write start position for the third column is set to the position at the address 0, the write start position for the fourth column is set to the position at the address 2, the write start position for the fifth column is set to the position at the address 2, the write start position for the sixth column is set to the position at the address 2, the write start position for the seventh column is set to the position at the address 3, the write start position for the eighth column is set to the position at the address 3, the write start position for the ninth column is set to the position at the address 3, the write start position for the tenth column is set to the position at the address 6, the write start position for the eleventh column is set to the position at the address 7, and the write start position for the twelfth column is set to the position at the address 7.

The multiple b is 1, and the number of bits m of one symbol is 8 when, for example, 256QAM is employed as a modulation scheme. In this case, as illustrated in FIG. 30, the memory 31 has 8 columns for storing 8×1 bits in its row direction, and stores 16200/(8×1) bits in its column direction.

Further, the write start position for the first column out of the 8 columns of the memory 31 is set to the position at the address 0, the write start position for the second column is set to the position at the address 0, the write start position for the third column is set to the position at the address 0, the write start position for the fourth column is set to the position at the address 1, the write start position for the fifth column is set to the position at the address 7, the write start position for the sixth column is set to the position at the address 20, the write start position for the seventh column is set to the position at the address 20, and the write start position for the eighth column is set to the position at the address 21.

The multiple b is 1, and the number of bits m of one symbol is 10 when, for example, 1024QAM is employed as a modulation scheme. In this case, as illustrated in FIG. 30, the memory 31 has 10 columns for storing 10×1 bits in its row direction, and stores 16200/(10×1) bits in its column direction.

Further, the write start position for the first column out of the 10 columns of the memory 31 is set to the position at the address 0, the write start position for the second column is set to the position at the address 1, the write start position for the third column is set to the position at the address 2, the write start position for the fourth column is set to the position at the address 2, the write start position for the fifth column is set to the position at the address 3, the write start position for the sixth column is set to the position at the address 3, the write start position for the seventh column is set to the position at the address 4, the write start position for the eighth column is set to the position at the address 4, the write start position for the ninth column is set to the position at the address 5, and the write start position for the tenth column is set to the position at the address 7.

The multiple b is 2, and the number of bits m of one symbol is 10 when, for example, 1024QAM is employed as a modulation scheme. In this case, as illustrated in FIG. 30, the memory 31 has 20 columns for storing 10×2 bits in its row direction, and stores 16200/(10×2) bits in its column direction.

Further, the write start position for the first column out of the 20 columns of the memory 31 is set to the position at the address 0, the write start position for the second column is set to the position at the address 0, the write start position for the third column is set to the position at the address 0, the write start position for the fourth column is set to the position at the address 2, the write start position for the fifth column is set to the position at the address 2, the write start position for the sixth column is set to the position at the address 2, the write start position for the seventh column is set to the position at the address 2, the write start position for the eighth column is set to the position at the address 2, the write start position for the ninth column is set to the position at the address 5, the write start position for the tenth column is set to the position at the address 5, the write start position for the eleventh column is set to the position at the address 5, the write start position for the twelfth column is set to the position at the address 5, the write start position for the thirteenth column is set to the position at the address 5, the write start position for the fourteenth column is set to the position at the address 7, the write start position for the fifteenth column is set to the position at the address 7, the write start position for the sixteenth column is set to the position at the address 7, the write start position for the seventeenth column is set to the position at the address 7, the write start position for the eighteenth column is set to the position at the address 8, the write start position for the nineteenth column is set to the position at the address 8, and the write start position for the twentieth column is set to the position at the address 10.

The multiple b is 1, and the number of bits m of one symbol is 12 when, for example, 4096QAM is employed as a modulation scheme. In this case, as illustrated in FIG. 30, the memory 31 has 12 columns for storing 12×1 bits in its row direction, and stores 16200/(12×1) bits in its column direction.

Further, the write start position for the first column out of the 12 columns of the memory 31 is set to the position at the address 0, the write start position for the second column is set to the position at the address 0, the write start position for the third column is set to the position at the address 0, the write start position for the fourth column is set to the position at the address 2, the write start position for the fifth column is set to the position at the address 2, the write start position for the sixth column is set to the position at the address 2, the write start position for the seventh column is set to the position at the address 3, the write start position for the eighth column is set to the position at the address 3, the write start position for the ninth column is set to the position at the address 3, the write start position for the tenth column is set to the position at the address 6, the write start position for the eleventh column is set to the position at the address 7, and the write start position for the twelfth column is set to the position at the address 7.

The multiple b is 2, and the number of bits m of one symbol is 12 when, for example, 4096QAM is employed as a modulation scheme. In this case, as illustrated in FIG. 30, the memory 31 has 24 columns for storing 12×2 bits in its row direction, and stores 16200/(12×2) bits in its column direction.

Further, the write start position for the first column out of the 24 columns of the memory 31 is set to the position at the address 0, the write start position for the second column is set to the position at the address 0, the write start position for the third column is set to the position at the address 0, the write start position for the fourth column is set to the position at the address 0, the write start position for the fifth column is set to the position at the address 0, the write start position for the sixth column is set to the position at the address 0, the write start position for the seventh column is set to the position at the address 0, the write start position for the eighth column is set to the position at the address 1, the write start position for the ninth column is set to the position at the address 1, the write start position for the tenth column is set to the position at the address 1, the write start position for the eleventh column is set to the position at the address 2, the write start position for the twelfth column is set to the position at the address 2, the write start position for the thirteenth column is set to the position at the address 2, the write start position for the fourteenth column is set to the position at the address 3, the write start position for the fifteenth column is set to the position at the address 7, the write start position for the sixteenth column is set to the position at the address 9, the write start position for the seventeenth column is set to the position at the address 9, the write start position for the eighteenth column is set to the position at the address 9, the write start position for the nineteenth column is set to the position at the address 10, the write start position for the twentieth column is set to the position at the address 10, the write start position for the twenty-first column is set to the position at the address 10, the write start position for the twenty-second column is set to the position at the address 10, the write start position for the twenty-third column is set to the position at the address 10, and the write start position for the twenty-fourth column is set to the position at the address 11.

Figure 31:
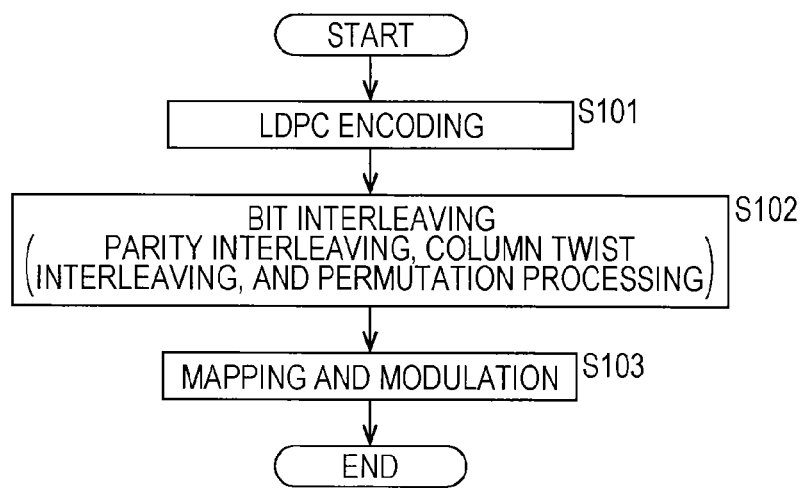
FIG. 31 is a flowchart depicting a process performed by the bit interleaver 116 and a QAM encoder 117.

FIG. 31 is a flowchart depicting a process performed in the LDPC encoder 115, the bit interleaver 116, and the QAM encoder 117 illustrated in FIG. 8.

The LDPC encoder 115 waits for LDPC target data to be supplied from the BCH encoder 114. In step S101, the LDPC encoder 115 encodes the LDPC target data into an LDPC code, and supplies the LDPC code to the bit interleaver 116. Then, the process proceeds to step S102.

In step S102, the bit interleaver 116 performs bit interleaving on the LDPC code supplied from the LDPC encoder 115, and supplies a symbol obtained by symbolizing the LDPC code that has been subjected to bit interleaving, to the QAM encoder 117. Then, the process proceeds to step S103.

More specifically, in step S102, in the bit interleaver 116 (FIG. 9), the parity interleaver 23 performs parity interleaving on the LDPC code supplied from the LDPC encoder 115, and supplies the LDPC code that has been subjected to parity interleaving to the column twist interleaver 24.

The column twist interleaver 24 performs column twist interleaving on the LDPC code supplied from the parity interleaver 23, and supplies the resulting LDPC code to the demultiplexer 25.

The demultiplexer 25 performs permutation processing to permute the code bits of the LDPC code that has been subjected to column twist interleaving by the column twist interleaver 24 and to map the permuted code bits to symbol bits of a symbol (i.e., bits representing the symbol).

Here, the permutation processing of the demultiplexer 25 may be performed in accordance with any of the first to fourth permutation types illustrated in FIGS. 22 and 23, and may also be performed in accordance with a certain predetermined allocation rule to allocate code bits of an LDPC code to symbol bits representing a symbol.

The symbols obtained by the permutation processing performed by the demultiplexer 25 are supplied from the demultiplexer 25 to the QAM encoder 117.

In step S103, the QAM encoder 117 maps the symbols supplied from the demultiplexer 25 to constellation points defined by the modulation scheme for the orthogonal modulation to be performed by the QAM encoder 117, and then performs orthogonal modulation. The resulting data is supplied to the time interleaver 118.

As described above, parity interleaving and column twist interleaving may improve resistance to erasures or burst errors in a case where a plurality of code bits of an LDPC code are transmitted as one symbol.

Here, in FIG. 9, the parity interleaver 23 serving as a block configured to perform parity interleaving and the column twist interleaver 24 serving as a block configured to perform column twist interleaving are configured as separate units, for convenience of illustration. However, the parity interleaver 23 and the column twist interleaver 24 may be integrated into a single unit.

More specifically, both parity interleaving and column twist interleaving can be performed by writing and reading code bits to and from a memory, and can be represented by a matrix that converts an address at which a code bit is to be written i.e., a write address) to an address at which a code bit is to be read (i.e., a read address).

Accordingly, once a matrix obtained by multiplying a matrix representing parity interleaving and a matrix representing column twist interleaving is determined, an LDPC code that has been subjected to parity interleaving and then column twist interleaving can be obtained by converting code bits using the determined matrix.

Furthermore, the demultiplexer 25 in addition to the parity interleaver 23 and the column twist interleaver 24 may also be integrated into a single unit.

More specifically, the permutation processing performed in the demultiplexer 25 can also be represented by a matrix that converts a write address in the memory 31 at which an LDPC code is stored to a read address.

Accordingly, once a matrix obtained by multiplying a matrix representing parity interleaving, a matrix representing column twist interleaving, and a matrix representing permutation processing is determined, parity interleaving, column twist interleaving, and permutation processing can be performed in a batch way using the determined matrix.

Note that either parity interleaving or column twist interleaving may be performed, or neither of them may be performed. For example, as in the DVB-S.2 system, if the communication path 13 (FIG. 7) is a non-AWGN channel that does not much take into account burst errors, flutters, and so forth, such as a satellite link, none of parity interleaving and column twist interleaving may be performed.

Next, simulations for measuring error rates (bit error rates) that were performed on the transmitting device 11 illustrated in FIG. 8 will be described with reference to FIGS. 32 to 34.

The simulations were performed using a communication path with a flutter having a D/U of 0 dB.

Figure 32:
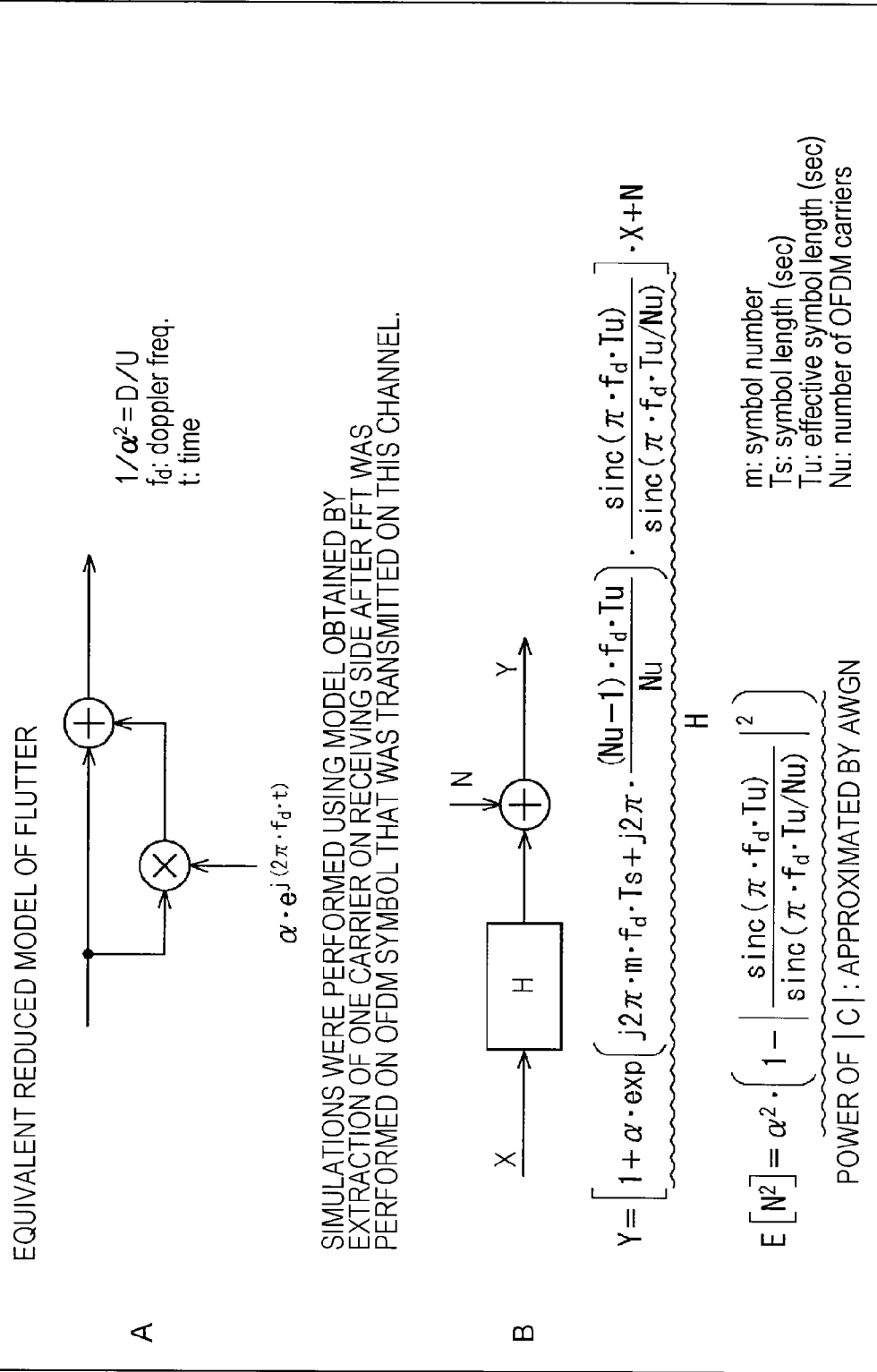
FIG. 32 includes diagrams illustrating a model of a communication path used in simulations.

FIG. 32 illustrates a model of a communication path employed in the simulations.

More specifically, part A of FIG. 32 illustrates a model of a flutter employed in the simulations.

Further, part B of FIG. 32 illustrates a model of a communication path having the flutter represented by the model illustrated in part A of FIG. 32.

Note that, in part B of FIG. 32, H represents the model of the flutter illustrated in part A of FIG. 32. In part B of FIG. 32, furthermore, N represents the ICI (Inter Carrier Interference). In the simulations, an expected value $E[N^2]$ of the power of the ICI was approximated by AWGN.

Figure 33:
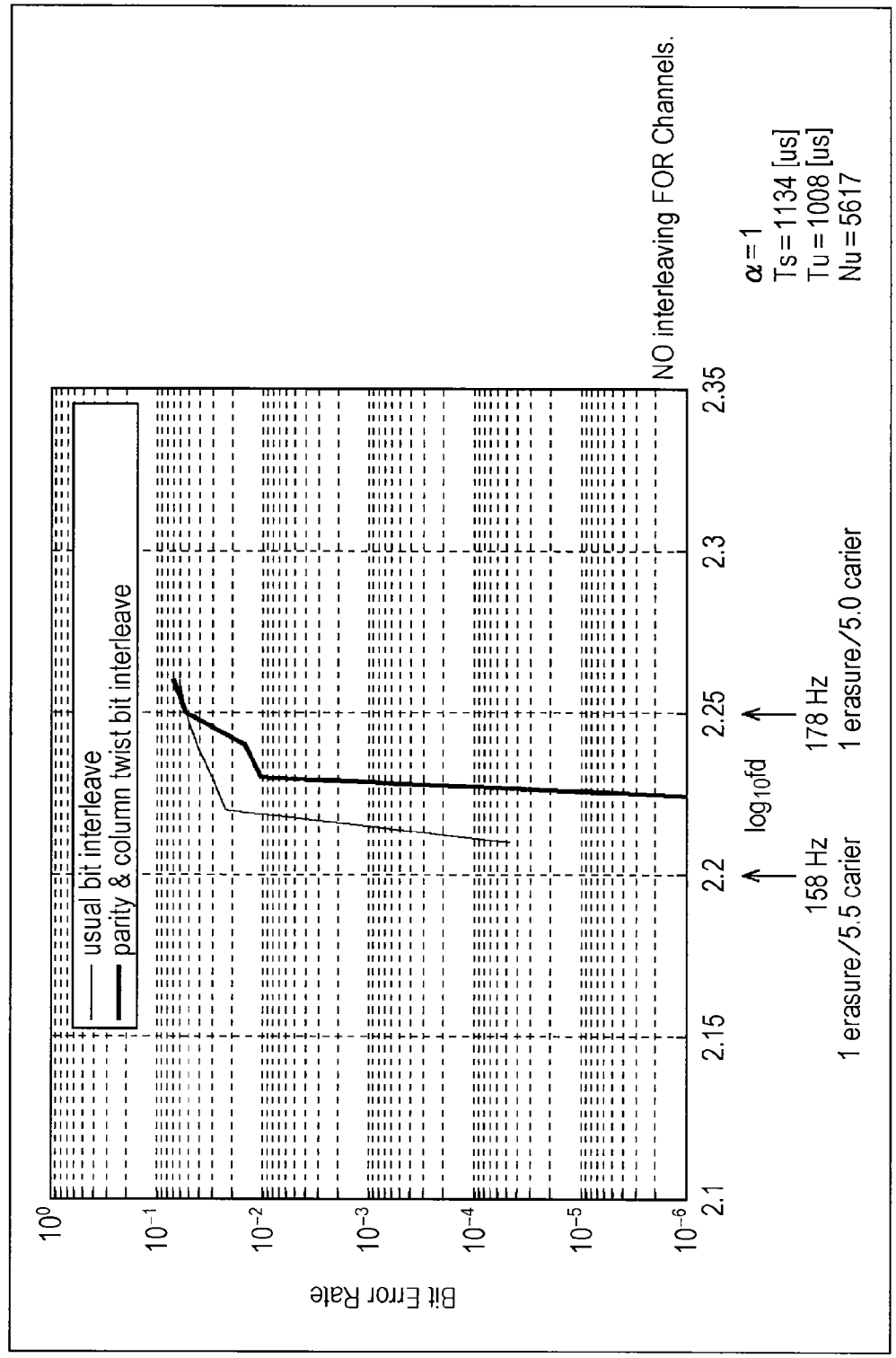
FIG. 33 is a diagram illustrating relationships between Doppler frequencies $f_d$ of flutters and error rates obtained in simulations.
Figure 34:
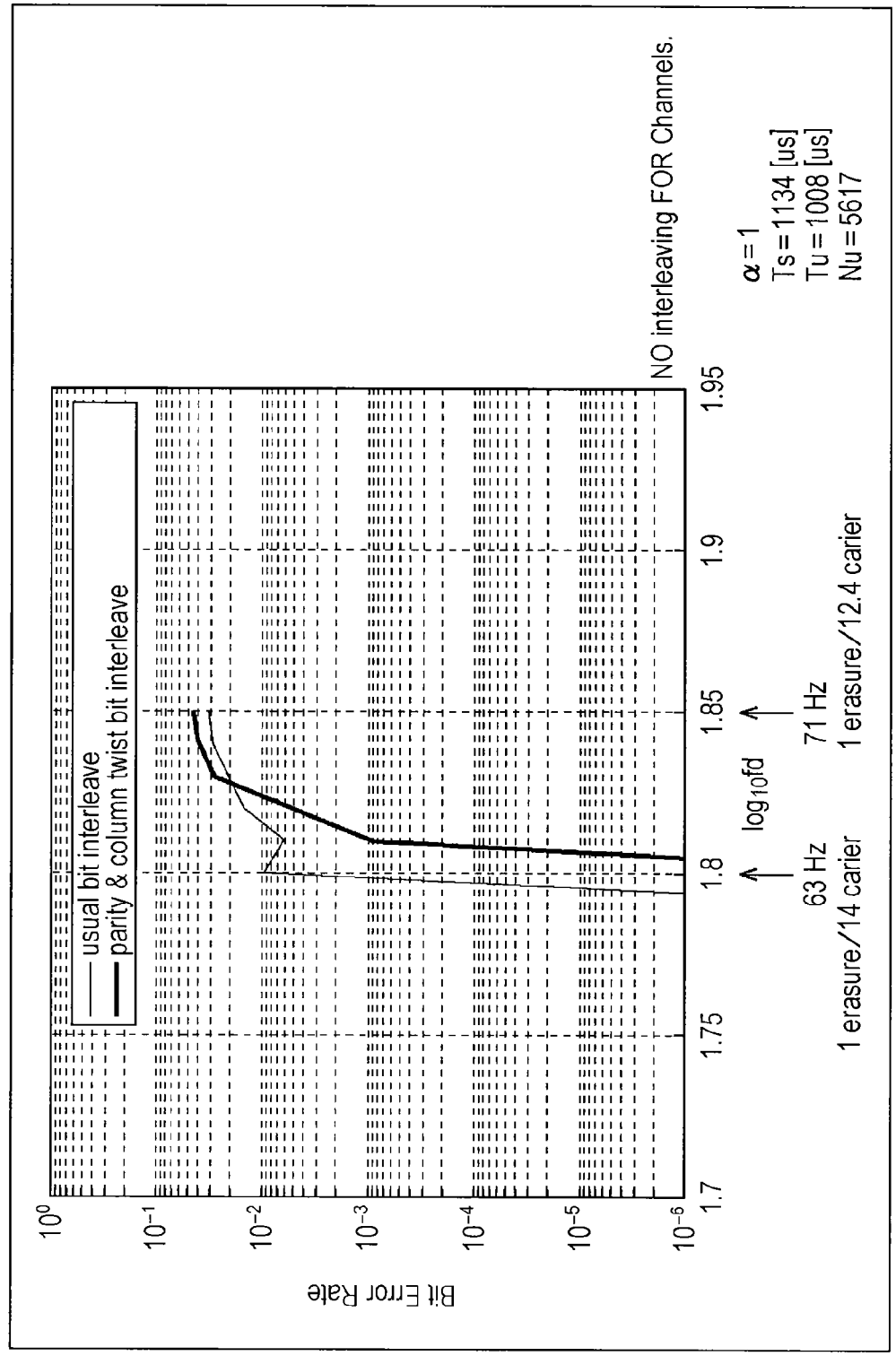
FIG. 34 is a diagram illustrating relationships between Doppler frequencies $f_d$ of flutters and error rates obtained in the simulations.

FIGS. 33 and 34 illustrate relationships between Doppler frequencies $f_d$ of flutters and error rates obtained in the simulations.

Note that FIG. 33 illustrates relationships between error rates and Doppler frequencies $f_d$ in a case where the modulation scheme is 16QAM, the code rate (r) is 3/4, and the permutation type is the first permutation type. FIG. 34 illustrates relationships between error rates and Doppler frequencies $f_d$ in a case where the modulation scheme is 64QAM, the code rate (r) is 5/6, and the permutation type is the first permutation type.

In FIGS. 33 and 34, furthermore, bold lines indicate relationships between error rates and Doppler frequencies $f_d$ in a case where parity interleaving, column twist interleaving, and permutation processing were all carried out, and thin lines indicate relationships between error rates and Doppler frequencies $f_d$ in a case where only permutation processing out of parity interleaving, column twist interleaving, and permutation processing was carried out.

It can be seen from any of FIGS. 33 and 34 that the error-rate performance is improved (i.e., error rates are reduced) in the case where parity interleaving, column twist interleaving, and permutation processing were all carried out, compared to the case where only permutation processing was carried out.

[Example Configuration of LDPC Encoder 115]

Figure 35:
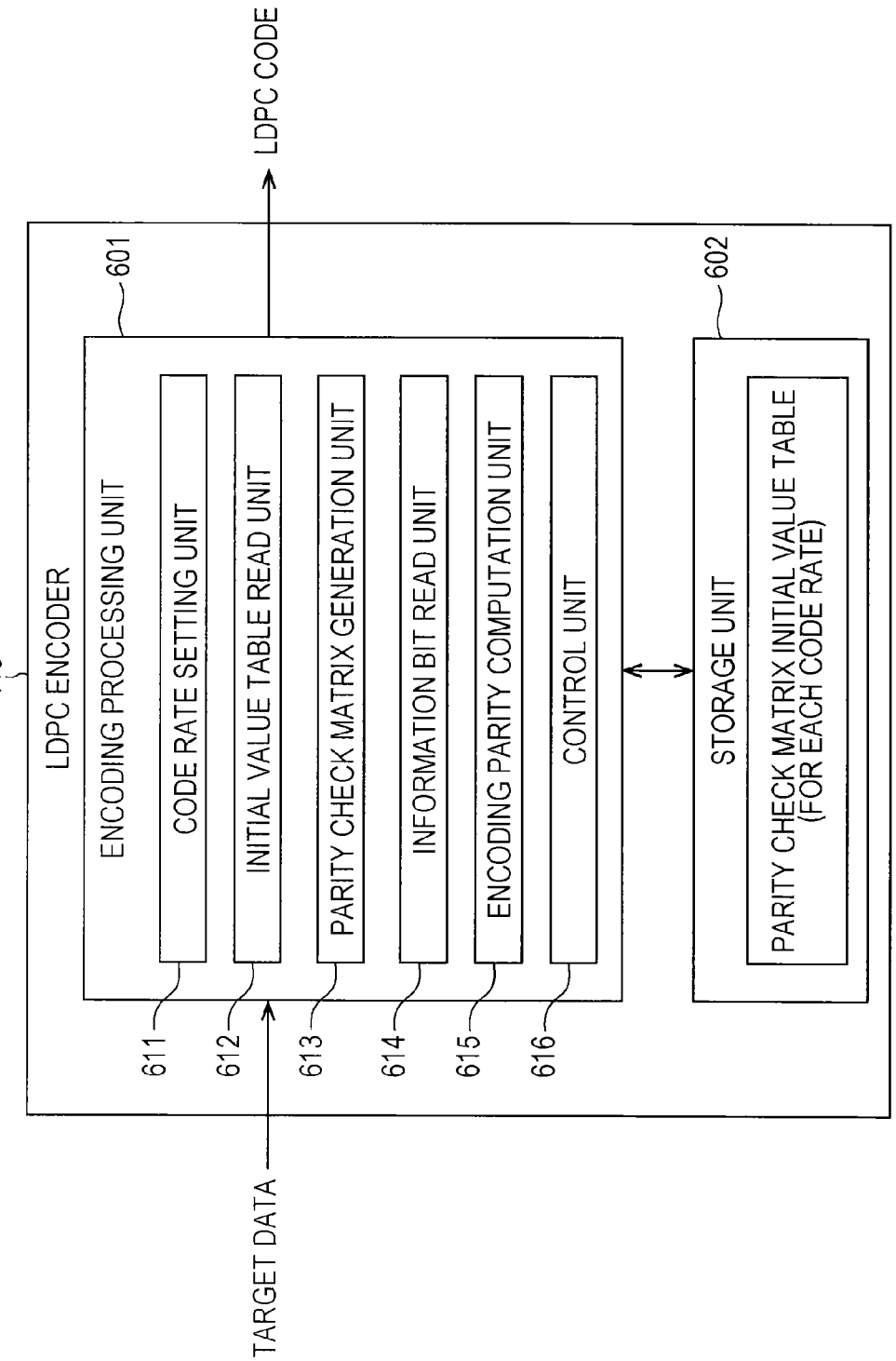
FIG. 35 is a block diagram illustrating an example configuration of an LDPC encoder 115.

FIG. 35 is a block diagram illustrating an example configuration of the LDPC encoder 115 illustrated in FIG. 8.

Note that the LDPC encoder 122 illustrated in FIG. 8 also has a similar configuration.

As described with reference to FIGS. 12 and 13, LDPC codes having two types of code lengths N of 64800 bits and 16200 bits are defined in the DVB-S.2 and similar standards.

In addition, 11 code rates, 1/4, 1/3, 2/5, 1/2, 3/5, 2/3, 3/4, 4/5, 5/6, 8/9, and 9/10, are defined for LDPC codes having a code length N of 64800 bits, and 10 code rates, 1/4, 1/3, 2/5, 1/2, 3/5, 2/3, 3/4, 4/5, 5/6, and 8/9, are defined for LDPC codes having a code length N of 16200 bits (FIGS. 12 and 13).

The LDPC encoder 115 is capable of performing encoding (i.e., error correcting encoding) using, for example, the LDPC codes having code lengths N of 64800 bits and 16200 bits and the respective code rates, in accordance with the parity check matrix H prepared for each code length N and each code rate.

The LDPC encoder 115 includes an encoding processing unit 601 and a storage unit 602.

The encoding processing unit 601 includes a code rate setting unit 611, an initial value table read unit 612, a parity check matrix generation unit 613, an information bit read unit 614, an encoding parity computation unit 615, and a control unit 616. The encoding processing unit 601 performs LDPC encoding on the LDPC target data supplied to the LDPC encoder 115, and supplies the resulting LDPC code to the bit interleaver 116 (FIG. 8).

More specifically, the code rate setting unit 611 sets a code length N and a code rate of the LDPC code in accordance with, for example, an operation of an operator or the like.

The initial value table read unit 612 reads a parity check matrix initial value table, described below, corresponding to the code length N and code rate set by the code rate setting unit 611 from the storage unit 602.

The parity check matrix generation unit 613 generates a parity check matrix H on the basis of the parity check matrix initial value table read by the initial value table read unit 612, by arranging elements of 1 in an information matrix $H_A$ having an information length K (=code length N−parity length M) corresponding to the code length N and code rate set by the code rate setting unit 611, in a column direction at intervals of 360 columns (i.e., the number of unit columns P of the cyclic structure). The parity check matrix H is stored in the storage unit 602.

The information bit read unit 614 reads (or extracts) information bits corresponding to the information length K from the LDPC target data supplied to the LDPC encoder 115.

The encoding parity computation unit 615 reads the parity check matrix H generated by the parity check matrix generation unit 613 from the storage unit 602, and generates a code word (i.e., an LDPC code) by calculating parity bits corresponding to the information bits read by the information bit read unit 614 in accordance with a certain formula by using the parity check matrix H.

The control unit 616 controls the blocks included in the encoding processing unit 601.

The storage unit 602 has stored therein a plurality of parity check matrix initial value tables and the like respectively corresponding to the plurality of code rates and the like illustrated in FIGS. 12 and 13 for the respective code lengths N such as 64800 bits and 16200 bits. In addition, the storage unit 602 temporarily stores data necessary for the processing of the encoding processing unit 601.

Figures 36, 37:
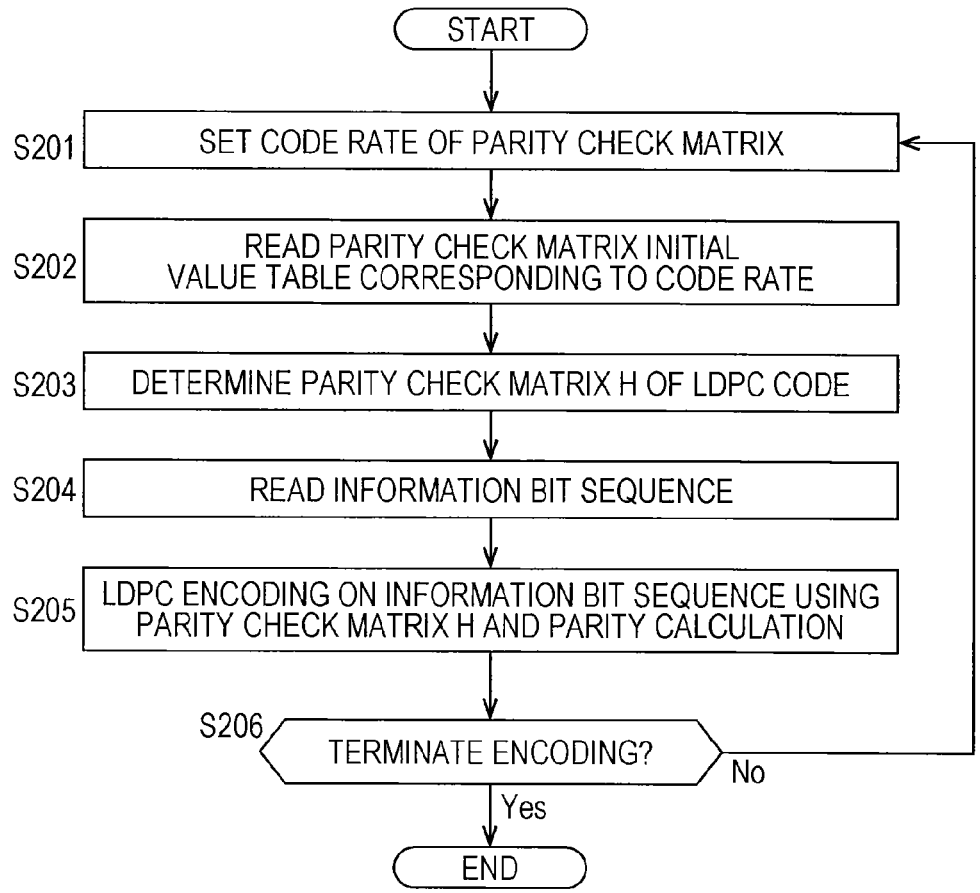
FIG. 36 is a flowchart depicting a process of the LDPC encoder 115.
FIG. 37 is a diagram illustrating an example of a parity check matrix initial value table with the code rate 1/4 and the code length 16200.

FIG. 36 is a flowchart depicting a process of the LDPC encoder 115 illustrated in FIG. 35.

In step S201, the code rate setting unit 611 determines (or sets) a code length N and a code rate r for LDPC encoding.

In step S202, the initial value table read unit 612 reads a predetermined parity check matrix initial value table corresponding to the code length N and code rate r determined by the code rate setting unit 611 from the storage unit 602.

In step S203, the parity check matrix generation unit 613 determines (or generates) a parity check matrix H of an LDPC code having the code length N and code rate r determined by the code rate setting unit 611 by using the parity check matrix initial value table read by the initial value table read unit 612 from the storage unit 602, and supplies the parity check matrix H to the storage unit 602 for storage.

In step S204, the information bit read unit 614 reads information bits of the information length K (=N×r) corresponding to the code length N and code rate r determined by the code rate setting unit 611 from the LDPC target data supplied to the LDPC encoder 115, and also reads the parity check matrix H determined by the parity check matrix generation unit 613 from the storage unit 602. Then, the information bit read unit 614 supplies the read information bits and parity check matrix H to the encoding parity computation unit 615.

In step S205, the encoding parity computation unit 615 sequentially computes parity bits of a code word c satisfying Expression (8) by using the information bits and the parity check matrix H supplied from the information bit read unit 614.

$$Hc^T = 0 \quad (8)$$

In Expression (8), c denotes a row vector as a code word (i.e., LDPC code), and $c^T$ denotes the transpose of the row vector c.

Here, as described above, if an information bit portion of the row vector c as the LDPC code (i.e., one code word) is represented by a row vector A and a parity bit portion is represented by a row vector T, the row vector c can be represented by the equation c=[A|T] using the row vector A corresponding to information bits and the row vector T corresponding to parity bits.

It is necessary for the parity check matrix H and the row vector c=[A|T] corresponding to the LDPC code to satisfy the equation $Hc^T = 0$. The values of the elements of the row vector T corresponding to parity bits in the row vector c=[A|T] satisfying the equation $Hc^T = 0$ can be sequentially determined by setting the elements in the respective rows of the column vector $Hc^T$ in the equation $Hc^T = 0$ to zero in order, starting from the element in the first row, in a case where the parity matrix $H_T$ in the parity check matrix H=[$H_A$|$H_T$] has the stepwise structure illustrated in FIG. 11.

The encoding parity computation unit 615 determines parity bits T corresponding to the information bits A supplied from the information bit read unit 614, and outputs a code word c=[A|T], which is represented by the information bits A and the parity bits T, as a result of LDPC encoding of the information bits A.

Then, in step S206, the control unit 616 determines whether or not to terminate the LDPC encoding operation. If it is determined in step S206 that the LDPC encoding operation is not to be terminated, for example, if there is any LDPC target data to be subjected to LDPC encoding, the process returns to step S201 (or step S204), and the processing of steps S201 (or steps S204) to S206 is subsequently repeatedly performed.

Further, if it is determined in step S206 that the LDPC encoding operation is to be terminated, for example, if there is no LDPC target data to be subjected to LDPC encoding, the LDPC encoder 115 terminates the process.

As described above, parity check matrix initial value tables corresponding to the respective code lengths N and the respective code rates r are prepared, and the LDPC encoder 115 performs LDPC encoding with a certain code length N and a certain code rate r by using a parity check matrix H generated from the parity check matrix initial value table corresponding to the certain code length N and the certain code rate r.

[Example of Parity Check Matrix Initial Value Table]

A parity check matrix initial value table is a table showing the positions of elements of 1 in an information matrix $H_A$ (FIG. 10) having an information length K corresponding to a code length N and code rate r of an LDPC code (i.e., an LDPC code defined by the parity check matrix H) in the parity check matrix H, in units of 360 columns (i.e., the number of unit columns P of the cyclic structure). A parity check matrix initial value table is created in advance for each of parity check matrices H having the respective code lengths N and the respective code rates r.

FIG. 37 is a diagram illustrating an example of a parity check matrix initial value table.

More specifically, FIG. 37 illustrates a parity check matrix initial value table for a parity check matrix H having a code length N of 16200 bits and a code rate (nominal code rate defined in DVB-T.2) r of 1/4, which is defined in the DVB-T.2 standard.

The parity check matrix generation unit 613 (FIG. 35) determines a parity check matrix H in the following way using the parity check matrix initial value table.

Figure 38:
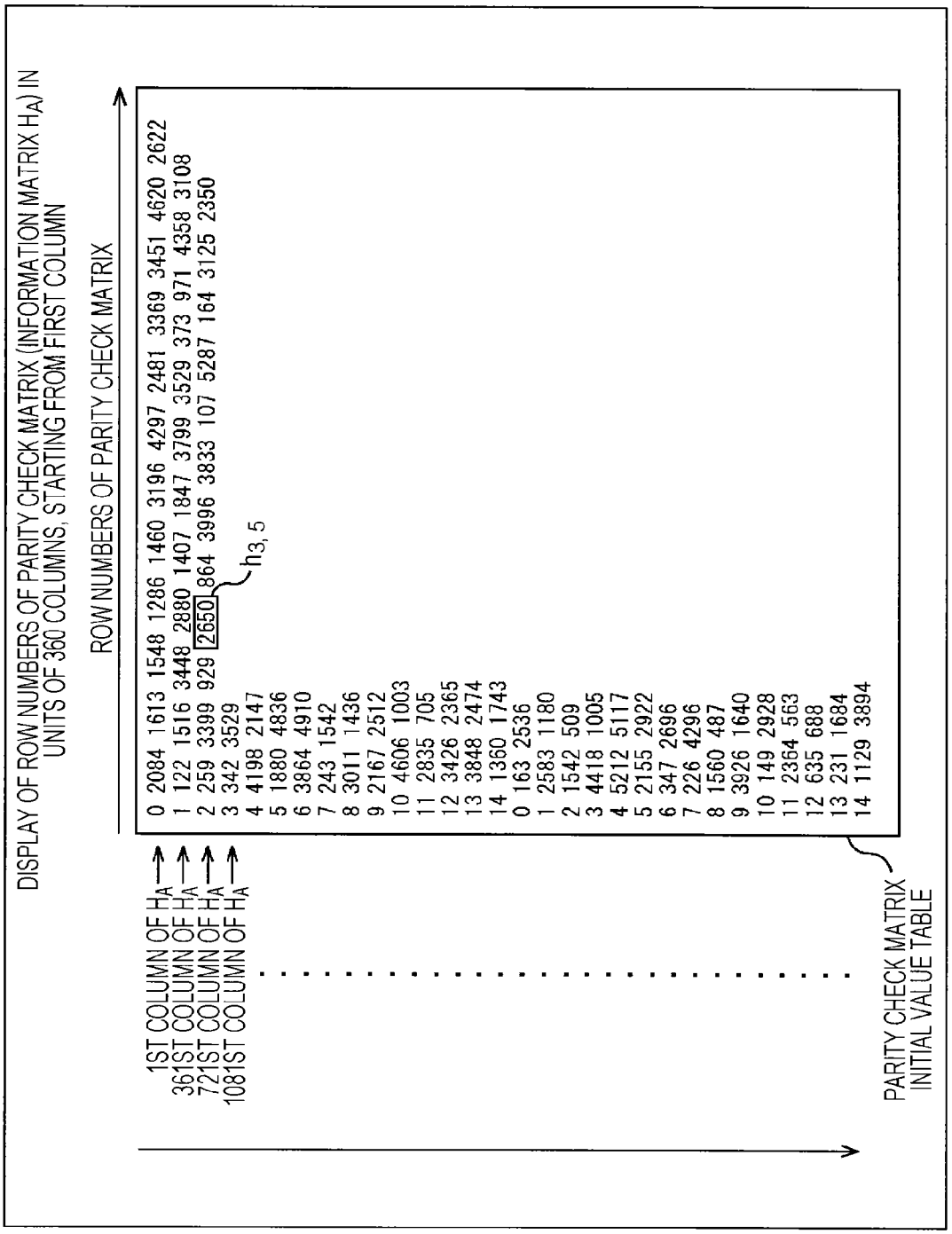
FIG. 38 is a diagram depicting a method for determining a parity check matrix H from a parity check matrix initial value table.

More specifically, FIG. 38 illustrates a method for determining a parity check matrix H from a parity check matrix initial value table.

Note that the parity check matrix initial value table illustrated in FIG. 38 is a parity check matrix initial value table for a parity check matrix H having a code length N of 16200 bits and a code rate r of 2/3, which is defined in the DVB-T.2 standard.

As described above, a parity check matrix initial value table is a table showing the positions of elements of 1 in an information matrix $H_A$ (FIG. 10) having an information length K corresponding to a code length N and code rate r of an LDPC code in units of 360 columns (i.e., the number of unit columns P of the cyclic structure). In the i-th row of the parity check matrix initial value table, row numbers of elements of 1 in the {1+360×(i−1)}-th column of the parity check matrix H (i.e., row numbers in which the row number of the first row of the parity check matrix H is set to 0), the number of which is equal to the number of column weights assigned to the {1+360×(i−1)}-th column, are arranged.

Here, since the parity matrix $H_T$ (FIG. 10) of the parity check matrix H, corresponding to the parity length M, is determined in the manner illustrated in FIG. 25, the information matrix $H_A$ (FIG. 10) of the parity check matrix H, corresponding to the information length K, is determined using the parity check matrix initial value table.

The number of rows k+1 of the parity check matrix initial value table differs depending on the information length K.

A relationship given by Expression (9) is established between the information length K and the number of rows k+1 of the parity check matrix initial value table.

$$K=(k+1)\times 360 \qquad (9)$$

Here, in Expression (9), 360 is the number of unit columns P of the cyclic structure described with reference to FIG. 26.

In the parity check matrix initial value table illustrated in FIG. 38, 13 values are arranged in each of the first to third rows, and three values are arranged in each of the fourth to (k+1)-th row (in FIG. 38, the 30th row).

Accordingly, the column weights of the parity check matrix H determined from the parity check matrix initial value table illustrated in FIG. 38 are 13 for the first to {1+360×(3−1)−1}-th columns, and 3 for the {1+360×(3−1)}-th to K-th columns.

In the parity check matrix initial value table illustrated in FIG. 38, the first row shows 0, 2084, 1613, 1548, 1286, 1460, 3196, 4297, 2481, 3369, 3451, 4620, and 2622, indicating that the elements of the rows with the row numbers 0, 2084, 1613, 1548, 1286, 1460, 3196, 4297, 2481, 3369, 3451, 4620, and 2622 in the first column of the parity check matrix H are 1 (and that the other elements are 0).

In the parity check matrix initial value table illustrated in FIG. 38, furthermore, the second row shows 1, 122, 1516, 3448, 2880, 1407, 1847, 3799, 3529, 373, 971, 4358, and 3108, indicating that the elements of the rows with the row numbers 1, 122, 1516, 3448, 2880, 1407, 1847, 3799, 3529, 373, 971, 4358, and 3108 in the 361st (=1+360×(2−1)) column of the parity check matrix H are 1.

In the manner described above, a parity check matrix initial value table shows the positions of elements of 1 in an information matrix $H_A$ of a parity check matrix H in units of 360 columns.

The elements in the columns other than the {1+360×(i−1)}-th column of the parity check matrix H, that is, the elements in the {2+360×(i−1)}-th to (360×i)-th columns, are arranged by cyclically shifting the elements of 1 in the {1+360×(i−1)}-th column, which are defined using the parity check matrix initial value table, downward (i.e., downward along the columns) in a periodic manner in accordance with the parity length M.

More specifically, for example, the elements in the {2+360×(i−1)}-th column are obtained by cyclically shifting the elements in the {1+360×(i−1)}-th column downward by M/360 (=q). The elements in the subsequent {3+360×(i−1)}-th column are obtained by cyclically shifting the elements in the {1+360×(i−1)}-th column downward by 2×M/360 (=2×q) (i.e., by cyclically shifting the elements in the {2+360×(i−1)}-th column downward by M/360 (=q)).

It is assumed now that the value in the i-th row (i.e., the i-th row from the top) and the j-th column (i.e., the j-th column from the left) of a parity check matrix initial value table is represented by $h_{i,j}$, and the row number of the j-th element of 1 in the w-th column of a parity check matrix H is represented by $H_{w-j}$. In this case, the row number $H_{w-j}$ of an element of 1 in the w-th column, which is a column other than the {1+360×(i−1)}-th column of the parity check matrix H, can be determined using Expression (10).

$$H_{w-j}=\mathrm{mod}\ \{h_{i,j}+\mathrm{mod}((w-1),P)\times q, M\} \qquad (10)$$

Here, mod(x, y) represents the remainder after division of x by y.

In addition, P denotes the number of unit columns of cyclic structure, described above, and is, for example, 360 in the DVB-S.2, DVB-T.2, and DVB-C.2 standards, as described above. Further, q denotes the value M/360 that is obtained by dividing the parity length M by the number of unit columns P of the cyclic structure (=360).

The parity check matrix generation unit 613 (FIG. 35) specifies a row number of an element of 1 in the {1+360×(i−1)}-th column of the parity check matrix H by using the parity check matrix initial value table.

The parity check matrix generation unit 613 (FIG. 35) further determines the row number $H_{w-j}$ of an element of 1 in the w-th column, which is a column other than the {1+360×(i−1)}-th column of the parity check matrix H, in accordance with Expression (10), and generates a parity check matrix H whose elements corresponding to the row numbers obtained in the way described above are 1.

[New LDPC Codes]

Incidentally, there has been a demand for proposing an improved version (hereinafter also referred to as "DVB-Sx") of the DVB-S.2 standard.

In the CfT (Call for Technology), which was submitted in the meeting for DVB-Sx standardization, a certain number of ModCods (which are combinations of modulation schemes (Modulation) and LDPC codes (Code)) are demanded for each range of C/N (Carrier to Noise Ratio) (SNR (Signal to Noise Ratio)) in accordance with use case.

More specifically, in the CfT, the first request is to prepare 20 ModCods for a C/N range of 7 dB from 5 dB to 12 dB for DTH (Direct To Home) use.

In the CfT, additionally, the second request is to prepare 22 ModCods for a C/N range of 12 dB from 12 dB to 24 dB, the third request is to prepare 12 ModCods for a C/N range of 8 dB from −3 dB to 5 dB, and the fourth request is to prepare 5 ModCods for a C/N range of 7 dB from −10 dB to −3 dB.

In the CfT, furthermore, it is also requested that the FER (Frame Error Rate) for the ModCods in the first to fourth requests be approximately $10^{-5}$ (or less).

Note that, in the CfT, the first request has a priority of "1", which is the highest, whereas the second to fourth requests have a priority of "2", which is lower than the priority of the first request.

Accordingly, the present technology provides (a parity check matrix of) an LDPC code capable of satisfying at least the first request having the highest priority in the CfT, as a new LDPC code.

Figure 39:
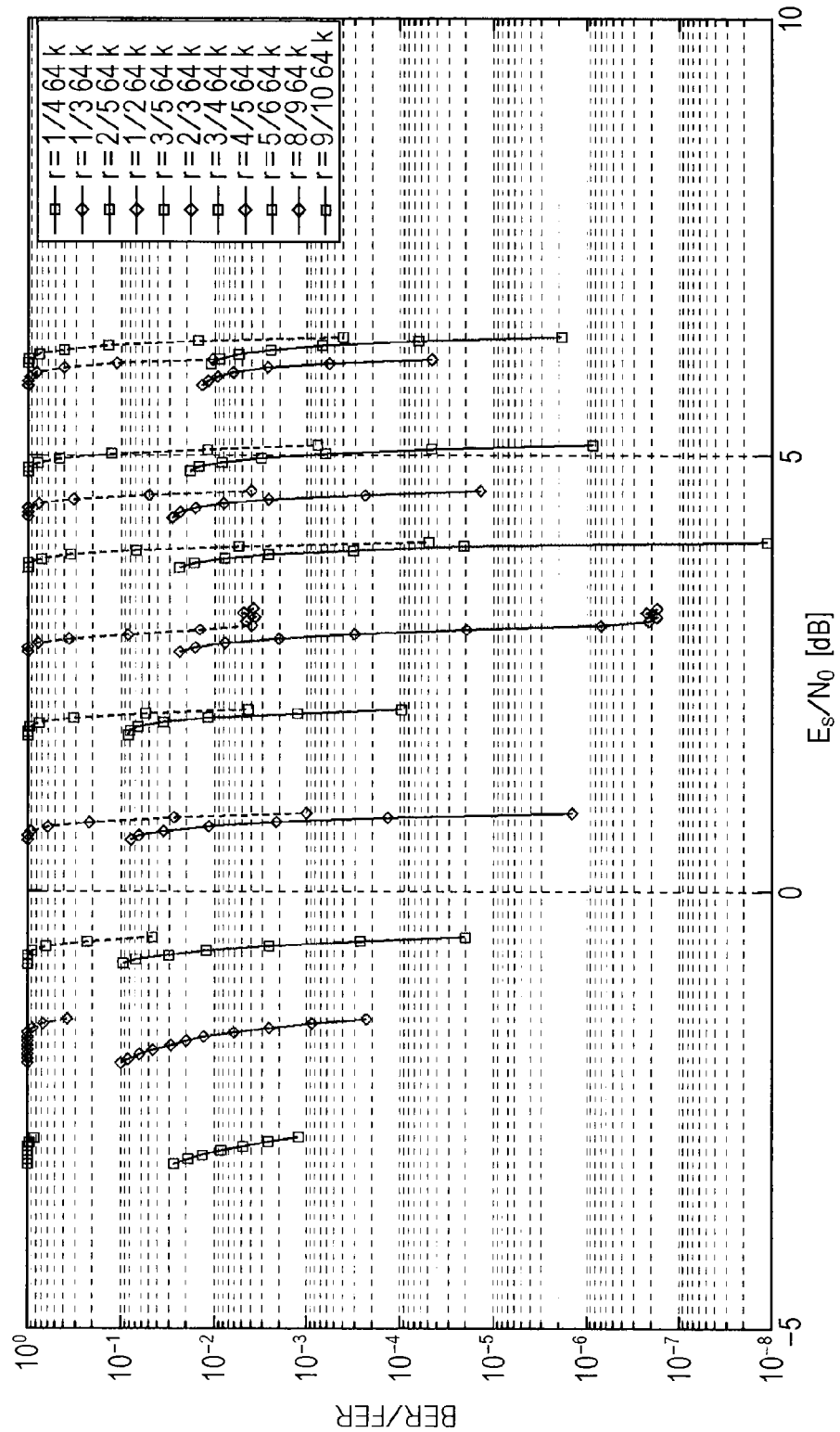
FIG. 39 is a diagram illustrating the BER/FER characteristics of an LDPC code having a code length of 64800 bits, which is defined in the DVB-S.2 standard.

FIG. 39 illustrates BER/FER curves for LDPC codes having a code length N of 64 k bits and 11 code rates, which are defined in the DVB-S.2, in a case where QPSK is employed as a modulation scheme.

In FIG. 39, the horizontal axis represents $E_s/N_0$ (the ratio of the signal power per symbol to the noise power) corresponding to the C/N, and the vertical axis represents FER/BER. Note that, in FIG. 39, solid lines indicate FERs, and dotted lines indicate BERs (Bit Error Rates).

In FIG. 39, FER (BER) curves for LDPC codes having a code length N of 64 k bits and 11 code rates, which are defined in the DVB-S.2 standard, are plotted for an $E_s/N_0$ range of 10 dB in a case where QPSK is employed as a modulation scheme.

More specifically, in FIG. 39, 11 FER curves for ModCods for which the modulation scheme is fixed to QPSK are drawn for an $E_s/N_0$ range of approximately 10 dB from approximately −3 dB to approximately 7 dB.

Accordingly, for LDPC codes having a code length N of 64 k bits and 11 code rates, which are defined in the DVB-S.2 standard, the interval between FER curves for ModCods on average (hereinafter also referred to as an "average interval") is approximately 1 dB ($\cong$10 dB/(10−1)).

In contrast, since the first request in the CfT requests that 20 ModCods be prepared for an $E_s/N_0$ (C/N) range of 7 dB, the average interval between FER curves for ModCods is approximately 0.3 dB ($\cong$7 dB/(20−1)).

In a case where the modulation scheme is fixed to one type such as QPSK, LDPC codes with code rates, the number of which is approximately three times ($\cong$1 dB/0.3 dB) the 11 code rates, or approximately 30 code rates, would be sufficient to ensure sufficient room to obtain ModCods having an average interval of 0.3 dB which meets the first request in the CfT, compared to the case of DVB-S.2 in which ModCods having an average interval of approximately 1 dB are obtained using LDPC codes with the 11 code rates.

In the present technology, accordingly, LDPC codes having a code length of 64 k and code rates of i/30 (where i is a positive integer less than 30) are prepared as LDPC codes having code rates for which approximately 30 code rates are readily settable, and are provided as new LDPC codes which meet at least the first request having the highest priority in the CfT.

It is to be noted that parity matrices $H_T$ of parity check matrices H of the new LDPC codes have a stepwise structure (FIG. 11), similarly to an LDPC code defined in the DVB-S.2 standard, in terms of keeping compatibility with DVB-S.2 as much as possible.

In addition, similarly to an LDPC code defined in the DVB-S.2 standard, information matrices $H_A$ of parity check matrices H of the new LDPC codes have a cyclic structure, where the number of unit columns P of the cyclic structure is also 360.

Figure 106:
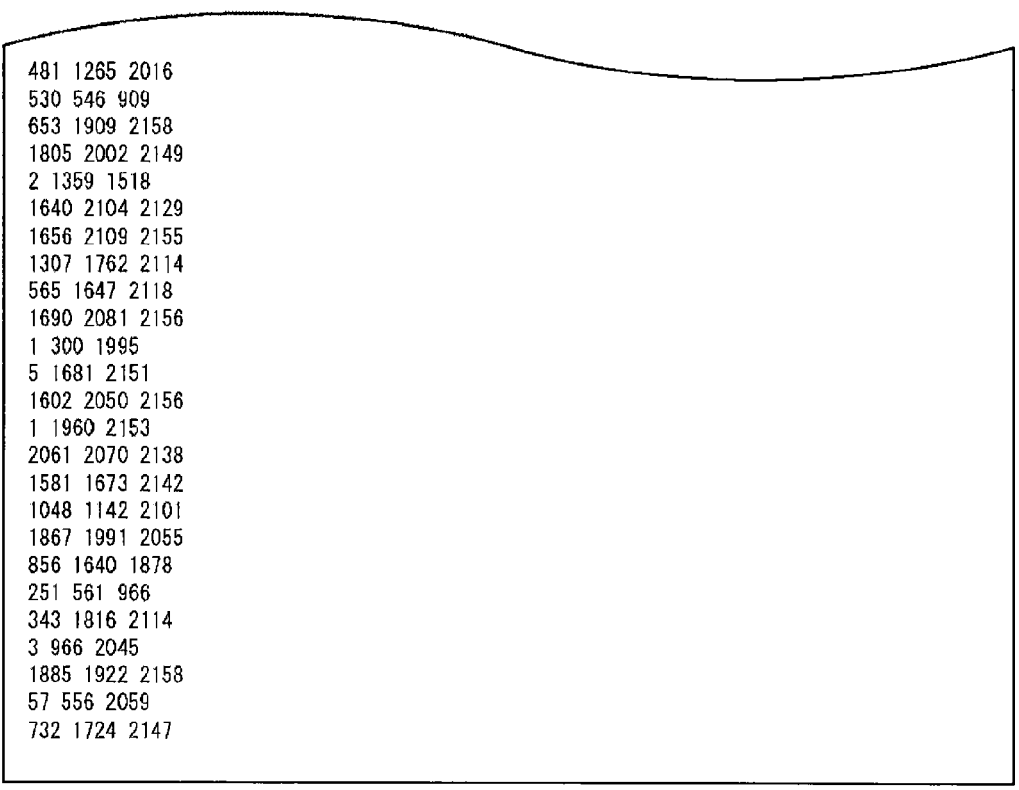
FIG. 106 is a diagram illustrating the example of the parity check matrix initial value table with the code rate 29/30 and the code length 64800.

FIGS. 40 to 106 are diagrams illustrating an example of parity check matrix initial value tables for new LDPC codes having a code length N of 64 k bits and code rates of i/30, as described above.

Here, the new LDPC codes are LDPC codes whose code rates are represented by i/30, and therefore include LDPC codes having up to 29 code rates, 1/30, 2/30, 3/30, . . . , 28/30, and 29/30.

However, an LDPC code with a code rate of 1/30 may be used in a limited fashion in terms of efficiency. In addition, an LDPC code with a code rate of 29/30 may be used in a limited fashion in terms of error rate (BER/FER).

For the reason described above, among LDPC codes with 29 code rates, namely, code rates of 1/30 to 29/30, one or both of an LDPC code with a code rate of 1/30 and an LDPC code with a code rate of 29/30 can be configured not to be used as new LDPC codes.

Herein, LDPC codes with 28 code rates, for example, LDPC codes with code rates of 2/30 to 29/30 among code rates of 1/30 to 29/30, are used as new LDPC codes, and parity check matrix initial value tables for parity check matrices H of the new LDPC codes will be given hereinbelow.

FIG. 40 illustrates a parity check matrix initial value table for a parity check matrix H of an LDPC code having a code length N of 64 k bits and a code rate r of 2/30.

FIG. 41 illustrates a parity check matrix initial value table for a parity check matrix H of an LDPC code having a code length N of 64 k bits and a code rate r of 3/30.

FIG. 42 illustrates a parity check matrix initial value table for a parity check matrix H of an LDPC code having a code length N of 64 k bits and a code rate r of 4/30.

FIG. 43 illustrates a parity check matrix initial value table for a parity check matrix H of an LDPC code having a code length N of 64 k bits and a code rate r of 5/30.

FIG. 44 illustrates a parity check matrix initial value table for a parity check matrix H of an LDPC code having a code length N of 64 k bits and a code rate r of 6/30.

FIG. 45 illustrates a parity check matrix initial value table for a parity check matrix H of an LDPC code having a code length N of 64 k bits and a code rate r of 7/30.

Figure 47:
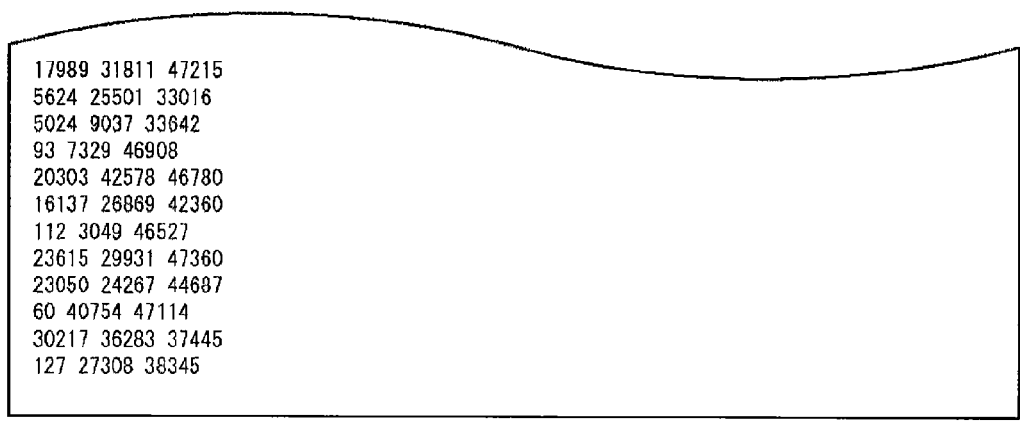
FIG. 47 is a diagram illustrating the example of the parity check matrix initial value table with the code rate 8/30 and the code length 64800.

FIGS. 46 and 47 illustrate a parity check matrix initial value table for a parity check matrix H of an LDPC code having a code length N of 64 k bits and a code rate r of 8/30.

Figure 49:
FIG. 49 is a diagram illustrating the example of the parity check matrix initial value table with the code rate 9/30 and the code length 64800.

FIGS. 48 and 49 illustrate a parity check matrix initial value table for a parity check matrix H of an LDPC code having a code length N of 64 k bits and a code rate r of 9/30.

Figure 51:
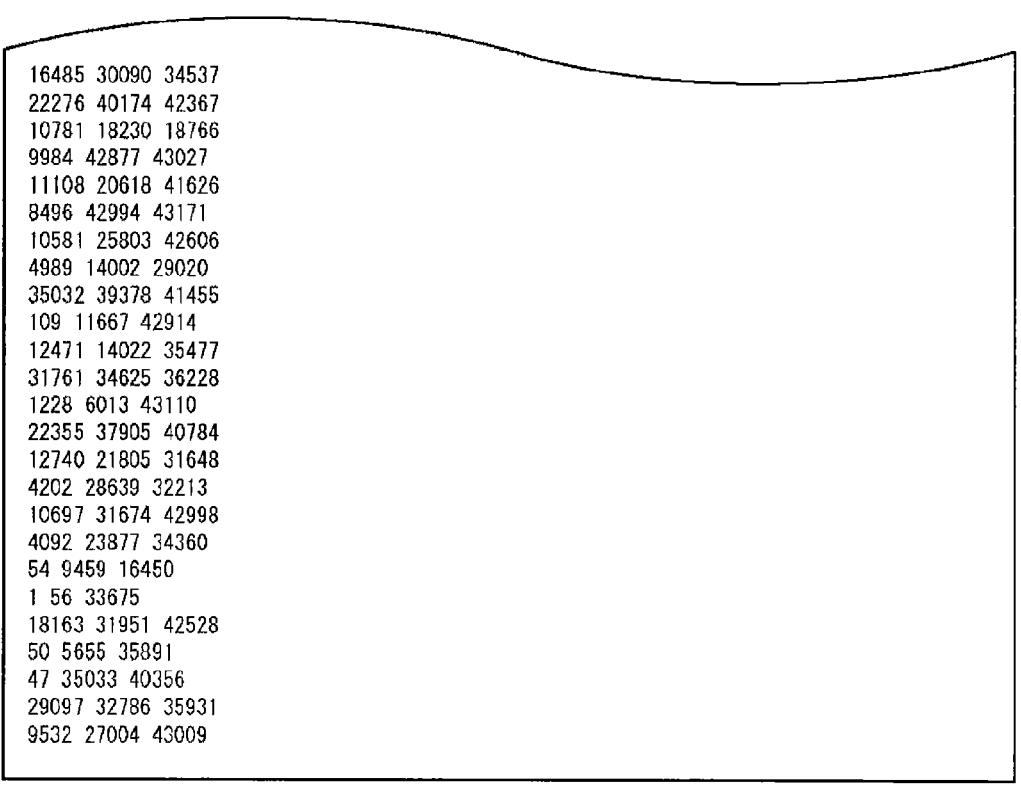
FIG. 51 is a diagram illustrating the example of the parity check matrix initial value table with the code rate 10/30 and the code length 64800.

FIGS. 50 and 51 illustrate a parity check matrix initial value table for a parity check matrix H of an LDPC code having a code length N of 64 k bits and a code rate r of 10/30.

Figure 53:
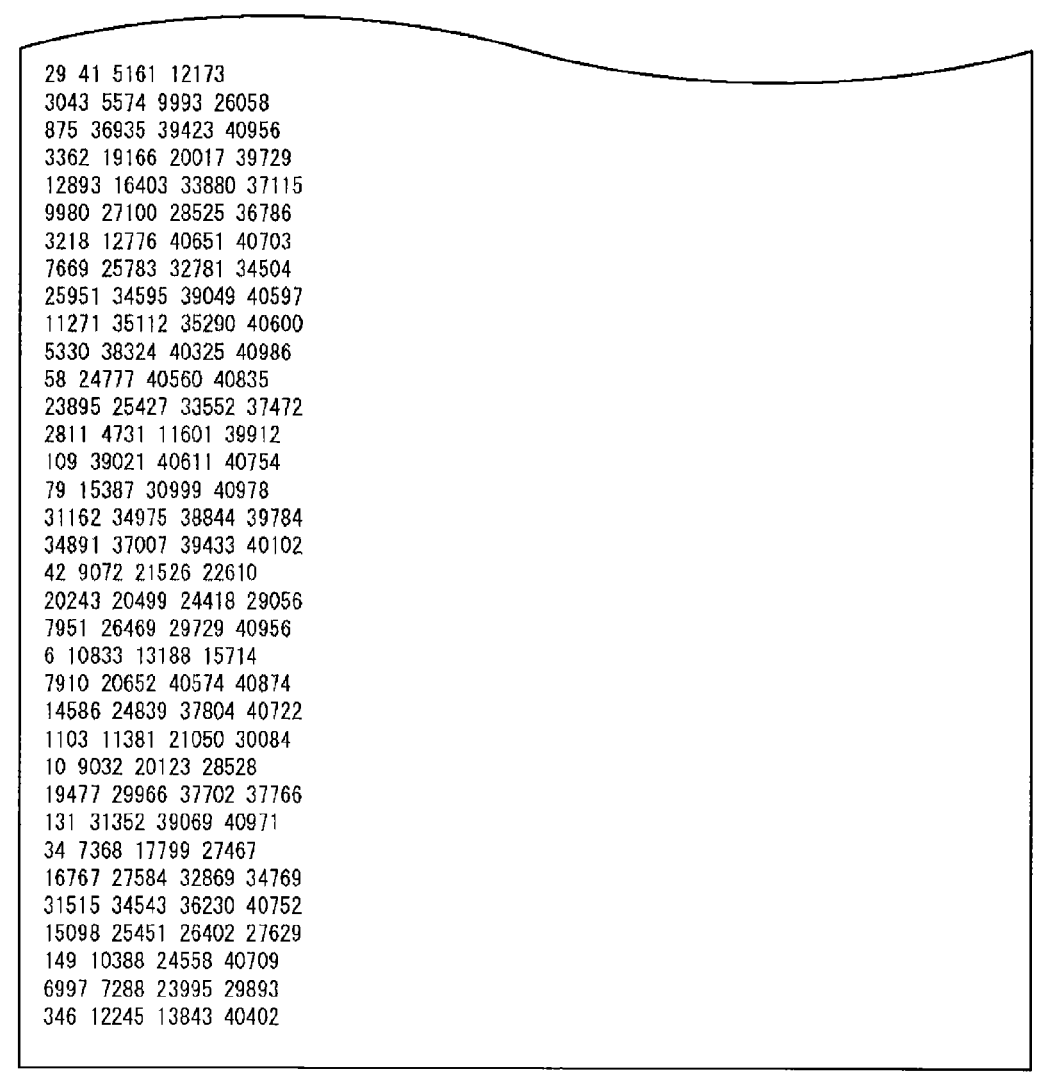

FIGS. 52 and 53 illustrate a parity check matrix initial value table for a parity check matrix H of an LDPC code having a code length N of 64 k bits and a code rate r of 11/30.

Figure 55:
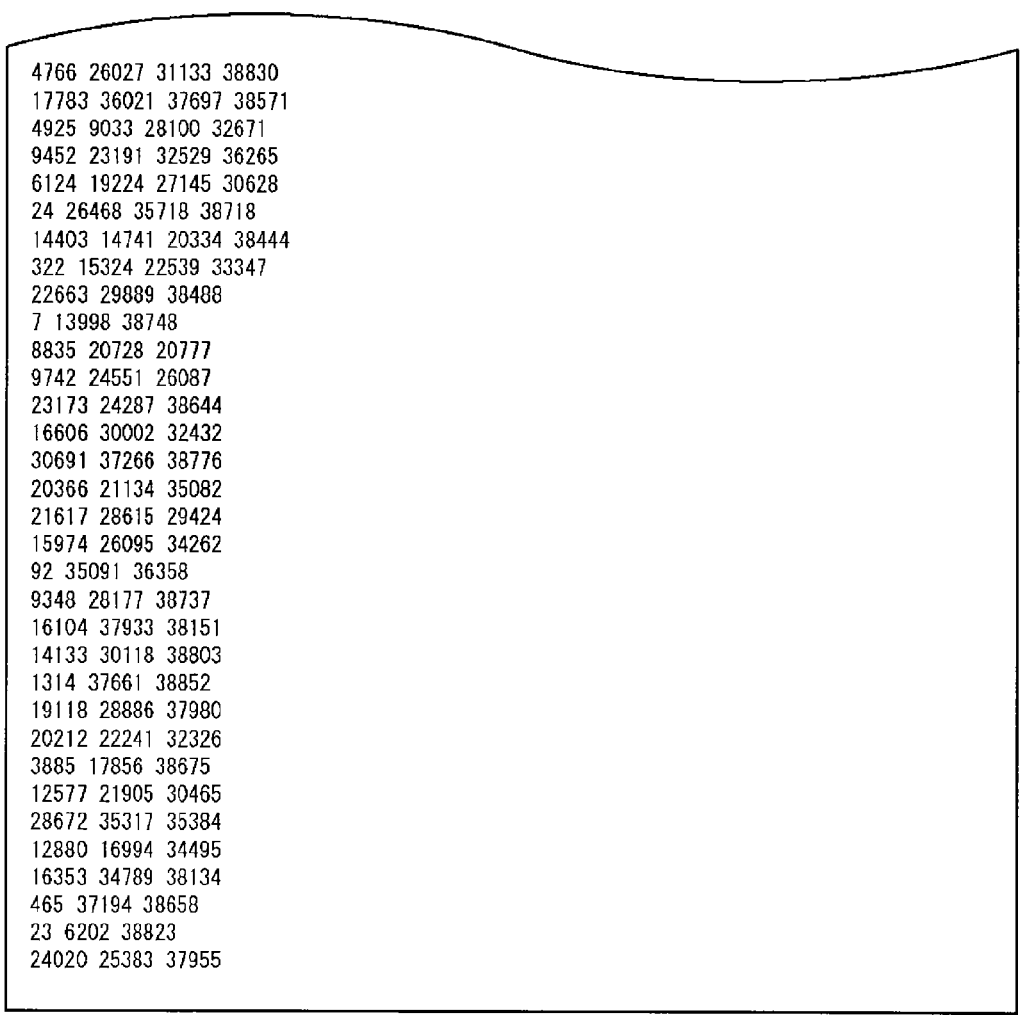
FIG. 55 is a diagram illustrating the example of the parity check matrix initial value table with the code rate 12/30 and the code length 64800.

FIGS. 54 and 55 illustrate a parity check matrix initial value table for a parity check matrix H of an LDPC code having a code length N of 64 k bits and a code rate r of 12/30.

Figure 57:
FIG. 57 is a diagram illustrating the example of the parity check matrix initial value table with the code rate 13/30 and the code length 64800.

FIGS. 56 and 57 illustrate a parity check matrix initial value table for a parity check matrix H of an LDPC code having a code length N of 64 k bits and a code rate r of 13/30.

Figure 59:
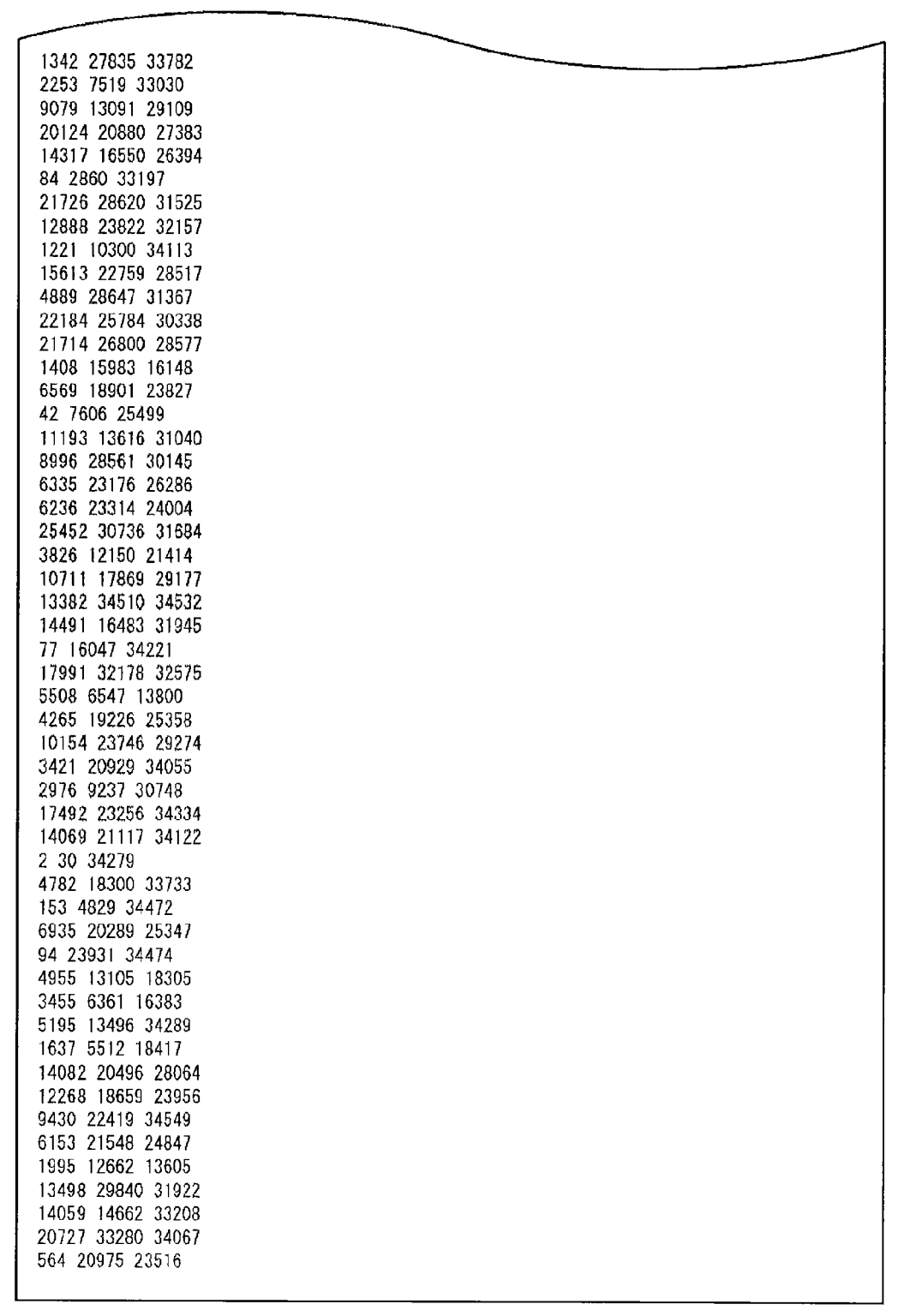

FIGS. 58 and 59 illustrate a parity check matrix initial value table for a parity check matrix H of an LDPC code having a code length N of 64 k bits and a code rate r of 14/30.

Figure 61:
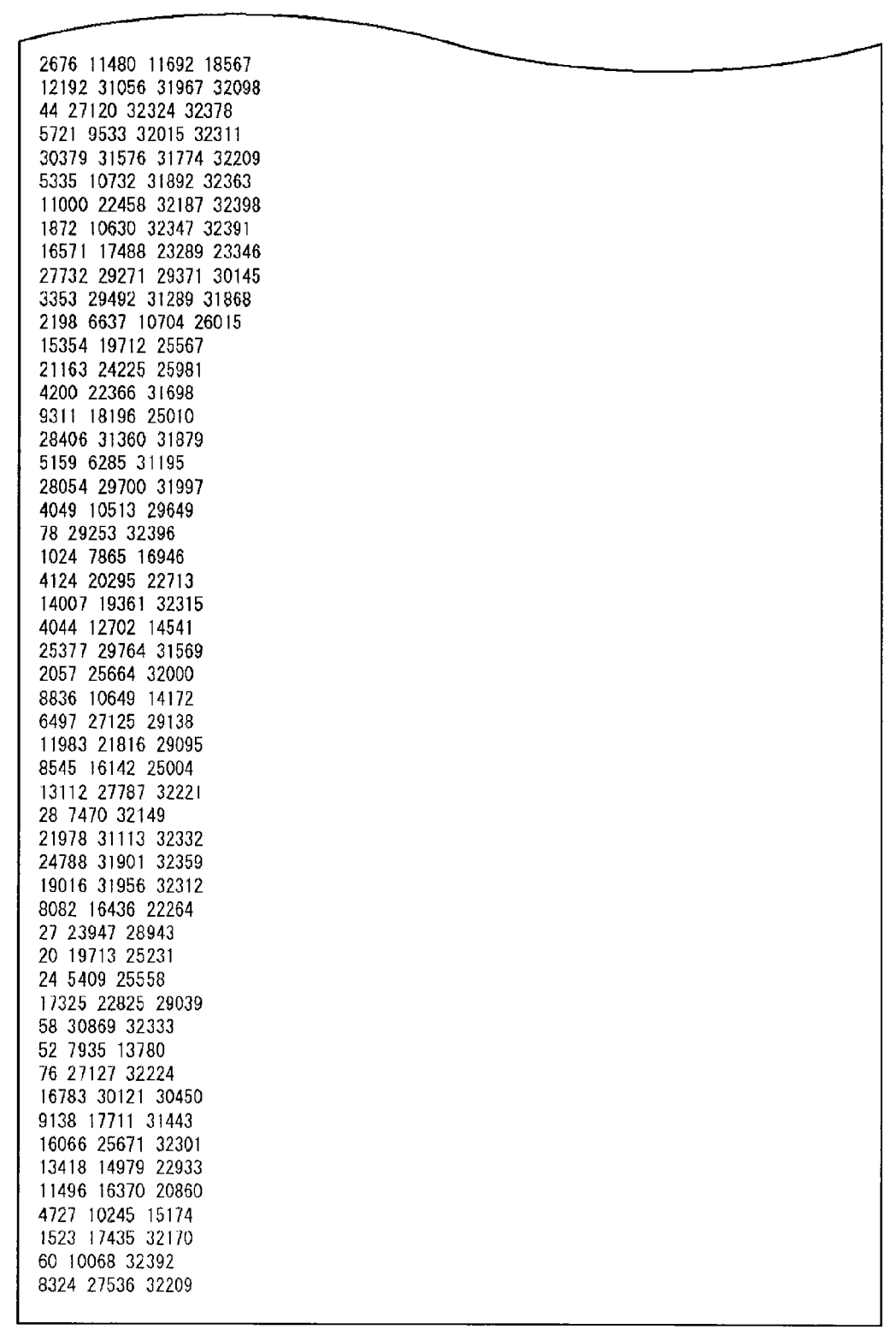

FIGS. 60 and 61 illustrate a parity check matrix initial value table for a parity check matrix H of an LDPC code having a code length N of 64 k bits and a code rate r of 15/30.

Figure 63:
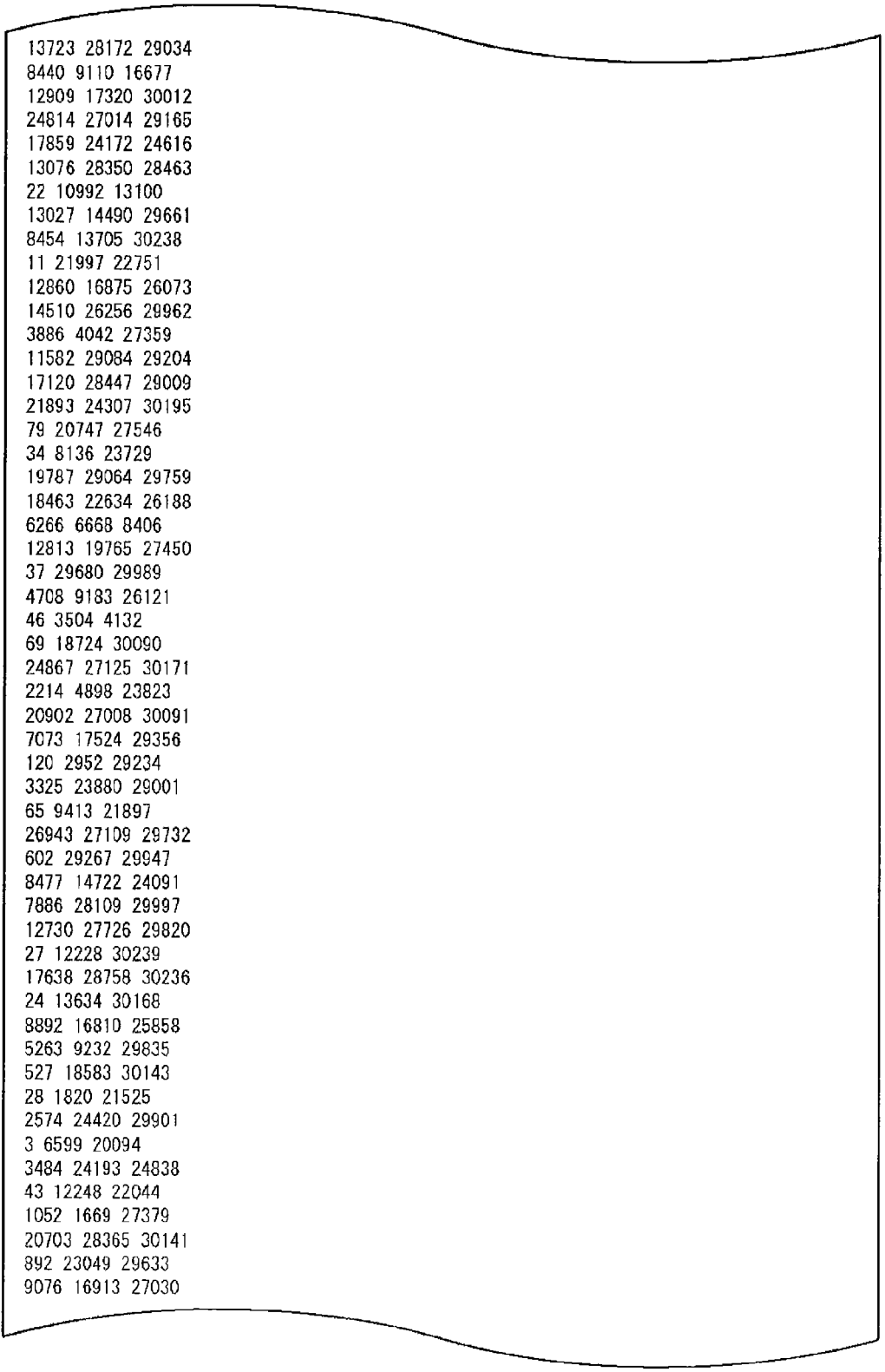
FIG. 63 is a diagram illustrating the example of the parity check matrix initial value table with the code rate 16/30 and the code length 64800.
Figure 64:
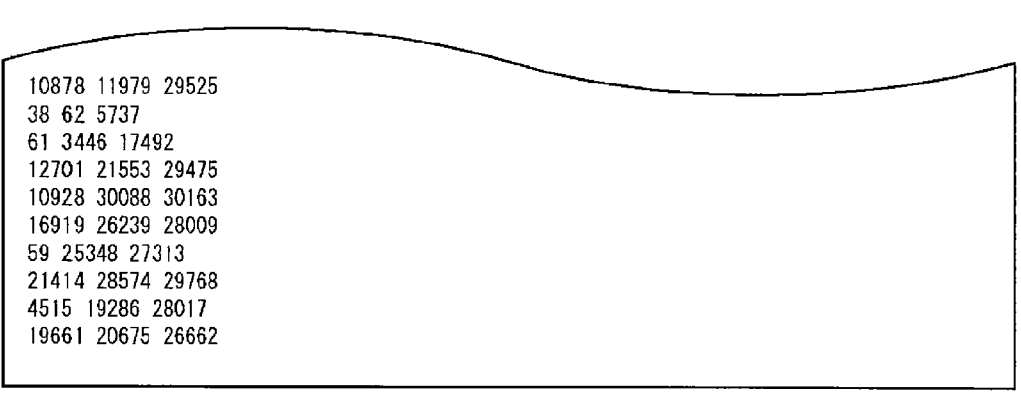
FIG. 64 is a diagram illustrating the example of the parity check matrix initial value table with the code rate 16/30 and the code length 64800.

FIGS. 62, 63, and 64 illustrate a parity check matrix initial value table for a parity check matrix H of an LDPC code having a code length N of 64 k bits and a code rate r of 16/30.

Figure 66:
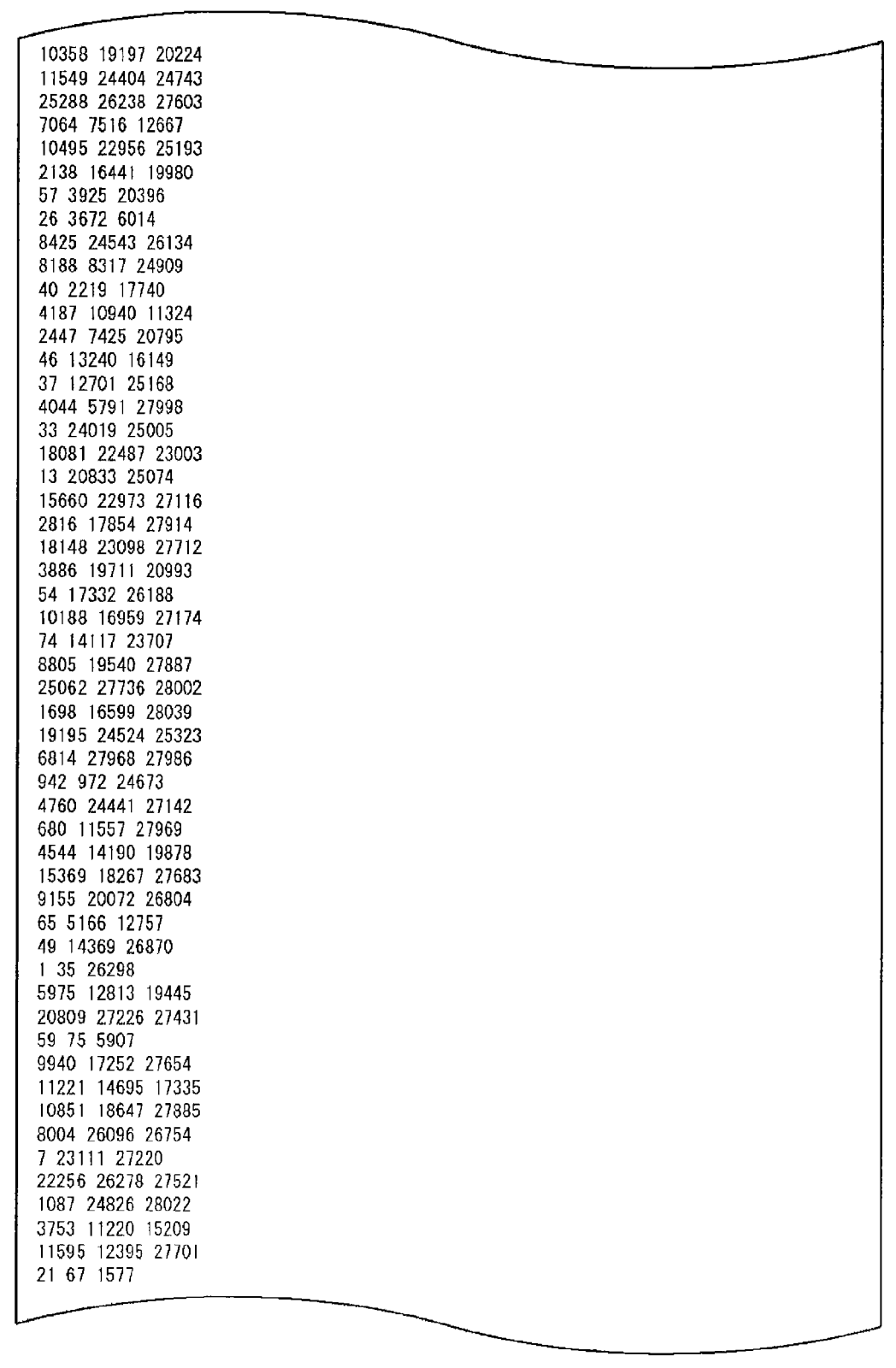
Figure 67:
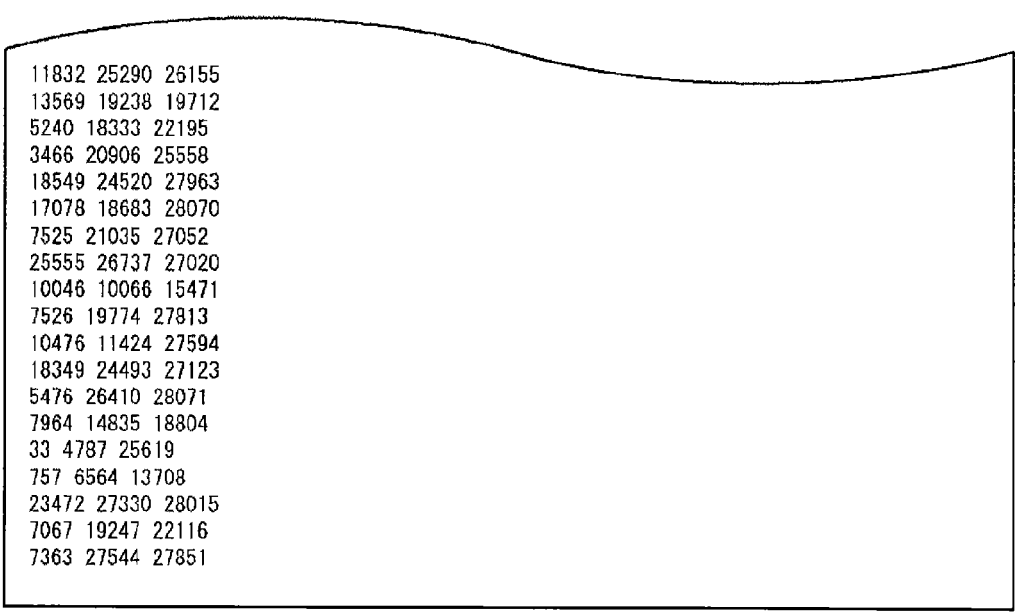
FIG. 67 is a diagram illustrating the example of the parity check matrix initial value table with the code rate and the code length 64800.

FIGS. 65, 66, and 67 illustrate a parity check matrix initial value table for a parity check matrix H of an LDPC code having a code length N of 64 k bits and a code rate r of 17/30.

Figure 69:
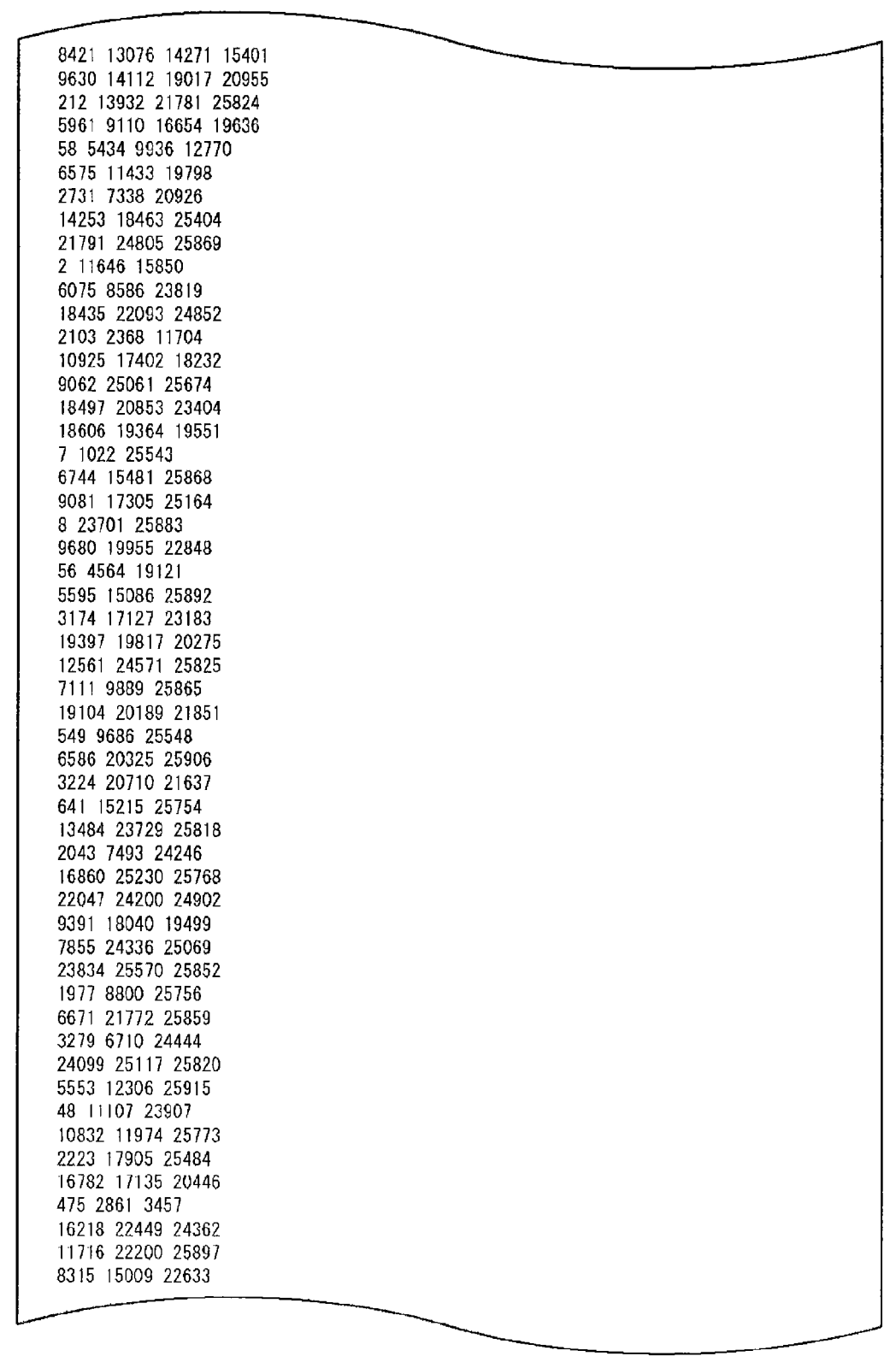
Figure 70:
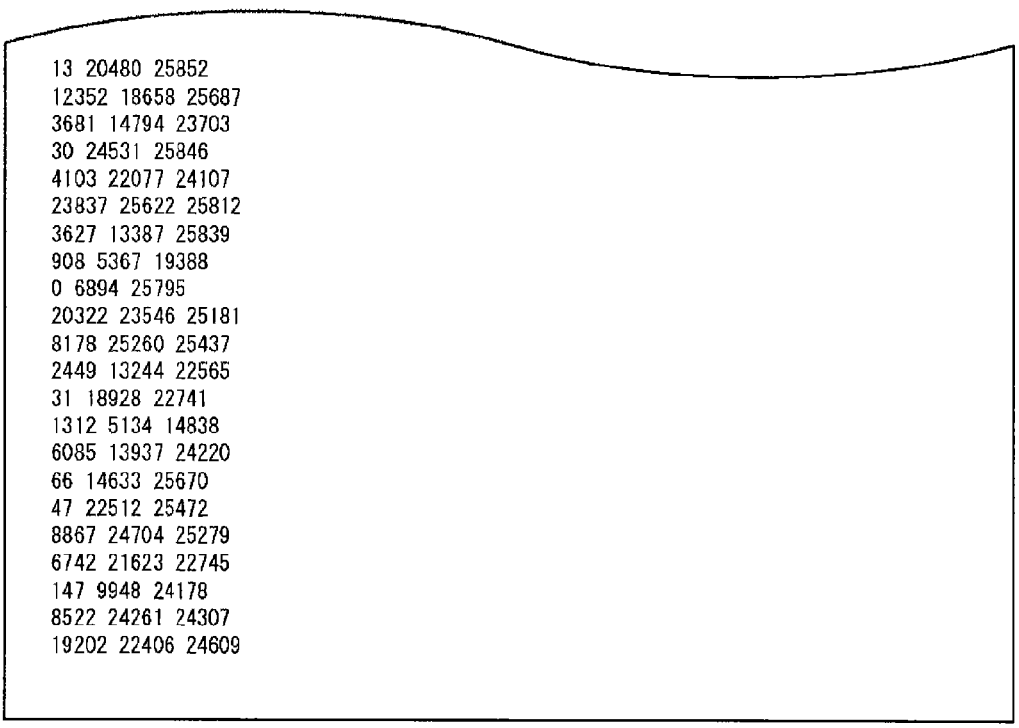
FIG. 70 is a diagram illustrating the example of the parity check matrix initial value table with the code rate 18/30 and the code length 64800.

FIGS. 68, 69, and 70 illustrate a parity check matrix initial value table for a parity check matrix H of an LDPC code having a code length N of 64 k bits and a code rate r of 18/30.

Figure 72:
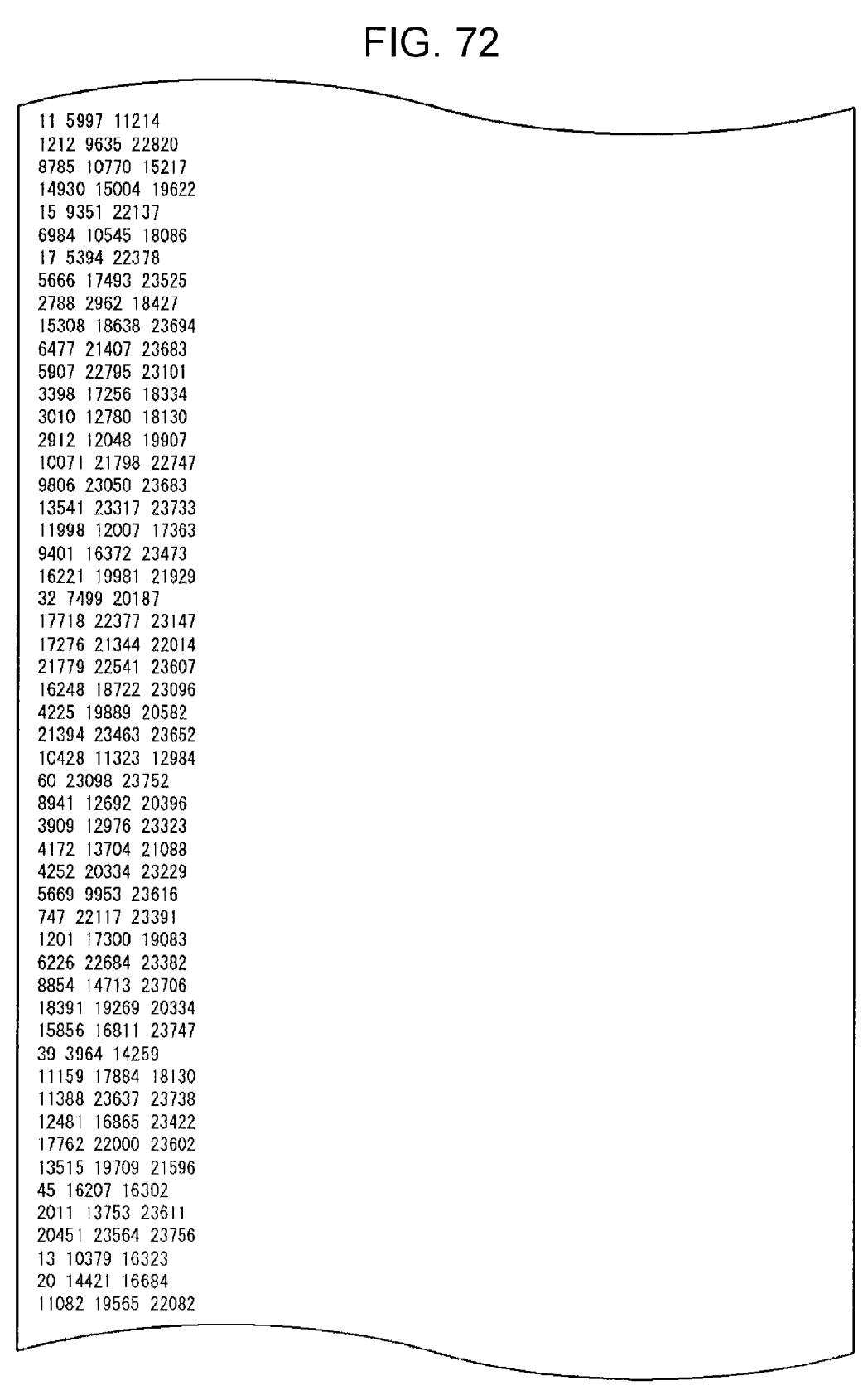
Figure 73:
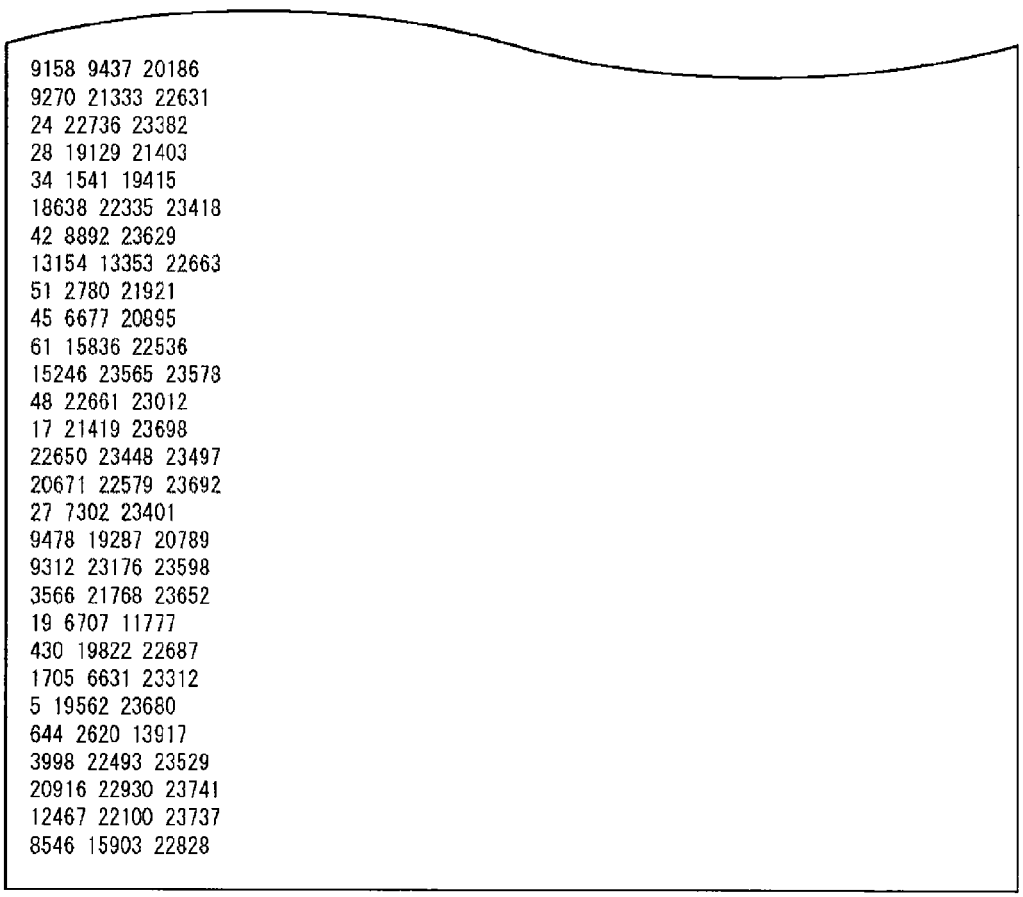
FIG. 73 is a diagram illustrating the example of the parity check matrix initial value table with the code rate 19/30 and the code length 64800.

FIGS. 71, 72, and 73 illustrate a parity check matrix initial value table for a parity check matrix H of an LDPC code having a code length N of 64 k bits and a code rate r of 19/30.

Figure 75:
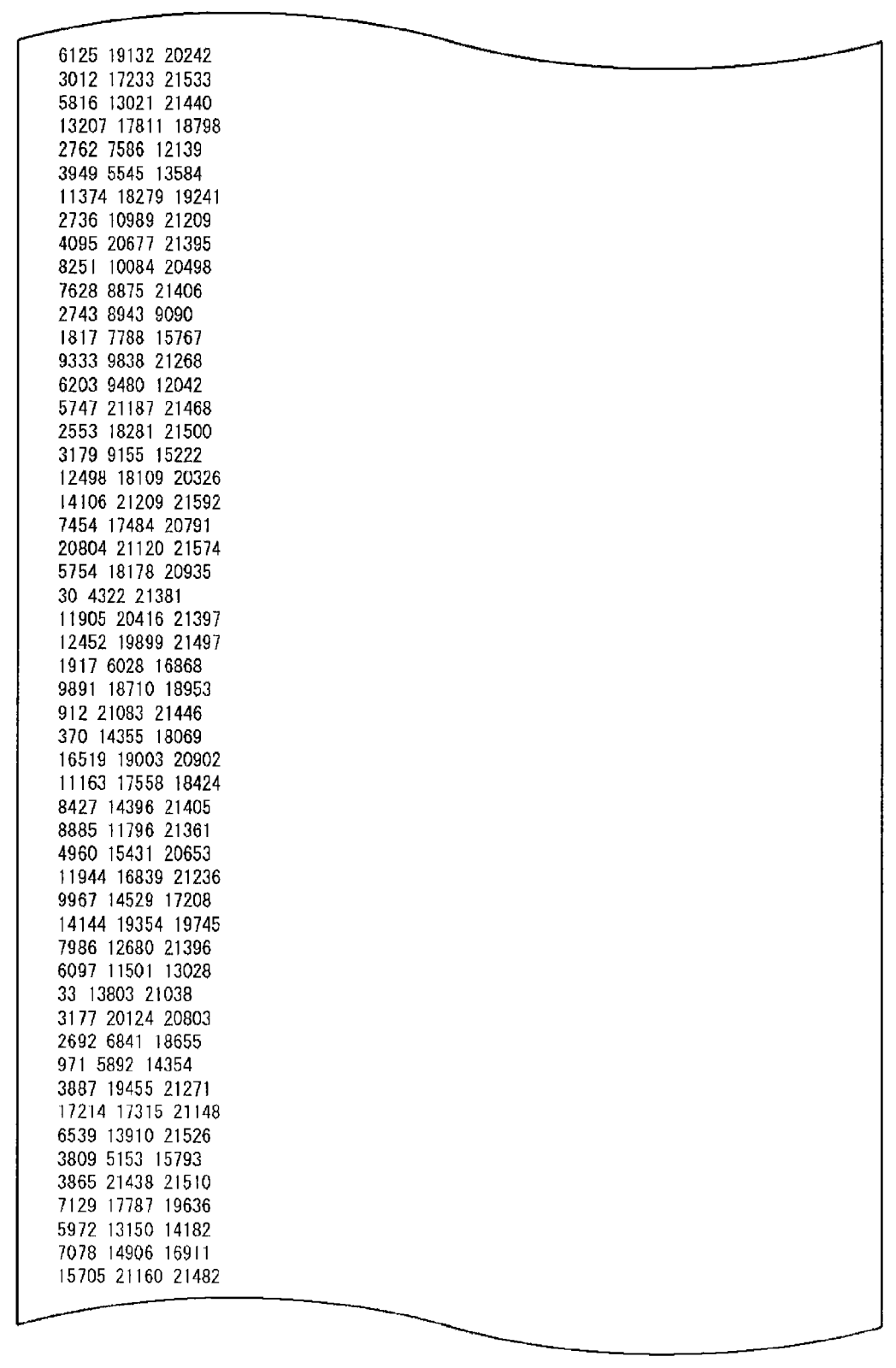
Figure 76:
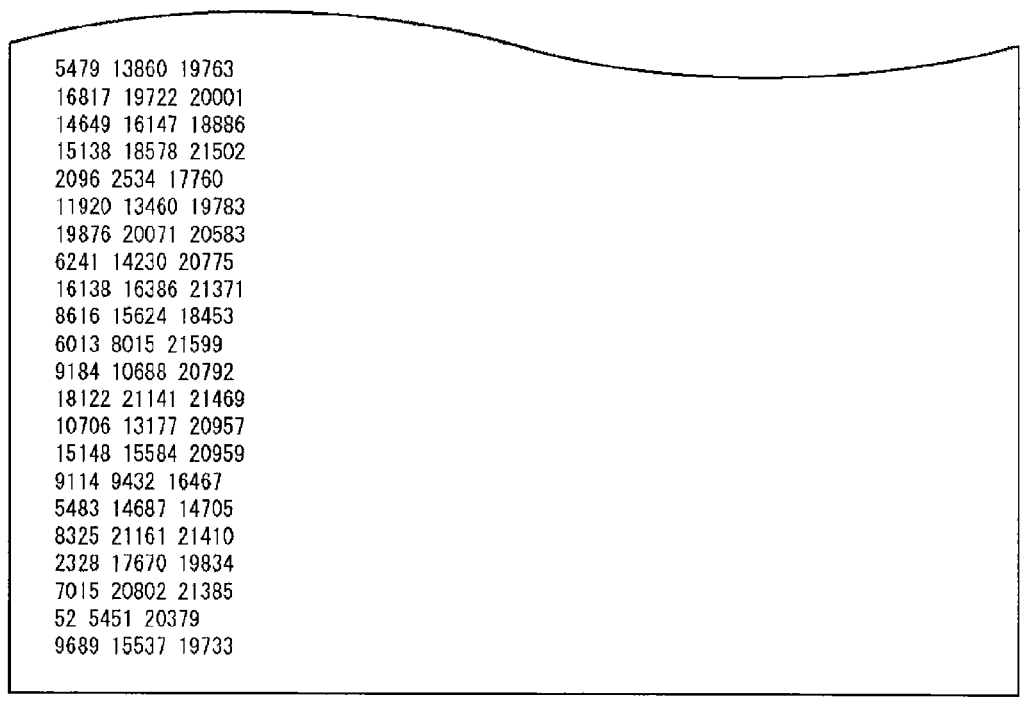
FIG. 76 is a diagram illustrating the example of the parity check matrix initial value table with the code rate 20/30 and the code length 64800.

FIGS. 74, 75, and 76 illustrate a parity check matrix initial value table for a parity check matrix H of an LDPC code having a code length N of 64 k bits and a code rate r of 20/30.

Figure 78:
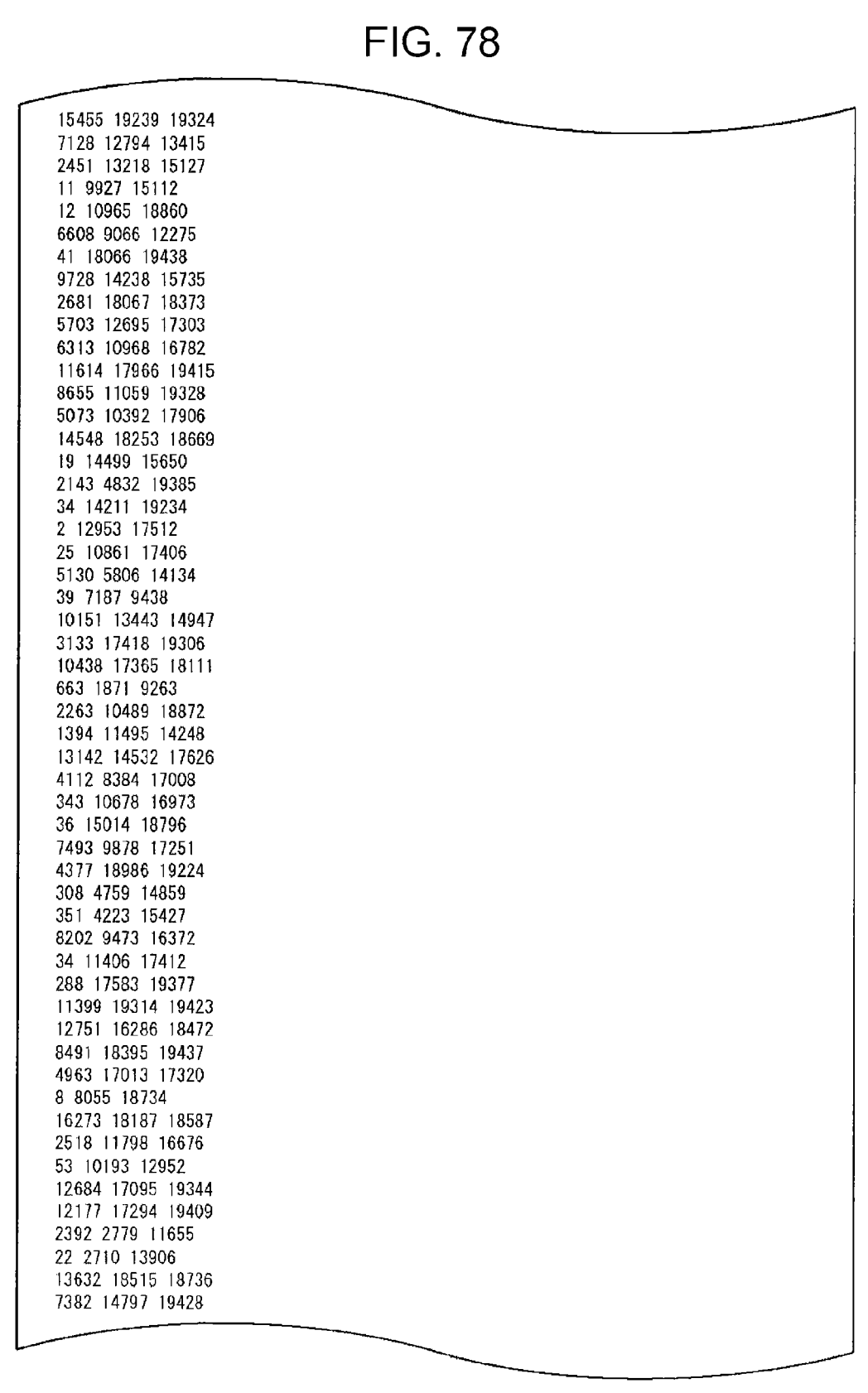
Figure 79:
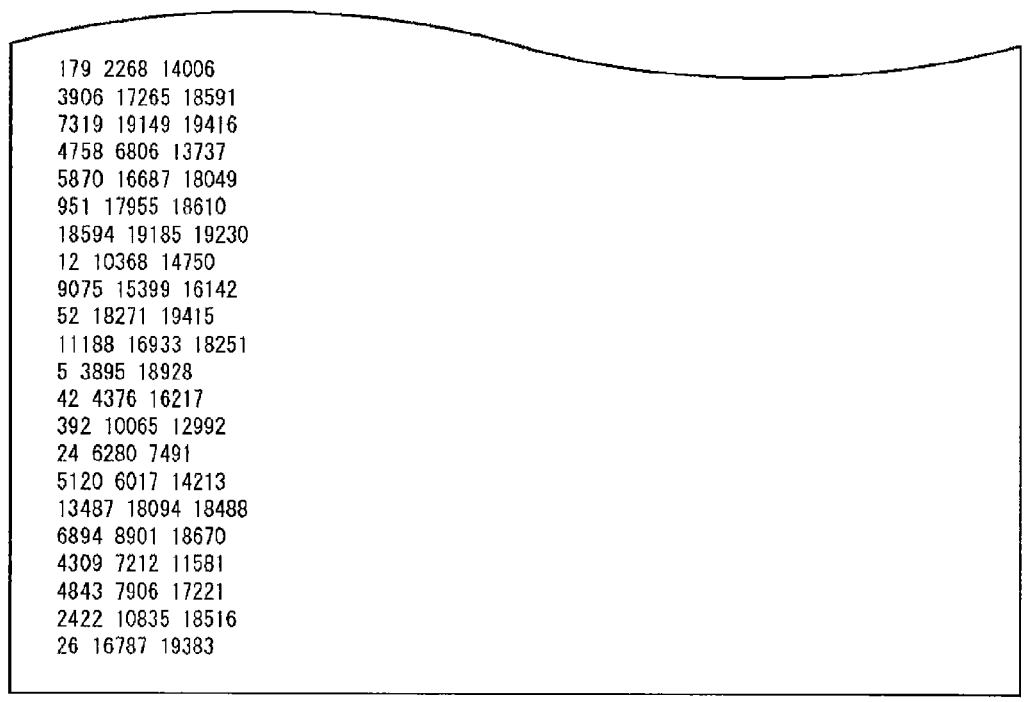
FIG. 79 is a diagram illustrating the example of the parity check matrix initial value table with the code rate 21/30 and the code length 64800.

FIGS. 77, 78, and 79 illustrate a parity check matrix initial value table for a parity check matrix H of an LDPC code having a code length N of 64 k bits and a code rate r of 21/30.

Figure 81:
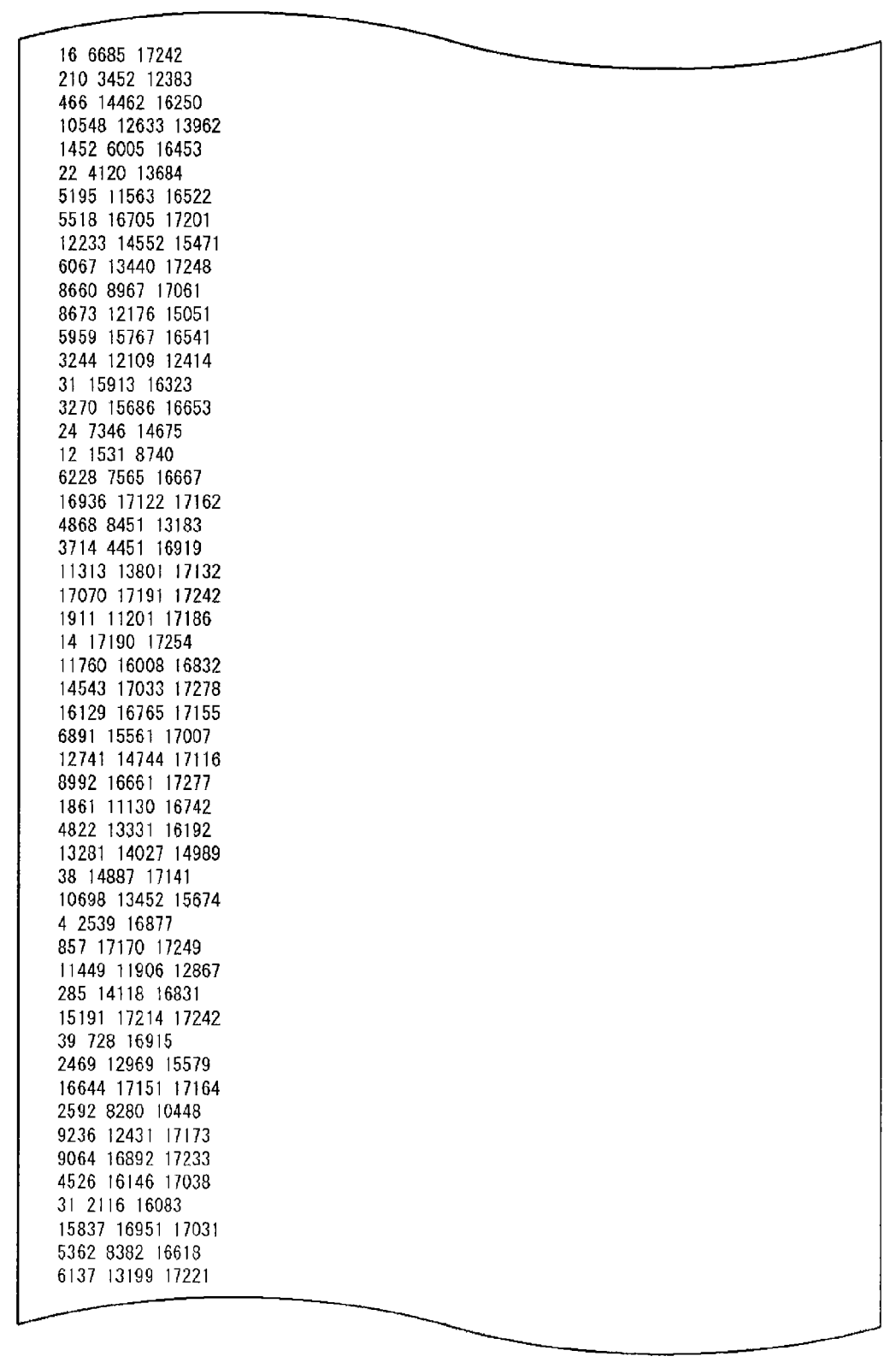
Figure 82:
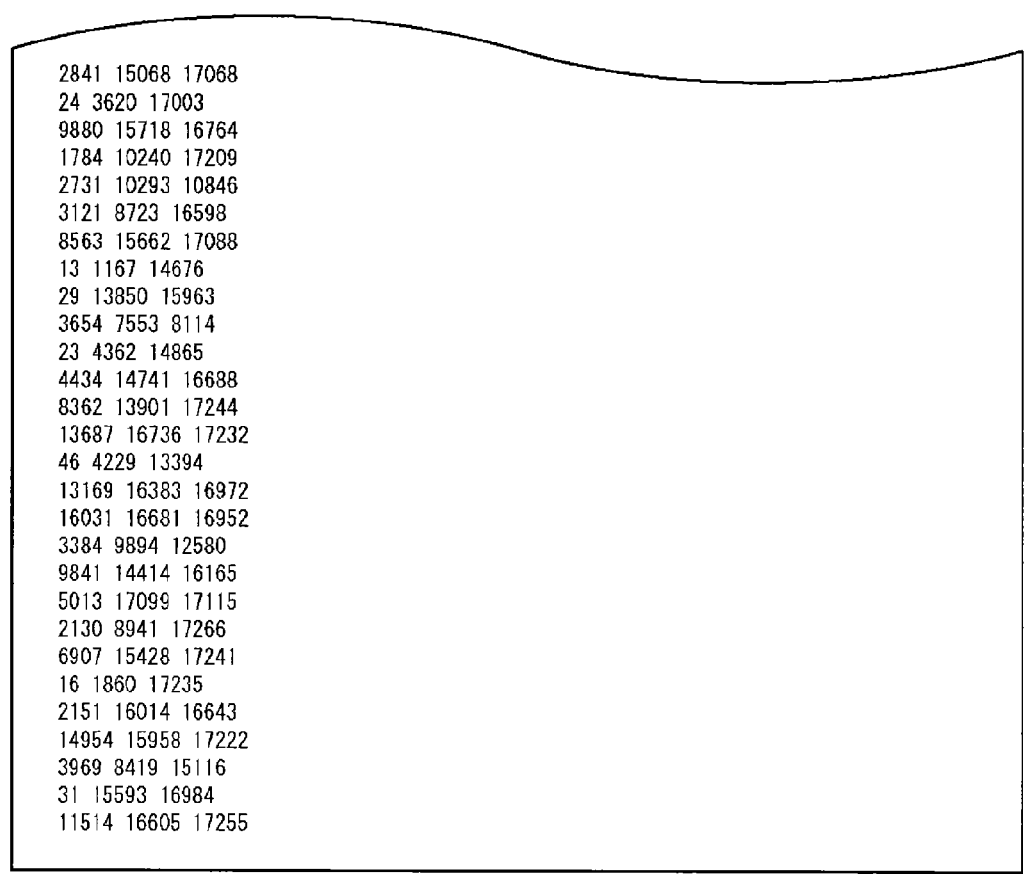
FIG. 82 is a diagram illustrating the example of the parity check matrix initial value table with the code rate 22/30 and the code length 64800.
Figure 98:
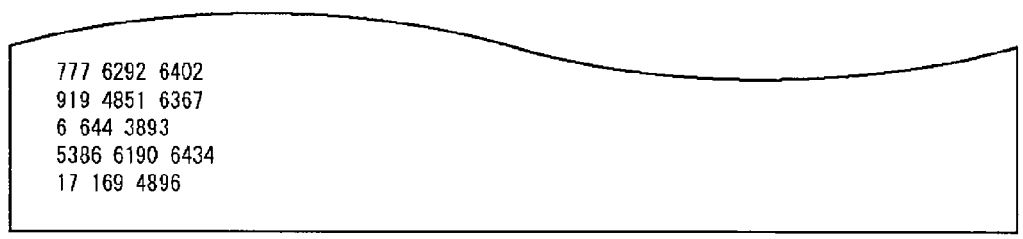
FIG. 98 is a diagram illustrating the example of the parity check matrix initial value table with the code rate 27/30 and the code length 64800.
Figure 102:
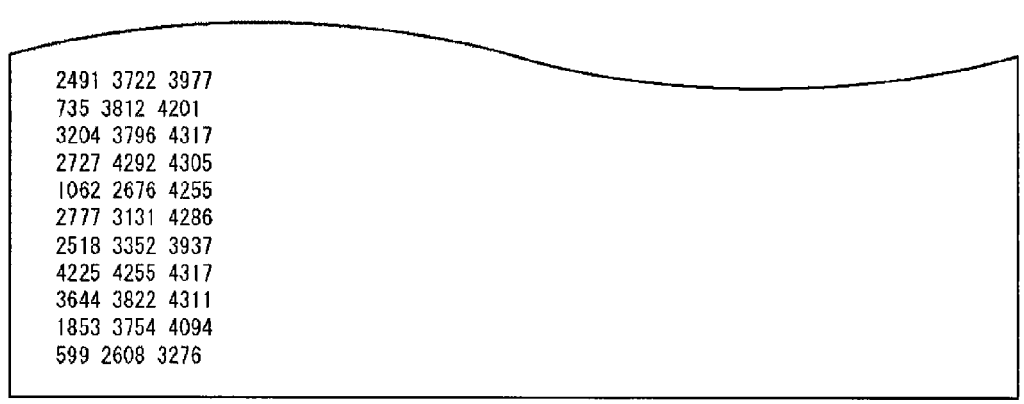
FIG. 102 is a diagram illustrating the example of the parity check matrix initial value table with the code rate 28/30 and the code length 64800.
Figure 104:
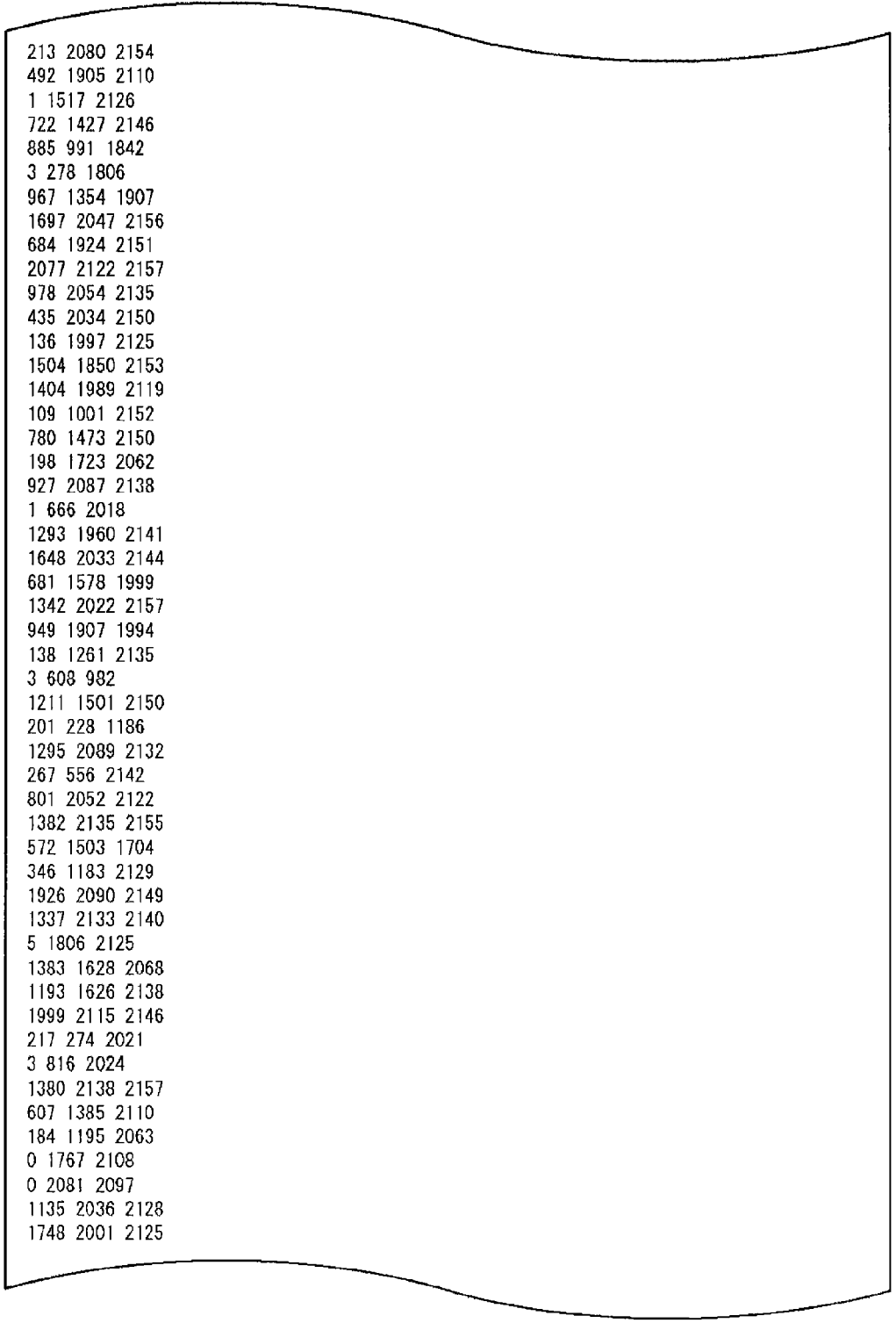
FIG. 104 is a diagram illustrating the example of the parity check matrix initial value table with the code rate 29/30 and the code length 64800.

FIGS. 80, 81, and 82 illustrate a parity check matrix initial value table for a parity check matrix H of an LDPC code having a code length N of 64 k bits and a code rate r of 22/30.

Figure 84:
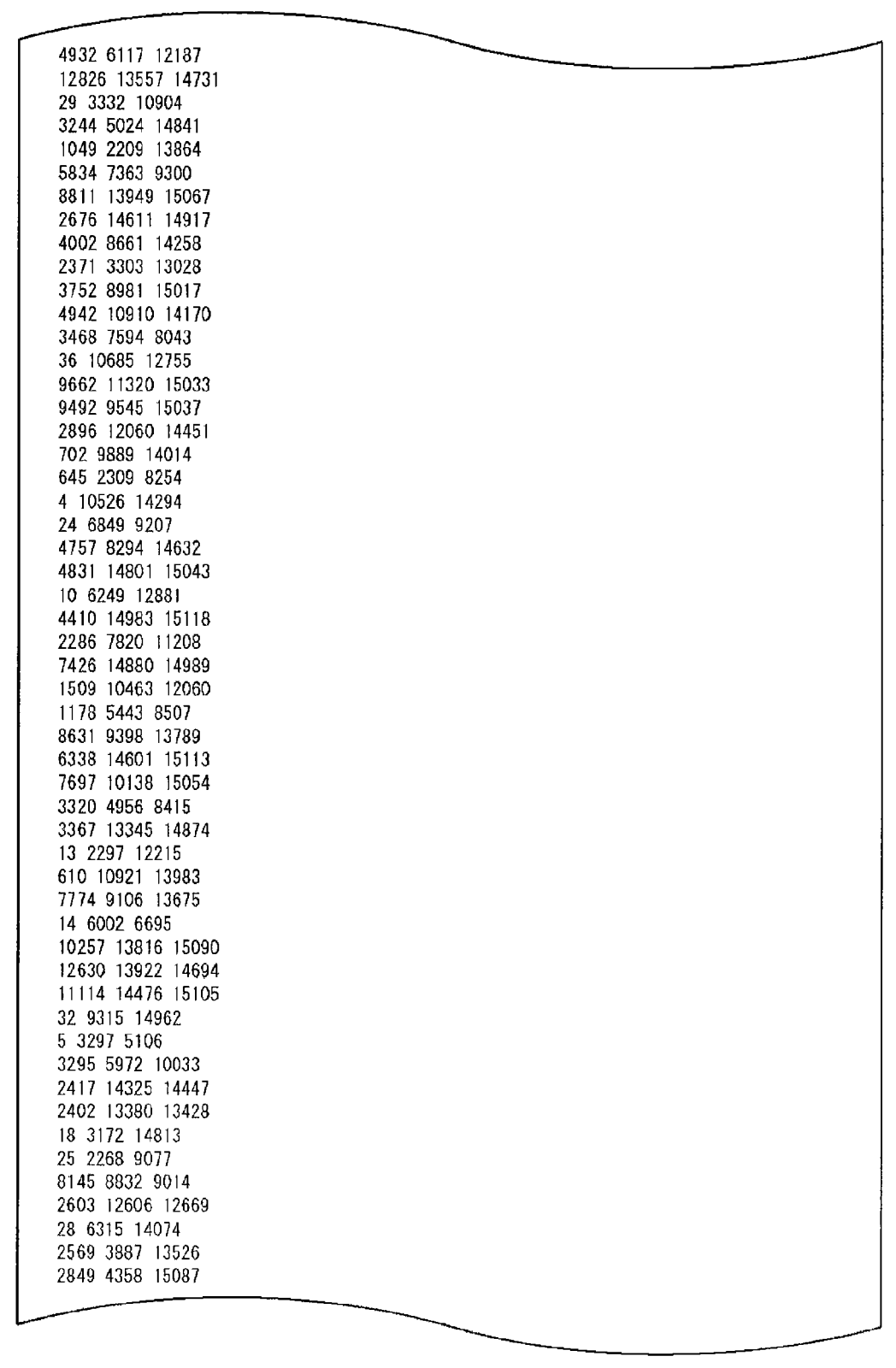
Figure 85:
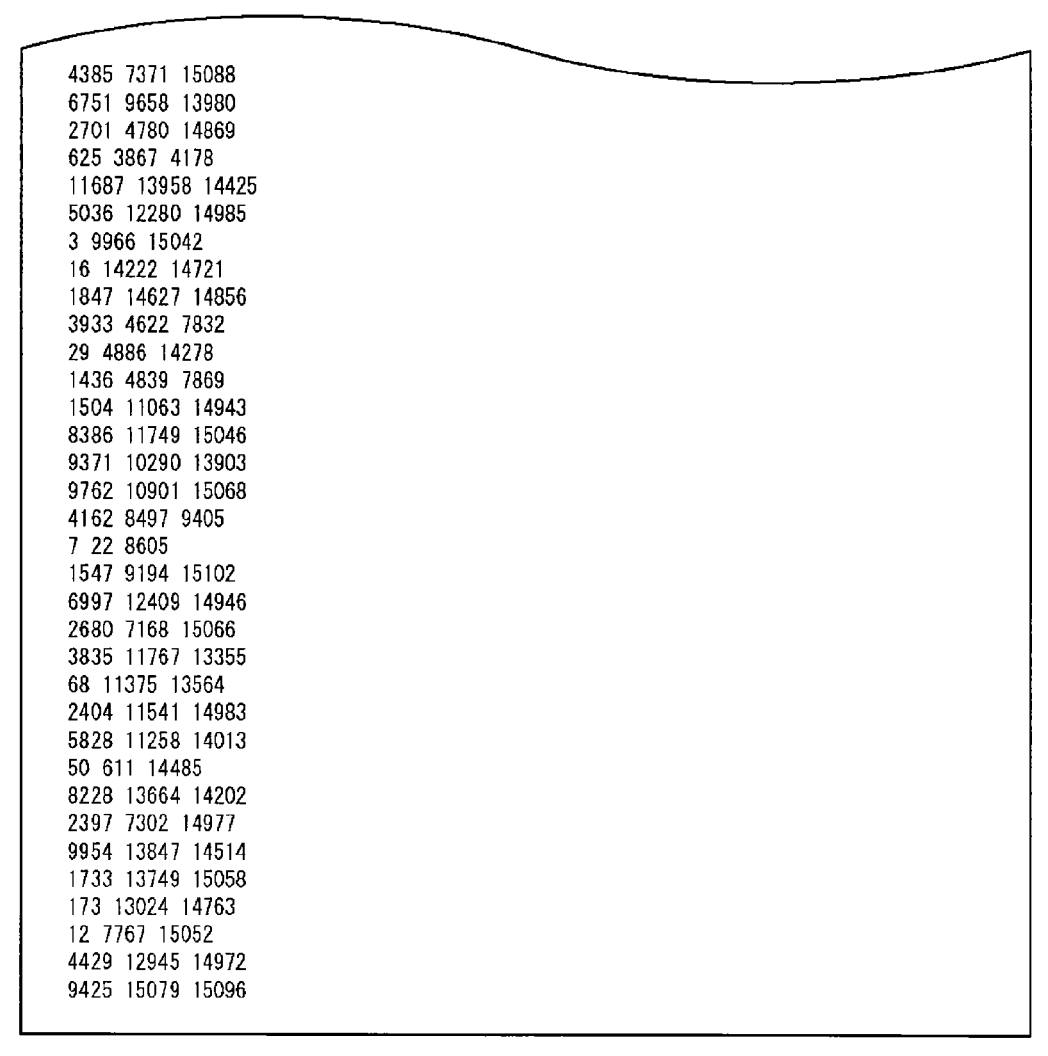

FIGS. 83, 84, and 85 illustrate a parity check matrix initial value table for a parity check matrix H of an LDPC code having a code length N of 64 k bits and a code rate r of 23/30.

FIGS. 86, 87, and 88 illustrate a parity check matrix initial value table for a parity check matrix H of an LDPC code having a code length N of 64 k bits and a code rate r of 24/30.

FIGS. 89, 90, and 91 illustrate a parity check matrix initial value table for a parity check matrix H of an LDPC code having a code length N of 64 k bits and a code rate r of 25/30.

FIGS. 92, 93, and 94 illustrate a parity check matrix initial value table for a parity check matrix H of an LDPC code having a code length N of 64 k bits and a code rate r of 26/30.

FIGS. 95, 96, 97, and 98 illustrate a parity check matrix initial value table for a parity check matrix H of an LDPC code having a code length N of 64 k bits and a code rate r of 27/30.

FIGS. 99, 100, 101, and 102 illustrate a parity check matrix initial value table for a parity check matrix H of an LDPC code having a code length N of 64 k bits and a code rate r of 28/30.

FIGS. 103, 104, 105, and 106 illustrate a parity check matrix initial value table for a parity check matrix H of an LDPC code having a code length N of 64 k bits and a code rate r of 29/30.

The LDPC encoder 115 (FIGS. 8 and 35) is capable of performing encoding on a (new) LDPC code having a code length N of 64 k bits and any of 28 code rates r of 2/30 to 29/30 by using a parity check matrix H determined from one of the parity check matrix initial value tables illustrated in FIGS. 40 to 106.

In the illustrated example, the storage unit 602 of the LDPC encoder 115 (FIG. 8) stores the parity check matrix initial value tables illustrated in FIGS. 40 to 106.

It is to be noted that not all the LDPC codes with 28 code rates r of 2/30 to 29/30 (which are determined from the parity check matrix initial value tables) illustrated in FIGS. 40 to 106 may be used as new LDPC. That is, an LDPC code or codes with any one or more code rates among the LDPC codes with 28 code rates r of 2/30 to 29/30 illustrated in FIGS. 40 to 106 may be employed as a new LDPC code or codes.

LDPC codes obtained using parity check matrices H determined from the parity check matrix initial value tables illustrated in FIGS. 40 to 106 may be high-performance LDPC codes.

The term "high-performance LDPC code", as used herein, refers to an LDPC code obtained from an appropriate parity check matrix H.

Furthermore, the term "appropriate parity check matrix H" refers to a parity check matrix satisfying a certain condition in which the BER (and FER) is (or are) reduced when an LDPC code obtained from a parity check matrix H is transmitted with a low $E_s/N_0$ or $E_b/N_o$ (which is the ratio of the signal power per bit to the noise power).

An appropriate parity check matrix H may be determined through simulations for measuring BERs when, for example, LDPC codes obtained from various parity check matrices satisfying a certain condition are transmitted with a low $E_s/N_o$.

Examples of the certain condition that an appropriate parity check matrix H is to satisfy include a condition that analysis results obtained using an analytical technique for the performance evaluation of codes, called density evolution, are good, and a condition that a loop of elements of 1, called cycle 4, does not exist.

Here, it is well established that a concentration of elements of 1, like cycle 4, in an information matrix $H_A$ will reduce the decoding performance of an LDPC code. Thus, the absence of cycle 4 is demanded as a certain condition that an appropriate parity check matrix H is to satisfy.

Note that the certain condition that an appropriate parity check matrix H is to satisfy may be determined, as desired, in terms of various factors such as improved decoding performance of an LDPC code and easy (or simplified) decoding processing of an LDPC code.

Figure 107:
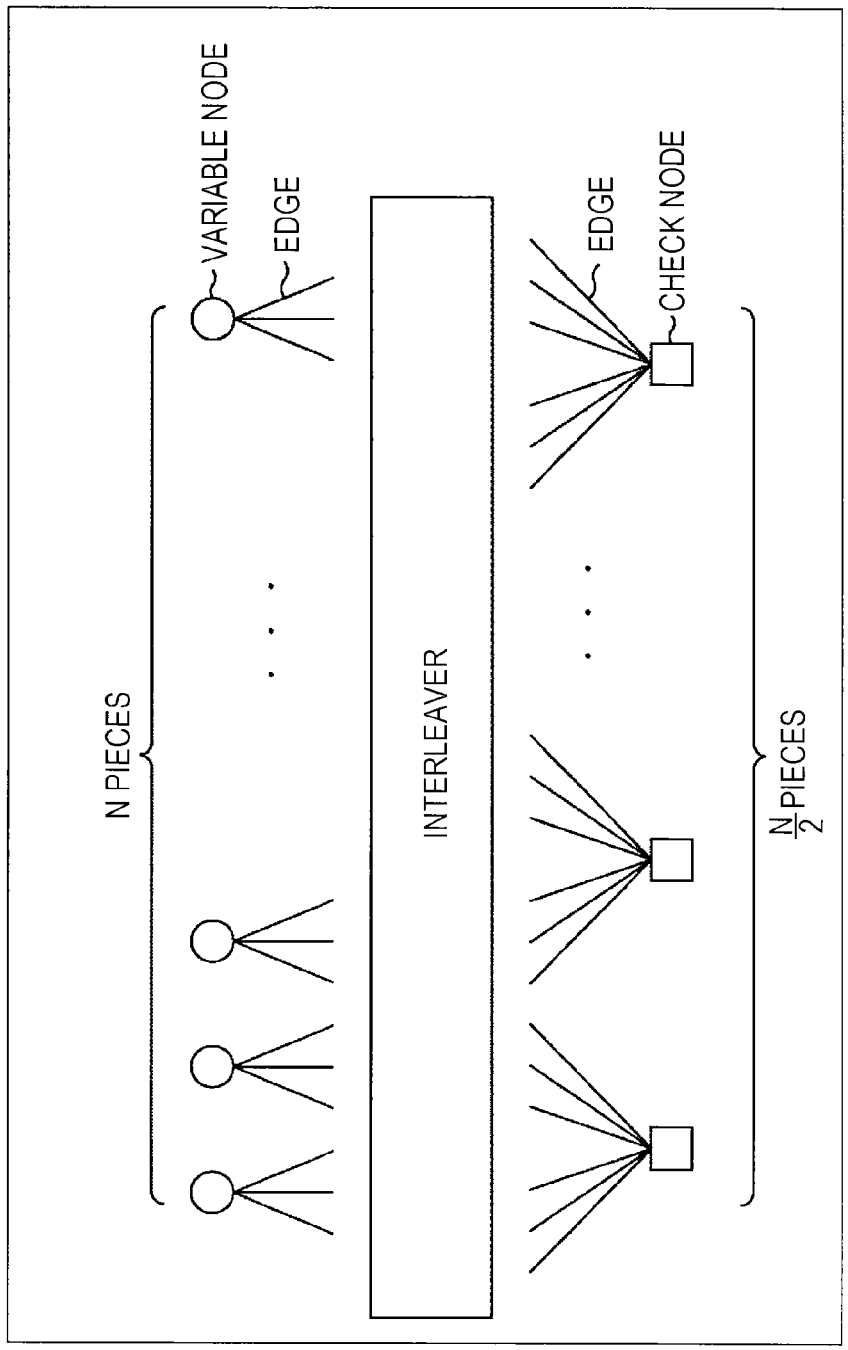
FIG. 107 is a diagram illustrating an example of a Tanner graph of an ensemble defined by a degree sequence indicating a column weight of 3 and a row weight of 6.
Figure 108:
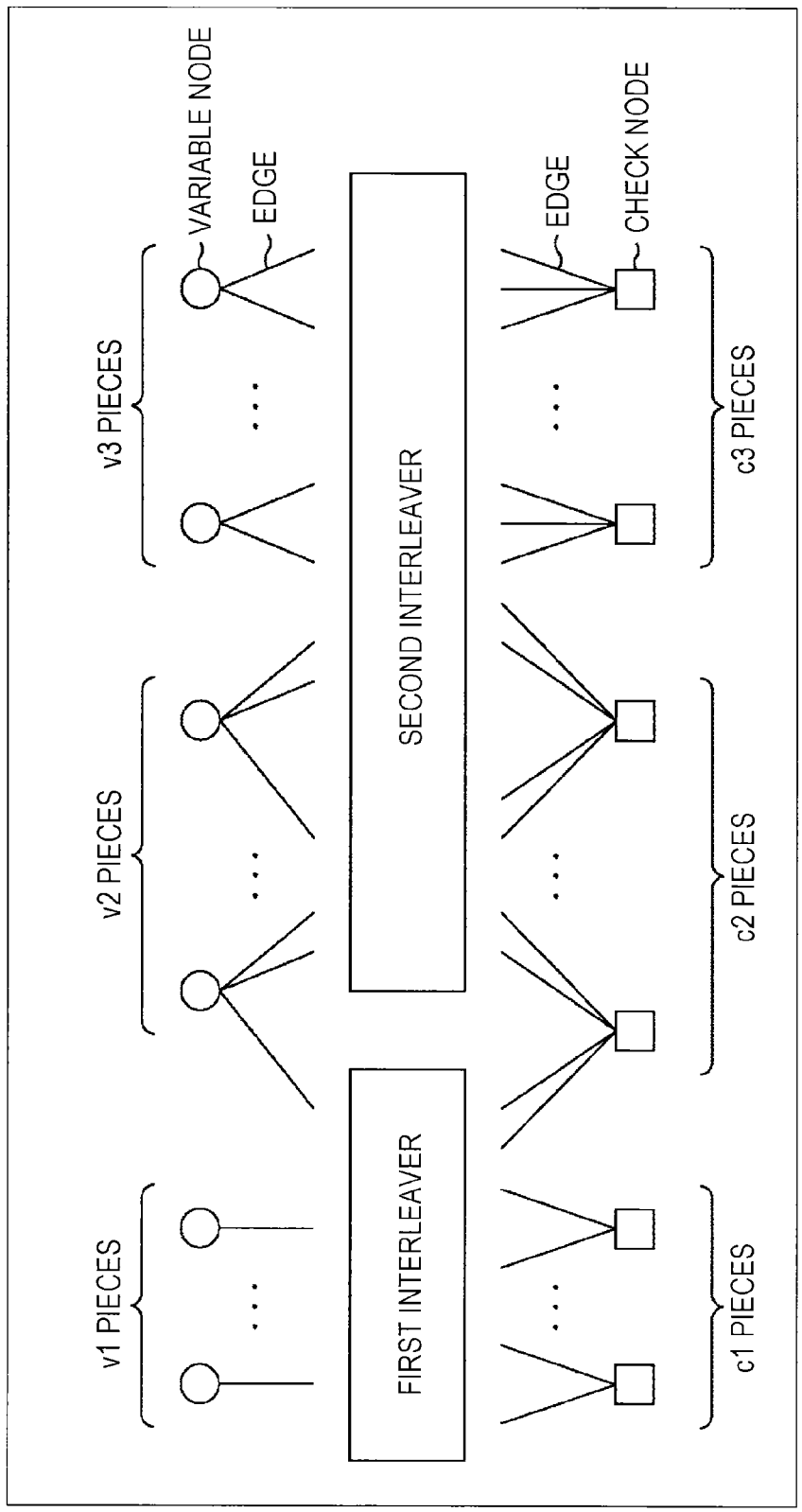
FIG. 108 is a diagram illustrating an example of a Tanner graph of a multi-edge type ensemble.

FIGS. 107 and 108 are diagrams depicting density evolution through which analysis results are obtained, as a certain condition that an appropriate parity check matrix H is to satisfy.

Density evolution is a code analysis technique for calculating an expected value of error probability for the set of all LDPC codes ("ensemble") whose code length N, which is characterized by a degree sequence described below, is infinite (∞).

For example, if a noise variance increases from zero in an AWGN channel, the expected value of error probability for a certain ensemble is initially zero, and becomes non-zero if the noise variance is greater than or equal to a certain threshold.

In the density evolution method, it can be determined whether the ensemble performance (i.e., the appropriateness of a parity check matrix) is good or not, by comparing noise variance thresholds (hereinafter also referred to as "performance thresholds") over which the expected values of error probability for ensembles become non-zero.

Note that the general performance of a specific LDPC code can be predicted by determining an ensemble including the LDPC code and performing density evolution on the ensemble.

Accordingly, once an ensemble with good performance is found, an LDPC code with good performance may be found from among the LDPC codes included in the ensemble.

Here, the degree sequence, described above, represents the ratio of variable nodes or check nodes with a weight of each value to the code length N of an LDPC code.

For example, a regular (3,6) LDPC code with a code rate of 1/2 belongs to an ensemble characterized by a degree sequence indicating that the weight (column weight) for all the variable nodes is 3 and the weight (row weight) for all the check nodes is 6.

FIG. 107 illustrates a Tanner graph of the above-described ensemble.

The Tanner graph illustrated in FIG. 107 includes N variable nodes indicated by circles ("○") in FIG. 107, the number of which is equal to the code length N, and N/2 check nodes indicated by squares ("□") in FIG. 107, the number of which is equal to a value obtained by multiplying the code length N by the code rate 1/2.

Three edges, the number of which is equal to the column weight, are connected to each variable node. Therefore, 3N edges in total are connected to the N variable nodes.

In addition, six edges, the number of which is equal to the row weight, are connected to each check node. Therefore, 3N edges in total are connected to the N/2 check nodes.

In the Tanner graph illustrated in FIG. 107, one interleaver is also included.

The interleaver randomly reorders the 3N edges connected to the N variable nodes, and connects each of the reordered edges to one of the 3N edges connected to the N/2 check nodes.

There are (3N)! (=(3N)×(3N−1)× . . . ×1) reordering patterns in which the interleaver reorders the 3N edges connected to the N variable nodes. Accordingly, an ensemble characterized by a degree sequence indicating that the weight for all the variable nodes is 3 and the weight for all the check nodes is 6 is the set of (3N)! LDPC codes.

In a simulation for determining an LDPC code with good performance (i.e., an appropriate parity check matrix), a multi-edge type ensemble was used in density evolution.

In the multi-edge type, an interleaver through which edges connected to variable nodes and edges connected to check nodes extend is divided into a plurality of pieces (multi-edge), which may allow more accurate characterization of an ensemble.

FIG. 108 illustrates an example of a Tanner graph of a multi-edge type ensemble.

In the Tanner graph illustrated in FIG. 108, two interleavers, namely, a first interleaver and a second interleaver, are included.

In addition, the Tanner graph illustrated in FIG. 108 includes v1 variable nodes each having one edge connected to the first interleaver and zero edges connected to the second interleaver, v2 variable nodes each having one edge connected to the first interleaver and two edges connected to the second interleaver, and v3 variable nodes each having zero edges connected to the first interleaver and two edges connected to the second interleaver.

The Tanner graph illustrated in FIG. 108 further includes c1 check nodes each having two edges connected to the first interleaver and zero edges connected to the second interleaver, c2 check nodes each having two edges connected to the first interleaver and two edges connected to the second interleaver, and c3 check nodes each having zero edges connected to the first interleaver and three edges connected to the second interleaver.

Here, density evolution and an implementation thereof are described in, for example, "On the Design of Low-Density Parity-Check Codes within 0.0045 dB of the Shannon Limit", S. Y. Chung, G. D. Forney, T. J. Richardson, R. Urbanke, IEEE Communications Leggers, VOL. 5, NO. 2, February 2001.

In a simulation for determining (a parity check matrix initial value table of) a new LDPC code, an ensemble for which the performance threshold, which is $E_b/N_0$ (which is the ratio of the signal power per bit to the noise power) at which a BER begins to drop (i.e., decreases), is less than or equal to a certain value was found using multi-edge type density evolution, and an LDPC code that reduces a BER in a plurality of modulation schemes used in DVB-S.2 and the like, such as QPSK, was selected as an LDPC code with good performance from among the LDPC codes belonging to the ensemble.

The parity check matrix initial value tables of the new LDPC codes described above are parity check matrix initial value tables of LDPC codes having a code length N of 64 k bits, which are determined through the simulations described above.

FIG. 109 is a diagram illustrating minimum cycle lengths and performance thresholds for parity check matrices H which are determined from parity check matrix initial value tables of new LDPC codes having a code length N of 64 k bits and 28 code rates of 2/30 to 29/30 illustrated in FIGS. 40 to 106.

Here, a minimum cycle length (or girth) is a minimum value of the length (loop length) of a loop composed of elements of 1 in a parity check matrix H.

Cycle 4 (a loop of elements of 1, with a loop length of 4) does not exist in a parity check matrix H determined from a parity check matrix initial value table of a new LDPC code.

In addition, as the code rate r decreases, the redundancy of an LDPC code increases. Thus, the performance threshold tends to be improved (i.e., decrease) as the code rate r decreases.

Figure 110:
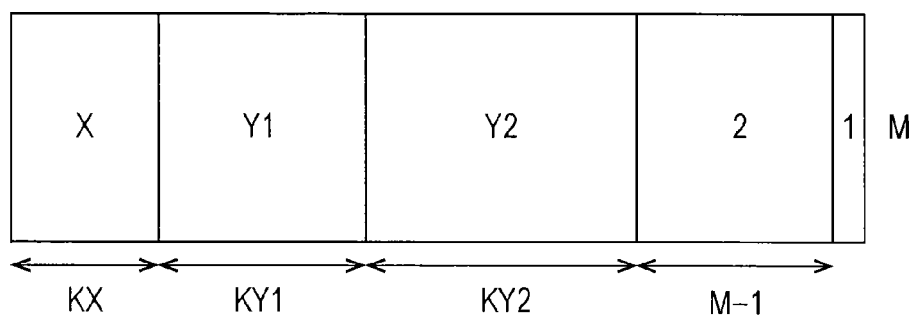
FIG. 110 is a diagram depicting a parity check matrix of an LDPC code with the code length 64800.

FIG. 110 is a diagram depicting a parity check matrix H (hereinafter also referred to as a "parity check matrix H of a new LDPC code") (determined from each of the parity check matrix initial value tables) illustrated in FIGS. 40 to 106.

The parity check matrix H of the new LDPC code has a column weight X for KX columns, starting with the first column, a column weight of Y1 for the subsequent KY1 columns, a column weight of Y2 for the subsequent KY2 columns, a column weight of 2 for the subsequent (M−1) columns, and a column weight of 1 for the last column.

Here, the sum of columns given by KX+KY1+KY2+M−1+1 equals the code length N=64800 bits.

FIG. 111 is a diagram illustrating the numbers of columns KX, KY1, KY2, and M, and the column weights X, Y1, and Y2 illustrated in FIG. 110 for the respective code rates r of the new LDPC codes.

In a parity check matrix H of a new LDPC code having a code length N of 64 k, similarly to the parity check matrix described with reference to FIGS. 12 and 13, the column weight tends to increase as the ordinal number of the columns of the parity check matrix H decreases (i.e., as the column comes closer to the left end of the parity check matrix H). Accordingly, robustness to errors (or resistance to errors) tends to increase as the ordinal number of the code bits of a new LDPC code decreases (i.e., the first code bit tends to be the most robust to errors).

It is noted that the amount of shift q used in cyclic shifting which is performed to determine a parity check matrix from a parity check matrix initial value table of a new LDPC code having a code length N of 64 k in the way described with reference to FIG. 38 is represented by the equation q=M/P=M/360.

Accordingly, the amounts of shift for new LDPC codes with code rates of 2/30, 3/30, 4/30, 5/30, 6/30, 7/30, 8/30, 9/30, 10/30, 11/30, 12/30, 13/30, 14/30, 15/30, 16/30, 17/30, 18/30, 19/30, 20/30, 21/30, 22/30, 23/30, 24/30, 25/30, 26/30, 27/30, 28/30, and 29/30 are 168, 162, 156, 150, 144, 138, 132, 126, 120, 114, 108, 102, 96, 90, 84, 78, 72, 66, 60, 54, 48, 42, 36, 30, 24, 18, 12, and 6, respectively.

Figure 112:
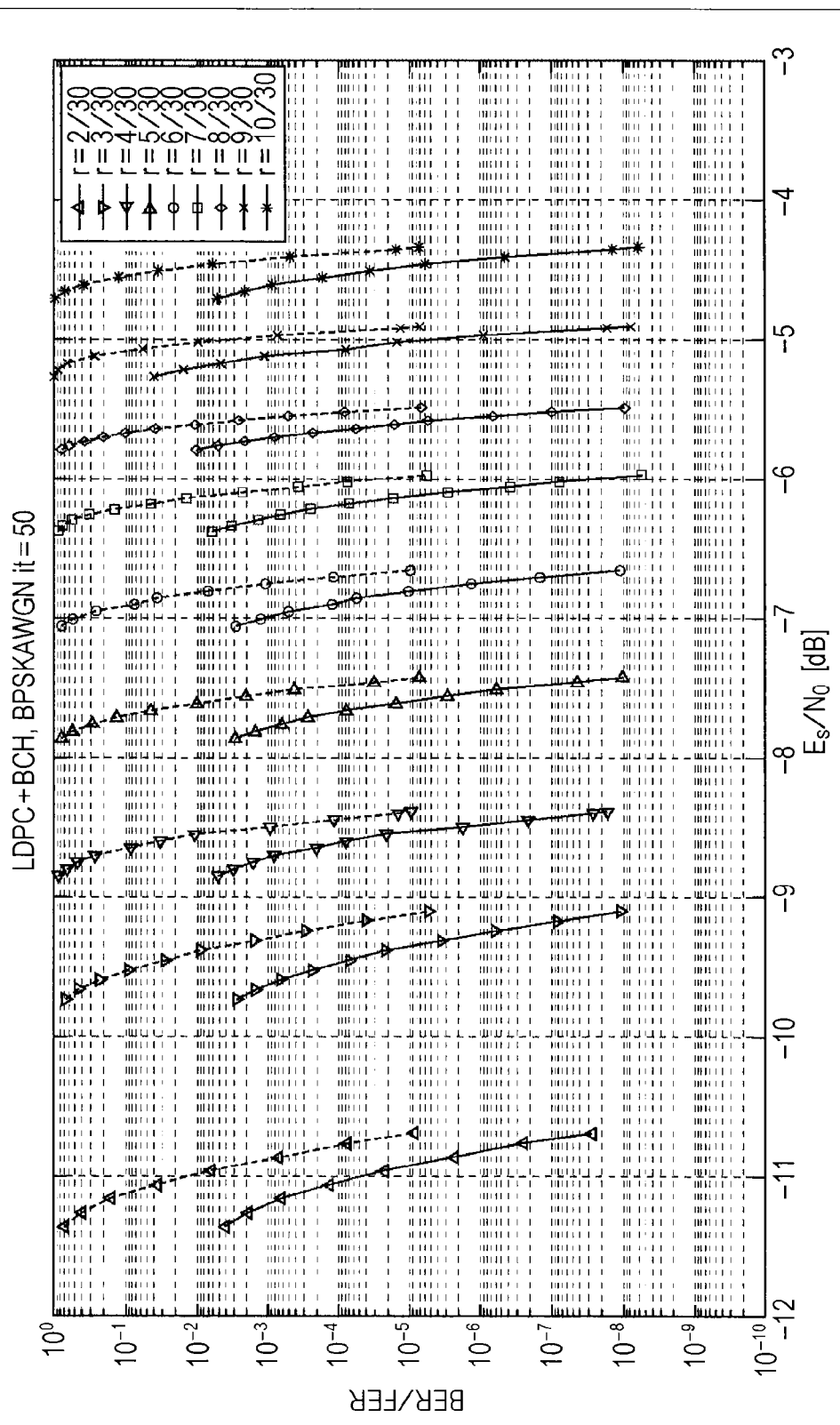
FIG. 112 is a diagram illustrating simulated BERs/FERs of LDPC codes with the code length 64800.
Figure 113:
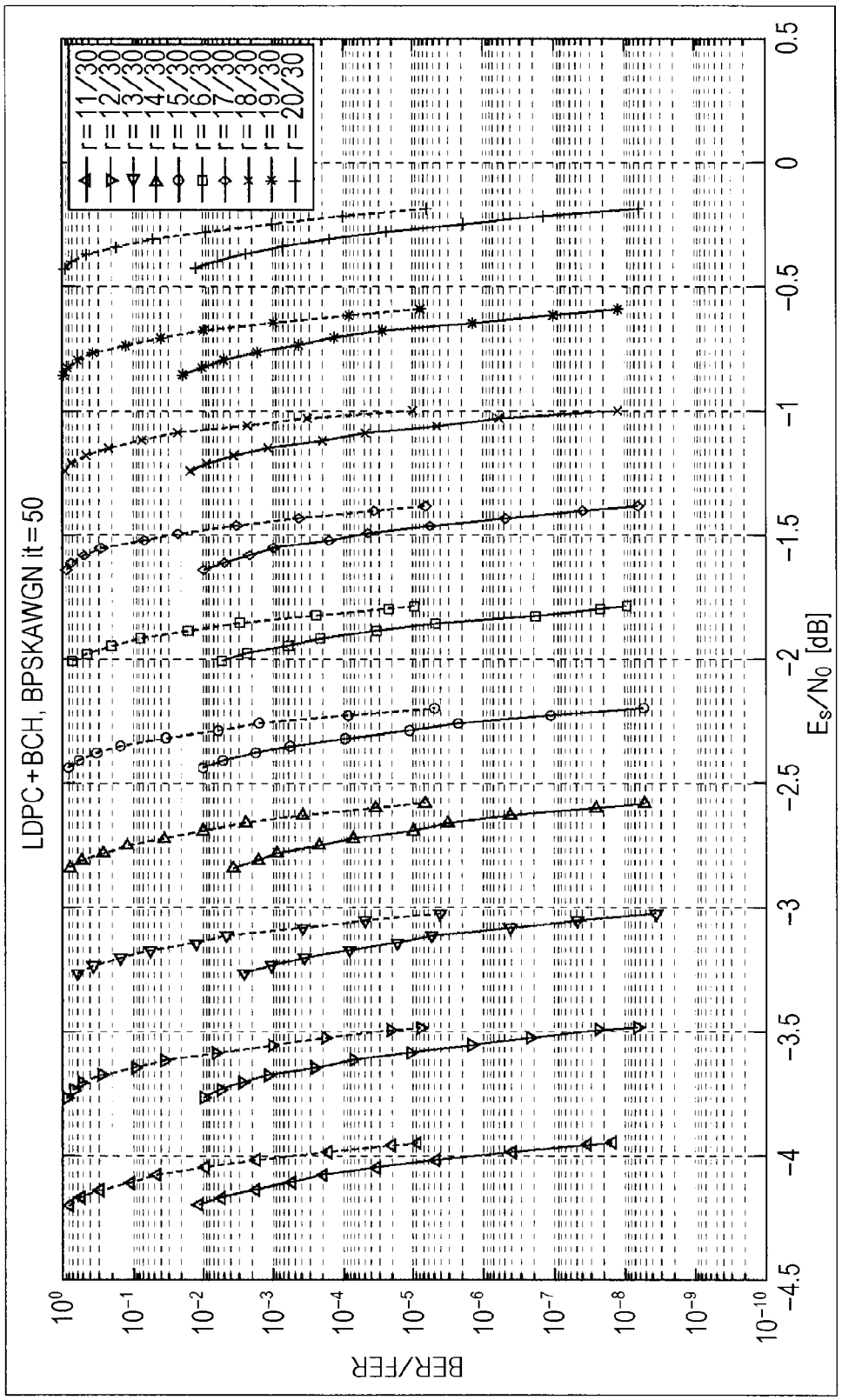
FIG. 113 is a diagram illustrating simulated BERs/FERs of LDPC codes with the code length 64800.
Figure 114:
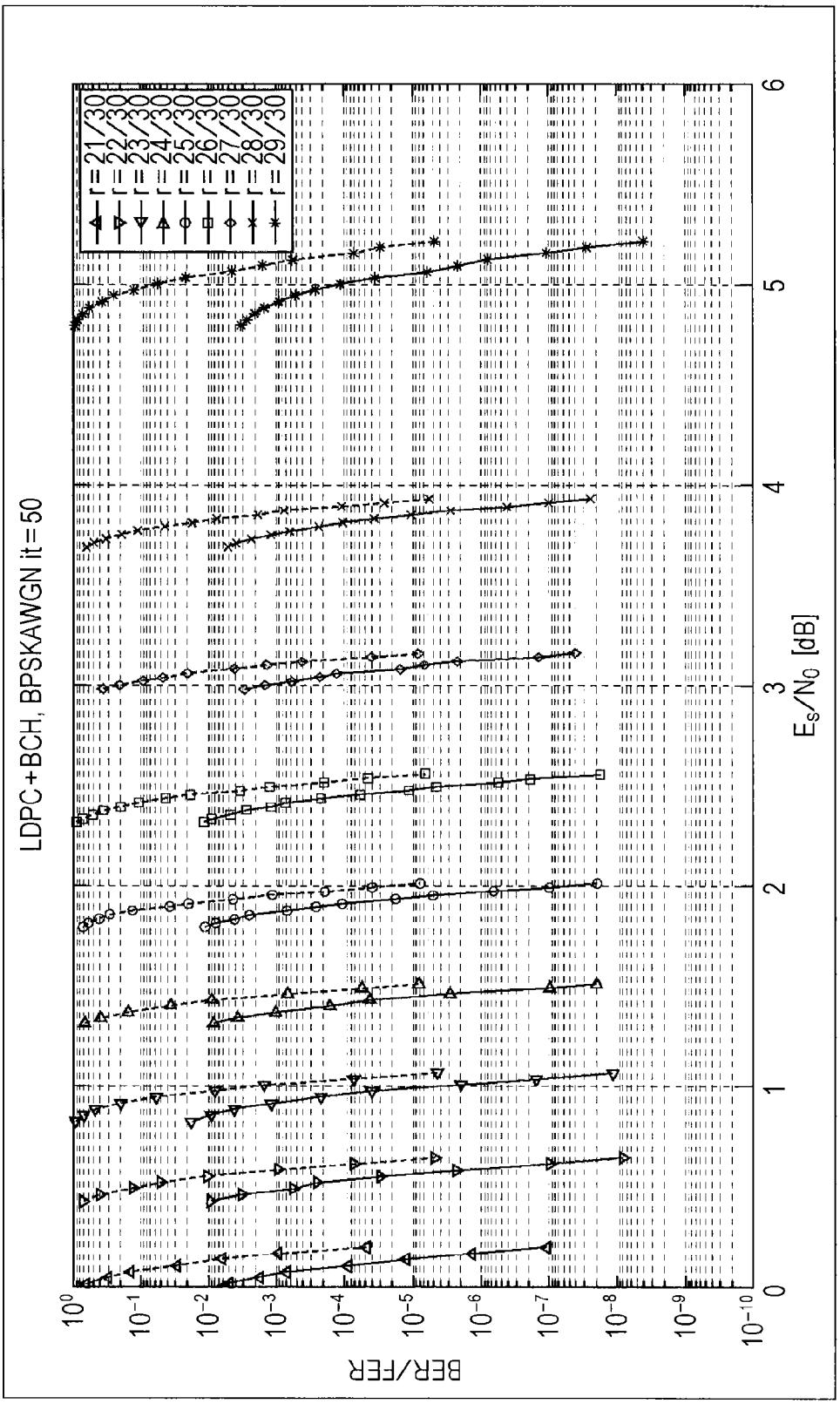
FIG. 114 is a diagram illustrating simulated BERs/FERs of LDPC codes with the code length 64800.

FIGS. 112, 113, and 114 are diagrams illustrating simulated BERs/FERs for the new LDPC codes illustrated in FIGS. 40 to 106.

The simulations were based on the assumption of an AWGN communication path (or channel), in which BPSK was employed as a modulation scheme and the number of times of repetitive decoding C(it) was 50.

In FIGS. 112, 113, and 114, the horizontal axis represents $E_s/N_0$, and the vertical axis represents BER/FER. Note that solid lines indicate BERs and dotted lines indicate FERs.

In FIGS. 112 to 114, FER (BER) curves for the respective new LDPC codes with 28 code rates of 2/30 to 29/30 exhibit FERs less than or equal to $10^{-5}$ for an $E_s/N_0$ range of (approximately) 15 dB from (substantially) −10 dB to 5 dB.

In the simulations, 28 ModCods having an FER less than or equal to $10^{-5}$ for an $E_s/N_0$ range of 15 dB from −10 dB to 5 dB can be set. Accordingly, 20 or more ModCods having an FER less than or equal to $10^{-5}$ for a range of 7 dB from 5 dB to 12 dB can be sufficiently predicted to be set by taking into account various modulation schemes other than BPSK used in the simulations, such as QPSK, 8PSK, 16APSK, 32APSK, 16QAM, 32QAM, and 64QAM.

Thus, it is possible to provide an LDPC code having good error-rate performance, meeting the first request in the CfT.

In addition, referring to FIGS. 112 to 114, most of FER (BER) curves for new LDPC codes are drawn at almost equal intervals less than 1 dB for each of low-, intermediate-, and high-code-rate groups. Accordingly, the new LDPC codes may provide broadcasters that broadcast programs using the transmitting device 11 with an advantage in facilitating selection of code rates to be used for broadcasting in accordance with the state of channels (i.e., the communication path 13).

Note that, in the simulations for determining the BER/FER curves illustrated in FIGS. 112 to 114, BCH encoding was performed on information, and the resulting BCH codes underwent LDPC encoding.

FIG. 115 includes diagrams depicting BCH encoding which was used in the simulations.

More specifically, part A of FIG. 115 is a diagram illustrating parameters of BCH encoding that is performed prior to the LDPC encoding into an LDPC code of 64 k, which is defined in the DVB-S.2 standard.

In DVB-S.2, 192, 160, or 128 redundancy bits are added in accordance with the code rate of an LDPC code, thereby providing BCH encoding capable of 12-, 10-, or 8-bit error correction.

Part B of FIG. 115 is a diagram illustrating parameters of BCH encoding which were used in the simulations.

In the simulations, similarly to the case of DVB-S.2, BCH encoding capable of 12-, 10-, or 8-bit error correction was performed by addition of 192, 160, or 128 redundancy bits in accordance with the code rate of an LDPC code.

[Example Configuration of Receiving Device 12]

Figure 116:
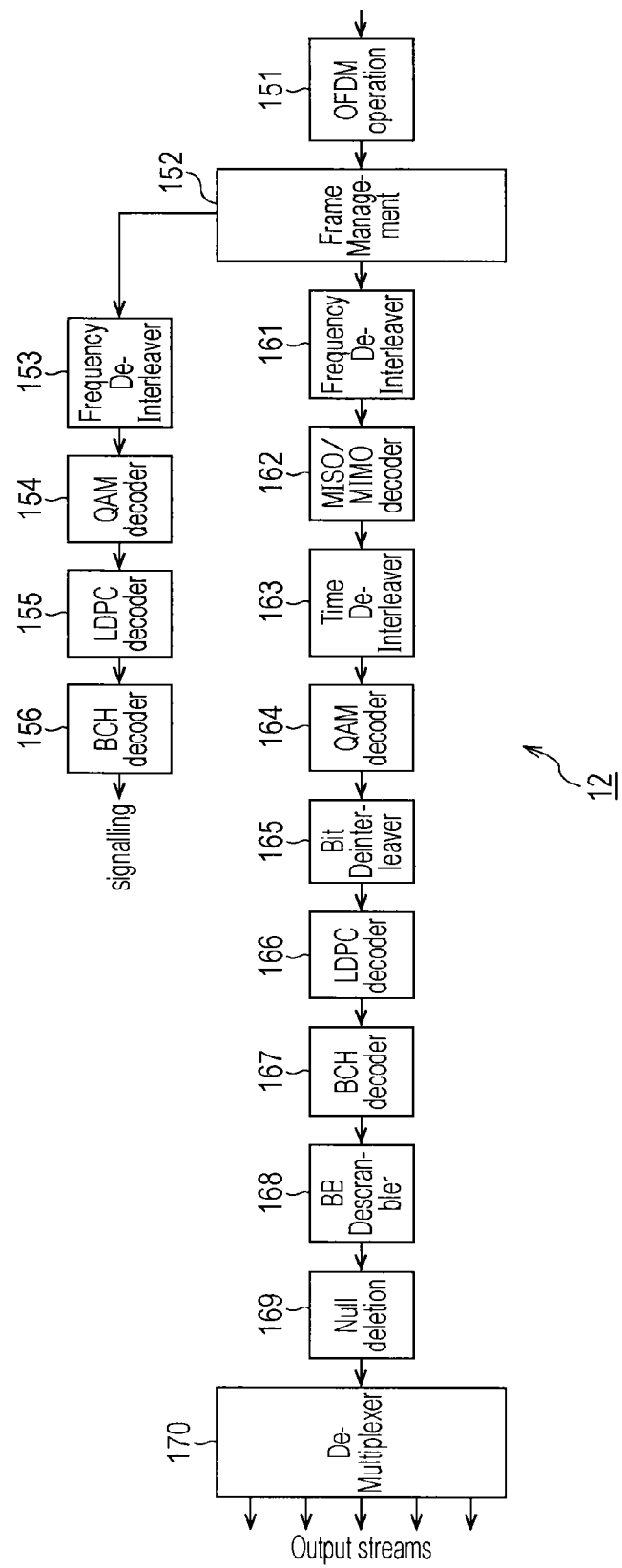
FIG. 116 is a block diagram illustrating an example configuration of a receiving device 12.

FIG. 116 is a block diagram illustrating an example configuration of the receiving device 12 illustrated in FIG. 7.

An OFDM processing unit (OFDM operation) 151 receives an OFDM signal from the transmitting device 11 (FIG. 7), and performs signal processing on the OFDM signal. The data (i.e., symbols) obtained through signal processing performed by the OFDM processing unit 151 is supplied to a frame management unit (Frame Management) 152.

The frame management 152 performs processing (frame interpretation) of a frame including the symbols supplied from the OFDM processing unit 151 to obtain symbols of target data and symbols of control data, and supplies the symbols of the target data and the symbols of the control data to frequency deinterleavers 161 and 153, respectively.

The frequency deinterleaver 153 performs frequency deinterleaving on the symbols supplied from the frame management 152 in units of symbols, and supplies the resulting symbols to a QAM decoder 154.

The QAM decoder 154 demaps the symbols (i.e., symbols mapped to constellation points) supplied from the frequency deinterleaver 153 (i.e., decodes the constellation points) for orthogonal demodulation, and supplies the resulting data (i.e., symbols) to an LDPC decoder 155.

The LDPC decoder 155 performs LDPC decoding on the LDPC code supplied from the QAM decoder 154, and supplies the resulting LDPC target data (in the illustrated example, a BCH code) to a BCH decoder 156.

The BCH decoder 156 performs BCH decoding on the LDPC target data supplied from the LDPC decoder 155, and outputs the resulting control data (signalling).

On the other hand, the frequency deinterleaver 161 performs frequency deinterleaving on the symbols supplied from the frame management 152 in units of symbols, and supplies the resulting symbols to an MISO/MIMO decoder 162.

The MISO/MIMO decoder 162 performs space-time decoding on the data (i.e., symbols) supplied from the frequency deinterleaver 161, and supplies the resulting data to a time deinterleaver 163.

The time deinterleaver 163 performs time deinterleaving on the data (i.e., symbols) supplied from the MISO/MIMO decoder 162 in units of symbols, and supplies the resulting data to a QAM decoder 164.

The QAM decoder 164 demaps the symbols (i.e., symbols mapped to constellation points) supplied from the time deinterleaver 163 (i.e., decodes the constellation points) for orthogonal demodulation, and supplies the resulting data (i.e., symbols) to a bit deinterleaver 165.

The bit deinterleaver 165 performs bit deinterleaving on the data (i.e., symbols) supplied from the QAM decoder 164, and supplies the resulting LDPC code to an LDPC decoder 166.

The LDPC decoder 166 performs LDPC decoding on the LDPC code supplied from the bit deinterleaver 165, and supplies the resulting LDPC target data (in the illustrated example, a BCH code) to a BCH decoder 167.

The BCH decoder 167 performs BCH decoding on the LDPC target data supplied from the LDPC decoder 155, and supplies the resulting data to a BB descrambler 168.

The BB descrambler 168 performs BB descrambling on the data supplied from the BCH decoder 167, and supplies the resulting data to a null deletion unit (Null Deletion) 169.

The null deletion unit 169 deletes the null added by the padder 112 illustrated in FIG. 8, from the data supplied from the BB descrambler 168, and supplies the resulting data to a demultiplexer 170.

The demultiplexer 170 separates one or more streams (target data) multiplexed in the data supplied from the null deletion unit 169, performs necessary processing, and outputs the resulting data as output streams.

Note that the receiving device 12 may be configured without including some of the blocks illustrated in FIG. 116. More specifically, for example, if the transmitting device 11 (FIG. 8) is configured without including the time interleaver 118, the MISO/MIMO encoder 119, the frequency interleaver 120, and the frequency interleaver 124, the receiving device 12 may be configured without including the time deinterleaver 163, the MISO/MIMO decoder 162, the frequency deinterleaver 161, and the frequency deinterleaver 153, which are the blocks corresponding to the time interleaver 118, the MISO/MIMO encoder 119, the frequency interleaver 120, and the frequency interleaver 124 of the transmitting device 11, respectively.

Figure 117:
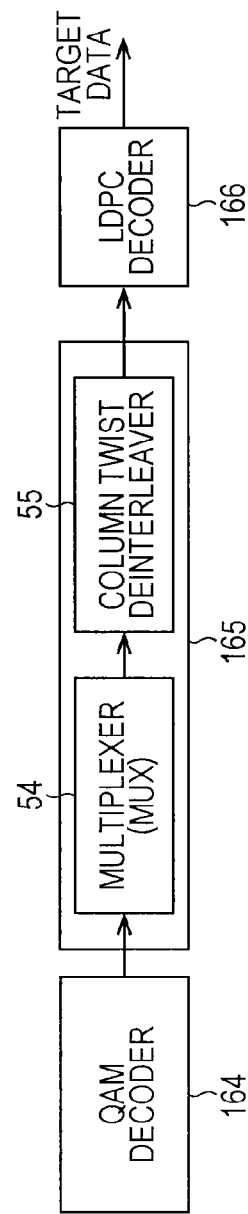
FIG. 117 is a block diagram illustrating an example configuration of a bit deinterleaver 165.

FIG. 117 is a block diagram illustrating an example configuration of the bit deinterleaver 165 illustrated in FIG. 116.

The bit deinterleaver 165 includes a multiplexer (MUX) 54 and a column twist deinterleaver 55, and performs (bit) deinterleaving on the symbol bits of the symbols supplied from the QAM decoder 164 (FIG. 116).

More specifically, the multiplexer 54 performs inverse permutation processing (which is the inverse of permutation processing), corresponding to the permutation processing performed by the demultiplexer 25 illustrated in FIG. 9, on the symbol bits of the symbols supplied from the QAM decoder 164. That is, the multiplexer 54 performs inverse permutation processing to restore the positions of the code bits (i.e., symbol bits) of the LDPC code permuted through the permutation processing to the original positions, and supplies the resulting LDPC code to the column twist deinterleaver 55.

The column twist deinterleaver 55 performs column twist deinterleaving (which is the inverse of column twist interleaving), corresponding to column twist interleaving as the reordering processing performed by the column twist interleaver 24 illustrated in FIG. 9, on the LDPC code supplied from the multiplexer 54. That is, the column twist deinterleaver 55 performs inverse reordering processing, for example, column twist deinterleaving, to restore the code bits of the LDPC code whose order has been changed through column twist interleaving as reordering processing to the original order.

Specifically, the column twist deinterleaver 55 performs column twist deinterleaving by writing and reading the code bits of the LDPC code to and from a memory for deinterleaving which has a configuration similar to that of the memory 31 illustrated in, typically, FIG. 28.

However, the column twist deinterleaver 55 writes code bits to the memory for deinterleaving in its row direction by using, as a write address, the read address at which a code bit has been read from the memory 31. In addition, the column twist deinterleaver 55 reads code bits from the memory for deinterleaving in its column direction by using, as a read address, the write address at which a code bit has been written to the memory 31.

The LDPC code obtained as a result of column twist deinterleaving is supplied from the column twist deinterleaver 55 to the LDPC decoder 166.

Here, if the LDPC code supplied from the QAM decoder 164 to the bit deinterleaver 165 has been subjected to parity interleaving, column twist interleaving, and permutation processing, the bit deinterleaver 165 may perform all of the inverse operations, namely, parity deinterleaving corresponding to parity interleaving (which is the inverse of parity interleaving operation, i.e., parity deinterleaving for restoring the code bits of the LDPC code whose order has been changed through parity interleaving to the original order), inverse permutation processing corresponding to permutation processing, and column twist deinterleaving corresponding to column twist interleaving.

In the bit deinterleaver 165 illustrated in FIG. 117, however, parity deinterleaving is not performed because the bit deinterleaver 165 does not include a block configured to perform parity deinterleaving corresponding to parity interleaving although it includes the multiplexer 54 that performs inverse permutation processing corresponding to permutation processing and the column twist deinterleaver 55 that performs column twist deinterleaving corresponding to column twist interleaving.

Accordingly, the LDPC code on which inverse permutation processing and column twist deinterleaving have been performed but parity deinterleaving has not been performed is supplied from (the column twist deinterleaver 55 of) the bit deinterleaver 165 to the LDPC decoder 166.

The LDPC decoder 166 performs LDPC decoding on the LDPC code supplied from the bit deinterleaver 165 by using a transformed parity check matrix obtained by performing at least column permutation corresponding to parity interleaving on the parity check matrix H that the LDPC encoder 115 illustrated in FIG. 8 has used for LDPC encoding, and outputs the resulting data as a result of decoding the LDPC target data.

Figure 118:
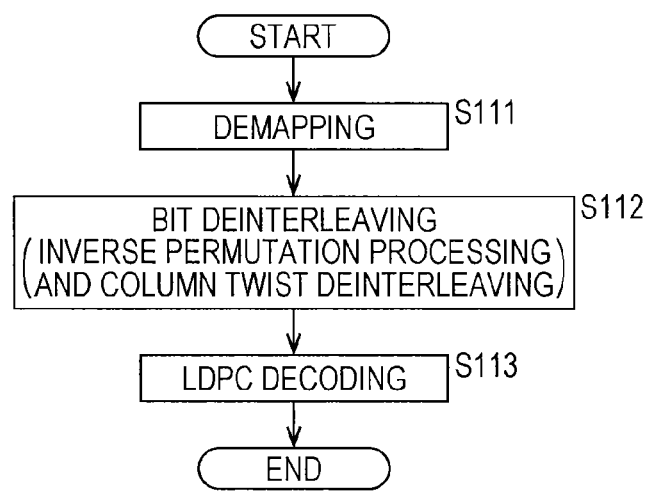
FIG. 118 is a flowchart depicting a process performed by a QAM decoder 164, the bit deinterleaver 165, and an LDPC decoder 166.

FIG. 118 is a flowchart depicting a process performed by the QAM decoder 164, the bit deinterleaver 165, and the LDPC decoder 166 illustrated in FIG. 117.

In step S111, the QAM decoder 164 demaps the symbols (i.e., symbols mapped to constellation points) supplied from the time deinterleaver 163 for orthogonal demodulation, and supplies the resulting data to the bit deinterleaver 165. Then, the process proceeds to step S112.

In step S112, the bit deinterleaver 165 performs deinterleaving (i.e., bit deinterleaving) on the symbol bits of the symbols supplied from the QAM decoder 164. Then, the process proceeds to step S113.

More specifically, in step S112, the multiplexer 54 in the bit deinterleaver 165 performs inverse permutation processing on the symbol bits of the symbols supplied from the QAM decoder 164, and supplies the code bits of the resulting LDPC code to the column twist deinterleaver 55.

The column twist deinterleaver 55 performs column twist deinterleaving on the LDPC code supplied from the multiplexer 54, and supplies the resulting LDPC code to the LDPC decoder 166.

In step S113, the LDPC decoder 166 performs LDPC decoding on the LDPC code supplied from the column twist deinterleaver 55 by using the parity check matrix H that the LDPC encoder 115 illustrated in FIG. 8 has used for LDPC encoding, that is, by using a transformed parity check matrix obtained by performing at least column permutation corresponding to parity interleaving on the parity check matrix H, and outputs the resulting data to the BCH decoder 167 as a result of decoding the LDPC target data.

Note that, also in FIG. 117, similarly to the case illustrated in FIG. 9, the multiplexer 54 that performs inverse permutation processing and the column twist deinterleaver 55 that performs column twist deinterleaving are configured as separate units, for convenience of illustration. However, the multiplexer 54 and the column twist deinterleaver 55 may be integrated into a single unit.

In addition, if the bit interleaver 116 illustrated in FIG. 9 does not perform column twist interleaving, the bit deinterleaver 165 illustrated in FIG. 117 need not be provided with the column twist deinterleaver 55.

Next, LDPC decoding performed by the LDPC decoder 166 illustrated in FIG. 116 will be described in further detail.

As described above, the LDPC decoder 166 illustrated in FIG. 116 performs LDPC decoding on the LDPC code supplied from the column twist deinterleaver 55, on which inverse permutation processing and column twist deinterleaving have been performed but parity deinterleaving has not been performed, by using a transformed parity check matrix obtained by performing at least column permutation corresponding to parity interleaving on the parity check matrix H that the LDPC encoder 115 illustrated in FIG. 8 has used for LDPC encoding.

Here, LDPC decoding may be performed using a transformed parity check matrix so as to keep the operating frequency within a sufficiently feasible range while reducing the size of circuitry. Such LDPC decoding has been previously proposed (see, for example, Japanese Patent No. 4224777).

Accordingly, first, LDPC decoding using a transformed parity check matrix, which has been previously proposed, will be described with reference to FIGS. 119 to 122.

Figure 119:
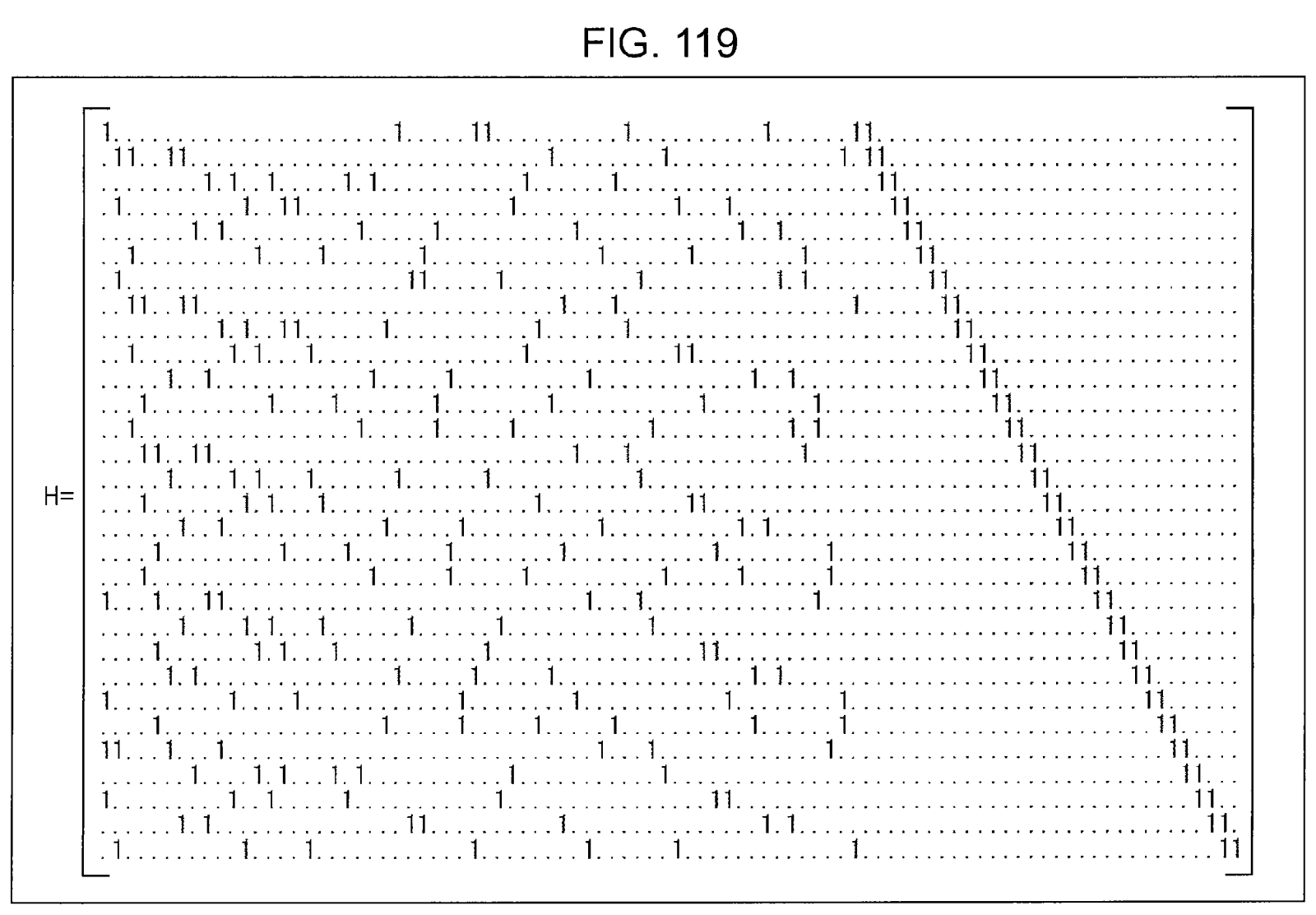

FIG. 119 illustrates an example of a parity check matrix H of an LDPC code having a code length N of 90 and a code rate of 2/3.

Note that, in FIG. 119 (also in FIGS. 120 and 121, described below), "0" is represented by a period (".").

In the parity check matrix H illustrated in FIG. 119, a parity matrix has a stepwise structure.

Figure 120:
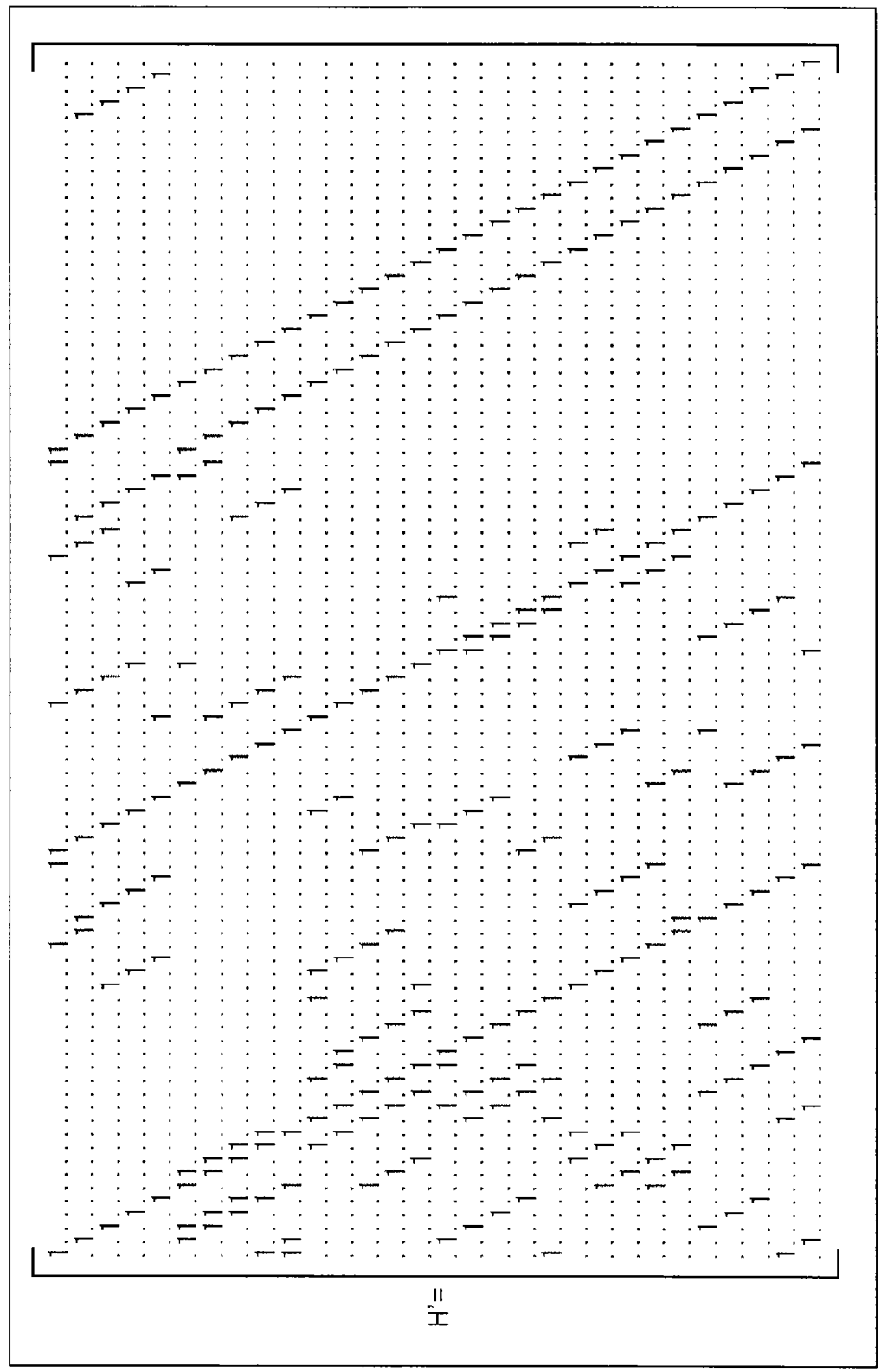
FIG. 120 is a diagram illustrating a matrix (transformed parity check matrix) obtained by performing row permutation and column permutation on a parity check matrix.

FIG. 120 illustrates a parity check matrix H' obtained by performing row permutation of Expression (11) and column permutation of Expression (12) on the parity check matrix H illustrated in FIG. 119.

Row permutation: $(6s+t+1)$-th row→$(5t+s+1)$-th row (11)

Column permutation: $(6x+y+61)$-th column→$(5y+x+61)$-th column (12)

Note that, in Expressions (11) and (12), s, t, x, and y are integers in the ranges of $0 \leq s < 5$, $0 \leq t < 6$, $0 \leq x < 5$, and $0 \leq t < 6$, respectively.

The row permutation of Expression (11) allows permutation such that the 1st, 7th, 13th, 19th, and 25th rows, whose numbers are divided by 6 yielding a remainder of 1, are replaced with the 1st, 2nd, 3rd, 4th, and 5th rows, respectively, and the 2nd, 8th, 14th, 20th, and 26th rows, whose numbers are divided by 6 yielding a remainder of 2, are replaced with the 6th, 7th, 8th, 9th, and 10th rows, respectively.

Further, the column permutation of Expression (12) allows permutation such that the 61st, 67th, 73rd, 79th, and 85th columns, whose numbers are divided by 6 yielding a remainder of 1, among the columns subsequent to the 61st column (parity matrix), are replaced with the 61st, 62nd, 63rd, 64th, and 65th columns, respectively, and the 62nd, 68th, 74th, 80th, and 86th columns, whose numbers are divided by 6 yielding a remainder of 2, are replaced with the 66th, 67th, 68th, 69th, and 70th columns, respectively.

A matrix obtained by performing row and column permutations on the parity check matrix H illustrated in FIG. 119 in the way described above is the parity check matrix H' illustrated in FIG. 120.

Here, the row permutation of the parity check matrix H would not affect the order of the code bits of the LDPC code.

Furthermore, the column permutation of Expression (12) corresponds to parity interleaving that is performed to interleave the $(K+qx+y+1)$-th code bit to the $(K+Py+x+1)$-th code bit position as described above, when the information length K is 60, the number of unit columns P of the cyclic structure is 5, and the divisor q (=M/P) of the parity length M (in the illustrated example, 30) is 6.

Accordingly, the parity check matrix H' illustrated in FIG. 120 is a transformed parity check matrix obtained by performing at least column permutation to replace the $(K+qx+y+1)$-th column of the parity check matrix (hereinafter referred to as an "original parity check matrix" as appropriate) H illustrated in FIG. 119 with the $(K+Py+x+1)$-th column.

Multiplying the transformed parity check matrix H' illustrated in FIG. 120 by an LDPC code obtained by performing the same permutation as that of Expression (12) on the LDPC code of the original parity check matrix H illustrated in FIG. 119 yields a zero vector. More specifically, if a row vector obtained by performing column permutation of Expression (12) on a row vector c as an LDPC code (i.e., a code word) of the original parity check matrix H is represented by c', $Hc^T$ is a zero vector due to the nature of the parity check matrix, and therefore $H'c'^T$ is also a zero vector.

Thus, the transformed parity check matrix H' illustrated in FIG. 120 is a parity check matrix of an LDPC code c' obtained by performing column permutation of Expression (12) on the LDPC code c of the original parity check matrix H.

Accordingly, a similar result of decoding to that obtained by decoding the LDPC code of the original parity check matrix H using the parity check matrix H may be obtained by decoding (LDPC decoding) the LDPC code c', which is obtained by performing column permutation of Expression (12) on the LDPC code c of the original parity check matrix H, using the transformed parity check matrix H' illustrated in FIG. 120 and then performing the inverse of the column permutation of Expression (12) on the decoded LDPC code c'.

Figure 121:
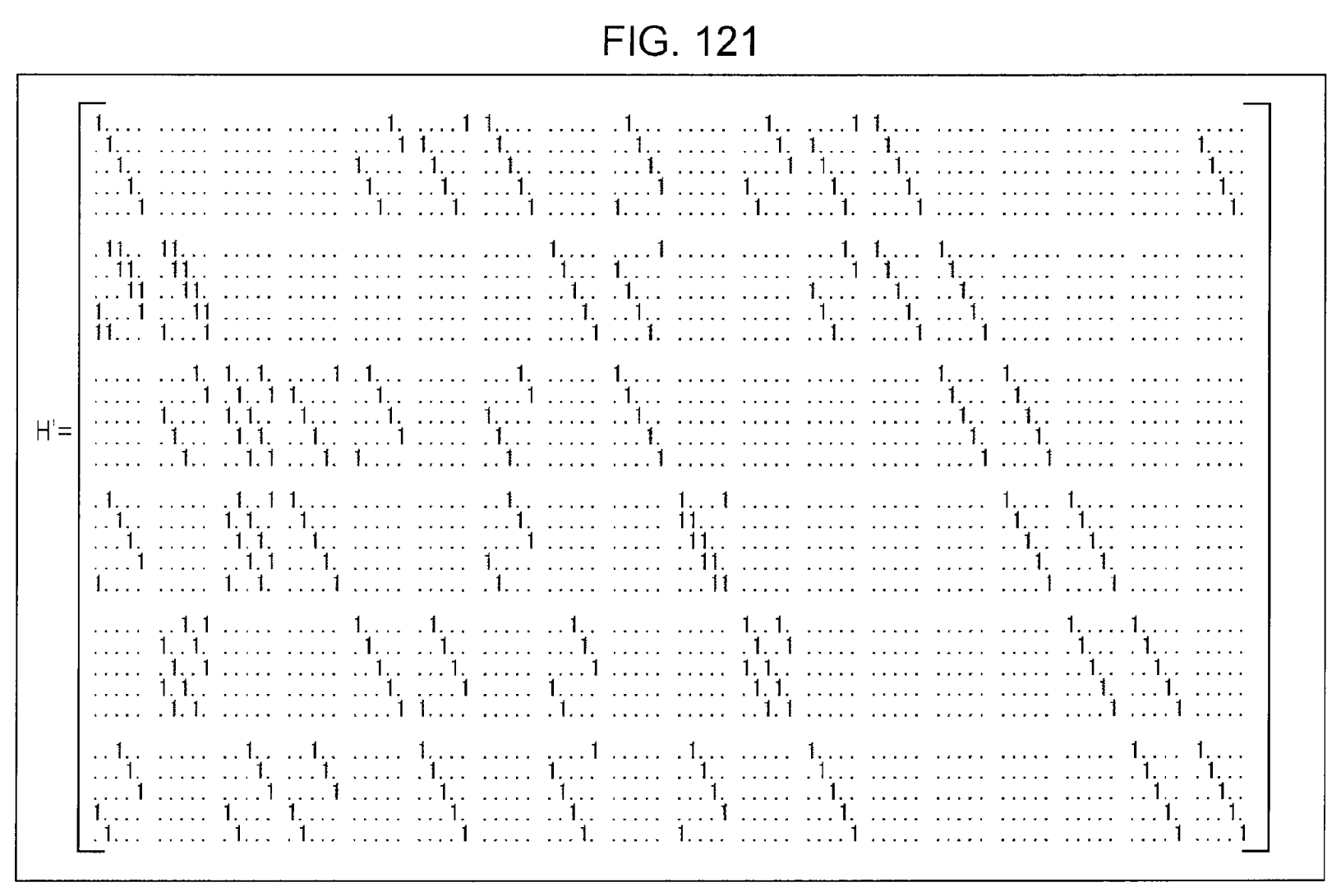

FIG. 121 illustrates the transformed parity check matrix H' illustrated in FIG. 120 whose elements are spaced apart from one another in units of 5×5 matrices.

In FIG. 121, the transformed parity check matrix H' is represented by a combination of 5×5 (=P×P) unit matrices, matrices each having one or more elements of 1 in a unit matrix which are replaced by elements of 0 (hereinafter referred to as "quasi-unit matrices" as appropriate), matrices produced by cyclically shifting a unit matrix or a quasi-unit matrix (hereinafter referred to as "shift matrices" as appropriate), matrices each of which is the sum of two or more of a unit matrix, a quasi-unit matrix, and a shift matrix (hereinafter referred to as "sum matrices" as appropriate), and 5×5 zero matrices.

The transformed parity check matrix H' illustrated in FIG. 121 can be said to be composed of 5×5 unit matrices, quasi-unit matrices, shift matrices, sum matrices, and zero matrices. These 5×5 matrices (unit matrices, quasi-unit matrices, shift matrices, sum matrices, and zero matrices) constituting the transformed parity check matrix H' are hereinafter referred to as "component matrices" as appropriate.

An LDPC code of a parity check matrix represented by P×P component matrices may be decoded using an architecture that simultaneously performs check node computation and variable node computation each for P nodes.

Figure 122:
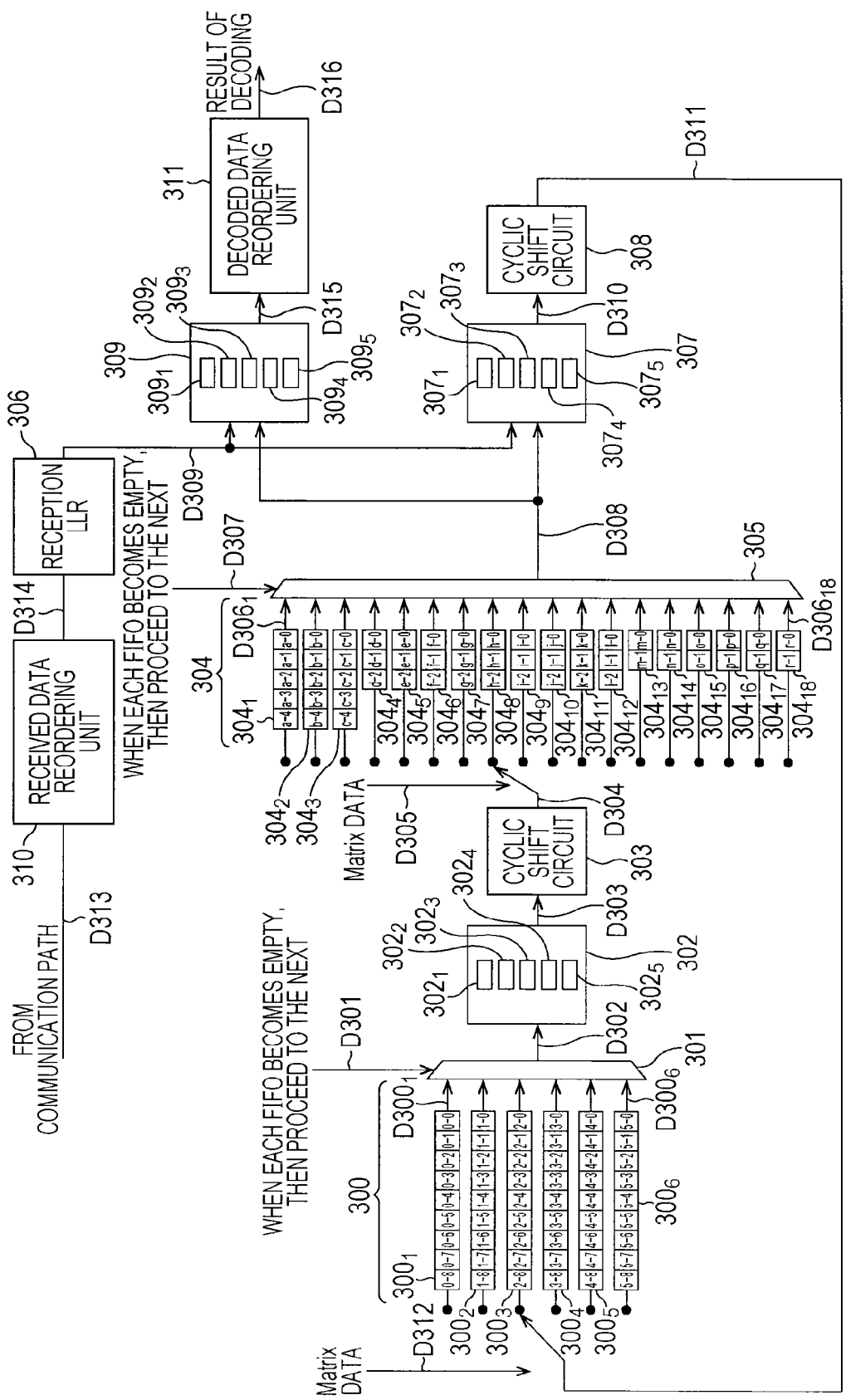

FIG. 122 is a block diagram illustrating an example configuration of a decoding device that performs the decoding operation described above.

More specifically, FIG. 122 illustrates an example configuration of a decoding device configured to decode an LDPC code by using the transformed parity check matrix H' illustrated in FIG. 121, which is obtained by performing at least column permutation of Expression (12) on the original parity check matrix H illustrated in FIG. 119.

The decoding device illustrated in FIG. 122 includes an edge data storage memory 300 having six FIFOs $300_1$ to $300_6$, a selector 301 for selecting one of the FIFOs $300_1$ to $300_6$, a check node calculation unit 302, two cyclic shift circuits 303 and 308, an edge data storage memory 304 having 18 FIFOs $304_1$ to $304_{18}$, a selector 305 for selecting one of the FIFOs $304_1$ to $304_{18}$, a received data memory 306 for storing received data, a variable node calculation unit 307, a decoded word calculation unit 309, a received data reordering unit 310, and a decoded data reordering unit 311.

First, a description will be made of a method for storing data in the edge data storage memories 300 and 304.

The edge data storage memory 300 includes the six FIFOs $300_1$ to $300_6$, the number of which is equal to a value obtained by dividing the number of rows of the transformed parity check matrix H' illustrated in FIG. 121, i.e., 30, by the number of rows of each component matrix (i.e., the number of unit columns P of the cyclic structure), i.e., 5. Each of the FIFOs $300_y$ (y=1, 2, . . . , 6) includes storage areas of multiple stages, and is configured such that messages corresponding to five edges, the number of which is equal to the number of rows and the number of columns of each component matrix (i.e., the number of unit columns P of the cyclic structure), can be simultaneously read from and written to the storage area of each stage. In addition, the number of stages of the storage areas of each of the FIFOs $300_y$ is 9, which is the maximum of the numbers of 1s (Hamming weights) in the row direction of the transformed parity check matrix illustrated in FIG. 121.

Data (i.e., messages $v_i$ from variable nodes) corresponding to the positions of is in the first to fifth rows of the transformed parity check matrix H' illustrated in FIG. 121 is stored in the FIFO $300_1$ in such a manner that every row is filled with the data elements in the lateral direction (i.e., 0s are ignored). More specifically, if the element in the j-th row and the i-th column is represented by (j,i), data corresponding to the positions of 1s in the 5×5 unit matrix of (1,1) to (5,5) of the transformed parity check matrix H' is stored in the storage area of the first stage of the FIFO $300_1$. Data corresponding to the positions of 1s in the shift matrix (which is a shift matrix obtained by cyclically shifting the 5×5 unit matrix to the right by three elements) of (1,21) to (5,25) of the transformed parity check matrix H' is stored in the storage area of the second stage. Similarly, data is stored in the storage areas of the third to eighth stages in association with the transformed parity check matrix H'. Furthermore, data corresponding to the positions of 1s in the shift matrix (which is a shift matrix obtained by replacing 1s in the first row with 0s in the 5×5 unit matrix and cyclically shifting the 5×5 unit matrix to the left by one element) of (1,86) to (5,90) of the transformed parity check matrix H' is stored in the storage area of the ninth stage.

Data corresponding to the positions of 1s in the sixth to tenth rows of the transformed parity check matrix H' illustrated in FIG. 121 is stored in the FIFO $300_2$. More specifically, data corresponding to the positions of 1s in a first shift matrix included in a sum matrix (which is a sum matrix representing the sum of a first shift matrix obtained by cyclically shifting the 5×5 unit matrix to the right by one element and a second shift matrix obtained by cyclically shifting the 5×5 unit matrix to the right by two elements) of (6,1) to (10,5) of the transformed parity check matrix H' is stored in the storage area of the first stage of the FIFO $300_2$. Furthermore, data corresponding to the positions of is in the second shift matrix included in the sum matrix of (6,1) to (10,5) of the transformed parity check matrix H' is stored in the storage area of the second stage.

More specifically, in the case of a component matrix having a weight of 2 or more, when the component matrix is represented by the sum of two or more of a P×P unit matrix having a weight of 1, a quasi-unit matrix produced by replacing one or more elements of 1 in the unit matrix with elements of 0, and a shift matrix produced by cyclically shifting the unit matrix or the quasi-unit matrix, data corresponding to the positions of 1s in the unit matrix having a weight of 1, the quasi-unit matrix, or the shift matrix (i.e., messages corresponding to edges belonging to the unit matrix, the quasi-unit matrix, or the shift matrix) is stored in the same address (i.e., the same FIFO among the FIFOs $300_1$ to $300_6$).

Data is also stored in the storage areas of the subsequent third to ninth stages in association with the transformed parity check matrix H'.

Similarly, data is stored in the FIFOs $300_3$ to $300_6$ in association with the transformed parity check matrix H'.

The edge data storage memory 304 includes 18 FIFOs $304_1$ to $304_{18}$, the number of which is equal to a value obtained by dividing the number of columns of the transformed parity check matrix H', i.e., 90, by the number of columns of each component matrix (i.e., the number of unit columns P of the cyclic structure), i.e., 5. Each of the FIFOs $304_x$ (x=1, 2, . . . , 18) includes storage areas of multiple stages, and is configured such that messages corresponding to five edges, the number of which is equal to the number of rows and the number of columns of each component matrix (i.e., the number of unit columns P of the cyclic structure), can be simultaneously read from and written to the storage area of each stage.

Data (i.e., messages $u_j$ from check nodes) corresponding to the positions of 1s in the first to fifth columns of the transformed parity check matrix H' illustrated in FIG. 121 is stored in the FIFO $304_1$ in such a manner that every column is filled with the data elements in the longitudinal direction (i.e., 0s are ignored). Specifically, data corresponding to the positions of 1s in the 5×5 unit matrix of (1,1) to (5,5) of the transformed parity check matrix H' is stored in the storage area of the first stage of the FIFO $304_1$. Data corresponding to the positions of is in a first shift matrix included in a sum matrix (which is a sum matrix representing the sum of a first shift matrix obtained by cyclically shifting the 5×5 unit matrix to the right by one element and a second shift matrix obtained by cyclically shifting the 5×5 unit matrix to the right by two elements) of (6,1) to (10,5) of the transformed parity check matrix H' is stored in the storage area of the second stage. Furthermore, data corresponding to the positions of is in the second shift matrix included in the sum matrix of (6,1) to (10,5) of the transformed parity check matrix H' is stored in the storage area of the third stage.

More specifically, in the case of a component matrix having a weight of 2 or more, when the component matrix is represented by the sum of two or more of a P×P unit matrix having a weight of 1, a quasi-unit matrix produced by replacing one or more elements of 1 in the unit matrix with elements of 0, and a shift matrix produced by cyclically shifting the unit matrix or the quasi-unit matrix, data corresponding to the positions of is in the unit matrix having a weight of 1, the quasi-unit matrix, or the shift matrix (i.e., messages corresponding to edges belonging to the unit matrix, the quasi-unit matrix, or the shift matrix) is stored in the same address (i.e., the same FIFO among the FIFOs $304_1$ to $304_{18}$).

Data is also stored in the storage areas of the subsequent fourth and fifth stages in association with the transformed parity check matrix H'. The number of stages of storage areas of the FIFO $304_1$ is 5, which is the maximum of the numbers of is (Hamming weights) in the row direction in the first to fifth columns of the transformed parity check matrix H'.

Similarly, data is also stored in the FIFOs $304_2$ and $304_3$ in association with the transformed parity check matrix H', with the respective lengths (the numbers of stages) being 5. Data is also stored in the FIFOs $304_4$ to $304_{12}$ in association with the transformed parity check matrix H', with the respective lengths being 3. Data is also stored in the FIFOs $304_{13}$ to $304_{18}$ in association with the transformed parity check matrix H', with the respective lengths being 2.

A description will now be made of the operation of the decoding device illustrated in FIG. 122.

The edge data storage memory 300, which includes the six FIFOs $300_1$ to $300_6$, selects a FIFO to store data from among the FIFOs $300_1$ to $300_6$ in accordance with information (matrix data) D312 indicating which row in the transformed parity check matrix H' illustrated in FIG. 121 five messages D311 supplied from the cyclic shift circuit 308 located upstream of the edge data storage memory 300 belong to, and collectively stores the five messages D311 in the selected FIFO in order. Further, when reading data, the edge data storage memory 300 reads five messages $D300_1$ in order from the FIFO $300_1$, and supplies the read messages $D300_1$ to the selector 301 located downstream of the edge data storage memory 300. After the reading of messages from the FIFO $300_1$ is completed, the edge data storage memory 300 also reads messages in order from the FIFOs $300_2$ to $300_6$, and supplies the read messages to the selector 301.

The selector 301 selects five messages received from a FIFO from which data is currently being read among the FIFOs $300_1$ to $300_6$ in accordance with a selection signal D301, and supplies the selected messages as messages D302 to the check node calculation unit 302.

The check node calculation unit 302 includes five check node calculators $302_1$ to $302_5$, and performs check node computation in accordance with Expression (7) using the messages D302 ($D302_1$ to $D302_5$) (corresponding to messages $v_i$ in Expression (7)) supplied through the selector 301. The check node calculation unit 302 supplies five messages D303 ($D303_1$ to $D303_5$) (corresponding to messages $u_j$ in Expression (7)) obtained as a result of the check node computation to the cyclic shift circuit 303.

The cyclic shift circuit 303 cyclically shifts the five messages $D303_1$ to $D303_5$ determined by the check node calculation unit 302 on the basis of information (matrix data) D305 indicating the number of original unit matrices (or quasi-unit matrices) which have been cyclically shifted in the transformed parity check matrix H' to obtain the corresponding edge, and supplies results to the edge data storage memory 304 as messages D304.

The edge data storage memory 304, which includes the 18 FIFOs $304_1$ to $304_{18}$, selects an FIFO to store data from among the FIFOs $304_1$ to $304_{18}$ in accordance with information D305 indicating which row in the transformed parity check matrix H' the five messages D304 supplied from the cyclic shift circuit 303 located upstream of the edge data storage memory 304 belong to, and collectively stores the five messages D304 in the selected FIFO in order. Further, when reading data, the edge data storage memory 304 reads five messages $D306_1$ in order from the FIFO $304_1$, and supplies the read messages $D306_2$ to the selector 305 located downstream of the edge data storage memory 304. After the reading of data from the FIFO $304_1$ is completed, the edge data storage memory 304 also reads messages in order from the FIFOs $304_2$ to $304_{18}$, and supplies the read messages to the selector 305.

The selector 305 selects five messages from a FIFO from which data is currently being read among the FIFOs $304_1$ to $304_{18}$ in accordance with a selection signal D307, and supplies the selected messages as messages D308 to the variable node calculation unit 307 and the decoded word calculation unit 309.

On the other hand, the received data reordering unit 310 reorders an LDPC code D313 corresponding to the parity check matrix H illustrated in FIG. 119, which has been received through the communication path 13, by performing column permutation of Expression (12), and supplies the resulting data as received data D314 to the received data memory 306. The received data memory 306 calculates reception LLRs (log-likelihood ratios) from the received data D314 supplied from the received data reordering unit 310, and stores the reception LLRs. The received data reordering unit 310 further collectively supplies the reception LLRs in units of five reception LLRs as reception values D309 to the variable node calculation unit 307 and the decoded word calculation unit 309.

The variable node calculation unit 307 includes five variable node calculators $307_1$ to $307_5$, and performs variable node computation in accordance with Expression (1) using the messages D308 ($D308_1$ to $D308_5$) (i.e., messages $u_j$ in Expression (1)) supplied through the selector 305 and the five reception values D309 (reception values $u_{0i}$ in Expression (1)) supplied from the received data memory 306. The variable node calculation unit 307 supplies messages D310 ($D310_1$ to $D310_5$) (i.e., messages $v_i$ in Expression (1)) obtained as a result of the computation to the cyclic shift circuit 308.

The cyclic shift circuit 308 cyclically shifts the messages $D310_1$ to $D310_5$ calculated by the variable node calculation unit 307 on the basis of information indicating the number of original unit matrices (or quasi-unit matrices) which have been cyclically shifted in the transformed parity check matrix H' to obtain the corresponding edge, and supplies results to the edge data storage memory 300 as messages D311.

The series of operations described above can be performed once to perform single decoding of an LDPC code (variable node computation and check node computation). After decoding an LDPC code a certain number of times, the decoding device illustrated in FIG. 122 determines and outputs final decoded data through the decoded word calculation unit 309 and the decoded data reordering unit 311.

More specifically, the decoded word calculation unit 309 includes five decoded word calculators $309_1$ to $309_5$, and serves as a final stage of a plurality of decoding operations to calculate decoded data (i.e., a decoded word) in accordance with Expression (5) using the five messages D308 ($D308_1$ to $D308_5$) (i.e., messages $u_j$ in Expression (5)) output from the selector 305 and the five reception values D309 (i.e., reception values $u_{0i}$ in Expression (5)) supplied from the received data memory 306. The decoded word calculation unit 309 supplies decoded data D315 obtained as a result of the calculation to the decoded data reordering unit 311.

The decoded data reordering unit 311 changes the order of the decoded data D315 supplied from the decoded word calculation unit 309 by performing the inverse of the column permutation of Expression (12), and outputs the resulting data as final decoded data D316.

As described above, one or both of the row permutation and the column permutation are performed on the parity check matrix (i.e., the original parity check matrix) to convert the parity check matrix into a parity check matrix (i.e., a transformed parity check matrix) that can be represented by a combination of component matrices, namely, a P×P unit matrix, a quasi-unit matrix produced by replacing one or more elements of 1 with elements of 0, a shift matrix produced by cyclically shifting the unit matrix or the quasi-unit matrix, a sum matrix representing the sum of two or more of the unit matrix, the quasi-unit matrix, and the shift matrix, and a P×P zero matrix. This allows decoding of an LDPC code by using an architecture that simultaneously performs check node computation and variable node computation each for P nodes, where P is less than the number of rows or the number of columns of the parity check matrix. The use of an architecture that simultaneously performs node computation (computation of check nodes and computation of variable nodes) for P nodes, where P is less than the number of rows or the number of columns of a parity check matrix, makes it possible to perform multiple repetitive decoding while keeping the operating frequency within a feasible range, compared to the case where node computation is simultaneously performed for nodes, the number of which is equal to the number of rows or the number of columns of a parity check matrix.

Similarly to the decoding device illustrated in FIG. 122, the LDPC decoder 166 included in the receiving device 12 illustrated in FIG. 116 is configured to perform LDPC decoding by, for example, simultaneously performing check node computation and variable node computation each for P nodes.

More specifically, it is assumed now that, for ease of description, the parity check matrix of the LDPC code output from the LDPC encoder 115 included in the transmitting device 11 illustrated in FIG. 8 is, for example, the parity check matrix H illustrated in FIG. 119 in which a parity matrix has a stepwise structure. In this case, the parity interleaver 23 of the transmitting device 11 performs parity interleaving to interleave the (K+qx+y+1)-th code bit to the (K+Py+x+1)-th code bit position with the information length K being 60, the number of unit columns P of the cyclic structure being 5, and the divisor q (=M/P) of the parity length M being 6.

As described above, this parity interleaving operation corresponds to the column permutation of Expression (12). Thus, it is not necessary for the LDPC decoder 166 to perform the column permutation of Expression (12).

In the receiving device 12 illustrated in FIG. 116, therefore, as described above, an LDPC code on which parity deinterleaving has not been performed, that is, an LDPC code on which the column permutation of Expression (12) has been performed, is supplied from the column twist deinterleaver 55 to the LDPC decoder 166. The LDPC decoder 166 performs processing similar to that of the decoding device illustrated in FIG. 122, except that the column permutation of Expression (12) is not performed.

Figure 123:
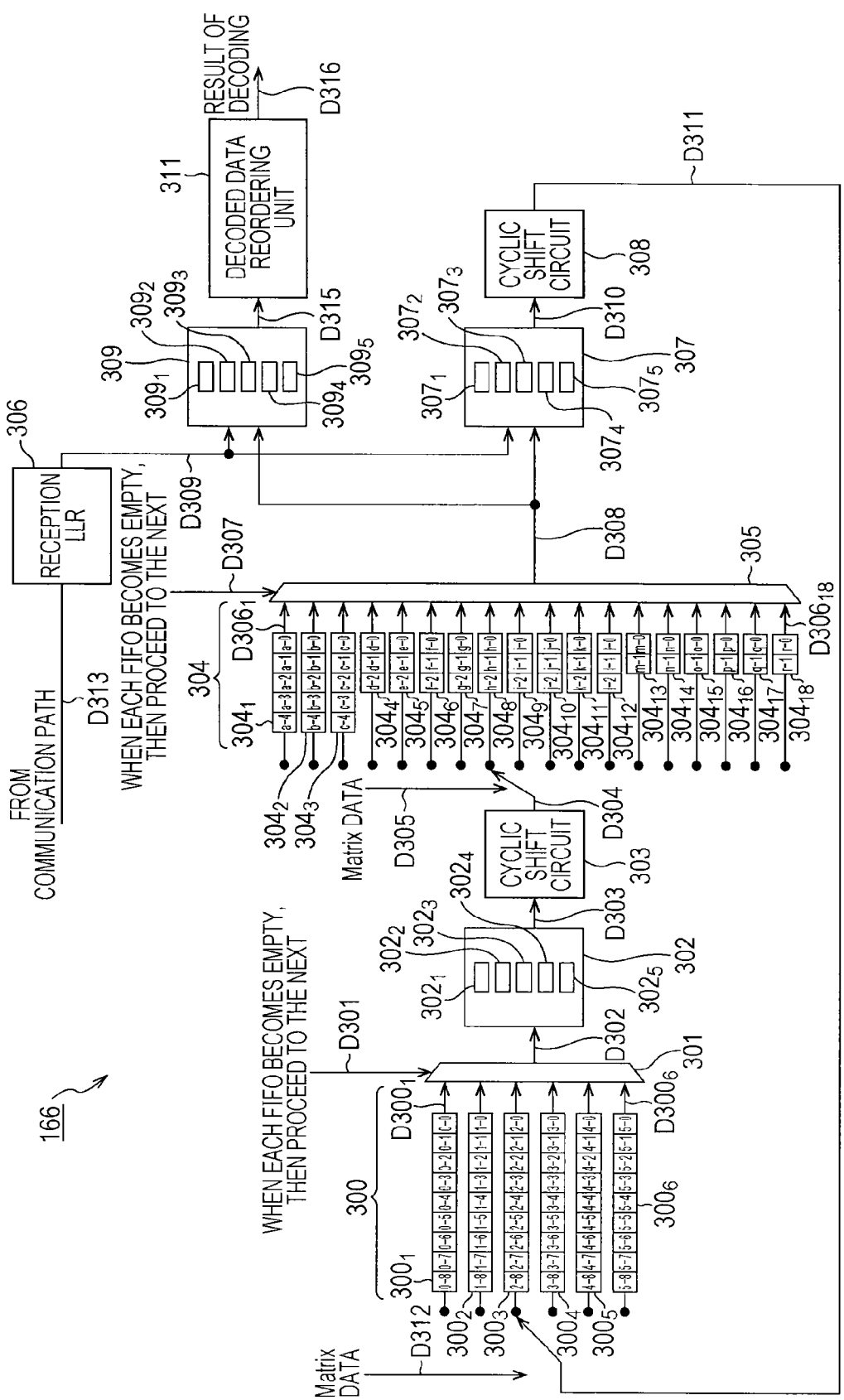

More specifically, FIG. 123 illustrates an example configuration of the LDPC decoder 166 illustrated in FIG. 116.

In FIG. 123, the LDPC decoder 166 has a configuration similar to the decoding device illustrated in FIG. 122, except that the received data reordering unit 310 illustrated in FIG. 122 is not included, and performs processing similar to that of the decoding device illustrated in FIG. 122, except that the column permutation of Expression (12) is not performed, which is not described herein.

As described above, the LDPC decoder 166 may be configured without including the received data reordering unit 310, and can be smaller in size than the decoding device illustrated in FIG. 122.

Note that, in FIGS. 119 to 123, for ease of illustration, the code length N of an LDPC code is 90, the information length K is 60, the number of unit columns P of the cyclic structure (i.e., the number of rows and the number of columns of a component matrix) is 5, and the divisor q (=M/P) of the parity length M is 6. However, the code length N, the information length K, the number of unit columns P of the cyclic structure, and the divisor q (=M/P) are not limited to the values described above.

More specifically, the LDPC encoder 115 in the transmitting device 11 illustrated in FIG. 8 outputs an LDPC code with, for example, the code length N being 64800, 16200, or the like, the information length K being given by N−Pq (=N−M), the number of unit columns P of the cyclic structure being 360, and the divisor q being given by M/P. The LDPC decoder 166 illustrated in FIG. 123 may be used to perform LDPC decoding on the LDPC code described above by simultaneously performing check node computation and variable node computation each for P nodes.

FIG. 124 includes diagrams depicting the processing of the multiplexer 54 included in the bit deinterleaver 165 illustrated in FIG. 117.

More specifically, part A of FIG. 124 illustrates an example functional configuration of the multiplexer 54.

The multiplexer 54 includes an inverse permutation unit 1001 and a memory 1002.

The multiplexer 54 performs inverse permutation processing (which is the inverse of permutation processing), corresponding to the permutation processing performed by the demultiplexer 25 of the transmitting device 11, on the symbol bits of the symbols supplied from the QAM decoder 164 located upstream of the multiplexer 54. That is, the multiplexer 54 performs inverse permutation processing to restore the positions of the code bits (symbol bits) of the LDPC code that have been permuted through the permutation processing to the original positions, and supplies the resulting LDPC code to the column twist deinterleaver 55 located downstream of the multiplexer 54.

More specifically, mb symbol bits $y_0, y_1, \ldots, y_{mb-1}$ of b symbols are supplied to the inverse permutation unit 1001 in the multiplexer 54 in units of (consecutive) b symbols.

The inverse permutation unit 1001 performs inverse permutation to restore the mb symbol bits $y_0$ to $y_{mb-1}$ to the order of the mb original code bits $b_0, b_1, \ldots, b_{mb-1}$, (i.e., the order of the code bits $b_0$ to $b_{mb-1}$ before the permutation unit 32 included in the demultiplexer 25 on the transmitting device 11 side performs permutation), and outputs the resulting mb code bits $b_0$ to $b_{mb-1}$.

Similarly to the memory 31 included in the demultiplexer 25 on the transmitting device 11 side, the memory 1002 has a storage capacity to store mb bits in its row (horizontal) direction and N/(mb) bits in its column (vertical) direction. In other words, the memory 1002 includes mb columns for storing N/(mb) bits.

Note that code bits of the LDPC code output from the inverse permutation unit 1001 are written to the memory 1002 in the direction in which a code bit is read from the memory 31 in the demultiplexer 25 of the transmitting device 11, and the code bits written in the memory 1002 are read from the memory 1002 in the direction in which a code bit is written to the memory 31.

Accordingly, as illustrated in part A of FIG. 124, the multiplexer 54 of the receiving device 12 writes code bits of the LDPC code output from the inverse permutation unit 1001 in the row direction in units of mb bits, where the writing operation moves from the top to the bottom of the memory 1002, starting from the first row.

Further, when the writing of code bits corresponding to one code length is completed, the multiplexer 54 reads the code bits from the memory 1002 in the column direction, and supplies the read code bits to the column twist deinterleaver 55 located downstream of the multiplexer 54.

Here, part B of FIG. 124 is a diagram illustrating the reading of code bits from the memory 1002.

The multiplexer 54 reads code bits of the LDPC code (in the column direction) from the top to the bottom of each of the columns of the memory 1002, where the reading operation moves toward the right, starting from the leftmost column.

FIG. 125 is a diagram depicting the processing of the column twist deinterleaver 55 included in the bit deinterleaver 165 illustrated in FIG. 117.

More specifically, FIG. 125 illustrates an example configuration of the memory 1002 of the multiplexer 54.

The memory 1002 has a storage capacity to store mb bits in its column (vertical) direction and N/(mb) bits in its row (horizontal) direction, and includes mb columns.

The column twist deinterleaver 55 performs column twist deinterleaving by controlling a read start position when code bits of the LDPC code are written to the memory 1002 in the row direction and are read from the memory 1002 in the column direction.

More specifically, the column twist deinterleaver 55 performs inverse reordering processing to restore the code bits whose order has been changed through column twist interleaving to the original order, by changing the read start position with which the reading of a code bit is started, as desired, for each of a plurality of columns.

Here, FIG. 125 illustrates an example configuration of the memory 1002 in a case where, as described with reference to FIG. 28, the modulation scheme is 16APSK, 16QAM, or the like and the multiple b is 1. In this case, the number of bits m of one symbol is 4, and the memory 1002 includes 4 (=mb) columns.

Instead of the multiplexer 54, the column twist deinterleaver 55 writes code bits of the LDPC code output from the inverse permutation unit 1001 in the row direction, where the writing operation moves downward sequentially from the first row of the memory 1002.

Further, when the writing of code bits corresponding to one code length is completed, the column twist deinterleaver 55 reads the code bits from the memory 1002 (in the column direction) from the top to the bottom, where the reading operation moves toward the right, starting from the leftmost column.

Note that the column twist deinterleaver 55 reads code bits from the memory 1002, using, as a read start position of the code bit, the write start position from which the column twist interleaver 24 on the transmitting device 11 side writes a code bit.

More specifically, if the address of the position of the first (or top) of each column is represented by 0 and the addresses of the respective positions in the column direction are represented by integers arranged in ascending order, the column twist deinterleaver 55 sets the read start position for the leftmost column to the position at the address 0, the read start position for the second column (from the left) to the position at the address 2, the read start position for the third column to the position at the address 4, and the read start position for the fourth column to the position at the address 7 in a case where the modulation scheme is 16 APSK or 16QAM and the multiple b is 1.

Note that, after reading code bits up to the bottom of the column for which the read start position is set to a position other than the position at the address 0, the column twist deinterleaver 55 returns to the first position (i.e., the position at the address 0), and reads code bits up to the position immediately before the read start position. The column twist deinterleaver 55 then performs reading from the subsequent (right) column.

The column twist deinterleaving operation described above allows the order of code bits that have been reordered through column twist interleaving to return to the original order.

FIG. 126 is a block diagram illustrating another example configuration of the bit deinterleaver 165 illustrated in FIG. 116.

Note that, in FIG. 126, portions corresponding to those illustrated in FIG. 117 are assigned the same reference numerals, and a description thereof will be omitted hereinafter, as appropriate.

More specifically, the bit deinterleaver 165 illustrated in FIG. 126 has a configuration similar to that illustrated in FIG. 117, except that a parity deinterleaver 1011 is further included.

In FIG. 126, the bit deinterleaver 165 includes a multiplexer (MUX) 54, a column twist deinterleaver 55, and a parity deinterleaver 1011, and performs bit deinterleaving on code bits of the LDPC code supplied from the QAM decoder 164.

More specifically, the multiplexer 54 performs inverse permutation processing (which is the inverse of permutation processing), corresponding to the permutation processing performed by the demultiplexer 25 of the transmitting device 11, on the LDPC code supplied from the QAM decoder 164. That is, the multiplexer 54 performs inverse permutation processing to restore the positions of the code bits permuted through permutation processing to the original positions, and supplies the resulting LDPC code to the column twist deinterleaver 55.

The column twist deinterleaver 55 performs column twist deinterleaving, corresponding to column twist interleaving as the reordering processing performed by the column twist interleaver 24 of the transmitting device 11, on the LDPC code supplied from the multiplexer 54.

The LDPC code obtained as a result of column twist deinterleaving is supplied from the column twist deinterleaver 55 to the parity deinterleaver 1011.

The parity deinterleaver 1011 performs parity deinterleaving (which is the inverse of parity interleaving operation), corresponding to parity interleaving performed by the parity interleaver 23 of the transmitting device 11, on the code bits on which column twist deinterleaving has been performed by the column twist deinterleaver 55. That is, the parity deinterleaver 1011 performs parity deinterleaving to restore the code bits of the LDPC code whose order has been changed through parity interleaving to the original order.

The LDPC code obtained as a result of parity deinterleaving is supplied from the parity deinterleaver 1011 to the LDPC decoder 166.

Accordingly, the bit deinterleaver 165 illustrated in FIG. 126 supplies an LDPC code on which inverse permutation processing, column twist deinterleaving, and parity deinterleaving have been performed, i.e., an LDPC code obtained through LDPC encoding in accordance with the parity check matrix H, to the LDPC decoder 166.

The LDPC decoder 166 performs LDPC decoding on the LDPC code supplied from the bit deinterleaver 165 by using the parity check matrix H that the LDPC encoder 115 of the transmitting device 11 has used for LDPC encoding. More specifically, the LDPC decoder 166 performs LDPC decoding on the LDPC code supplied from the bit deinterleaver 165 by using the parity check matrix H that the LDPC encoder 115 of the transmitting device 11 has used for LDPC encoding, or by using a transformed parity check matrix obtained by performing at least column permutation, corresponding to parity interleaving, on the parity check matrix H.

Here, in FIG. 126, an LDPC code obtained through LDPC encoding in accordance with the parity check matrix H is supplied from (the parity deinterleaver 1011 of) the bit deinterleaver 165 to the LDPC decoder 166. Accordingly, in a case where the LDPC decoding of the LDPC code is performed using the parity check matrix H that the LDPC encoder 115 of the transmitting device 11 has used for LDPC encoding, the LDPC decoder 166 may be implemented as, for example, a decoding device configured to perform LDPC decoding using a full serial decoding method for sequentially performing computation of messages (i.e., check node messages and variable node messages) on a node-by-node basis, or a decoding device configured to perform LDPC decoding using a full parallel decoding method for simultaneously (or in parallel) performing computation of messages for all the nodes.

Furthermore, in a case where the LDPC decoder 166 performs LDPC decoding on an LDPC code using a transformed parity check matrix obtained by performing at least column permutation, corresponding to parity interleaving, on the parity check matrix H that the LDPC encoder 115 of the transmitting device 11 has used for LDPC encoding, the LDPC decoder 166 may be implemented as a decoding device having an architecture that simultaneously performs check node computation and variable node computation each for P (or a divisor of P other than 1) nodes, which is the decoding device (FIG. 122) including the received data reordering unit 310 configured to perform column permutation similar to column permutation for obtaining a transformed parity check matrix on an LDPC code to reorder the code bits of the LDPC code.

Note that, in FIG. 126, the multiplexer 54 that performs inverse permutation processing, the column twist deinterleaver 55 that performs column twist deinterleaving, and the parity deinterleaver 1011 that performs parity deinterleaving are configured as separate units, for convenience of illustration. However, two or more of the multiplexer 54, the column twist deinterleaver 55, and the parity deinterleaver 1011 may be integrated into a single unit, similarly to the parity interleaver 23, the column twist interleaver 24, and the demultiplexer 25 of the transmitting device 11.

In addition, if the bit interleaver 116 (FIG. 8) of the transmitting device 11 is configured without including the parity interleaver 23 or the column twist interleaver 24, the bit deinterleaver 165 illustrated in FIG. 126 may be configured without including the column twist deinterleaver 55 or the parity deinterleaver 1011.

Also in this case, the LDPC decoder 166 may be implemented as a decoding device of the full serial decoding type that performs LDPC decoding using the parity check matrix H itself, a decoding device of the full parallel decoding type that performs LDPC decoding using the parity check matrix H itself, or the decoding device (FIG. 122) including the received data reordering unit 310 configured to perform LDPC decoding by simultaneously performing check node computation and variable node computation each for P nodes using a transformed parity check matrix H'.

[Example Configuration of Receiving System]

FIG. 127 is a block diagram illustrating a first example configuration of a receiving system to which the receiving device 12 is applicable.

In FIG. 127, the receiving system includes an acquisition unit 1101, a transmission path decoding processing unit 1102, and an information source decoding processing unit 1103.

The acquisition unit 1101 acquires a signal including an LDPC code obtained by performing at least LDPC encoding on LDPC target data such as image data and audio data of a program via a transmission path (or communication path) (not illustrated) such as terrestrial digital broadcasting, satellite digital broadcasting, a CATV network, the Internet, or any other suitable network, and supplies the signal to the transmission path decoding processing unit 1102.

Here, in a case where the acquisition unit 1101 acquires a signal broadcasted from, for example, a broadcast station via terrestrial, satellite, CATV (Cable Television), or any other network, the acquisition unit 1101 may be implemented as a tuner, an STB (Set Top Box), or the like. Further, in a case where the acquisition unit 1101 acquires a signal transmitted using, for example, multicast technology like IPTV (Internet Protocol Television) from a web server, the acquisition unit 1101 may be implemented as a network I/F (Interface) such as a NIC (Network Interface Card).

The transmission path decoding processing unit 1102 corresponds to the receiving device 12. The transmission path decoding processing unit 1102 performs a transmission path decoding process, including at least processing for correcting errors caused in a transmission path, on the signal acquired by the acquisition unit 1101 via a transmission path, and supplies the resulting signal to the information source decoding processing unit 1103.

More specifically, the signal acquired by the acquisition unit 1101 via a transmission path is a signal obtained by performing at least error correcting encoding to correct errors caused in a transmission path. The transmission path decoding processing unit 1102 performs a transmission path decoding process such as an error correction process on the above-described signal.

Here, examples of the error correcting encoding include LDPC encoding and BCH encoding. Here, at least LDPC encoding is performed as error correcting encoding.

Furthermore, the transmission path decoding process may include, for example, demodulation of modulation signals.

The information source decoding processing unit 1103 performs an information source decoding process, including at least processing for expanding compressed information into original information, on the signal on which the transmission path decoding process has been performed.

More specifically, the signal acquired by the acquisition unit 1101 via a transmission path may have been subjected to compression encoding for compressing information in order to reduce the amount of data such as image data and audio data as information. In this case, the information source decoding processing unit 1103 performs an information source decoding process, such as processing for expanding compressed information into original information (i.e., expansion processing), on the signal on which the transmission path decoding process has been performed.

Note that, if the signal acquired by the acquisition unit 1101 via a transmission path has not been subjected to compression encoding, the information source decoding processing unit 1103 does not perform processing for expanding compressed information into original information.

Here, examples of the expansion processing include MPEG decoding. Furthermore, the transmission path decoding process may include descrambling and so forth in addition to expansion processing.

In the receiving system having the configuration described above, the acquisition unit 1101 acquires a signal obtained by performing compression encoding such as MPEG encoding and error correcting encoding such as LDPC encoding on data such as image data and audio data, via a transmission path, and supplies the acquired signal to the transmission path decoding processing unit 1102.

The transmission path decoding processing unit 1102 performs a transmission path decoding process, for example, processing similar to that performed by the receiving device 12, on the signal supplied from the acquisition unit 1101, and supplies the resulting signal to the information source decoding processing unit 1103.

The information source decoding processing unit 1103 performs an information source decoding process such as MPEG decoding on the signal supplied from the transmission path decoding processing unit 1102, and outputs the resulting images or audio.

The receiving system illustrated in FIG. 127 as described above may be applied to, for example, a television tuner or the like that receives television broadcasting as digital broadcasting.

Note that the acquisition unit 1101, the transmission path decoding processing unit 1102, and the information source decoding processing unit 1103 may be constructed as single independent devices (hardware (such as ICs (Integrated Circuits)) or software modules).

In addition, the acquisition unit 1101, the transmission path decoding processing unit 1102, and the information source decoding processing unit 1103 may be configured such that the combination of the acquisition unit 1101 and the transmission path decoding processing unit 1102, the combination of the transmission path decoding processing unit 1102 and the information source decoding processing unit 1103, or the combination of the acquisition unit 1101, the transmission path decoding processing unit 1102, and the information source decoding processing unit 1103 is constructed as a single independent device.

FIG. 128 is a block diagram illustrating a second example configuration of the receiving system to which the receiving device 12 is applicable.

Note that, in FIG. 128, portions corresponding to those illustrated in FIG. 127 are assigned the same reference numerals, and a description thereof will be omitted hereinafter, as appropriate.

The receiving system illustrated in FIG. 128 is common to that illustrated in FIG. 127 in that the acquisition unit 1101, the transmission path decoding processing unit 1102, and the information source decoding processing unit 1103 are included, and is different from that illustrated in FIG. 127 in that an output unit 1111 is further included.

The output unit 1111 may be, for example, a display device configured to display an image or a speaker configured to output audio, and outputs images, audio, or the like as signals output from the information source decoding processing unit 1103. In other words, the output unit 1111 displays images or outputs audio.

The receiving system illustrated in FIG. 128 as described above may be applied to, for example, a TV set (television receiver) that receives television broadcasting as digital broadcasting or a radio receiver that receives radio broadcasting.

Note that, if the signal acquired by the acquisition unit 1101 has not been subjected to compression encoding, a signal output from the transmission path decoding processing unit 1102 is supplied to the output unit 1111.

FIG. 129 is a block diagram illustrating a third example configuration of the receiving system to which the receiving device 12 is applicable.

Note that, in FIG. 129, portions corresponding to those illustrated in FIG. 127 are assigned the same reference numerals, and a description thereof will be omitted hereinafter, as appropriate.

The receiving system illustrated in FIG. 129 is common to that illustrated in FIG. 127 in that the acquisition unit 1101 and the transmission path decoding processing unit 1102 are included.

However, the receiving system illustrated in FIG. 129 is different from that illustrated in FIG. 127 in that the information source decoding processing unit 1103 is not included and a recording unit 1121 is further included.

The recording unit 1121 records (or stores) the signal (e.g., TS packets of an MPEG TS stream) output from the transmission path decoding processing unit 1102 on (or in) a recording (or storage) medium such as an optical disk, a hard disk (magnetic disk), or a flash memory.

The receiving system illustrated in FIG. 129 as described above may be applied to, for example, a recorder that records television broadcasting.

Note that, in FIG. 129, the receiving system may include the information source decoding processing unit 1103, and the recording unit 1121 is capable of recording a signal that has been subjected to an information source decoding process by the information source decoding processing unit 1103, that is, an image or audio obtained by decoding.

[Embodiment of Computer]

Next, the series of processes described above may be performed by hardware or software. If the series of processes is performed by software, a program constituting the software is installed into a general-purpose computer or the like.

Thus, FIG. 130 illustrates an example configuration of an embodiment of a computer into which a program for executing the series of processes described above is installed.

The program may be recorded in advance on a hard disk 705 or a ROM 703 serving as a recording medium incorporated in the computer.

Alternatively, the program may be temporarily or persistently stored in (or recorded on) a removable recording medium 711 such as a flexible disc, a CD-ROM (Compact Disc Read Only Memory), an MO (Magneto Optical) disc, a DVD (Digital Versatile Disc), a magnetic disk, or a semiconductor memory. The removable recording medium 711 may be provided as packaged software.

The program may be installed into the computer from the removable recording medium 711 described above, or may be wirelessly transferred to the computer from a download site via an artificial satellite for digital satellite broadcasting or transferred to the computer via a network such as a LAN (Local Area Network) or the Internet by wired connection. In the computer, the program transferred in the way described above may be received by a communication unit 708, and installed into the hard disk 705 incorporated in the computer.

The computer has a CPU (Central Processing Unit) 702 incorporated therein. An input/output interface 710 is connected to the CPU 702 via a bus 701. When an instruction is input by a user by, for example, operating an input unit 707 including a keyboard, a mouse, a microphone, and so forth via the input/output interface 710, the CPU 702 executes a program stored in the ROM (Read Only Memory) 703 in accordance with the instruction. Alternatively, the CPU 702 loads a program stored in the hard disk 705, a program transferred from a satellite or a network, received by the communication unit 708, and installed into the hard disk 705, or a program read from the removable recording medium 711 set in a drive 709 and installed into the hard disk 705 into a RAM (Random Access Memory) 704, and executes the loaded program. Accordingly, the CPU 702 performs processing according to the flowcharts described above or processing performed with the configurations in the block diagrams described above. Then, the CPU 702 outputs a result of the processing, if necessary, for example, from an output unit 706 including an LCD (Liquid Crystal Display), a speaker, and so forth via the input/output interface 710, transmits the result from the communication unit 708, or records the result on the hard disk 705.

It should be noted herein that processing steps describing a program for causing a computer to perform various kinds of processing may not necessarily be processed in a time-series manner in accordance with the order described herein in the flowcharts, and may also include processes executed in parallel or individually (for example, parallel processing or object-based processing).

In addition, a program may be processed by a single computer, or may be processed by a plurality of computers in a distributed manner. Furthermore, a program may also be transferred to and executed by a remote computer.

Note that embodiments of the present technology are not limited to the embodiments described above, and a variety of changes can be made without departing from the scope of the present technology.

More specifically, for example, the (parity check matrix initial value tables of) new LDPC codes described above may be used regardless of whether the communication path 13 (FIG. 7) is a satellite link, a terrestrial link, a cable (wired line), or any other unit. In addition, the new LDPC codes may also be used for data transmission other than digital broadcasting.

REFERENCE SIGNS LIST

11 transmitting device, 12 receiving device, 23 parity interleaver, 24 column twist interleaver, 25 demultiplexer, 31 memory, 32 permutation unit, 54 multiplexer, 55 column twist interleaver, 111 mode adaptation/multiplexer, 112 padder, 113 BB scrambler, 114 BCH encoder, 115 LDPC encoder, 116 bit interleaver, 117 QAM encoder, 118 time interleaver, 119 MISO/MIMO encoder, 120 frequency interleaver, 121 BCH encoder, 122 LDPC encoder, 123 QAM encoder, 124 frequency interleaver, 131 frame builder & resource allocation unit, 132 OFDM generation unit, 151 OFDM processing unit, 152 frame management unit, 153 frequency deinterleaver, 154 QAM decoder, 155 LDPC decoder, 156 BCH decoder, 161 frequency deinterleaver, 162 MISO/MIMO decoder, 163 time deinterleaver, 164 QAM decoder, 165 bit deinterleaver, 166 LDPC decoder, 167 BCH decoder, 168 BB descrambler, 169 null deletion unit, 170 demultiplexer, 300 edge data storage memory, 301 selector, 302 check node calculation unit, 303 cyclic shift circuit, 304 edge data storage memory, 305 selector, 306 received data memory, 307 variable node calculation unit, 308 cyclic shift circuit, 309 decoded word calculation unit, 310 received data reordering unit, 311 decoded data reordering unit, 601 encoding processing unit, 602 storage unit, 611 code rate setting unit, 612 initial value table read unit, 613 parity check matrix generation unit, 614 information bit read unit, 615 encoding parity computation unit, 616 control unit, 701 bus, 702 CPU, 703 ROM, 704 RAM, 705 hard disk, 706 output unit, 707 input unit, 708 communication unit, 709 drive, 710 input/output interface, 711 removable recording medium, 1001 inverse permutation unit, 1002 memory, 1011 parity deinterleaver, 1101 acquisition unit, 1101 transmission path decoding processing unit, 1103 information source decoding processing unit, 1111 output unit, 1121 recording unit

The invention claimed is:

1. A data processing apparatus for using an LDPC code to enable error correction processing to correct errors generated in a transmission path of a television broadcast, the data processing apparatus comprising:

a receiver configured to receive, from a television broadcast, an LDPC (Low Density Parity Check) code word having a code length of 64800 bits and a code rate of 13/15; and a decoder configured to decode the LDPC code word on the basis of a parity check matrix of the LDPC code, wherein the LDPC code word includes information bits and parity bits, the parity check matrix includes an information matrix portion corresponding to the information bits and a parity matrix portion corresponding to the parity bits, the information matrix portion is represented by a parity check matrix initial value table, and the parity check matrix initial value table is a table showing positions of elements of 1 in the information matrix portion in units of 360 columns, including 142 2307 2598 2650 4028 4434 5781 5881 6016 6323 6681 6698 8125

2932 4928 5248 5256 5983 6773 6828 7789 8426 8494 8534 8539 8583

899 3295 3833 5399 6820 7400 7753 7890 8109 8451 8529 8564 8602

21 3060 4720 5429 5636 5927 6966 8110 8170 8247 8355 8365 8616

20 1745 2838 3799 4380 4418 4646 5059 7343 8161 8302 8456 8631

9 6274 6725 6792 7195 7333 8027 8186 8209 8273 8442 8548 8632

494 1365 2405 3799 5188 5291 7644 7926 8139 8458 8504 8594 8625

192 574 1179 4387 4695 5089 5831 7673 7789 8298 8301 8612 8632

11 20 1406 6111 6176 6256 6708 6834 7828 8232 8457 8495 8602

6 2654 3554 4483 4966 5866 6795 8069 8249 8301 8497 8509 8623

21 1144 2355 3124 6773 6805 6887 7742 7994 8358 8374 8580 8611

335 4473 4883 5528 6096 7543 7586 7921 8197 8319 8394 8489 8636

2919 4331 4419 4735 6366 6393 6844 7193 8165 8205 8544 8586 8617

12 19 742 930 3009 4330 6213 6224 7292 7430 7792 7922 8137

710 1439 1588 2434 3516 5239 6248 6827 8230 8448 8515 8581 8619

200 1075 1868 5581 7349 7642 7698 8037 8201 8210 8320 8391 8526

3 2501 4252 5256 5292 5567 6136 6321 6430 6486 7571 8521 8636

3062 4599 5885 6529 6616 7314 7319 7567 8024 8153 8302 8372 8598

105 381 1574 4351 5452 5603 5943 7467 7788 7933 8362 8513 8587

787 1857 3386 3659 6550 7131 7965 8015 8040 8312 8484 8525 8537

15 1118 4226 5197 5575 5761 6762 7038 8260 8338 8444 8512 8568

36 5216 5368 5616 6029 6591 8038 8067 8299 8351 8565 8578 8585

1 23 4300 4530 5426 5532 5817 6967 7124 7979 8022 8270 8437

629 2133 4828 5475 5875 5890 7194 8042 8345 8385 8518 8598 8612

11 1065 3782 4237 4993 7104 7863 7904 8104 8228 8321 8383 8565

2131 2274 3168 3215 3220 5597 6347 7812 8238 8354
8527 8557 8614
5600 6591 7491 7696
1766 8281 8626
1725 2280 5120
1650 3445 7652
4312 6911 8626
15 1013 5892
2263 2546 2979
1545 5873 7406
67 726 3697
2860 6443 8542
17 911 2820
1561 4580 6052
79 5269 7134
22 2410 2424
3501 5642 8627
808 6950 8571
4099 6389 7482
4023 5000 7833
5476 5765 7917
1008 3194 7207
20 495 5411
1703 8388 8635
6 4395 4921
200 2053 8206
1089 5126 5562
10 4193 7720
1967 2151 4608
22 738 3513
3385 5066 8152
440 1118 8537
3429 6058 7716
5213 7519 8382
5564 8365 8620
43 3219 8603
4 5409 5815
5 6376 7654
4091 5724 5953
5348 6754 8613
1634 6398 6632
72 2058 8605
3497 5811 7579
3846 6743 8559
15 5933 8629
2133 5859 7068
4151 4617 8566
2960 8270 8410
2059 3617 8210
544 1441 6895
4043 7482 8592
294 2180 8524
3058 8227 8373
364 5756 8617
5383 8555 8619
1704 2480 4181
7338 7929 7990
2615 3905 7981
4298 4548 8296
8262 8319 8630
892 1893 8028
5694 7237 8595
1487 5012 5810
4335 8593 8624
3509 4531 5273
10 22 830
4161 5208 6280

275 7063 8634
4 2725 3113
2279 7403 8174
1637 3328 3930
2810 4939 5624
3 1234 7687
2799 7740 8616
22 7701 8636
4302 7857 7993
7477 7794 8592
9 6111 8591
5 8606 8628
347 3497 4033
1747 2613 8636
1827 5600 7042
580 1822 6842
232 7134 7783
4629 5000 7231
951 2806 4947
571 3474 8577
2437 2496 7945
23 5873 8162
12 1168 7686
8315 8540 8596
1766 2506 4733
929 1516 3338
21 1216 6555
782 1452 8617
8 6083 6087
667 3240 4583
4030 4661 5790
559 7122 8553
3202 4388 4909
2533 3673 8594
1991 3954 6206
6835 7900 7980
189 5722 8573
2680 4928 4998
243 2579 7735
4281 8132 8566
7656 7671 8609
1116 2291 4166
21 388 8021
6 1123 8369
311 4918 8511
0 3248 6290
13 6762 7172
4209 5632 7563
49 127 8074
581 1735 4075
0 2235 5470
2178 5820 6179
16 3575 6054
1095 4564 6458
9 1581 5953
2537 6469 8552
14 3874 4844
0 3269 3551
2114 7372 7926
1875 2388 4057
3232 4042 6663
9 401 583
13 4100 6584
2299 4190 4410
21 3670 4979.

2. The data processing apparatus according to claim 1, wherein
  a row of the parity check matrix initial value table is represented by i and a parity length of the LDPC code is represented by M,
  a {2+360×(i−1)}-th column of the parity check matrix is a column obtained by cyclically shifting a {1+360×(i−1)}-th column of the parity check matrix, in which positions of elements of 1 are represented in the parity check matrix initial value table, downward by q, where q is equal to M/360.

3. The data processing apparatus according to claim 2, wherein
  for the {1+360×(i−1)}-th column of the parity check matrix,
  an i-th row of the parity check matrix initial value table represents a row number of an element of 1 in the {1+360×(i−1)}-th column of the parity check matrix, and
  for each of the {2+360×(i−1)}-th to (360×i)-th columns, which are columns other than the {1+360×(i−1)}-th column of the parity check matrix,
  a row number $H_{w\text{-}j}$ of an element of 1 in a w-th column of the parity check matrix, which is a column other than the {1+360×(i−1)}-th column of the parity check matrix, is represented by equation $H_{w\text{-}j}=\mod\{h_{i,j}+\mod((w-1),360)\times M/360, M\}$,
  where $h_{i,j}$ denotes a value in the i-th row and a j-th column of the parity check matrix initial value table, and $H_{w\text{-}j}$ denotes a row number of a j-th element of 1 in the w-th column of the parity check matrix H.

4. The data processing apparatus according to claim 1, further comprising:
  an inverse permutation processor configured to perform inverse permutation processing on the LDPC code word, in a case where permutation processing has been performed on the LDPC code word to replace code bits of the LDPC code word with symbol bits of a symbol corresponding to one of a certain number of constellation points defined by a certain digital modulation scheme, to restore the code bits whose positions have been replaced with the symbol bits to original positions.

5. A television receiver comprising the data processing apparatus according to claim 1.

6. A television receiver according to claim 5, wherein the television receiver comprises an information source decoding processor and a display,
  the decoder being configured to supply a decoded signal after decoding of the LDPC code word to the information decoding processor,
  the information decoding processor being configured to perform an information source decoding of the decoded signal and to output images to the display.

7. A data processing method for using an LDPC code to enable error correction processing to correct errors generated in a transmission path of a television broadcast, the method comprising:
  receiving, from a television broadcast, an LDPC (Low Density Parity Check) code word having a code length of 64800 bits and a code rate of 13/15; and
  decoding the LDPC code word on the basis of a parity check matrix of the LDPC code, wherein
  the LDPC code word includes information bits and parity bits,
  the parity check matrix includes an information matrix portion corresponding to the information bits and a parity matrix portion corresponding to the parity bits,
  the information matrix portion is represented by a parity check matrix initial value table, and
  the parity check matrix initial value table is a table showing positions of elements of 1 in the information matrix portion in units of 360 columns, including 142 2307 2598 2650 4028 4434 5781 5881 6016 6323 6681 6698 8125
2932 4928 5248 5256 5983 6773 6828 7789 8426 8494 8534 8539 8583
899 3295 3833 5399 6820 7400 7753 7890 8109 8451 8529 8564 8602
21 3060 4720 5429 5636 5927 6966 8110 8170 8247 8355 8365 8616
20 1745 2838 3799 4380 4418 4646 5059 7343 8161 8302 8456 8631
9 6274 6725 6792 7195 7333 8027 8186 8209 8273 8442 8548 8632
494 1365 2405 3799 5188 5291 7644 7926 8139 8458 8504 8594 8625
192 574 1179 4387 4695 5089 5831 7673 7789 8298 8301 8612 8632
11 20 1406 6111 6176 6256 6708 6834 7828 8232 8457 8495 8602
6 2654 3554 4483 4966 5866 6795 8069 8249 8301 8497 8509 8623
21 1144 2355 3124 6773 6805 6887 7742 7994 8358 8374 8580 8611
335 4473 4883 5528 6096 7543 7586 7921 8197 8319 8394 8489 8636
2919 4331 4419 4735 6366 6393 6844 7193 8165 8205 8544 8586 8617
12 19 742 930 3009 4330 6213 6224 7292 7430 7792 7922 8137
710 1439 1588 2434 3516 5239 6248 6827 8230 8448 8515 8581 8619
200 1075 1868 5581 7349 7642 7698 8037 8201 8210 8320 8391 8526
3 2501 4252 5256 5292 5567 6136 6321 6430 6486 7571 8521 8636
3062 4599 5885 6529 6616 7314 7319 7567 8024 8153 8302 8372 8598
105 381 1574 4351 5452 5603 5943 7467 7788 7933 8362 8513 8587
787 1857 3386 3659 6550 7131 7965 8015 8040 8312 8484 8525 8537
15 1118 4226 5197 5575 5761 6762 7038 8260 8338 8444 8512 8568
36 5216 5368 5616 6029 6591 8038 8067 8299 8351 8565 8578 8585
1 23 4300 4530 5426 5532 5817 6967 7124 7979 8022 8270 8437
629 2133 4828 5475 5875 5890 7194 8042 8345 8385 8518 8598 8612
11 1065 3782 4237 4993 7104 7863 7904 8104 8228 8321 8383 8565
2131 2274 3168 3215 3220 5597 6347 7812 8238 8354 8527 8557 8614
5600 6591 7491 7696
1766 8281 8626
1725 2280 5120
1650 3445 7652
4312 6911 8626
15 1013 5892
2263 2546 2979

1545 5873 7406
67 726 3697
2860 6443 8542
17 911 2820
1561 4580 6052
79 5269 7134
22 2410 2424
3501 5642 8627
808 6950 8571
4099 6389 7482
4023 5000 7833
5476 5765 7917
1008 3194 7207
20 495 5411
1703 8388 8635
6 4395 4921
200 2053 8206
1089 5126 5562
10 4193 7720
1967 2151 4608
22 738 3513
3385 5066 8152
440 1118 8537
3429 6058 7716
5213 7519 8382
5564 8365 8620
43 3219 8603
4 5409 5815
5 6376 7654
4091 5724 5953
5348 6754 8613
1634 6398 6632
72 2058 8605
3497 5811 7579
3846 6743 8559
15 5933 8629
2133 5859 7068
4151 4617 8566
2960 8270 8410
2059 3617 8210
544 1441 6895
4043 7482 8592
294 2180 8524
3058 8227 8373
364 5756 8617
5383 8555 8619
1704 2480 4181
7338 7929 7990
2615 3905 7981
4298 4548 8296
8262 8319 8630
892 1893 8028
5694 7237 8595
1487 5012 5810
4335 8593 8624
3509 4531 5273
10 22 830
4161 5208 6280
275 7063 8634
4 2725 3113
2279 7403 8174
1637 3328 3930
2810 4939 5624
3 1234 7687
2799 7740 8616
22 7701 8636
4302 7857 7993
7477 7794 8592
9 6111 8591
5 8606 8628
347 3497 4033
1747 2613 8636
1827 5600 7042
580 1822 6842
232 7134 7783
4629 5000 7231
951 2806 4947
571 3474 8577
2437 2496 7945
23 5873 8162
12 1168 7686
8315 8540 8596
1766 2506 4733
929 1516 3338
21 1216 6555
782 1452 8617
8 6083 6087
667 3240 4583
4030 4661 5790
559 7122 8553
3202 4388 4909
2533 3673 8594
1991 3954 6206
6835 7900 7980
189 5722 8573
2680 4928 4998
243 2579 7735
4281 8132 8566
7656 7671 8609
1116 2291 4166
21 388 8021
6 1123 8369
311 4918 8511
0 3248 6290
13 6762 7172
4209 5632 7563
49 127 8074
581 1735 4075
0 2235 5470
2178 5820 6179
16 3575 6054
1095 4564 6458
9 1581 5953
2537 6469 8552
14 3874 4844
0 3269 3551
2114 7372 7926
1875 2388 4057
3232 4042 6663
9 401 583
13 4100 6584
2299 4190 4410
21 3670 4979.

8. The data processing method according to claim 7, wherein
a row of the parity check matrix initial value table is represented by i and a parity length of the LDPC code is represented by M,
a $\{2+360\times(i-1)\}$-th column of the parity check matrix is a column obtained by cyclically shifting a $\{1+360\times(i-1)\}$-th column of the parity check matrix, in which positions of elements of 1 are represented in the parity check matrix initial value table, downward by q, where q is equal to M/360.

9. The data processing method according to claim 7, wherein
for the {1+360×(i−1)}-th column of the parity check matrix,
an i-th row of the parity check matrix initial value table represents a row number of an element of 1 in the {1+360×(i−1)}-th column of the parity check matrix, and
for each of the {2+360×(i−1)}-th to (360×i)-th columns, which are columns other than the {1+360×(i−1)}-th column of the parity check matrix,
a row number $H_{w-j}$ of an element of 1 in a w-th column of the parity check matrix, which is a column other than the {1+360×(i−1)}-th column of the parity check matrix, is represented by equation $H_{w-j}$=mod {$h_{i,j}$+mod ((w−1),360)×M/360, M),
where $h_{i,j}$ denotes a value in the i-th row and a j-th column of the parity check matrix initial value table, and $H_{w-j}$ denotes a row number of a j-th element of 1 in the w-th column of the parity check matrix H.

10. The data processing method according to claim 7, wherein the method comprises:
information source decoding of a decoded signal received after LDPC decoding of the LDPC code word; and
displaying images resulting from information source decoding.

11. A non-transitory computer-readable storage medium storing computer-readable instructions, which, when executed by a processing apparatus, cause the processing apparatus to perform a data processing method for using an LDPC code to enable error correction processing to correct errors generated in a transmission path of a television broadcast, the method comprising:
receiving, from a television broadcast, an LDPC (Low Density Parity Check) code word having a code length of 64800 bits and a code rate of 13/15; and
decoding the LDPC code word on the basis of a parity check matrix of the LDPC code, wherein
the LDPC code word includes information bits and parity bits,
the parity check matrix includes an information matrix portion corresponding to the information bits and a parity matrix portion corresponding to the parity bits,
the information matrix portion is represented by a parity check matrix initial value table, and
the parity check matrix initial value table is a table showing positions of elements of 1 in the information matrix portion in units of 360 columns, including
142 2307 2598 2650 4028 4434 5781 5881 6016 6323 6681 6698 8125
2932 4928 5248 5256 5983 6773 6828 7789 8426 8494 8534 8539 8583
899 3295 3833 5399 6820 7400 7753 7890 8109 8451 8529 8564 8602
21 3060 4720 5429 5636 5927 6966 8110 8170 8247 8355 8365 8616
20 1745 2838 3799 4380 4418 4646 5059 7343 8161 8302 8456 8631
9 6274 6725 6792 7195 7333 8027 8186 8209 8273 8442 8548 8632
494 1365 2405 3799 5188 5291 7644 7926 8139 8458 8504 8594 8625
192 574 1179 4387 4695 5089 5831 7673 7789 8298 8301 8612 8632
11 20 1406 6111 6176 6256 6708 6834 7828 8232 8457 8495 8602
6 2654 3554 4483 4966 5866 6795 8069 8249 8301 8497 8509 8623
21 1144 2355 3124 6773 6805 6887 7742 7994 8358 8374 8580 8611
335 4473 4883 5528 6096 7543 7586 7921 8197 8319 8394 8489 8636
2919 4331 4419 4735 6366 6393 6844 7193 8165 8205 8544 8586 8617
12 19 742 930 3009 4330 6213 6224 7292 7430 7792 7922 8137
710 1439 1588 2434 3516 5239 6248 6827 8230 8448 8515 8581 8619
200 1075 1868 5581 7349 7642 7698 8037 8201 8210 8320 8391 8526
3 2501 4252 5256 5292 5567 6136 6321 6430 6486 7571 8521 8636
3062 4599 5885 6529 6616 7314 7319 7567 8024 8153 8302 8372 8598
105 381 1574 4351 5452 5603 5943 7467 7788 7933 8362 8513 8587
787 1857 3386 3659 6550 7131 7965 8015 8040 8312 8484 8525 8537
15 1118 4226 5197 5575 5761 6762 7038 8260 8338 8444 8512 8568
36 5216 5368 5616 6029 6591 8038 8067 8299 8351 8565 8578 8585
1 23 4300 4530 5426 5532 5817 6967 7124 7979 8022 8270 8437
629 2133 4828 5475 5875 5890 7194 8042 8345 8385 8518 8598 8612
11 1065 3782 4237 4993 7104 7863 7904 8104 8228 8321 8383 8565
2131 2274 3168 3215 3220 5597 6347 7812 8238 8354 8527 8557 8614
5600 6591 7491 7696
1766 8281 8626
1725 2280 5120
1650 3445 7652
4312 6911 8626
15 1013 5892
2263 2546 2979
1545 5873 7406
67 726 3697
2860 6443 8542
17 911 2820
1561 4580 6052
79 5269 7134
22 2410 2424
3501 5642 8627
808 6950 8571
4099 6389 7482
4023 5000 7833
5476 5765 7917
1008 3194 7207
20 495 5411
1703 8388 8635
6 4395 4921
200 2053 8206
1089 5126 5562
10 4193 7720
1967 2151 4608
22 738 3513
3385 5066 8152
440 1118 8537
3429 6058 7716
5213 7519 8382
5564 8365 8620

43 3219 8603
4 5409 5815
5 6376 7654
4091 5724 5953
5348 6754 8613
1634 6398 6632
72 2058 8605
3497 5811 7579
3846 6743 8559
15 5933 8629
2133 5859 7068
4151 4617 8566
2960 8270 8410
2059 3617 8210
544 1441 6895
4043 7482 8592
294 2180 8524
3058 8227 8373
364 5756 8617
5383 8555 8619
1704 2480 4181
7338 7929 7990
2615 3905 7981
4298 4548 8296
8262 8319 8630
892 1893 8028
5694 7237 8595
1487 5012 5810
4335 8593 8624
3509 4531 5273
10 22 830
4161 5208 6280
275 7063 8634
4 2725 3113
2279 7403 8174
1637 3328 3930
2810 4939 5624
3 1234 7687
2799 7740 8616
22 7701 8636
4302 7857 7993
7477 7794 8592
9 6111 8591
5 8606 8628
347 3497 4033
1747 2613 8636
1827 5600 7042
580 1822 6842
232 7134 7783
4629 5000 7231
951 2806 4947
571 3474 8577
2437 2496 7945
23 5873 8162
12 1168 7686
8315 8540 8596
1766 2506 4733
929 1516 3338
21 1216 6555
782 1452 8617
8 6083 6087
667 3240 4583
4030 4661 5790
559 7122 8553
3202 4388 4909
2533 3673 8594
1991 3954 6206
6835 7900 7980
189 5722 8573
2680 4928 4998
243 2579 7735
4281 8132 8566
7656 7671 8609
1116 2291 4166
21 388 8021
6 1123 8369
311 4918 8511
0 3248 6290
13 6762 7172
4209 5632 7563
49 127 8074
581 1735 4075
0 2235 5470
2178 5820 6179
16 3575 6054
1095 4564 6458
9 1581 5953
2537 6469 8552
14 3874 4844
0 3269 3551
2114 7372 7926
1875 2388 4057
3232 4042 6663
9 401 583
13 4100 6584
2299 4190 4410
21 3670 4979.

12. A data processing apparatus for using an LDPC code to enable error correction processing to correct errors generated in a transmission path of a television broadcast, the data processing apparatus comprising:
an encoder configured to encode information bits into an LDPC (Low Density Parity Check) code word having a code length of 64800 bits and a code rate of 13/15 on the basis of a parity check matrix of the LDPC code and to supply the encoded information bits for television broadcast, wherein
the LDPC code word includes information bits and parity bits,
the parity check matrix includes an information matrix portion corresponding to the information bits and a parity matrix portion corresponding to the parity bits,
the information matrix portion is represented by a parity check matrix initial value table, and
the parity check matrix initial value table is a table showing positions of elements of 1 in the information matrix portion in units of 360 columns, including
142 2307 2598 2650 4028 4434 5781 5881 6016 6323 6681 6698 8125
2932 4928 5248 5256 5983 6773 6828 7789 8426 8494 8534 8539 8583
899 3295 3833 5399 6820 7400 7753 7890 8109 8451 8529 8564 8602
21 3060 4720 5429 5636 5927 6966 8110 8170 8247 8355 8365 8616
20 1745 2838 3799 4380 4418 4646 5059 7343 8161 8302 8456 8631
9 6274 6725 6792 7195 7333 8027 8186 8209 8273 8442 8548 8632
494 1365 2405 3799 5188 5291 7644 7926 8139 8458 8504 8594 8625
192 574 1179 4387 4695 5089 5831 7673 7789 8298 8301 8612 8632

11 20 1406 6111 6176 6256 6708 6834 7828 8232 8457 8495 8602
6 2654 3554 4483 4966 5866 6795 8069 8249 8301 8497 8509 8623
21 1144 2355 3124 6773 6805 6887 7742 7994 8358 8374 8580 8611
335 4473 4883 5528 6096 7543 7586 7921 8197 8319 8394 8489 8636
2919 4331 4419 4735 6366 6393 6844 7193 8165 8205 8544 8586 8617
12 19 742 930 3009 4330 6213 6224 7292 7430 7792 7922 8137
710 1439 1588 2434 3516 5239 6248 6827 8230 8448 8515 8581 8619
200 1075 1868 5581 7349 7642 7698 8037 8201 8210 8320 8391 8526
3 2501 4252 5256 5292 5567 6136 6321 6430 6486 7571 8521 8636
3062 4599 5885 6529 6616 7314 7319 7567 8024 8153 8302 8372 8598
105 381 1574 4351 5452 5603 5943 7467 7788 7933 8362 8513 8587
787 1857 3386 3659 6550 7131 7965 8015 8040 8312 8484 8525 8537
15 1118 4226 5197 5575 5761 6762 7038 8260 8338 8444 8512 8568
36 5216 5368 5616 6029 6591 8038 8067 8299 8351 8565 8578 8585
1 23 4300 4530 5426 5532 5817 6967 7124 7979 8022 8270 8437
629 2133 4828 5475 5875 5890 7194 8042 8345 8385 8518 8598 8612
11 1065 3782 4237 4993 7104 7863 7904 8104 8228 8321 8383 8565
2131 2274 3168 3215 3220 5597 6347 7812 8238 8354 8527 8557 8614
5600 6591 7491 7696
1766 8281 8626
1725 2280 5120
1650 3445 7652
4312 6911 8626
15 1013 5892
2263 2546 2979
1545 5873 7406
67 726 3697
2860 6443 8542
17 911 2820
1561 4580 6052
79 5269 7134
22 2410 2424
3501 5642 8627
808 6950 8571
4099 6389 7482
4023 5000 7833
5476 5765 7917
1008 3194 7207
20 495 5411
1703 8388 8635
6 4395 4921
200 2053 8206
1089 5126 5562
10 4193 7720
1967 2151 4608
22 738 3513
3385 5066 8152
440 1118 8537
3429 6058 7716
5213 7519 8382
5564 8365 8620
43 3219 8603
4 5409 5815
5 6376 7654
4091 5724 5953
5348 6754 8613
1634 6398 6632
72 2058 8605
3497 5811 7579
3846 6743 8559
15 5933 8629
2133 5859 7068
4151 4617 8566
2960 8270 8410
2059 3617 8210
544 1441 6895
4043 7482 8592
294 2180 8524
3058 8227 8373
364 5756 8617
5383 8555 8619
1704 2480 4181
7338 7929 7990
2615 3905 7981
4298 4548 8296
8262 8319 8630
892 1893 8028
5694 7237 8595
1487 5012 5810
4335 8593 8624
3509 4531 5273
10 22 830
4161 5208 6280
275 7063 8634
4 2725 3113
2279 7403 8174
1637 3328 3930
2810 4939 5624
3 1234 7687
2799 7740 8616
22 7701 8636
4302 7857 7993
7477 7794 8592
9 6111 8591
5 8606 8628
347 3497 4033
1747 2613 8636
1827 5600 7042
580 1822 6842
232 7134 7783
4629 5000 7231
951 2806 4947
571 3474 8577
2437 2496 7945
23 5873 8162
12 1168 7686
8315 8540 8596
1766 2506 4733
929 1516 3338
21 1216 6555
782 1452 8617
8 6083 6087
667 3240 4583
4030 4661 5790
559 7122 8553
3202 4388 4909

2533 3673 8594
1991 3954 6206
6835 7900 7980
189 5722 8573
2680 4928 4998
243 2579 7735
4281 8132 8566
7656 7671 8609
1116 2291 4166
21 388 8021
6 1123 8369
311 4918 8511
0 3248 6290
13 6762 7172
4209 5632 7563
49 127 8074
581 1735 4075
0 2235 5470
2178 5820 6179
16 3575 6054
1095 4564 6458
9 1581 5953
2537 6469 8552
14 3874 4844
0 3269 3551
2114 7372 7926
1875 2388 4057
3232 4042 6663
9 401 583
13 4100 6584
2299 4190 4410
21 3670 4979.

13. The data processing apparatus according to claim 12, wherein
- a row of the parity check matrix initial value table is represented by i and a parity length of the LDPC code is represented by M,
- a {2+360×(i−1)}-th column of the parity check matrix is a column obtained by cyclically shifting a {1+360×(i−1)}-th column of the parity check matrix, in which positions of elements of 1 are represented in the parity check matrix initial value table, downward by q, where q is equal to M/360.

14. A data processing method for using an LDPC code to enable error correction processing to correct errors generated in a transmission path of a television broadcast, the method comprising:
- encoding information bits into an LDPC (Low Density Parity Check) code word having a code length of 64800 bits and a code rate of 13/15 on the basis of a parity check matrix of the LDPC code; and
- supplying the encoded information bits for television broadcast, wherein
- the LDPC code word includes information bits and parity bits,
- the parity check matrix includes an information matrix portion corresponding to the information bits and a parity matrix portion corresponding to the parity bits,
- the information matrix portion is represented by a parity check matrix initial value table, and
- the parity check matrix initial value table is a table showing positions of elements of 1 in the information matrix portion in units of 360 columns, including 142 2307 2598 2650 4028 4434 5781 5881 6016 6323 6681 6698 8125
2932 4928 5248 5256 5983 6773 6828 7789 8426 8494 8534 8539 8583
899 3295 3833 5399 6820 7400 7753 7890 8109 8451 8529 8564 8602
21 3060 4720 5429 5636 5927 6966 8110 8170 8247 8355 8365 8616
20 1745 2838 3799 4380 4418 4646 5059 7343 8161 8302 8456 8631
9 6274 6725 6792 7195 7333 8027 8186 8209 8273 8442 8548 8632
494 1365 2405 3799 5188 5291 7644 7926 8139 8458 8504 8594 8625
192 574 1179 4387 4695 5089 5831 7673 7789 8298 8301 8612 8632
11 20 1406 6111 6176 6256 6708 6834 7828 8232 8457 8495 8602
6 2654 3554 4483 4966 5866 6795 8069 8249 8301 8497 8509 8623
21 1144 2355 3124 6773 6805 6887 7742 7994 8358 8374 8580 8611
335 4473 4883 5528 6096 7543 7586 7921 8197 8319 8394 8489 8636
2919 4331 4419 4735 6366 6393 6844 7193 8165 8205 8544 8586
8617
12 19 742 930 3009 4330 6213 6224 7292 7430 7792 7922 8137
710 1439 1588 2434 3516 5239 6248 6827 8230 8448 8515 8581 8619
200 1075 1868 5581 7349 7642 7698 8037 8201 8210 8320 8391 8526
3 2501 4252 5256 5292 5567 6136 6321 6430 6486 7571 8521 8636
3062 4599 5885 6529 6616 7314 7319 7567 8024 8153 8302 8372 8598
105 381 1574 4351 5452 5603 5943 7467 7788 7933 8362 8513 8587
787 1857 3386 3659 6550 7131 7965 8015 8040 8312 8484 8525 8537
15 1118 4226 5197 5575 5761 6762 7038 8260 8338 8444 8512 8568
36 5216 5368 5616 6029 6591 8038 8067 8299 8351 8565 8578 8585
1 23 4300 4530 5426 5532 5817 6967 7124 7979 8022 8270 8437
629 2133 4828 5475 5875 5890 7194 8042 8345 8385 8518 8598 8612
11 1065 3782 4237 4993 7104 7863 7904 8104 8228 8321 8383 8565
2131 2274 3168 3215 3220 5597 6347 7812 8238 8354 8527 8557 8614
5600 6591 7491 7696
1766 8281 8626
1725 2280 5120
1650 3445 7652
4312 6911 8626
15 1013 5892
2263 2546 2979
1545 5873 7406
67 726 3697
2860 6443 8542
17 911 2820
1561 4580 6052
79 5269 7134
22 2410 2424
3501 5642 8627
808 6950 8571
4099 6389 7482
4023 5000 7833

5476 5765 7917
1008 3194 7207
20 495 5411
1703 8388 8635
6 4395 4921
200 2053 8206
1089 5126 5562
10 4193 7720
1967 2151 4608
22 738 3513
3385 5066 8152
440 1118 8537
3429 6058 7716
5213 7519 8382
5564 8365 8620
43 3219 8603
4 5409 5815
5 6376 7654
4091 5724 5953
5348 6754 8613
1634 6398 6632
72 2058 8605
3497 5811 7579
3846 6743 8559
15 5933 8629
2133 5859 7068
4151 4617 8566
2960 8270 8410
2059 3617 8210
544 1441 6895
4043 7482 8592
294 2180 8524
3058 8227 8373
364 5756 8617
5383 8555 8619
1704 2480 4181
7338 7929 7990
2615 3905 7981
4298 4548 8296
8262 8319 8630
892 1893 8028
5694 7237 8595
1487 5012 5810
4335 8593 8624
3509 4531 5273
10 22 830
4161 5208 6280
275 7063 8634
4 2725 3113
2279 7403 8174
1637 3328 3930
2810 4939 5624
3 1234 7687
2799 7740 8616
22 7701 8636
4302 7857 7993
7477 7794 8592
9 6111 8591
5 8606 8628
347 3497 4033
1747 2613 8636
1827 5600 7042
580 1822 6842
232 7134 7783
4629 5000 7231
951 2806 4947
571 3474 8577
2437 2496 7945
23 5873 8162
12 1168 7686
8315 8540 8596
1766 2506 4733
929 1516 3338
21 1216 6555
782 1452 8617
8 6083 6087
667 3240 4583
4030 4661 5790
559 7122 8553
3202 4388 4909
2533 3673 8594
1991 3954 6206
6835 7900 7980
189 5722 8573
2680 4928 4998
243 2579 7735
4281 8132 8566
7656 7671 8609
1116 2291 4166
21 388 8021
6 1123 8369
311 4918 8511
0 3248 6290
13 6762 7172
4209 5632 7563
49 127 8074
581 1735 4075
0 2235 5470
2178 5820 6179
16 3575 6054
1095 4564 6458
9 1581 5953
2537 6469 8552
14 3874 4844
0 3269 3551
2114 7372 7926
1875 2388 4057
3232 4042 6663
9 401 583
13 4100 6584
2299 4190 4410
21 3670 4979.

15. The data processing method according to claim 14, wherein
a row of the parity check matrix initial value table is represented by i and a parity length of the LDPC code is represented by M,
a {2+360×(i−1)}-th column of the parity check matrix is a column obtained by cyclically shifting a {1+360×(i−1)}-th column of the parity check matrix, in which positions of elements of 1 are represented in the parity check matrix initial value table, downward by q, where q is equal to M/360.

\* \* \* \* \*